(12) United States Patent
Nagano et al.

(10) Patent No.: US 9,748,289 B2
(45) Date of Patent: Aug. 29, 2017

(54) SEMICONDUCTOR DEVICE, ITS MANUFACTURING METHOD AND ELECTRONIC APPARATUS THEREOF

(75) Inventors: Takashi Nagano, Kanagawa (JP); Yasushi Morita, Kanagawa (JP)

(73) Assignee: Sony Semiconductor Solutions Corporation, Atsugi, Kanagawa (JP)

( * ) Notice: Subject to any disclaimer, the term of this patent is extended or adjusted under 35 U.S.C. 154(b) by 271 days.

(21) Appl. No.: 11/705,519

(22) Filed: Feb. 12, 2007

(65) Prior Publication Data

US 2007/0141772 A1 Jun. 21, 2007

Related U.S. Application Data

(62) Division of application No. 10/483,882, filed as application No. PCT/JP03/06020 on May 14, 2003, now Pat. No. 7,235,835.

(30) Foreign Application Priority Data

May 14, 2002 (JP) ................................ P2002-138638

(51) Int. Cl.
  *H01L 21/8238* (2006.01)
  *H01L 27/146* (2006.01)
  (Continued)

(52) U.S. Cl.
  CPC .. *H01L 27/14609* (2013.01); *H01L 21/82385* (2013.01); *H01L 21/823864* (2013.01);
  (Continued)

(58) Field of Classification Search
  CPC ....... H01L 27/10894; H01L 27/146–27/14665
  (Continued)

(56) References Cited

U.S. PATENT DOCUMENTS

| 5,483,104 A | 1/1996 | Godino et al. |
| 5,585,299 A * | 12/1996 | Hsu ................ H01L 21/823443 |
| | | 257/E21.622 |

(Continued)

FOREIGN PATENT DOCUMENTS

| CN | 1327262 | 12/2001 |
| EP | 1 075 028 | 8/2000 |

(Continued)

*Primary Examiner* — Eric Ward
(74) *Attorney, Agent, or Firm* — Robert Depke; The Chicago Technology Law Group

(57) ABSTRACT

The present invention proposes a semiconductor device, its manufacturing method and to an electronic apparatus thereof equipped with the semiconductor device where it becomes possible to make a CMOS type solid-state imaging device, an imager area formed with a MOS transistor of an LDD structure without having a metal silicide layer of a refractory metal, an area of DRAM cells and the like into a single semiconductor chip. According to the present invention, a semiconductor device is constituted such that an insulating film having a plurality of layers is used, sidewalls at the gate electrodes are formed by etchback the insulating film of the plurality of layers or a single layer film in the region where metal silicide layers are formed and in the region where the metal silicide layers are not formed, sidewalls composed of an upper layer insulating film is formed on a lower layer insulating film whose surface is coated or the insulating film of the plurality of layers remain unchanged.

21 Claims, 83 Drawing Sheets

(51) Int. Cl.
*H01L 27/092* (2006.01)
*H01L 27/108* (2006.01)

(52) U.S. Cl.
CPC ...... *H01L 27/092* (2013.01); *H01L 27/14689* (2013.01); *H01L 27/10873* (2013.01); *H01L 27/10894* (2013.01)

(58) Field of Classification Search
USPC .......................................... 438/199; 257/292
See application file for complete search history.

(56) References Cited

U.S. PATENT DOCUMENTS

| | | | |
|---|---|---|---|
| 5,792,684 A | 8/1998 | Lee et al. | |
| 5,998,251 A | 12/1999 | Wu et al. | |
| 6,015,748 A | 1/2000 | Kim et al. | |
| 6,023,081 A * | 2/2000 | Drowley et al. | 257/292 |
| 6,025,267 A * | 2/2000 | Pey et al. | 438/656 |
| 6,037,222 A * | 3/2000 | Huang et al. | 438/257 |
| 6,040,593 A * | 3/2000 | Park | 257/292 |
| 6,096,595 A * | 8/2000 | Huang | 438/238 |
| 6,137,127 A * | 10/2000 | Merrill | 257/292 |
| 6,156,593 A * | 12/2000 | Peng et al. | 438/200 |
| 6,160,282 A * | 12/2000 | Merrill | 257/292 |
| 6,177,319 B1 | 1/2001 | Chen | |
| 6,194,258 B1 * | 2/2001 | Wuu | 438/200 |
| 6,218,235 B1 * | 4/2001 | Hachisuka et al. | 438/241 |
| 6,258,648 B1 * | 7/2001 | Lee | 438/238 |
| 6,277,683 B1 * | 8/2001 | Pradeep et al. | 438/200 |
| 6,291,279 B1 * | 9/2001 | Hsiao et al. | 438/197 |
| 6,445,014 B1 | 9/2002 | Rhodes et al. | |
| 6,448,101 B1 * | 9/2002 | Kuo et al. | 438/45 |
| 6,448,167 B1 * | 9/2002 | Wang et al. | 438/595 |
| 6,486,516 B1 | 11/2002 | Hachisuka | |
| 6,563,187 B1 * | 5/2003 | Park | 257/446 |
| 6,593,198 B2 * | 7/2003 | Segawa | 438/303 |
| 6,607,951 B2 * | 8/2003 | Chen et al. | 438/199 |
| 6,624,019 B2 * | 9/2003 | Kim | 438/241 |
| 6,774,441 B2 * | 8/2004 | Maki et al. | 257/384 |
| 6,777,734 B2 | 8/2004 | Min | |
| 7,342,269 B1 * | 3/2008 | Yuzurihara | 257/292 |
| 2001/0025970 A1 * | 10/2001 | Nozaki et al. | 257/255 |
| 2002/0094697 A1 | 7/2002 | Leung et al. | |

FOREIGN PATENT DOCUMENTS

| | | |
|---|---|---|
| EP | 1 139 428 | 3/2001 |
| JP | 08-298290 | 11/1996 |
| JP | HEI 08-298290 | 11/1996 |
| JP | 10-256390 | 9/1998 |
| JP | HEI 10-256390 | 9/1998 |
| JP | 2000-040819 | 2/2000 |
| JP | 2000-049089 | 2/2000 |
| JP | 2001-035934 | 2/2001 |
| JP | 2001-35934 | 2/2001 |
| JP | 2001-77209 | 3/2001 |
| JP | 2001-077209 | 3/2001 |
| JP | 2001-111022 | 4/2001 |
| JP | 2001-196549 | 7/2001 |
| JP | 2001-345439 | 12/2001 |
| KR | 2001-0029901 | 4/2001 |
| KR | 2001-0070037 | 7/2001 |
| KR | 2001-0093670 | 10/2001 |
| TW | 451420 | 8/2001 |
| TW | 455997 | 9/2001 |
| TW | 479269 | 3/2002 |

* cited by examiner

SEMICONDUCTOR DEVICE, ITS MANUFACTURING METHOD AND ELECTRONIC APPARATUS THEREOF

The subject matter of application Ser. No. 10/483,882 is incorporated herein by reference. The present application is a Divisional of U.S. Ser. No. 10/483,882, filed Jun. 14, 2004, which is a U.S. National Stage of PCT Application No. PCT/JP03/06020, filed May 13, 2003, which claims priority to Japanese Patent Application No. JP 2002-138638 filed May 14, 2002, all of which applications are incorporated herein by reference.

TECHNICAL FIELD

The present invention relates, for example, to a solid-state imaging device having photodiodes such as a CMOS image sensor, to a semiconductor device represented by a logic LSI with embedded DRAM and the like, to its manufacturing method and to an electronic apparatus thereof equipped with this semiconductor device. More particularly, the present invention relates to a semiconductor device having a semiconductor region formed with a metal silicate layer of a refractory metal and a semiconductor region without a metal silicate layer of a refractory metal, to its manufacturing method and to an electronic apparatus thereof equipped with this semiconductor device.

BACKGROUND ART

In recent years, it has been progressed in the process of a semiconductor device having a CMOS logic circuit for making the device with a fine construction by utilizing a scaling law. In such a process, it is general to use a method for forming a metal silicate layer of a refractory metal in a source/drain region of a MOS transistor by using a salicide technology for the purpose of reducing the parasitic resistance. The salicide technology is a process for forming a metal silicide layer of a refractory metal selectively and self-adjustingly on a surface of a silicon gate electrode and a source/drain region of a MOS transistor at the same time. Additionally, with respect to a semiconductor device having a CMOS logic circuit, total system unification on a silicon substrate has been highly demanded for the purpose of a fine construction of a device and at the same time for the purpose of reduction of power consumption, improvement of operation speed and lower cost. For example, it has become an important theme how to form a functional device such as a CMOS image sensor and a logic LSI with embedded DRAM.

However, it is technically difficult to unify a CMOS logic region where a metal silicide layer of a refractory metal is formed in a source region and a drain region with a solid-state imaging device having DRAM cells and photodiodes where there is a problem of a junction leak current on a single silicon substrate. In more detail, when metal silicide layers of a refractory metal are formed in a source region and a drain region, it causes an increase of a junction leak current and it especially becomes a fatal problem for a solid-state imaging device having DRAM cells and photodiodes where a junction leak current is a matter of a problem. The metal silicide, layers of a refractory metal are formed by forming a metal of a refractory metal on the surfaces of the source region and the drain region and by reacting the silicon and the metal of a refractory metal. However, when the silicon and the metal of a refractory metal do not completely react each other and the metal of a refractory metal which does not react owing to some probability remains in the vicinity of a junction, it causes an increase of a junction leak current in response to a fact that the remaining metal of a refractory metal becomes a core.

On the other hand, it is adopted for a MOS transistor that a source region and a drain region are made as an LDD structure by utilizing an insulating film spacer formed at the gate electrode and the side wall thereof, that is, a so-called sidewall. Then, by using, for example, a photo-resist method, a method is proposed where an etchingback process is applied only to a CMOS logic region where metal silicide layers of a refractory metal are formed such that the metal silicide layers of a refractory metal are formed only in the source region and the drain region in the CMOS logic region. However, in case of this method, there is a problem that either of the source region and the drain region cannot be formed in a region where the metal silicide layer of a refractory metal is not formed.

Consequently, in case of forming a source region and a drain region having a relatively deep junction, a sidewall structure becomes necessary in order to avoid an influence towards the channel region of the MOS transistor. As mentioned above, when the same region is used for a region formed with a metal silicide layer of a refractory metal and a region formed with a sidewall, a sidewall cannot be formed in a region where the metal silicide layer of a refractory metal in not formed and it becomes impossible to form the source region and the drain region in a forming region and in a non-forming region of a metal silicide layer of a refractory metal at the same time. In a CMOS image sensor, for example, a picture quality has been attempted to improve by making the potential setting of the photodiode deeper such that the saturation signal is increased and the S/N ratio is made larger. However, in response to setting the potential of the photodiode deeper, the potential setting of the source/drain regions of the MOS transistor for reading-out should be made deeper in order to read out the signal charge of the photodiode. As to this means, it becomes indispensable to form a source/drain region by injecting an impurity of a high concentration using the sidewall as a mask. In other words, it is necessary to form source/drain regions also in an area of picture elements where a metal silicide layer of a refractory metal is not formed, but there has been a theme in the prior art technique that such a necessity cannot be cleared.

It should be noted that a JAP laid-open patent No. 2001-44404 discloses about a constitution of forming a metal silicide layer in a source/drain region of a MOS transistor connected to a light receiving portion.

DISCLOSURE OF THE INVENTION

In view of the above aspects, the present invention propose a semiconductor device, its manufacturing method and to an electronic apparatus thereof equipped with such a semiconductor device where in case of a field effect transistor having a problem of a junction leak current such as a MOS transistor in a region of a DRAM cell or a CMOS type imager, a metal silicide layer of a refractory metal is not formed and in case of a field effect transistor necessary for reducing a parasitic resistance such as a MOS transistor in a region of a logic circuit portion, a metal silicide layer of a refractory metal can be formed.

A first semiconductor device according to the present invention has a first region formed with a metal silicide layer of a refractory metal on a substrate and a second region without a metal silicide layer of a refractory metal being formed, wherein a sidewall composed of a plurality of insulating films is formed at a side wall of a gate electrode of a first field effect transistor formed in the first region, the metal silicide layer of a refractory metal is formed in a source/drain region of the first field effect transistor, the second region is covered by a lower layer insulating film of the plurality of insulating films together with a second field effect transistor formed in said second region, and a sidewall composed of an upper layer insulating film of the plurality of insulating films is formed corresponding to a side wall of a gate electrode of the second field effect transistor.

As to the substrate, for example, a semiconductor substrate and preferably a silicon substrate can be used. As to the first and the second field effect transistors, insulated gate field effect transistors which are so-called MOS transistors are used. Hereinafter, a field effect transistor is explained as a MOS transistor for an abbreviation. Both the first MOS transistor and the second MOS transistor are formed with sidewalls at their gate electrodes, so that the source/drain regions are formed by a so-called LDD structure. This is similarly true in the cases of other semiconductor devices and manufacturing methods, so that repetitive explanations will be omitted.

The metal silicide layer of a refractory metal can be formed also at the gate electrode of the first field effect transistor formed in the first region.

It is possible to form the plurality of insulating films by a first insulating film, a second insulating film and a third insulating film; to form the lower layer covering the second region by the first and second insulating films; and to form the upper layer by the third insulating film. It is possible to form the second insulating film by an insulating film having a different etching characteristic from that of the third insulating film. For example, it is possible to form the first and third insulating films by silicon oxide films and to form the second insulating film by a silicon nitride film. It is desirable to select the film thickness of a silicon oxide film forming the first insulating film as 20 nm or less. It is desirable to select the film thickness of a silicon nitride film forming the second insulating film as 30 nm or less. It is desirable to select the film thickness of a silicon oxide film forming the third insulating film as 100 nm or less.

Additionally, it is possible to form the plurality of insulating films by a first insulating film and a second insulating film, to form the lower layer covering the second region by the first film, and to form the upper layer insulating film by the second insulating film. It is possible to form the second insulating film by an insulating film having a different etching characteristic from that of the first insulating film. For example, it is possible to form the first insulating film by a silicon nitride film and to form the second insulating film by a silicon oxide film. It is desirable to select the film thickness of a silicon nitride film forming the first insulating film as 30 nm or less. It is desirable to select the film thickness of a silicon oxide film forming the second insulating film as 100 nm or less.

According to the first semiconductor device of the present invention, it is possible to form a metal silicide of a refractory metal at the source/drain region of an LDD structure or at this source/drain region and the surface of the gate electrode in the first region by using a sidewall of a plurality of insulating films such as a 3-layer structure composed of a first, a second and a third insulating films or a 2-layer structure composed of a first and a second insulating films, so that the device can be made with a fine structure and at the same time with a reduced parasitic resistance such that it becomes possible to realize a high speed operation and a reduction in power consumption. On the other hand, in the second region, a lower layer of the plurality of insulating films, that is, for example, the first and second insulating films in case of 3-layer structure and the first insulating film in case of 2-layer structure cover the surface thereof and a sidewall is formed in correspondence with the side wall of the gate electrode, so that it becomes possible to avoid forming a metal silicide layer of a refractory metal and to suppress a junction leak current. Additionally, a MOS transistor of an LDD structure can be formed. Consequently, both can be MOS transistors having source/drain regions of an LDD structure where one region having a MOS transistor formed with a metal silicide layer of a refractory metal and the other region having a MOS transistor formed without a metal silicide layer of a refractory metal being formed can be made into a same semiconductor chip.

When an insulating film of a 3-layer structure is used, by using a second insulating film which has a different etching characteristic from that of a third insulating film, it becomes possible to form a sidewall made of the third insulating film by an etchback process in the second region in a condition that the first and the second insulating films remain on the side wall of the gate electrode, so that it is made possible to avoid forming a metal silicide layer of a refractory metal in the second region. Such an etchback process can become possible in a condition that the first insulating film is formed by a silicon oxide film, second insulating film is formed by a silicon nitride film and the third insulating film is formed by a silicon oxide film respectively. When an insulating film of a 2-layer structure is used, by using a first insulating film which has a different etching characteristic from that of a second insulating film, it becomes possible to form a sidewall made of the second insulating film by an etchback process in the second region in a condition that the first insulating film remains on the side wall of the gate electrode, so that it is made possible to avoid forming a metal silicide layer of a refractory metal in the second region. Such an etchback process can become possible in a condition that the first insulating film is formed by a silicon nitride film and the second insulating film is formed by a silicon oxide film respectively.

In case when the plurality of insulating films are formed by 3-layer films, the sidewall can be easily made by selecting the film thickness of the silicon oxide film of the first insulating film as 20 nm or less, the film thickness of the silicon nitride film of the second insulating film as 30 nm or less and the film thickness of the silicon oxide film of the third insulating film as 100 nm or less. If the film thickness goes beyond the above value, it becomes difficult to make the sidewall in a fine device. Further, it is convenient when making a reflection prohibiting film on, for example, a sensor portion if film thickness of the silicon oxide film of the first insulating film is selected to be 20 nm or less and the film thickness of the silicon nitride film of the second insulating film is selected to be 30 nm or less. On the second silicon nitride film of the sensor portion, an insulating film (for example, a silicon nitride film, silicon oxide film and the like) is formed in a process of making a wiring and it becomes possible to raise the efficiency of the incident light to the sensor portion by means of the silicon oxide film and the insulating film formed in the process of making the wiring which will have a reflection prohibition function. In case of forming the plurality of insulating films by a 2-layer film, similarly, it becomes easy to make a sidewall and further it becomes convenient to make a reflection prohibiting film on, for example, the sensor portion.

A first manufacturing method of a semiconductor device according to the present invention comprises a process for forming gate electrodes through insulation films on a first region to be formed with a metal silicide layer of a refractory metal on a substrate and a second region without a metal silicide layer of a refractory metal being formed; a process for forming a first impurity introducing region by introducing an impurity to the substrate using the gate electrode as a mask; a process for forming an insulating film which becomes a lower layer on the whole surface of the substrate including the gate electrode; a process for forming a sidewall on the side wall of the gate electrode by selectively etchingback only the insulating film which becomes the lower layer on the first region; a process for forming a second impurity introducing region by forming an insulating film which becomes an upper layer on the first and second regions, by forming a sidewall at a portion corresponding to the side wall of the gate electrode by etchingback the insulating film which becomes said upper layer and by introducing an impurity using said sidewall and the gate electrode as a mask; and a process for selectively forming a metal silicide layer of a refractory metal at the second impurity introducing region of the first region or at said second impurity introducing region and the gate electrode.

Here, in the first region and the second region, the aforesaid first impurity introducing region becomes a source/drain region in case of a MOS transistor and becomes one of the conductive type regions forming a photodiode in case of a sensor portion of a imager area which will be described hereinafter. Further, the aforesaid second impurity introducing region becomes a source/drain region of a high concentration in case of a MOS transistor and becomes a semiconductor region of a high concentration for reducing a junction leak current in case of a sensor portion of a imager area which will be described hereinafter. For MOS transistor, a source/drain region of a so-called LDD structure is formed.

It is possible to form the plurality of insulating films constituting the lower and upper insulating films by a 3-layer film of a first insulating film, a second insulating film and a third insulating film; to form the lower layer film by the first and second insulating films; and to form the upper layer by the third insulating film. It is possible to form the second insulating film by an insulating film having a different etching characteristic from that of the third insulating film. In this way, the second insulating film becomes a stopper when the third insulating film is etchedback and it becomes possible to make the second and the first insulating films remain in the second region. For example, it is possible to form the first insulating film by a silicon oxide film; to form the second insulating film by a silicon nitride film and to form the third insulating film by a silicon oxide film.

Additionally, it is possible to form the plurality of insulating films constituting the lower and upper insulating films by a 2-layer film of a first insulating film and a second insulating film; to form the lower layer film is formed by the first insulating film; and to form the upper layer is formed by the second insulating film. In this case, too, it is possible to form the first insulating film by an insulating film having a different etching characteristic from that of the second insulating film. In this way, the first insulating film becomes a stopper when the second insulating film is etchedback and it becomes possible to make the first insulating films remain in the second region. For example, it is possible to form the first insulating film by a silicon nitride film and to form the second insulating film by a silicon oxide film. Further, it is also possible to form the first insulating film by a silicon oxide film and to form the second insulating film by a silicon nitride film.

According to the first semiconductor manufacturing method of the present invention, by using a plurality of insulating films such as a 3-layer structure composed of a first, a second and a third insulating films or a 2-layer structure composed of a first and a second insulating films and after forming a lower side layer(s), for example, the first and the second insulating films or the first insulating film on the whole surface, a sidewall is formed by etchingback only the first region selectively. Next, MOS transistors of an LDD structure can be formed both in the first and the second regions by forming an upper layer such as a third insulating film or a second insulating film on the whole surface, by etchingback it and by forming a sidewall composed of the third insulating film. It should be noted that the metal silicide layer of a refractory metal is protected by the lower side layer insulating film for its second region, so that it is formed only in the first region, but not in the second region. Consequently, a MOS transistor of a fine constitution can be made, and at the same time it becomes possible to manufacture a semiconductor device containing a first region where a MOS transistor is formed with a reduced parasitic resistance, with a high speed operation and a reduced power consumption and a second region where a MOS transistor is formed with a suppressed junction leak current on a same semiconductor chip.

In case of the 3-layer film the second insulating film when etchingback the third insulating film or in case of the 2-layer film the second insulating film when etchingback the second insulating film has a different etching characteristic from that of the insulating film etchedback, so that an insulating film which becomes a protective film can remain at the surface of the second region such that a metal silicide layer of a refractory metal can be prevented from being formed in the second region. Additionally, as the second region is protected by an insulating film, the surface of the silicon substrate is etched when etchingback, and consequently it will not be exposed to the plasma such that the silicon substrate is avoided from the damage.

By selecting the film thickness of the lower side insulating film remaining on the second region as an above mentioned value, it becomes possible to introduce an impurity and it becomes possible to form a second impurity introducing region in the second region.

A second semiconductor device according to the present invention has a first region formed with a metal silicide layer of a refractory metal on a semiconductor substrate and a second region without a metal silicide layer of a refractory metal being formed, wherein the second region is covered by a lower layer insulating film of the plurality of insulating films together with a second MOS transistor formed in said second region, a sidewall of a single layer film composed of an upper layer insulating film of the plurality of insulating films is formed corresponding to a side wall of a gate electrode of the second MOS transistor, a sidewall composed of the single layer film which does not include silicon nitride is formed at a side wall of a gate electrode of a first MOS transistor formed in the first region, and the metal silicide layer of a refractory metal is formed in a source/drain region or in a source/drain region and a gate electrode of the first MOS transistor.

It is possible to form the plurality of insulating films by a first insulating film, a second insulating film and a third insulating film; to form the lower layer covering the second region by the first and to form second insulating films; and the upper layer is formed by the third insulating film. In this case, too, it is possible as mentioned above to form the second insulating film by an insulating film having a different etching characteristic from that of the third insulating film. For example, it is possible to form the first and third insulating films by silicon oxide films and to form the second insulating film by a silicon nitride film. It is desirable to select the film thickness of a silicon oxide film forming the first insulating film as 20 nm or less. It is desirable to select the film thickness of a silicon nitride film forming the second insulating film as 30 nm or less. It is desirable to select to select the film thickness of a silicon oxide film forming the third insulating film as 100 nm or less.

Additionally, it is possible to form the plurality of insulating films by a first insulating film and a second insulating film, to form the lower layer covering the second region by the first film, and to form the upper layer insulating film by the second insulating film. In this case, too, it is possible as mentioned above to form the first insulating film by an insulating film having a different etching characteristic from that of the second insulating film. For example, it is possible to form the first insulating film by a silicon nitride film and to form the second insulating film by a silicon oxide film. It is desirable to select the film thickness of a silicon nitride film forming the first insulating film as 100 nm or less. It is desirable to select the film thickness of a silicon oxide film forming the second insulating film as 100 nm or less.

According to the second semiconductor device of the present invention, a sidewall of a single layer film which does not include silicon nitride is formed on the side wall of the gate electrode in the first region, so that the impurity in the gate electrode, especially boron (B) in the gate electrode of the p-channel MOS transistor when processing an activating annealing of the introduced impurity after introducing an impurity can be avoided from diffusing into the semiconductor substrate such that a deterioration of the transistor characteristic such as a deterioration of a current driving ability of a MOS transistor can be suppressed. For other aspects, it is possible such as to form a MOS transistor of an LDD structure having a metal silicide layer of a refractory metal in the first region and to form a MOS transistor of an LDD structure suppressed with a junction leak current and without a metal silicide layer of a refractory metal in the second region such that it has similar effects as the first semiconductor device of the present invention mentioned above. When the insulating film is constituted by a 3-layer film, the sidewall becomes easy to be made similarly as mentioned above by selecting the film thicknesses of the first, second and third insulating films as 20 nm or less, 30 nm or less and 100 nm or less respectively. Further, it becomes convenient for making a reflection prohibiting film.

When the insulating film is constituted by a 2-layer film, the sidewall becomes easy to be made similarly by selecting the film thicknesses of the first and the second insulating films as 100 nm respectively such that it becomes convenient for making a reflection prohibiting film.

A third semiconductor device according to the present invention has a first region formed with a metal silicide layer of a refractory metal on a semiconductor substrate and a second region without a metal silicide layer of a refractory metal being formed, wherein the second region is covered by the plurality of insulating films together with a second MOS transistor formed in said second region, a sidewall of a single layer film composed of an upper layer insulating film of the plurality of insulating films which does not include silicon nitride is formed at a side wall of a gate electrode of the first MOS transistor formed in the first region, and the metal silicide layer of a refractory metal is formed in a source/drain region or in a source/drain region and a gate electrode of the first MOS transistor.

It is possible that the plurality of insulating films are formed by a first insulating film, a second insulating film and a third insulating film; and the upper layer insulating film is formed by the third insulating film. In this case, too, it is possible as mentioned above to form the second insulating film by an insulating film having a different etching characteristic from that of the third insulating film. For example, it is possible to form the first and third insulating films by silicon oxide films and to form the second insulating film by a silicon nitride film. It is desirable as mentioned above to select the film thickness of a silicon oxide film forming the first insulating film as 20 nm or less. It is desirable to select the film thickness of a silicon nitride film forming the second insulating film as 30 nm or less. It is desirable to select the film thickness of a silicon oxide film forming the third insulating film is selected to be 100 nm or less.

Additionally, it is possible to form the plurality of insulating films by a first insulating film and a second insulating film and a second insulating film and to form the upper layer insulating film by the second insulating film. For example, it is possible to form the first insulating film by a silicon nitride film and to form the second insulating film by a silicon oxide film. It is desirable to select the film thickness of a silicon nitride film forming the first insulating film as 100 nm or less and to form the film thickness of a silicon oxide film forming the second insulating film as 100 nm or less.

According to the third semiconductor device of the present invention, just like the second semiconductor device of the present invention, a sidewall of a single layer film which does not include silicon nitride on the side wall of the gate electrode in the first region, so that the impurity in the gate electrode, especially boron (B) in the gate electrode of the p-channel MOS transistor when processing an activating annealing of the introduced impurity after introducing an impurity can be avoided from diffusing into the semiconductor substrate such that a deterioration of the transistor characteristic can be suppressed. For other aspects, it is possible such as to form a MOS transistor of an LDD structure having a metal silicide layer of a refractory metal in the first region and to form a MOS transistor of an LDD structure suppressed with a junction leak current and without a metal silicide layer of a refractory metal in the second region such that it has similar effects as the first semiconductor device of the present invention mentioned above. When the insulating film is constituted by a 3-layer film, the sidewall becomes easy to be made by selecting the film thicknesses of the first, second and third insulating films as 20 nm or less, 30 nm or less and 100 nm or less respectively. Further, it becomes convenient for making a reflection prohibiting film. When the insulating film is constituted by a 2-layer film, the sidewall becomes easy to be made similarly by selecting the film thicknesses of the first and the second insulating films as 100 nm respectively such that it becomes convenient for making a reflection prohibiting film.

A second manufacturing method of a semiconductor device according to the present invention comprises a process for forming material films of gate electrodes through gate insulation films on a first region to be formed with a metal silicide layer of a refractory metal on a semiconductor substrate and a second region without a metal silicide layer of a refractory metal being formed; a process for forming a gate electrode by patterning processing only the material film of the gate electrode of the second region selectively; a process for forming a first impurity introducing region by introducing an impurity to the second region using the gate electrode as a mask; a process for stacking a first insulating film and a second insulating film on the whole surface of the first region and the second region; a process for forming a second impurity introducing region by mask the upper face of the second region, by forming a gate electrode in a process of removing the first and second insulating films on the material film of the gate electrode at the first region and patterning processing the material film of said gate electrode, and by introducing an impurity to the first region using said gate electrode as a mask; a process for forming a sidewall of a single layer film made of a third insulating film on the side wall of the gate electrode in the first region and for forming a sidewall by the third insulating film through the first and second insulating films on the side wall of the gate electrode in the second region by forming a third insulating film on the whole surfaces of the first region and the second region and thereafter etchingback said third insulating film; a process for forming a third impurity introducing region by introducing an impurity in the first region and the second region using the gate electrode and the sidewall as a mask; and a process for forming a metal silicide layer of a refractory metal at the third impurity introducing region of the first region or at said third impurity introducing region and the gate electrode.

Here, the aforesaid first impurity introducing region of the second region becomes a source/drain region of a low concentration, for example, in case of a MOS transistor and becomes one conductive type region constituting a photodiode in case of a sensor portion of an imager area which will be described hereinafter. The aforesaid second impurity introducing region of the first region becomes a source/drain region of a low concentration, for example, in case of a MOS transistor. The aforesaid third impurity introducing region of the first and second regions becomes a source/drain region of a high concentration, for example, in case of a MOS transistor and becomes a semiconductor region of a high concentration for reducing a junction leak current in case of a sensor portion of an imager area which will be described hereinafter. For the MOS transistor a source/drain region of a so-called LDD structure is formed.

In this case, too, it is possible as mentioned above to form the second insulating film by an insulating film having a different etching characteristic from that of the third insulating film. For example, it is possible to form the first insulating film is formed by a silicon oxide film; to form the second insulating film by a silicon nitride film and to form the third insulating film by a silicon oxide film.

According to the second semiconductor manufacturing method of the present invention, by using an insulating film of a 3-layer structure, a sidewall of a single layer film composed of the third insulating film which does not include silicon nitride is formed on the side wall of the gate electrode in the first region, so that the impurity in the gate electrode, especially boron (B) in the gate electrode of the p-channel MOS transistor when processing an activating annealing of the introduced impurity after introducing an impurity can be avoided from diffusing into the semiconductor substrate such that a deterioration of the transistor characteristic such as a deterioration of a current driving ability of a MOS transistor can be suppressed. For other aspects, a metal silicide of a refractory metal is formed only at a MOS transistor and a MOS transistor of a fine constitution can be made, and at the same time it becomes possible to manufacture such a semiconductor device containing a first region where a MOS transistor of an LDD structure is included with a reduced parasitic resistance, with a high speed operation and a reduced power consumption and a second region where a MOS transistor is formed with a suppressed junction leak current on a same semiconductor chip such that it has similar effects as the first semiconductor manufacturing method of the present invention mentioned above.

A third manufacturing method of a semiconductor device according to the present invention comprises a process for forming material films of gate electrodes through gate insulation films on a first region to be formed with a metal silicide layer of a refractory metal on a semiconductor substrate and a second region without a metal silicide layer of a refractory metal being formed; a process for forming a gate electrode by patterning processing only the material film of the gate electrode of the second region selectively; a process for forming a first impurity introducing region by introducing an impurity to the second region using said gate electrode as a mask; a process for stacking a first insulting layer and a second insulating layer on the whole surface of the first region and the second region; a process for forming a second impurity introducing region by introducing an impurity to the second region using the first and second insulating films of the gate electrode and the side wall of said gate electrode as a mask; a process for forming a second impurity introducing region by mask the upper face of the second region, by forming a gate electrode in a process of removing the first and second insulating films on the material film of the gate electrode at the first region and patterning processing the material film of said gate electrode, and by introducing an impurity to the first region using said gate electrode as a mask; a process for forming a fourth impurity introducing region by forming a third insulating film on the whole surfaces of the first region and the second region and thereafter mask the second region and etchingback the third insulating film and by introducing an impurity to the first region using the gate electrode and the sidewall as a mask; and a process for forming a sidewall of a single layer film made of a third insulating film on the side wall of the gate electrode in the first region and for forming a metal silicide layer of a refractory metal at the fourth impurity introducing region of the first region or at said fourth impurity introducing region and the gate electrode.

Here, the aforesaid first impurity introducing region of the second region becomes a source/drain region in case of a MOS transistor and becomes one of the conductive type regions forming a photodiode in case of a sensor portion of a imager area which will be described hereinafter. The aforesaid second impurity introducing region of the second region becomes a source/drain region of a high concentration in case of a MOS transistor and becomes a semiconductor region of a high concentration for reducing a junction leak current in case of a sensor portion of a imager area which will be described hereinafter. The aforesaid third impurity introducing region of the first region becomes a source/drain region of a low concentration in case of a MOS transistor. The aforesaid fourth impurity introducing region of the first region becomes a source/drain region of a high concentration in case of a MOS transistor. For the MOS transistor, a source/drain region of a so-called LDD structure is formed.

In this case, too, it is possible as mentioned above to form the first insulating film by a silicon oxide film, to form the second insulating film by a silicon nitride film and to form the third insulating film by a silicon oxide film.

According to the third semiconductor manufacturing method of the present invention, by using an insulating film of a 3-layer structure, a sidewall of a single layer film composed of the third insulating film which does not include silicon nitride is formed on the side wall of the gate electrode in the first region, so that the impurity in the gate electrode, especially boron (B) in the gate electrode of the p-channel MOS transistor when processing an activating annealing of the introduced impurity after introducing an impurity can be avoided from diffusing into the semiconductor substrate such that a deterioration of the transistor characteristic such as a deterioration of a current driving ability of a MOS transistor can be suppressed. Additionally, the insulating film of the 3-layer structure remained unchanged in the second region, so that the film thickness of the second insulating film can be freely selected. In this way, the reflection intensity relative to the incident light can be made minimized when, for example, a photoelectric transfer means is formed. For other aspects, a metal silicide of a refractory metal is formed only at a MOS transistor and a MOS transistor of a fine constitution can be made, and at the same time it becomes possible to manufacture such a semiconductor device containing a first region where a MOS transistor of an LDD structure is included with a reduced parasitic resistance, with a high speed operation and a reduced power consumption and a second region where a MOS transistor is formed with a suppressed junction leak current on a same semiconductor chip such that it has similar effects as the first semiconductor manufacturing method of the present invention mentioned above.

A fourth manufacturing method of a semiconductor device according to the present invention comprises a process for forming material films of gate electrodes through gate insulation films on a first region to be formed with a metal silicide layer of a refractory metal on a semiconductor substrate and a second region without a metal silicide layer of a refractory metal being formed; a process for forming a gate electrode by patterning processing only the material film of the gate electrode of the second region selectively, a process for forming a first impurity introducing region by introducing an impurity to the second region using the gate electrode as a mask; a process for forming a first insulating film on the whole surface of the first region and the second region; a process for forming a second impurity introducing region by mask the second region, by forming a gate electrode in a process of removing the first insulating film on the material film of the gate electrode at the first region and patterning processing the material film of said gate electrode, and by introducing an impurity to the first region using said gate electrode as a mask; a process for forming a sidewall of a single layer film made of a second insulating film on the side wall of the gate electrode in the first region and for forming a sidewall by the second insulating film through the first insulating film on the side wall of the gate electrode in the second region by forming a second insulating film on the whole surfaces of the first region and the second region and thereafter etchingback said second insulating film; a process for forming a third impurity introducing region by introducing an impurity in the first region and the second region using the gate electrode and the sidewall as a mask; and a process for forming a metal silicide layer of a refractory metal at the third impurity introducing region of the first region or at said third impurity introducing region and the gate electrode. In this case, too, it is possible as mentioned above to form the first insulating film by an insulating film having a different etching characteristic from that of the second insulating film. For example, it is possible to form the first insulating film by a silicon nitride film and to form the second insulating film by a silicon oxide film.

Here, the aforesaid first impurity introducing region of the second region becomes a source/drain region of a low concentration, for example, in case of a MOS transistor and becomes one conductive type region constituting a photo-diode in case of a sensor portion of an imager area which will be described hereinafter. The aforesaid second impurity introducing region of the first region becomes a source/drain region of a low concentration, for example, in case of a MOS transistor. The aforesaid third impurity introducing region of the first and second regions becomes a source/drain region of a high concentration, for example, in case of a MOS transistor and becomes a semiconductor region of a high concentration for reducing a junction leak current in case of a sensor portion of an imager area which will be described hereinafter. For the MOS transistor a source/drain region of a so-called LDD structure is formed.

According to the fourth semiconductor manufacturing method of the present invention, by using an insulating film of a 2-layer structure, a sidewall of a single layer film composed of the second insulating film which does not include silicon nitride is formed on the side wall of the gate electrode in the first region, so that the impurity in the gate electrode, especially boron (B) in the gate electrode of the p-channel MOS transistor when processing an activating annealing of the introduced impurity after introducing an impurity can be avoided from diffusing into the semiconductor substrate such that a deterioration of the transistor characteristic such as a deterioration of a current driving ability of a MOS transistor can be suppressed. For other aspects, a metal silicide of a refractory metal is formed only at a MOS transistor and a MOS transistor of a fine constitution can be made, and at the same time it becomes possible to manufacture such a semiconductor device containing a first region where a MOS transistor of an LDD structure is included with a reduced parasitic resistance, with a high speed operation and a reduced power consumption and a second region where a MOS transistor is formed with a suppressed junction leak current on a same semiconductor chip such that it has similar effects as the first semiconductor manufacturing method of the present invention mentioned above.

A fifth manufacturing method of a semiconductor device according to the present invention comprises a process for forming material films of gate electrodes through gate insulation films on a first region to be formed with a metal silicide layer of a refractory metal on a semiconductor substrate and a second region without a metal silicide layer of a refractory metal being formed; a process for forming a gate electrode by patterning processing only the material film of the gate electrode of the second region selectively; a process for forming a first impurity introducing region by introducing an impurity to the second region using the gate electrode as a mask; a process for forming a first insulting layer on the whole surface of the first region and the second region; a process for forming a second impurity introducing region by introducing an impurity to the second region using the first insulating film of the gate electrode and the side wall of the gate electrode as a mask; a process for forming a third impurity introducing region by mask the second region, by forming a gate electrode in a process of removing the first insulating film on the material film of the gate electrode at the first region and patterning processing the material film of said gate electrode, and by introducing an impurity to the first region using said gate electrode as a mask; a process for forming a fourth impurity introducing region by forming a second insulating film on the whole surfaces of the first region and the second region and thereafter mask the second region and etchingback the second insulating film, by forming a sidewall of a single layer film made of a second insulating film on the side wall of the gate electrode in the first region and by introducing an impurity to the first region using the gate electrode and the sidewall as a mask; and a process for forming a metal silicide layer of a refractory metal at the fourth impurity introducing region of the first region or at said fourth impurity introducing region and the gate electrode. In this case, too, as mentioned above it is possible, for example, to form the first insulating film by a silicon nitride film and to form the second insulating film by a silicon oxide film.

Additionally, it is possible, for example, to form the first insulating film by a silicon nitride film and to form the second insulating film by a silicon oxide film.

Here, the aforesaid first impurity introducing region of the second region becomes a source/drain region of a low concentration, for example, in case of a -MOS transistor and becomes one conductive type region constituting a photodiode in case of a sensor portion of an imager area which will be described hereinafter. The second impurity introducing region of the second region becomes a source/drain region of a low concentration, for example, in case of a MOS transistor and becomes a semiconductor region of a high concentration for reducing a junction leak current in case of a sensor portion of a imager area which will be described hereinafter. The third impurity introducing region of the first region becomes a source/drain region of a low concentration, for example, in case of a MOS transistor. The fourth impurity introducing region of the first region becomes a source/drain region of a high concentration, for example, in case of a MOS transistor For the MOS transistor a source/drain region of a so-called LDD structure is formed.

According to the fifth semiconductor manufacturing method of the present invention, by using an insulating film of a 2-layer structure, a sidewall of a single layer film composed of the second insulating film which does not include silicon nitride is formed on the side wall of the gate electrode in the first region, so that the impurity in the gate electrode, especially boron (B) in the gate electrode of the p-channel MOS transistor when processing an activating annealing of the introduced impurity after introducing an impurity can be avoided from diffusing into the semiconductor substrate such that a deterioration of the transistor characteristic such as a deterioration of a current driving ability of a MOS transistor can be suppressed. Additionally, the insulating film of the 2-layer structure remained unchanged in the second region, so that the film thickness of the first insulating film can be freely selected. In this way, the reflection intensity relative to the incident light can be made minimized when, for example, a photoelectric transfer means is formed. For other aspects, a metal silicide of a refractory metal is formed only at a MOS transistor and a MOS transistor of a fine constitution can be made, and at the same time it becomes possible to manufacture such a semiconductor device containing a first region where a MOS transistor of an LDD structure is included with a reduced parasitic resistance, with a high speed operation and a reduced power consumption and a second region where a MOS transistor is formed with a suppressed junction leak current on a same semiconductor chip such that it has similar effects as the first semiconductor manufacturing method of the present invention mentioned above.

For the above mentioned semiconductor devices, it is possible to form a first MOS transistor constituting a logic circuit in the first region and to form a signal charge storing means is formed in the second region.

For the above mentioned semiconductor devices, it is possible to form a first MOS transistor constituting a logic circuit in the first region, and to form an imager area having a picture element and composed of a second MOS transistor and a sensor portion is formed in the second region such that it is used as a CMOS type solid-state imaging device. When it is applied to a CMOS type solid-state imaging. device and when the plural insulations are made by a 3-layer film structure, a reflection prohibition film can be formed on the sensor portion of the imager area by means of a laminated layer composed of the first silicon oxide film, the second silicon oxide film and an upper insulating film formed in the process of making the wiring. In this case, it is possible to select the film thickness of the silicon oxide film of the first insulating film as 20 nm or less and to select the total film thickness of the silicon nitride film of the second insulating film and the silicon nitride film of the upper layer insulating to be between 150 nm and 20 nm and desirably to be between 100 nm and 20 nm. With respect to the film thickness of the silicon oxide film of the first insulating film the thinner is the better and it is possible to make it zero thickness. By setting or selecting the film thickness of each insulating film as a value mentioned above, it becomes possible to make the stacked film have a reflection prohibiting function. When the film thickness of each insulating film becomes thicker than the indicated value, that is, when it becomes too thick, it becomes difficult to get a reflection prohibiting function and at the same time it becomes difficult to form a contact hole. Further, when the plurality of insulating films are formed by a 2-layer film structure, it also becomes possible to make a similar reflection prohibiting function on the sensor portion.

It is possible to use the above mentioned semiconductor device as a semiconductor integrating circuit of a logic with embedded DRAM, wherein a first field effect transistor constituting a logic circuit is formed in the first region, and a DRAM cell having a memory device composed of a second field effect transistor and a capacitance device is formed in the second region.

In the above mentioned manufacturing method of a semiconductor device it is possible to manufacture a CMOS type solid-state imaging device, wherein an LDD-structure type MOS transistor composed of the gate electrode and the first and second impurity introducing region and constituting a logic circuit is formed in the first region; and an LDD-structure type MOS transistor composed of the gate electrode and the first and second impurity introducing region and an imager area composed of a sensor portion are formed in the second region such that a CMOS type solid-state imaging device is manufactured.

In the above mentioned manufacturing method of a semiconductor device it is possible to manufacture a semiconductor integrating circuit of a logic with embedded DRAM wherein an LDD-structure type MOS transistor composed of the gate electrode and the first and second impurity introducing region and constituting a logic circuit is formed in the first region; and a memory device composed of an LD-structure type MOS transistor composed of the gate electrode and the first and second impurity introducing region and a capacitance device is formed in the second region.

According to the present invention, it is possible to constitute an electronic apparatus equipped with the above mentioned semiconductor device. For the semiconductor device equipped in the electric apparatus, it is possible to form a first MOS transistor constituting a logic circuit in the first region, and to form a signal charge storage means is formed in the second region. For example, a MOS type solid-state imaging device can be obtained by using the semiconductor device, wherein a first MOS transistor constituting a logic circuit is formed in the first region, and an imager area having a picture element and composed of a second MOS transistor and a sensor portion is formed in the second region such that it is used as a semiconductor device for a MOS type solid-state imaging device. In another aspect, a logic semiconductor integrating circuit with embedded DRAM can be obtained by using the semiconductor device, wherein a first MOS transistor constituting a logic circuit is formed in the first region, and a DRAM cell having a memory device composed of a second MOS transistor and a capacitance device is formed in the second region.

Additionally, an electric apparatus of a portable type communication apparatus can be constituted by being equipped with the above mentioned semiconductor device.

BEST MODE FOR CARRYING OUT THE INVENTION

Exemplified embodiments of the present invention will be described hereinafter with reference to the drawings.

Figure 1:
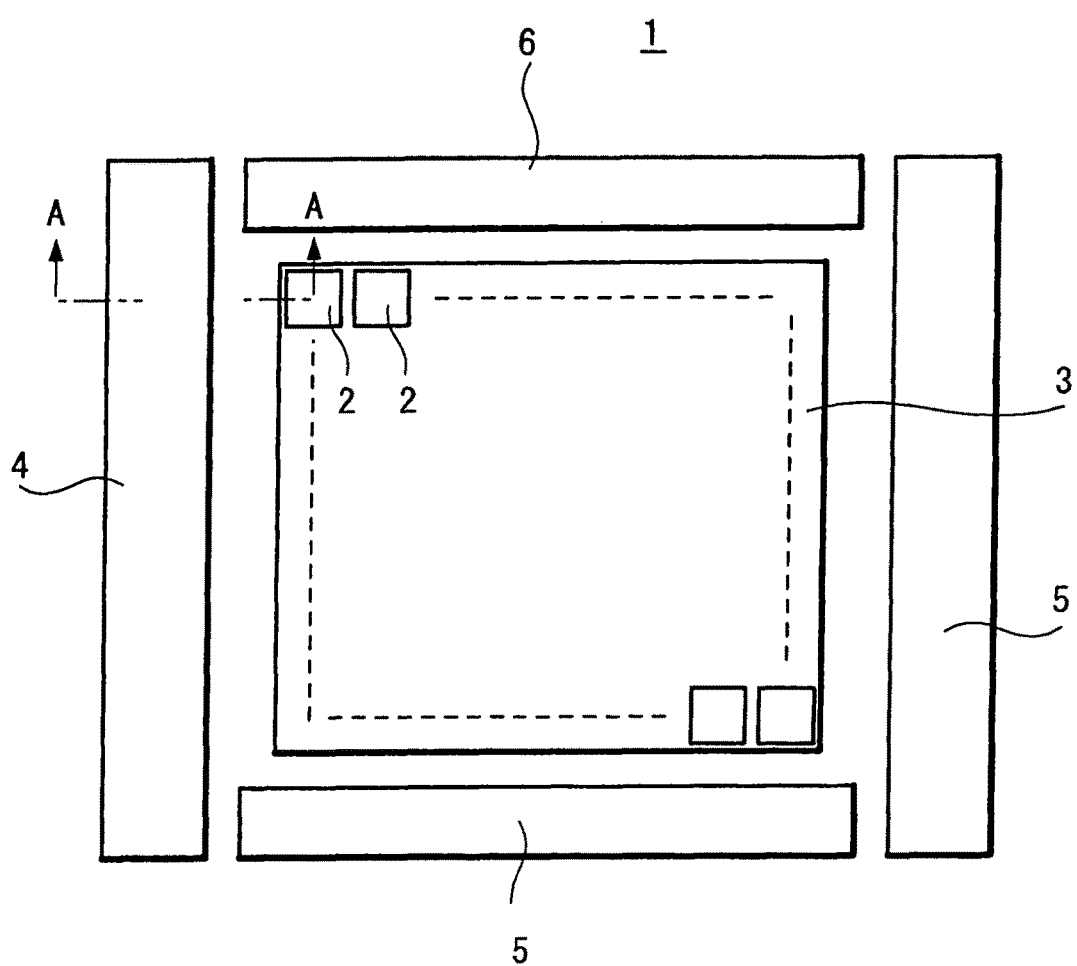
FIG. 1 is a conceptional constitutional diagram showing one exemplified embodiment of a semiconductor device according to the present invention which is applied to a CMOS type solid-state imaging device.

FIG. 1 shows one exemplified embodiment of a semiconductor device according to the present invention which is applied to a CMOS type solid-state imaging device. A solid-state imaging device 1 according to the exemplified embodiment includes an imager area 3 where picture elements constituted by photodiodes forming a sensor portion and a plurality of MOS transistors are arranged in a matrix form; and CMOS logic circuit portions 4, 5 and analog circuit portions 6, 7 formed at the peripheral portion of the imager area 3. With respect to the MOS transistors constituting the picture elements 2, the total numbers thereof differs in response to the construction of the picture elements, but they are formed with MOS transistors for driving at least photodiodes, that is, MOS transistors for reading out signal charges of the photodiodes, MOS transistors for outputting signals of the of signal outputs of the photodiodes and the like. The solid-state imaging device 1 is formed together with those of the imager area 3, the CMOS logic circuit portions 4, 5 and the analog circuit portions 6, 7 as an embedded one chip configuration on a common substrate.

Figure 2:
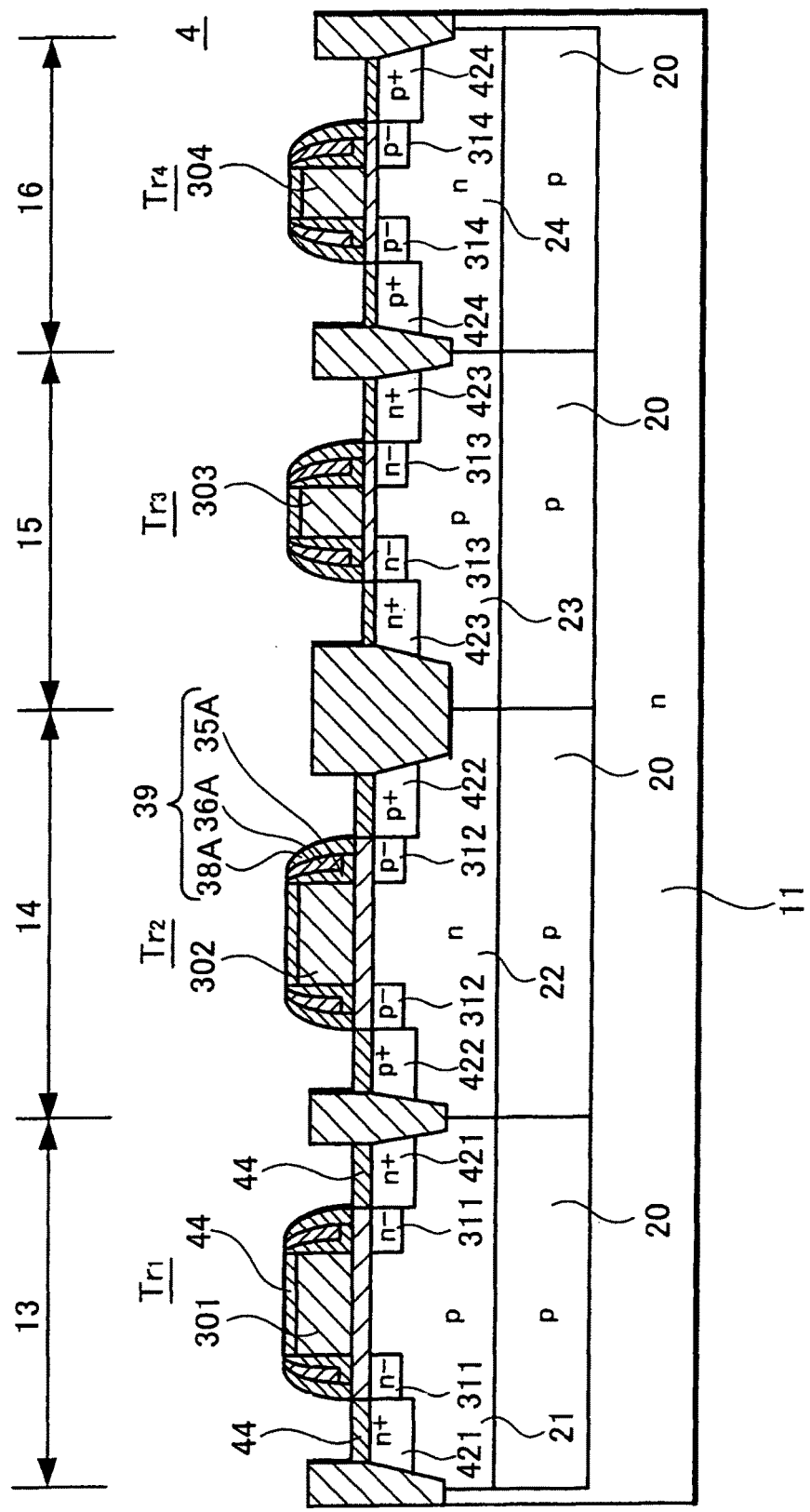
FIG. 2 is a cross-sectional view of a CMOS logic circuit portion at the A-A line of the CMOS type solid-state imaging device of FIG. 1.
Figure 3:
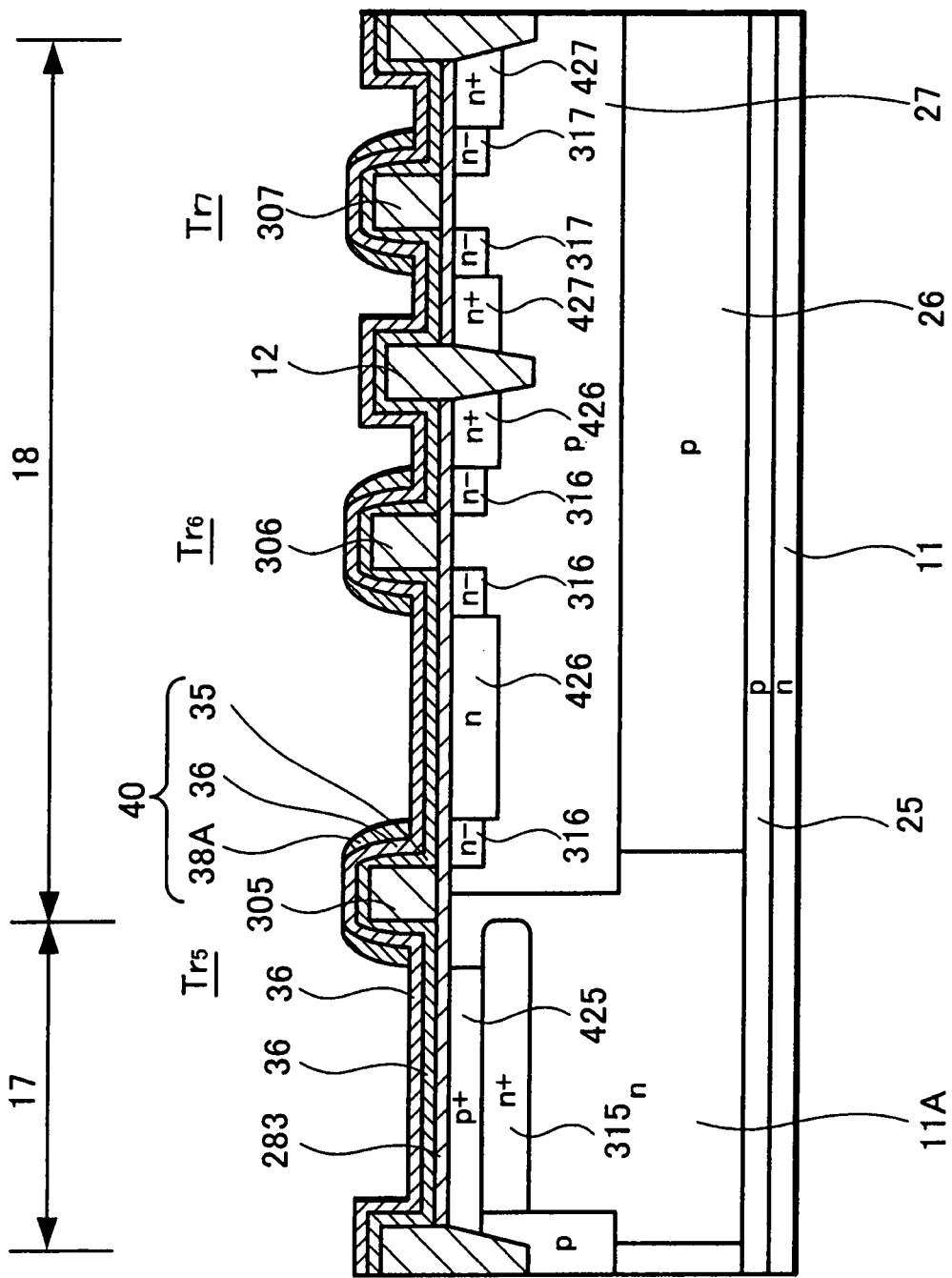
FIG. 3 is a cross-sectional view of a picture element portion at the A-A line of the CMOS type solid-state imaging device of FIG. 1.

FIG. 2 and FIG. 3 show cross-sectional structures at the A-A line of a CMOS logic circuit portion 4 and one picture element 2 of an imager area 3 of FIG. 1. FIG. 2 shows the CMOS logic circuit portion 4 and FIG. 3 shows a main portion of the one picture element 2 of the imager area 3.

In the CMOS type solid-state imaging device 1 according to the exemplified embodiment, as shown in FIG. 2 and FIG. 3, element separating regions 12 are formed on a common semiconductor substrate 11 of a first conductivity type, that is, an n-type in this example, the picture elements 2 constituting the imager area 3 are formed in the desirable regions of the semiconductor substrate 11 and the CMOS logic circuit portion 4 is formed in another desirable region of the semiconductor substrate 11. It is constituted such that a metal silicide layer of a refractory metal is not formed at the MOS transistor on the side of picture elements 2 and a metal silicide layer of a refractory metal is formed at the MOS transistor on the side of the CMOS logic circuit portion 4.

In the CMOS logic circuit portion 4, as shown in FIG. 2, a second conductivity type of, that is, p-type of semiconductor well regions 20 are formed at a deep position of the n-type semiconductor substrate 11 extending from a first to a fourth MOS transistor forming regions 13 to 16 such that p-type of semiconductor well regions 20 introduced with the second conductivity type of, that is, p-type of impurity are formed. Additionally, in the first and the third MOS transistor forming regions 13 and 15, p-type semiconductor well regions 21 and 23 which extend from the surface of the substrate to the p-type semiconductor well regions 20 are formed. Further, in the second and the fourth MOS transistor forming regions n-type semiconductor well regions 22 and 24 which extend from the surface of the substrate to the p-type semiconductor well regions 20 are formed. On the p-type semiconductor well region 21 and the n-type semiconductor well region 22, gate electrodes 301 and 302 which are made of such as polycrystalline silicon films are formed respectively through gate insulating films 281. In the p-type semiconductor well region 21, a source/drain region of an LDD structure consisting of an $n^−$ region 311 and an $n^+$ region 421 at the both sides of the gate electrode 301 is formed and an n-channel MOS transistor Tr1 is formed. In the n-type semiconductor well region 22, a source/drain region of an LDD structure consisting of an $p^+$ region 312 and an $n^+$ region 422 at the both sides of the gate electrode 302 is formed and a p-channel MOS transistor Tr2 is formed. The n-channel MOS transistor Tr1 and the p-channel MOS transistor Tr2 constitute a CMOS transistor structure. Gate electrodes 303 and 304 made of, for example, polycrystalline silicon films are formed on the p-type semiconductor well region 23 and the n-type semiconductor well region 24 through gate insulating films 282. In the p-type semiconductor well region 23, a source/drain region of an LDD structure consisting of an $n^−$ region 313 and an $n^+$ region 423 at the both sides of the gate electrode 303 is formed and an n-channel MOS transistor Tr3 is formed. In the n-type semiconductor well region 24, a source/drain region of an LDD structure consisting of an $p^−$ region 314 and an $p^+$ region 424 at the both sides of the gate electrode 304 are formed and a p-channel MOS transistor Tr4 is formed. The n-channel MOS transistor Tr3 and the p-channel MOS transistor Tr4 constitute a CMOS transistor structure.

Additionally, a sidewall 39 [35A, 36A, 38A] of a 3-layer structure of a first insulating film 35, a second insulating film 36 and a third insulating film 38 is formed at each of the side walls of the gate electrodes 301 to 304 of the MOS transistors Tr1 to Tr4. The first and third insulating films 35 and 38 can be formed, for example, by silicon oxide films ($SiO_2$ films) and the second insulating film 36 can be formed, for example, by a silicon nitride film. The $n^−$ regions 311, 313 and $p^−$ regions 312, 314 constituting the source/drain regions are formed with self-aligning by using the gate electrodes 301 to 304 as masks. The $n^−$ regions 421, 423 and $p^−$ regions 422, 424 are formed with self-aligning by using the sidewalls 39 made of the insulating films 35, 36, 38 of a 3-layer structure and the gate electrodes 301 to 304 as masks. Then, metal silicide layers 44 of a refractory metal are formed respectively on the surfaces of the gate electrodes 301 to 304 of the MOS transistors Tr1 to Tr4 and on the surfaces of $n^+$ regions 421, 423 and $p^+$ regions 422, 424 of the source/drain regions. It should be noted that it is similarly constituted for the side of the CMOS logic circuit portion 5. In this case 2 channels of power supplies are connected in the example of the CMOS logic circuit portions 4, 5. For example, the power supply voltage for the CMOS transistor structure consisting of the n-channel MOS transistor Tr1 and the p-channel MOS transistor Tr2 is made different from those for the MOS transistor Tr3 and the p-channel MOS transistor Tr4.

With respect to the picture element 2, as shown in FIG. 3, a p-type semiconductor well region 25 introduced with a p-type impurity extending through a sensor portion forming region 17 and a MOS transistor forming region 18 is formed at a deep portion of the n-type semiconductor substrate 11. Further, in the MOS transistor forming region 18, double stacked p-type semiconductor well regions 26 and 27 are formed from the surface side extending to the p-type semiconductor well region 25. In the sensor portion forming region 17 surrounded by the p-type semiconductor well regions 25, 26, 27, an n-type semiconductor region 315 having a higher impurity concentration than that of the n-type region 11A is formed at the surface side of the n-type semiconductor region 11A. The n-type semiconductor region 11A is a part of the semiconductor substrate 11 separated by the p-type semiconductor region 25 which is formed by an ion injection at a deep position of the semiconductor substrate 11. At the surface of the substrate, a $p^+$ semiconductor region 425 having a high impurity concentration is formed such that it contacts with the n-type semiconductor region 11A for the purpose of reducing the junction leak current. A sensor portion 45 of photodiodes, that is, a HAD sensor is formed by means of the p-type semiconductor well region 25, the n-type semiconductor regions 11A, 25 and the $p^+$ semiconductor region 425. On the other hand, in the MOS transistor forming region 18, for example, gate electrodes 305, 306, 307 made of polycrystalline silicon films are formed through gate insulating films 19; source/drain regions of an LDD structure composed of n region 315, $n^+$ region 425 and source/drain regions of an LDD structure composed of $n^+$ region 316 and $n^+$ region 426 and source/drain regions of an LDD structure composed of $n^+$ region 317 and $n^+$ region 427 are formed at both sides of the gate electrodes respectively; and a plurality of n-channel MOS transistors, for example, a MOS transistor Tr5 for reading out and MOS transistors Tr6, Tr7 for signal outputs of outputting a signal are formed. Additionally, in the regions of picture elements 2, first insulating films 35 and second insulating films 36 are piled for covering the upper sides of the sensor portions 45, the gate electrodes 305 to 307 of the MOS transistors Tr5, Tr6, Tr7 and the source/drain regions, so that sidewall portions 38A composed of third insulating films 38 are formed on the side walls of the gate electrodes 305 to 307 respectively. The n⁻ regions 316, 317 constituting the source/drain regions are formed with self-aligning by using the gate electrodes 305 to 307 as masks. The n⁺ regions 426, 427 are formed with self-aligning by using sidewalls 40 of a 3-layer structure of insulating films 35, 36, 38 and the gate electrodes 305 to 307 as masks. At this time, first and second insulating films 35, 36 are formed on the n⁺ regions 426, 427 of the source/drain regions, but it is possible to form n⁺ regions 426, 427 also under the insulating films 35, 36 by making the film thicknesses of the insulating films 35, 36 and the acceleration energy (injection energy) when injecting an impurity optimized. Further, sidewalls 40 of a 3-layer structure are formed on the side walls of the gate electrodes 305 to 307, so that source/drain regions of an LDD structure similar to those of the MOS transistors Tr1 to Tr4 of the CMOS logic circuit portion 4 shown in FIG. 2 can be formed. For the MOS transistors Tr5 to Tr7, metal silicide layers of a refractory metal are not formed on gate electrodes 305 to 307 and n⁺ regions 426, 427.

According to the CMOS type solid-state imaging device 1 of the present exemplified embodiment, by using the sidewalls 39, 40 consisting of the first, second and third insulating films 35, 36 and 38, metal silicide layers 44 of a refractory metal can be formed on the surfaces of the gate electrodes 301 to 304 of the CMOS transistors Tr1 to Tr4 and on the surfaces of the high impurity concentration regions (n⁺ region, p⁺ region) 421 to 424 of the source/drain regions of an LDD structure on the side of the CMOS logic circuit portion 4. At the same time it becomes possible to avoid forming metal silicide layers of a refractory metal for the MOS transistors Tr5 to Tr7 on the side of the picture elements 2. Further, MOS transistors of an LDD structure can be constituted for the MOS transistor Tr5 to Tr7 on the side of picture elements 2.

In the CMOS logic circuit portions 4, 5, metal silicide layers 44 of a refractory metal are formed, so that the device can be designed with a fine structure and with a reduced parasitic resistance such that it becomes possible to realize a high speed operation and a reduction in power consumption. On the other hand, in the picture elements 2, metal silicide layers of a refractory metal are not formed, so that a junction leak current caused by the metal of a refractory metal in the MOS transistor is suppressed. Additionally, as the surfaces of the sensor portions are protected by the first and the second insulating films 35, 36, a defect such as plasma damage and a contamination is suppressed from being produced.

Consequently, both can be MOS transistors having source/drain regions of an LDD structure where one region is a CMOS logic circuit region having a CMOS transistor formed with a metal silicide layer of a refractory metal and the other region is an imager area having a MOS transistor formed without a metal silicide layer of a refractory metal being formed can be made into a same semiconductor chip.

Next, a manufacturing method of a solid-state imaging device 1 according to the exemplified embodiment will be described. FIG. 4 to FIG. 13 show manufacturing processes of a CMOS logic circuit 4 side where a metal silicide layer of a refractory metal is formed and FIG. 14 to FIG. 23 show manufacturing processes on the side of one picture element 2 where a metal silicide layer of a refractory metal is not formed. The processes of FIG. 4 to FIG. 13 correspond to the processes of FIG. 14 to FIG. 23 each other with respect to the processes.

Figure 4:
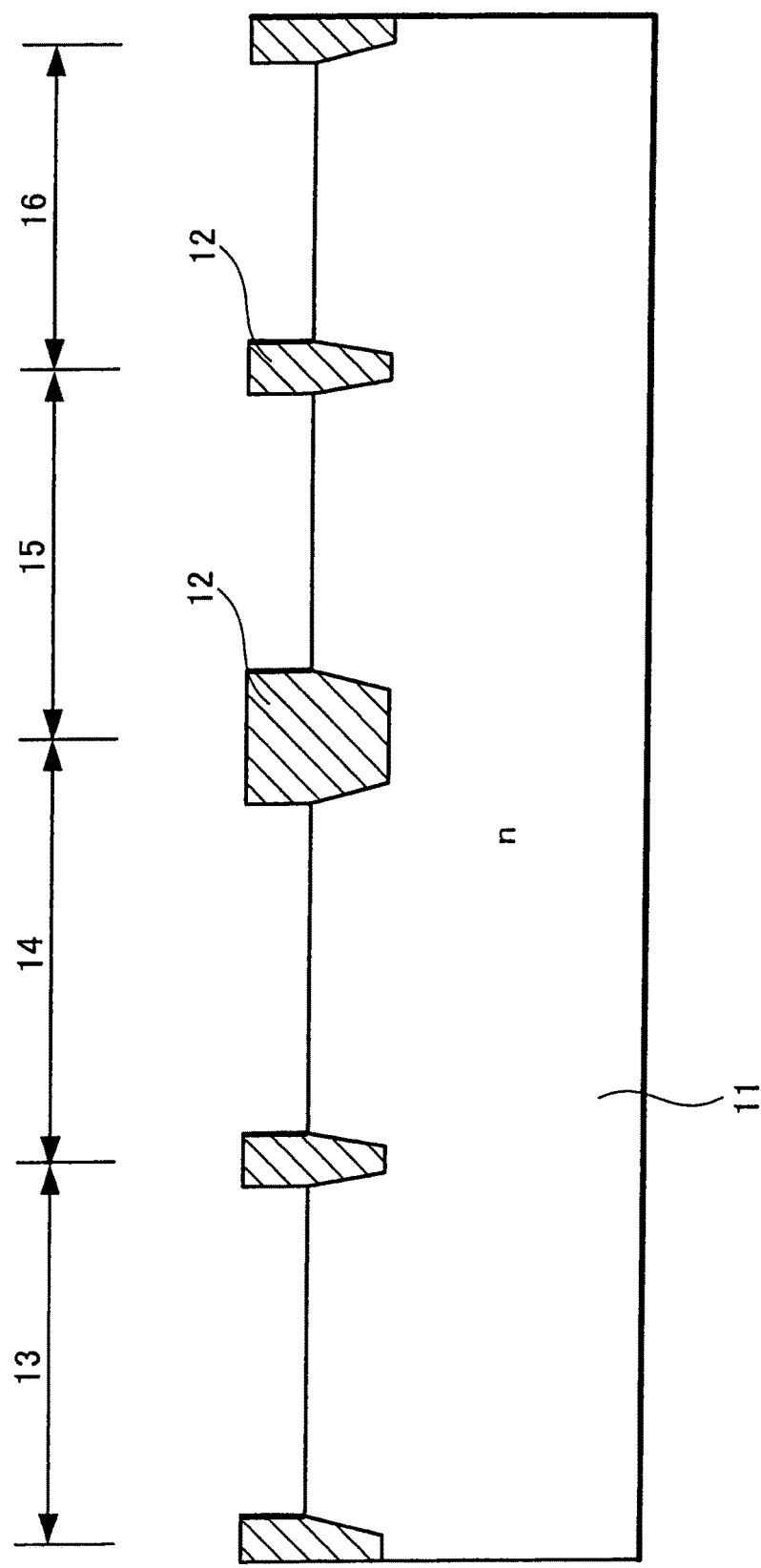
FIG. 4 to FIG. 13 are manufacturing process diagrams of a CMOS logic circuit portion showing one exemplified embodiment of a manufacturing method of a CMOS type solid-state imaging device.
Figure 14:
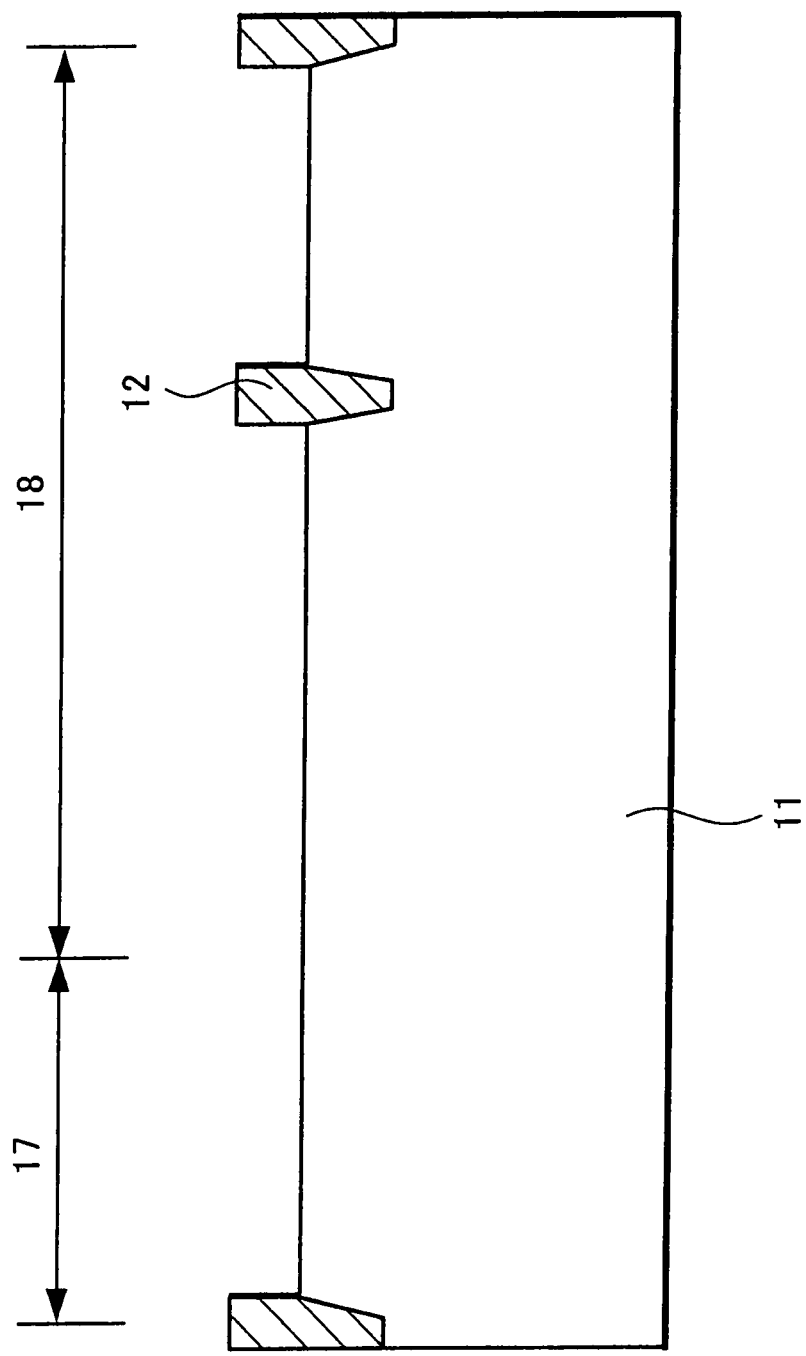
FIG. 14 to FIG. 23 are manufacturing process diagrams of a CMOS logic circuit portion showing one exemplified embodiment of a manufacturing method of a CMOS type solid-state imaging device.

First, as shown in FIG. 4 and FIG. 14, a common silicon semiconductor substrate 11 of a first conductivity type, that is, an n-type in this example of is provided and element separating regions 12 are formed in the semiconductor substrate 11. The element separating regions 12 are formed by forming grooves at the portions corresponding to the element separating regions through a mask made of, for example, a silicon nitride film (SiN film) formed on the semiconductor substrate 11, by coating a heat oxide films at the inner walls of the grooves, thereafter by burying the groves with silicon oxide films (e.g. $CVD\text{-}SiO_2$ films) and thereafter by removing the silicon nitride films. In the CMOS logic circuit portion 4, the element separating regions 12 are formed so as to form a first MOS transistor forming region 13, a second MOS transistor forming region 14, a third MOS transistor region 15 and a fourth MOS transistor region 16. (see FIG. 4) In the picture element 2, the element separating regions 12 are formed so as to form a sensor portion (photodiode) forming region 17 and a MOS transistor forming region 18. (see FIG. 14)

Figure 5:
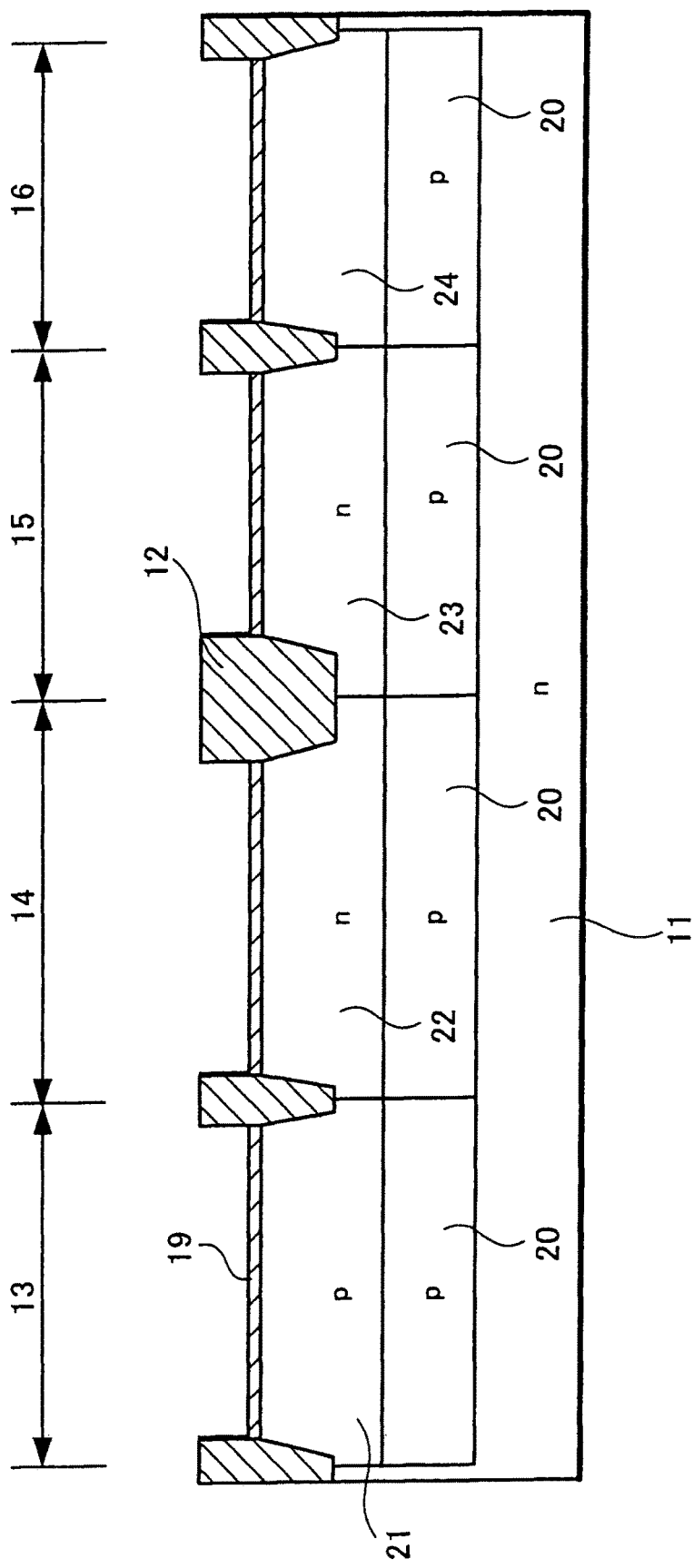
Figure 15:
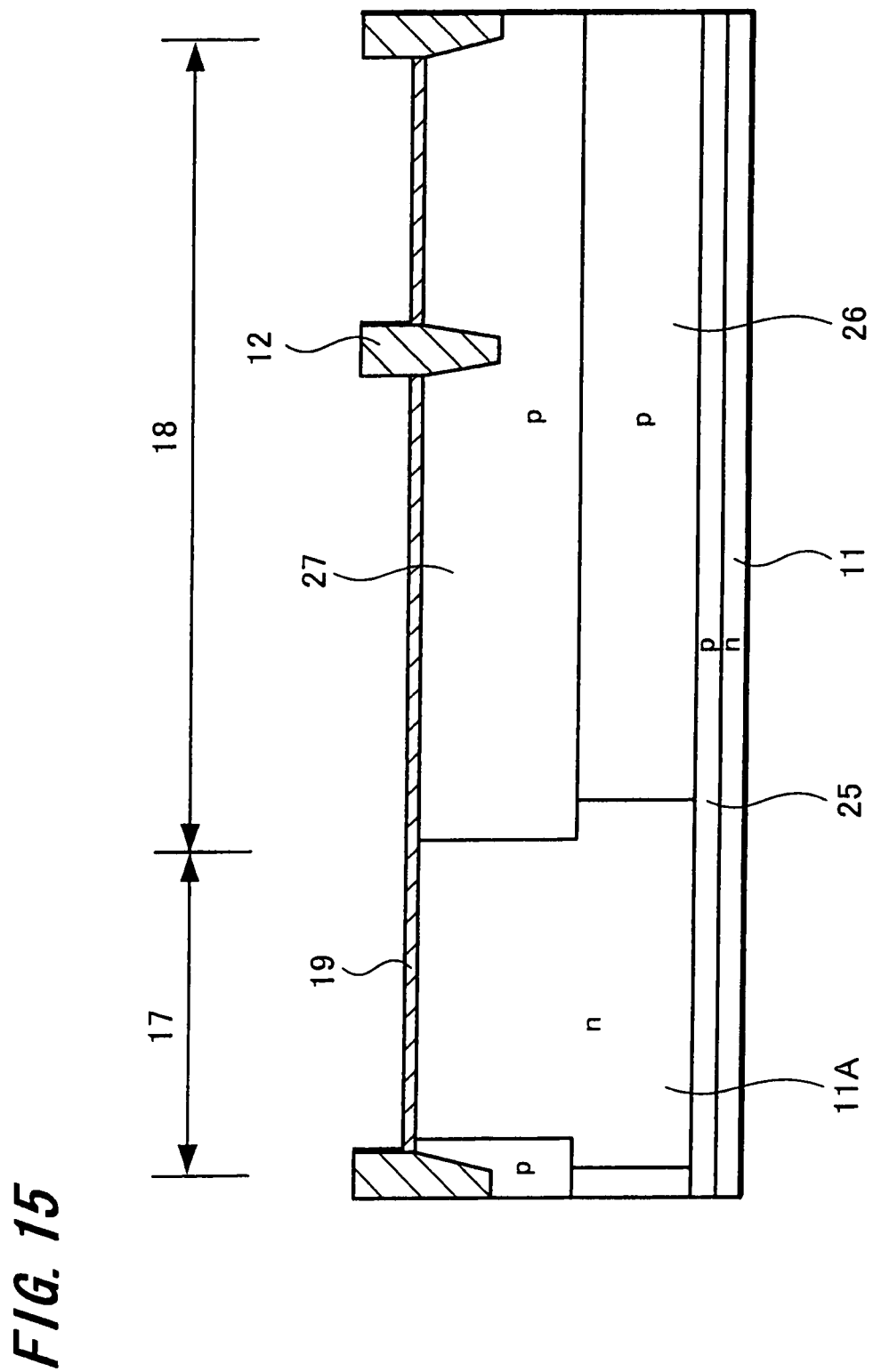

Next, as shown in FIG. 5 and FIG. 15, an insulating film for an ion injection, for example, a screen oxide film ($SiO_2$ film) 19 is formed on the semiconductor substrate 11 a semiconductor well region of a desirable conductive type by introducing a desirable impurity using an ion injection method. The semiconductor well regions can be formed by injecting to each of regions 13 to 18 with selected impurities to be injected and with selected injection conditions (injection energy, impurity concentration and the like) using a photo-resist method. On the side of the CMOS logic circuit portion 4, a second conductivity type, that is, p-type of and the same impurity concentration of semiconductor well regions 20 are formed, for example, at a deep position of each of the MOS transistor forming regions 13 to 16. Additionally, in the first and the third MOS transistor forming regions 13 and 15, p-type semiconductor well regions 21 and 23 which extend from the surface of the substrate to the p-type semiconductor well regions 20 are formed, and in the second and the fourth MOS transistor forming regions, n-type semiconductor well regions 22 and 24 are formed. In this case, it is allowed to form the p-type semiconductor well regions 20 by a single ion injection process at the same time with respect to the first to the fourth MOS transistor regions 13 to 16 or to form them individually with respect to each of p-type and n-type semiconductor well regions 21, 22, 23, 24. In the latter case, the masks for the ion injection of the semiconductor well region 21, 22, 23, 24 are commonly used such that it can save one mask for the ion injection. (see FIG. 5) On the side of the picture elements 2, the second conductivity type, that is, p-type of and the same impurity concentration of p-type semiconductor well regions 25 are formed at a deep position of the sensor portion forming region 17 and the MOS transistor forming region 18. Further, p-type semiconductor well regions 26, 27 are formed to a depth direction at a portion which separates the side of the MOS transistor forming region 18 and the sensor portion forming region 17. In the sensor portion forming region 17, an n-type semiconductor well regions 11A which is surrounded by the p-type well regions 25, 26 and 27 is formed by means of the n-type semiconductor substrate 11. (see FIG. 15)

Figure 6:
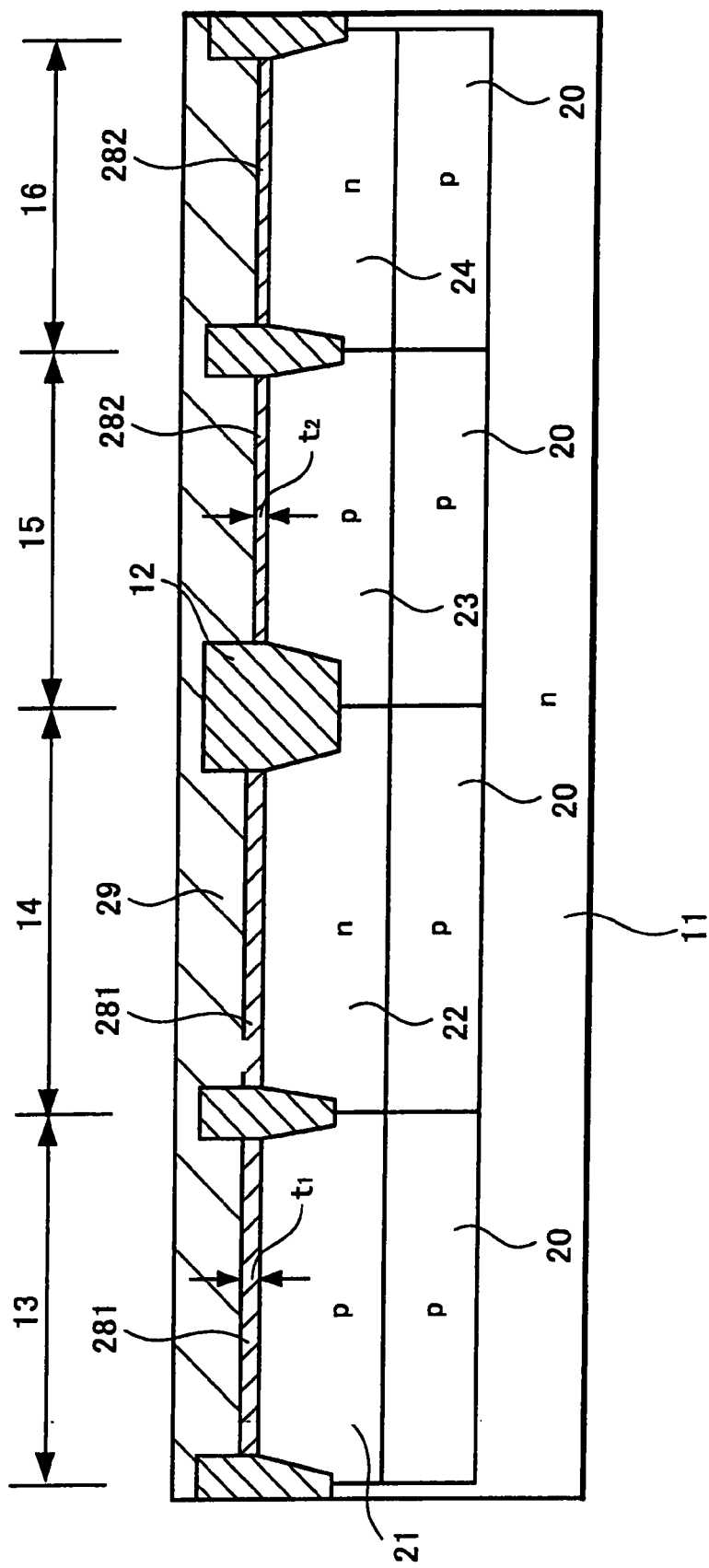
Figure 16:
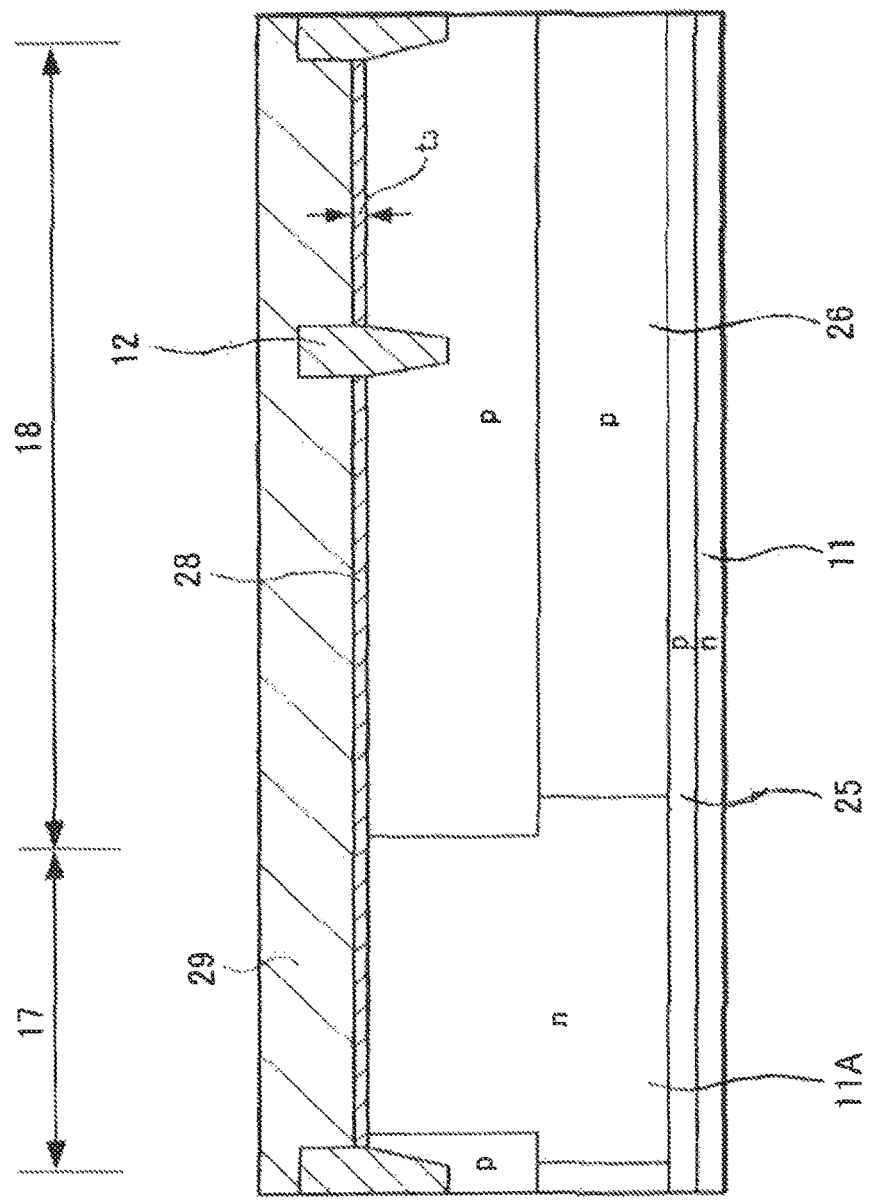

Next, as shown in FIG. 6 and FIG. 16, insulating films of desirable film thicknesses 28 [281, 282, 283] are formed on the regions 13 to 18 of the CMOS logic circuit portion 4 and the picture element 2 respectively and gate electrode material films 29 are formed on the gate insulating films 28. As the gate insulating films 28, for example, silicon oxide films (SiO$_2$ films) are used. As the gate electrode material films 29, for example, polycrystalline silicon films are used. On the side of the CMOS logic circuit portion 4, gate insulating films 281 of the same desirable film thickness t1, for example, of 5 nm thickness are formed on the first and the second MOS transistor forming regions 13 and 14; and gate insulating films 282 of the same desirable film thickness t2, for example, of 3 nm thickness are formed on the third and the fourth MOS transistor forming regions 15 and 16. (see FIG. 6) On the side of the picture elements 2, gate insulating films 283 of the same desirable film thickness t3, for example, of 3 nm thickness are formed on the sensor portion forming region 17 and the MOS transistor forming region 18. (see FIG. 16) The film thickness t4 of the gate electrode material films 29 can be selected as, for example, 200 nm.

Figure 7:
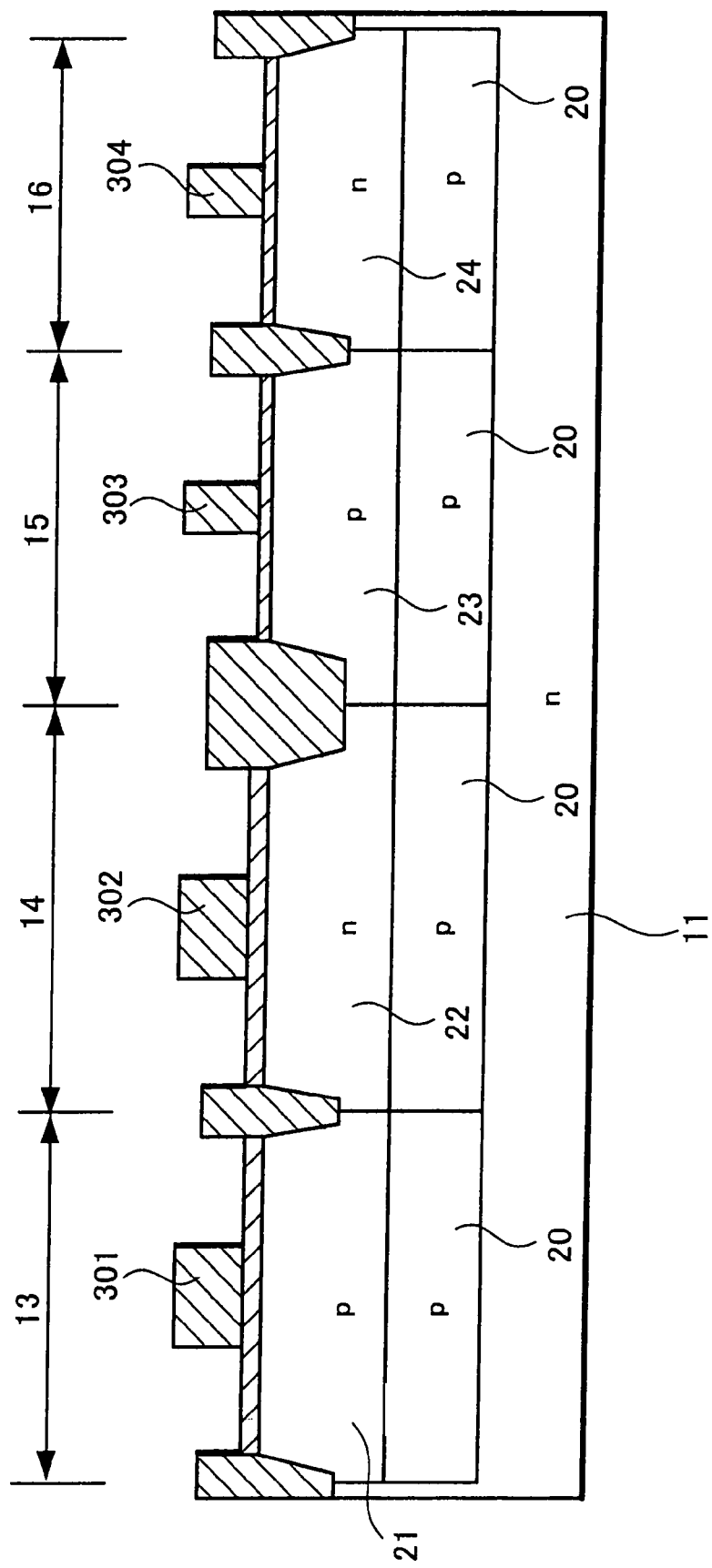
Figure 17:
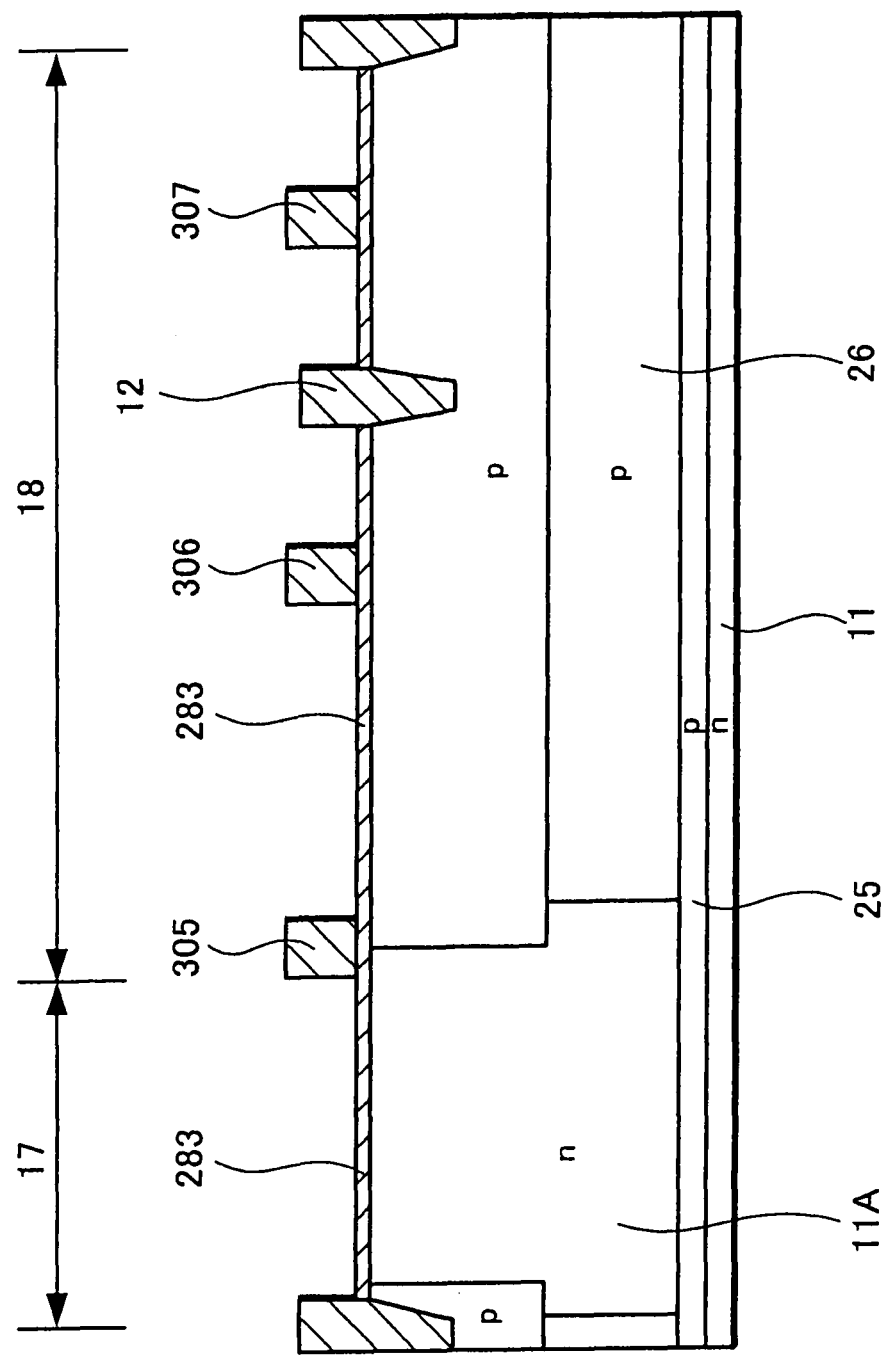

Next, as shown in FIG. 7 and FIG. 17, the gate electrode material films 29 are patterning processed by using, for example, a photo-resist method and an etching method, for example, a dry etching method and gate electrodes 30 [301, 302, 303, 304, 305, 306, 307] are formed. On the side of the CMOS logic circuit portion 4, there are formed a gate electrode 301 at a position corresponding to the first MOS transistor forming region 13, a gate electrode 302 at a position corresponding to the second MOS transistor forming region 14, a gate electrode 303 at a position corresponding to the third MOS transistor forming region 15 and a gate electrode 304 at a position corresponding to the fourth MOS transistor forming region 16 respectively. In this example, for taking a characteristic designing into a consideration, the gate length of the gate electrode 301 and 302 in the first and second MOS transistor forming regions 13 and 14 are selected larger than the gate length of the gate electrode 303 and 304 in the third and fourth MOS transistor forming regions. (see FIG. 7) On the side of the picture elements 2, gate electrodes 305, 306 and 307 are formed at positions corresponding to the MOS transistor forming regions 18. (see FIG. 17)

Figure 8:
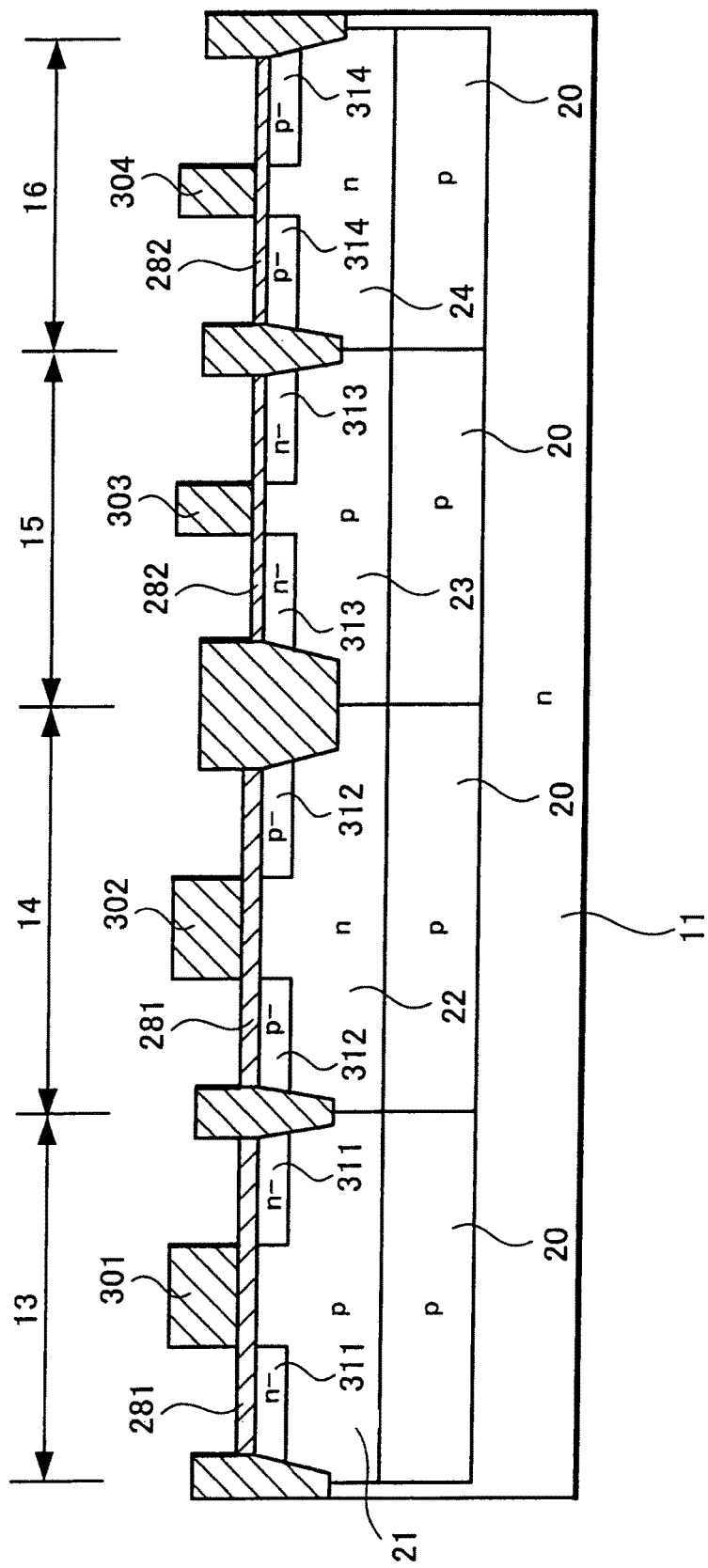
Figure 18:
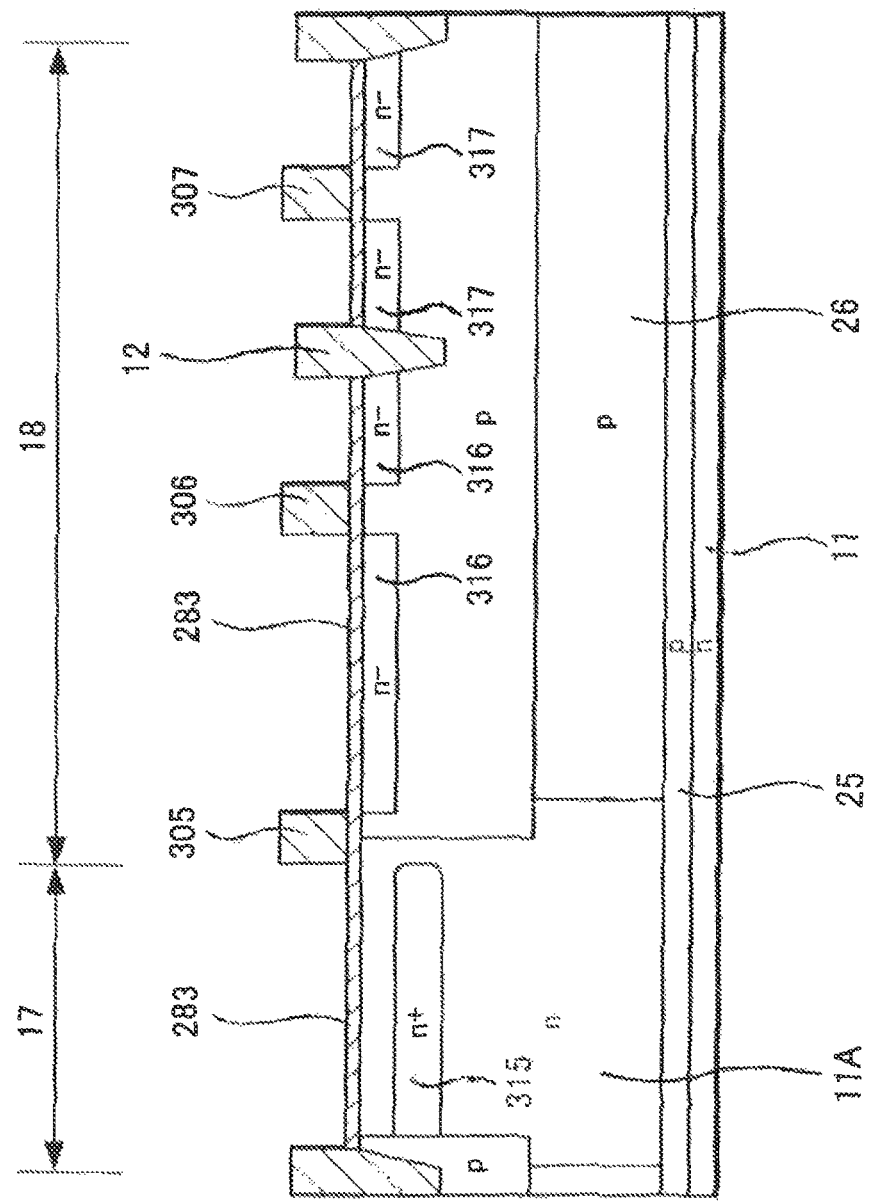

Next, as shown in FIG. 8 and FIG. 18, desirable impurities are introduced by an ion injection method to the regions on the side of the CMOS logic circuit portion 4 and on the side of the picture elements 2 using the element separating region 12 and the gate electrode 30 [301 to 307] as masks respectively and impurity introducing regions 31 [311, 312, 313, 314, 315, 316, 317] of desirable conductive types are formed. The impurity introducing regions 31 can be formed by injecting to each of regions with selected impurities to be injected and with selected injection conditions (injection energy, impurity concentration and the like) using a photo-resist method. On the side of the CMOS logic circuit portion 4, there are formed impurity introducing regions, that is, n$^-$ regions 311, 313 of low impurity concentration constituting LDD structures in the first and third p-type semiconductor well regions 21 and 23 and impurity introducing regions, that is, p$^-$ regions 312, 314 of low impurity concentration constituting LDD structures in the second and fourth n-type semiconductor well regions 22 and 24. (see FIG. 8) On the side of the picture element 2, an impurity introducing region, that is, an n-type semiconductor region 315 constituting a photodiode is formed in the n-region (corresponding to a portion of the n-type semiconductor substrate 11) 11A of the sensor portion forming region 17. Additionally, impurity introduced regions, that is, n$^-$ regions 316, 317 of a low impurity concentration which constitute an LDD structure are formed in the p-type semiconductor well region 27. (see FIG. 18)

Figure 9:
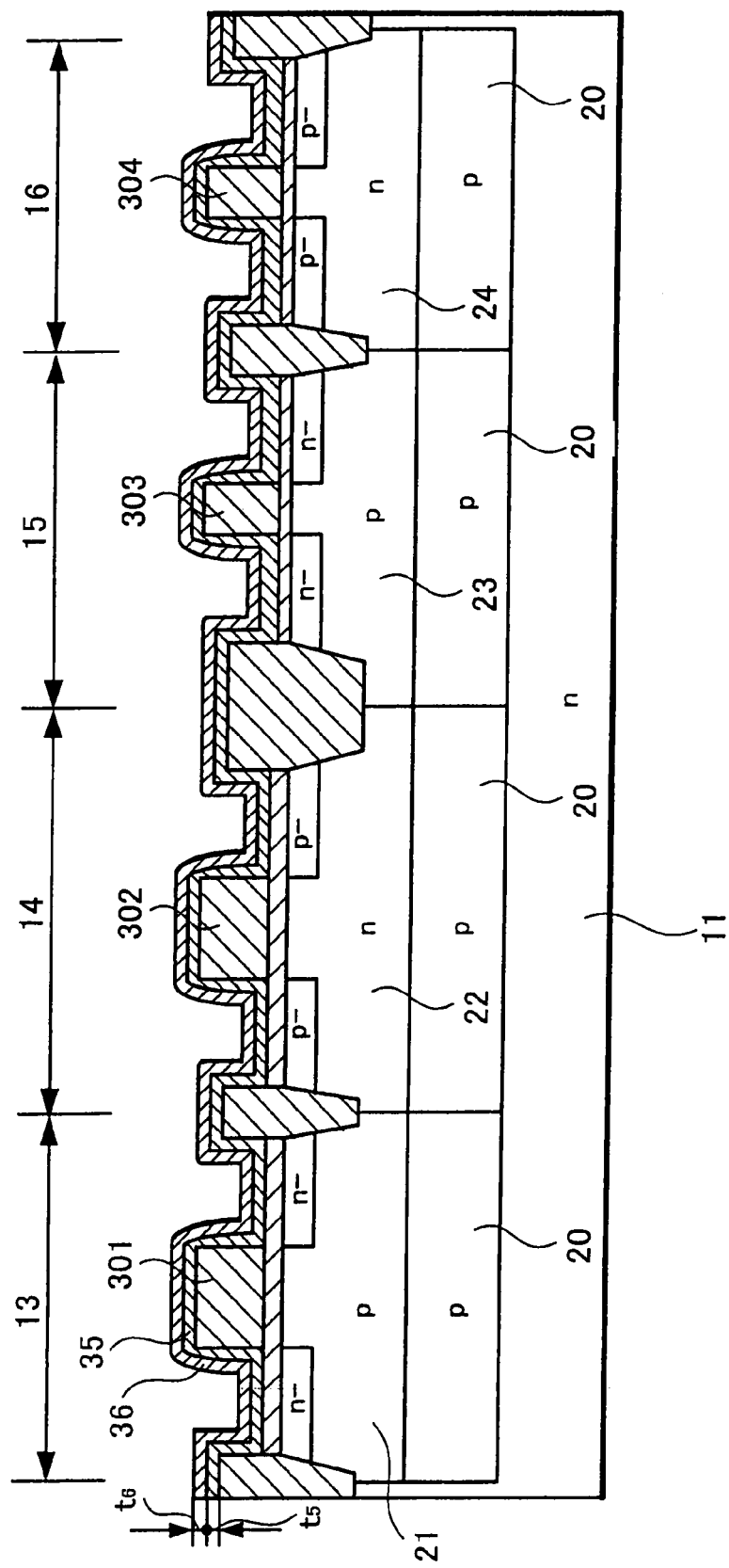
Figure 19:
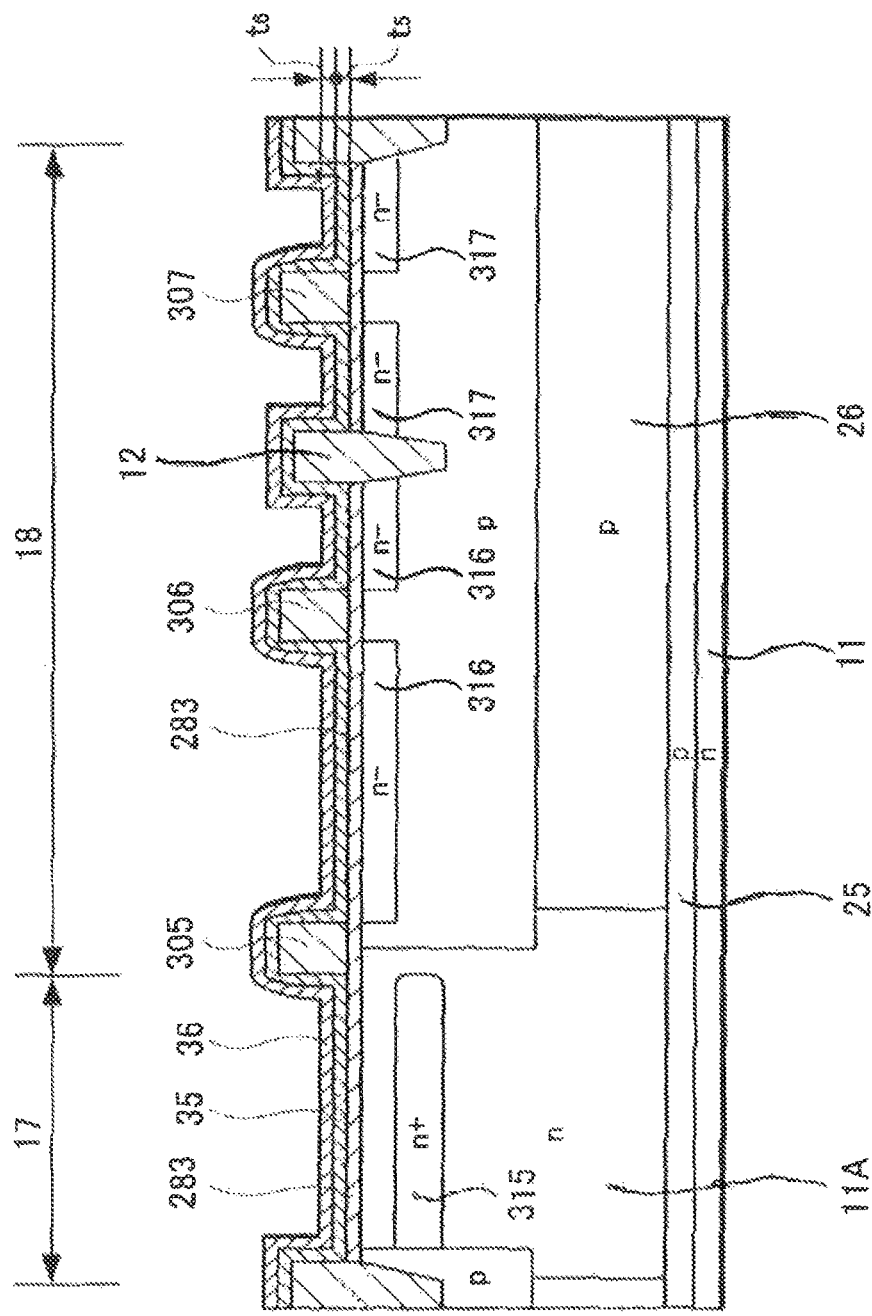

Next, as shown in FIG. 9 and FIG. 19, first insulating films 35 and second insulating films 36 of film thicknesses t5, t6 respectively are formed successively on the whole surface of the semiconductor substrate 11 including the gate electrodes 30 [301 to 307]. It is possible to use, for example, silicon oxide films (SiO$_2$ films) as the first insulating films 35. It is possible to use, for example, silicon nitride films which have a different etching rate from that of the silicon oxide films as the second insulating films 36. It is possible to select the film thickness t5 of the first insulating film 35 as, for example, approximately 10 nm and the film thickness t6 of the second insulating film 36 as, for example, approximately 30 nm.

Figure 10:
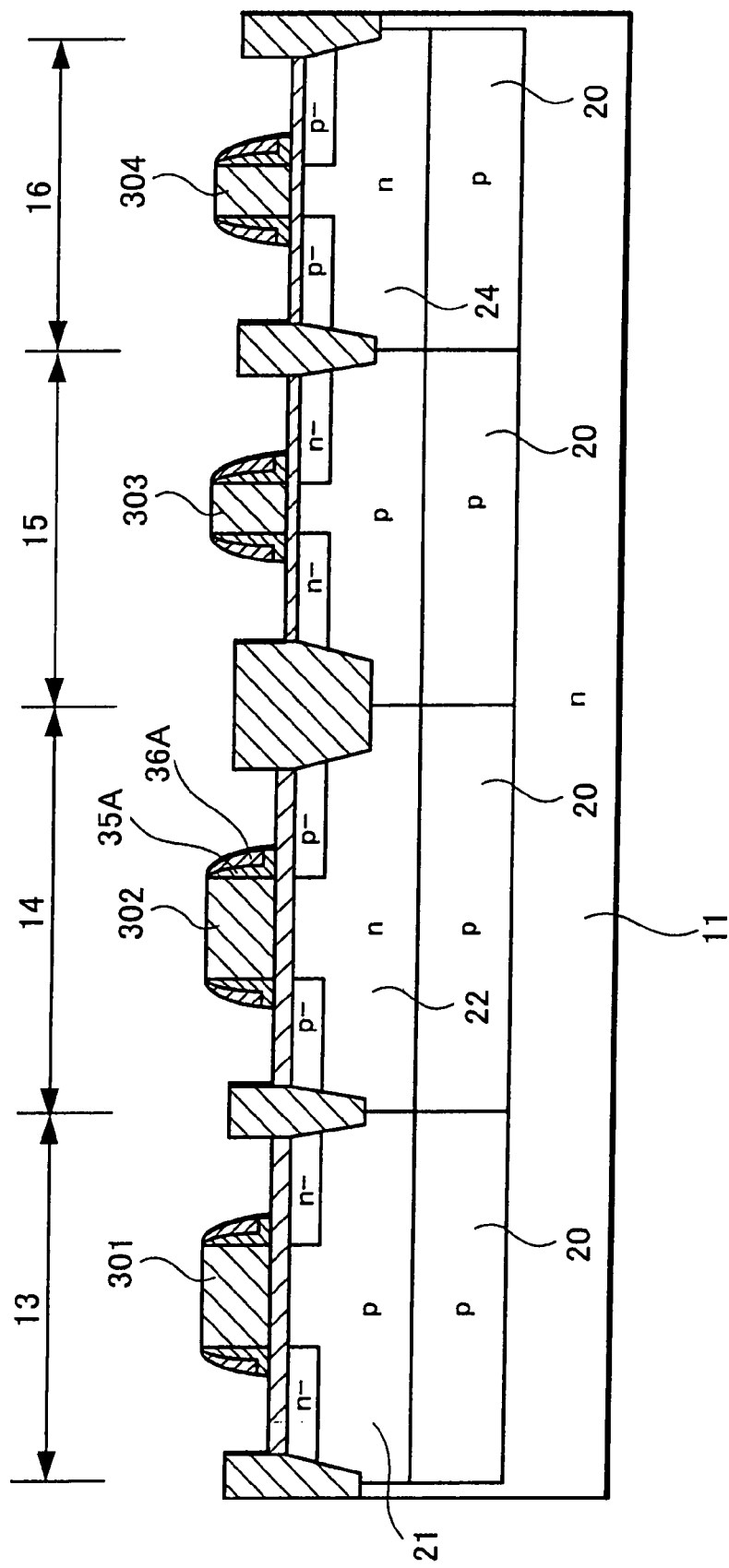
Figure 20:
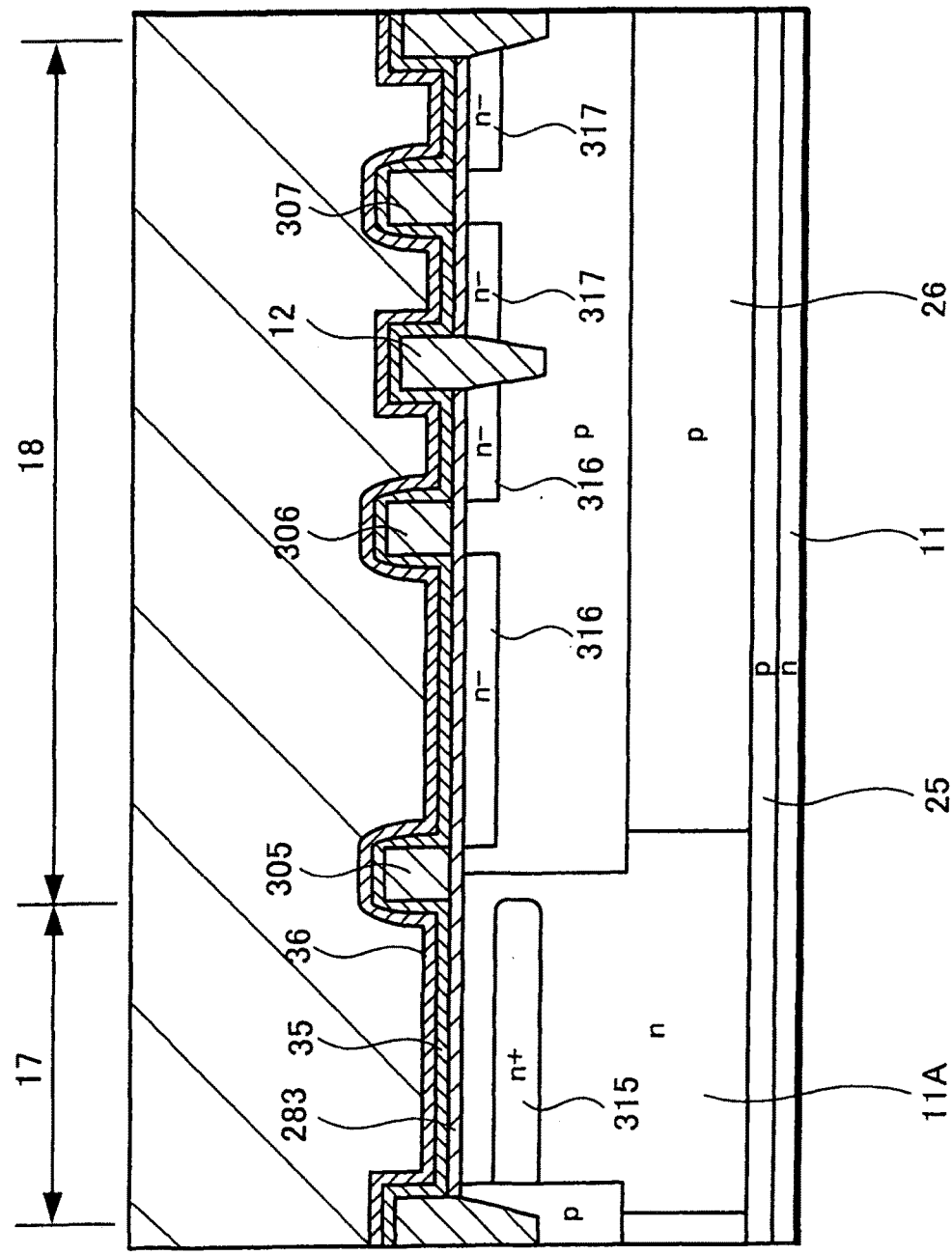

Next, as shown in FIG. 10 and FIG. 20, photo-resist masks 37 are formed selectively on the second insulating films 36 on the side of the picture elements 2 and in this condition the first and second insulating films 35 and 36 on the side of the CMOS logic circuit portion 4 are etching processed using an etchback method such that sidewall portions 35A and 36A composed of the first insulating films 35 and the second insulating films 36 are formed only on the side walls of the gate electrodes 301 to 304 respectively. (see FIG. 10) In the region on the side of the picture elements 2, the first and second insulating films 35 and 36 are protected by the photo-resist mask 37 and remain without being removed by etching. (see FIG. 20)

Figure 11:
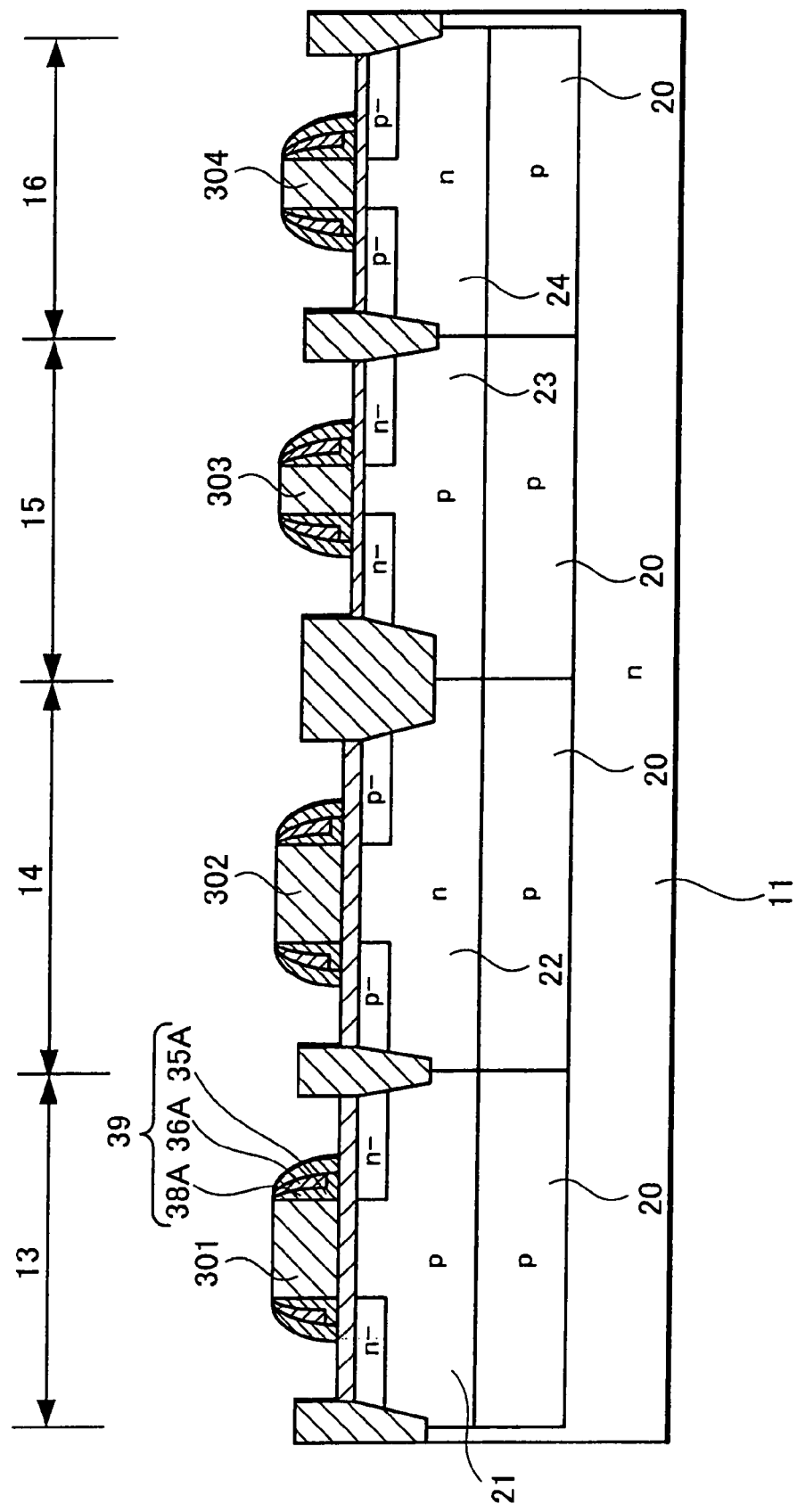
Figure 21:
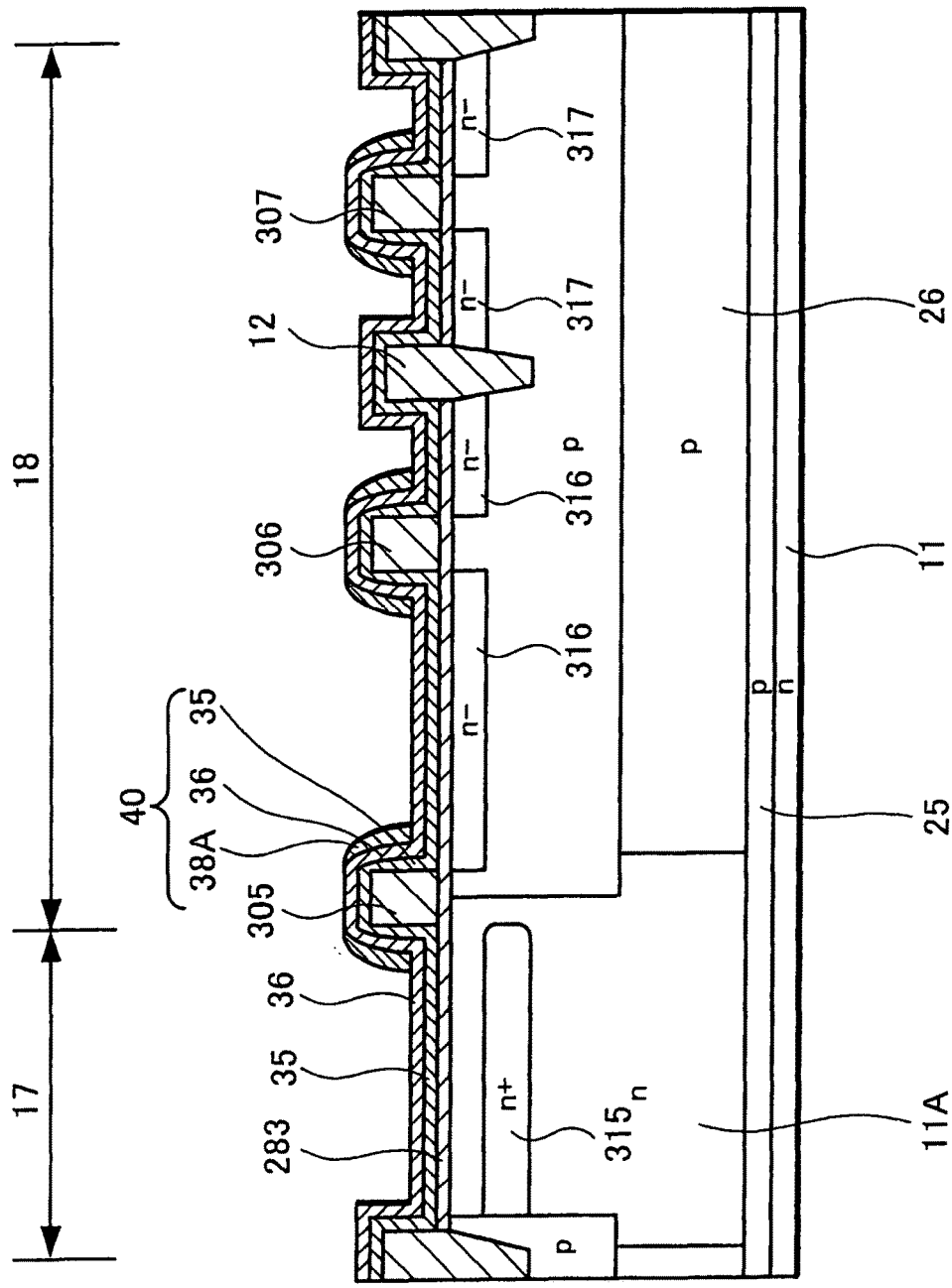

Next, as shown in FIG. 11 and FIG. 21, the photo-resist mask 37 on the side of the picture elements 2 is removed. Subsequently, third insulating films 38 of a desirable film thickness t6 (not shown) is formed on the whole surface of the semiconductor substrate on the side of the at the CMOS logic circuit portion 4 and on the side of the picture elements 2. It is possible to use, for example, silicon oxide films (SiO$_2$ film) which have a different etching rate from that of the second insulating films 36 as the third insulating films 38. It is possible to select the film thickness t7 of the third insulating film 38 as, for example, approximately 100 nm. The third insulating films 38 are etching processed using an etchback method such that sidewall portions 38A are formed on the side walls of the gate electrodes 301 to 307 respectively on the side of the at the CMOS logic circuit portion 4 and on the side of the picture elements 2. In this way, sidewalls 39 of a 3-layer structure composed of the first, second and third insulating films 35A, 36A and 38A are formed on the gate electrodes 301 to 304 respectively on the side of the at the CMOS logic circuit portion 4. (see FIG. 11) Additionally, on the side of the picture elements 2, only the third insulating films 38 are etchedback, because the second insulating films 36 become etching stoppers such that the first and second insulating films 35 and 36 will not be removed. Consequently, sidewalls 40 of a 3-layer structure composed of the first, second and third insulating films 35, 36 and 38A are formed on the side walls of the gate electrodes 305 to 307 respectively. (see FIG. 21)

Figure 12:
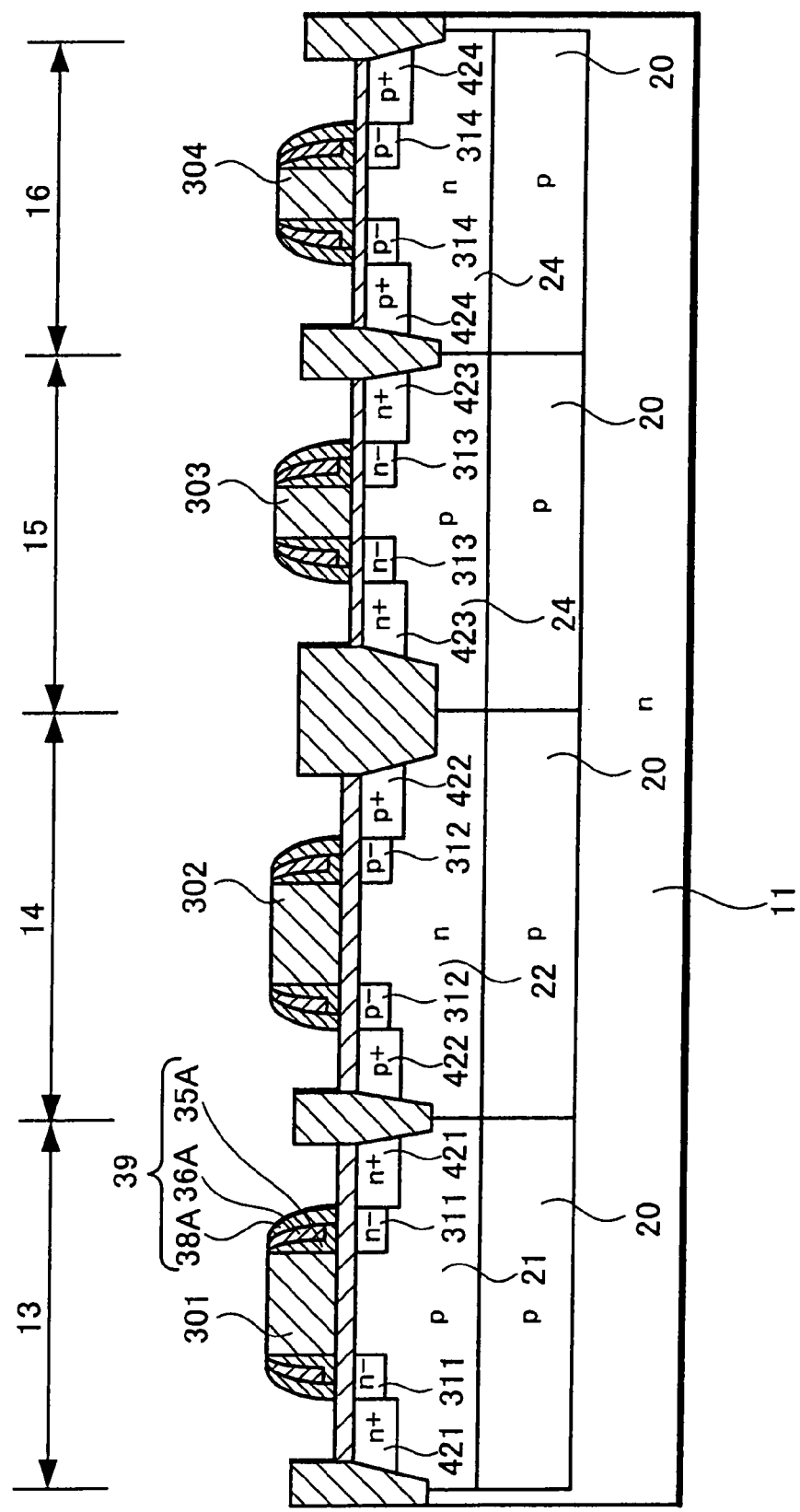
Figure 22:
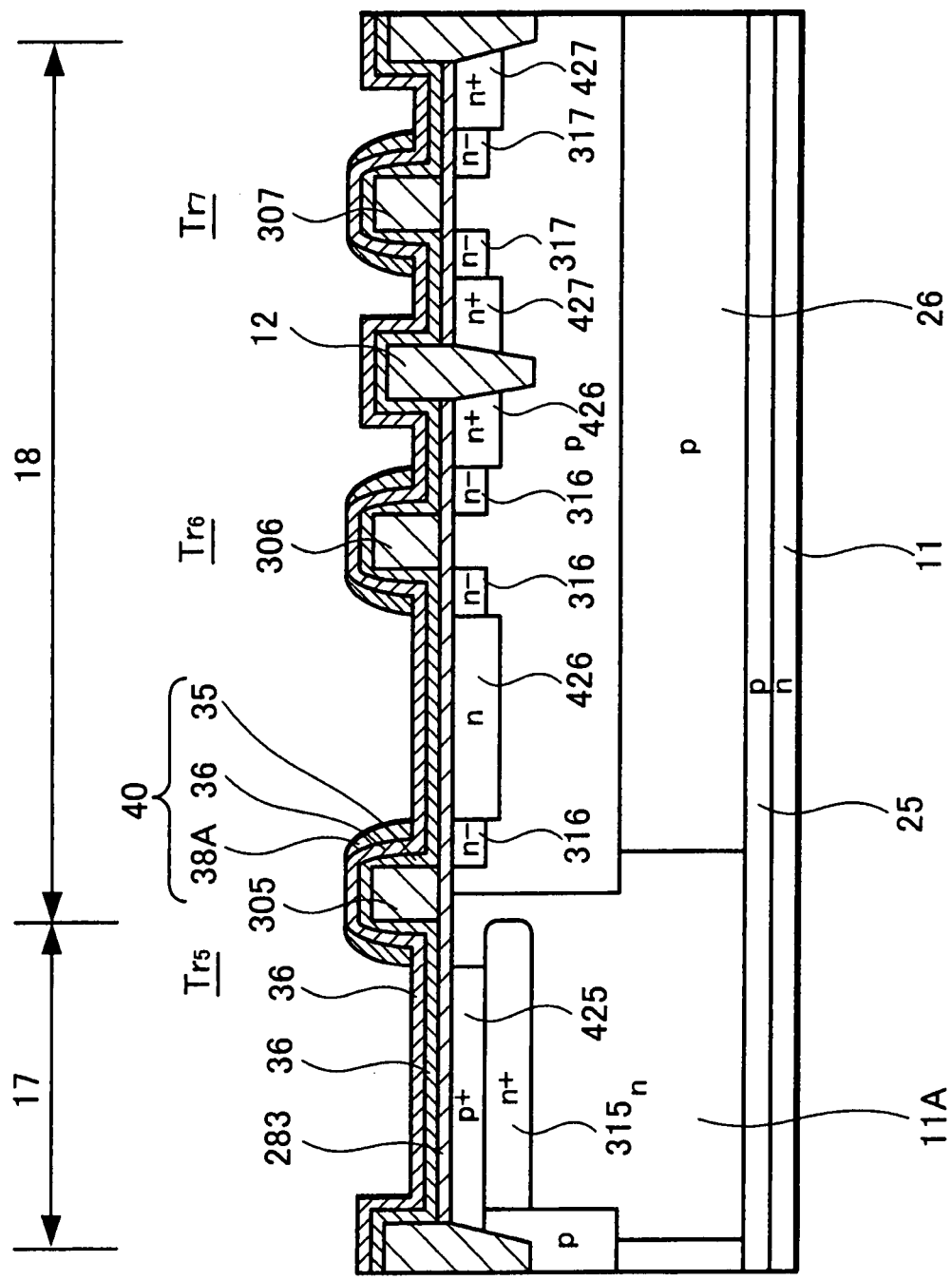

Next, as shown in FIG. 12 and FIG. 22, in the regions on the side of the CMOS logic circuit portion 4 and on the side of the picture elements 2, desirable impurities are introduced by an ion injection method using the gate electrodes 301 to 307 and sidewalls 39, 40 as masks and impurity introduced regions 42 [421, 422, 423, 424, 425, 426, 427] of desirable conductive types which will become source/drain regions and HADs (Hole Accumulation Diodes) are formed. The impurity introducing regions 42 can be formed by injecting to each of the regions with selected impurities to be injected and with selected injection conditions (injection energy, impurity concentration and the like) using a photo-resist method. On side of the CMOS logic circuit portion 4, $p^+$ source/drain regions 421 and 423 of a high impurity concentration are formed in the p-type semiconductor well regions 21 and 23, and $n^+$ source/drain regions 422 and 424 of a high impurity concentration are formed in the n-type semiconductor well region 22 and 24. P-type source/drain regions of an LDD structure are formed by a $p^-$ region 311 and a $p^+$ region 421 and by a $p^-$ region 313 and a $p^+$ region 423 respectively. N-type source/drain regions of an LDD structure are formed by an $n^-$ region 312 and an $n^+$ region 422 and by an n region 314 and an $n^+$ region 424 respectively. (see FIG. 12) On the side of the picture elements 2, a $p^+$ semiconductor region (hole storage region) 425 which is an impurity introducing region of a high concentration for forming a buried photodiode, that is, a so called a HAD (Hole Accumulation Diode) is formed on the surface of the sensor portion forming region 17 for the purpose of more reducing a junction leak current. Additionally, $n^+$ source/drain regions 426, 427 of a high impurity concentration are formed in the MOS transistor forming region 18. N-type source/drain regions of an LDD structure are formed by an $n^-$ region 316 and an $n^+$ region 426 and by an $n^-$ region 317 and an $n^+$ region 427 respectively. (see FIG. 22)

In the MOS transistor forming region 18 on the side of the picture elements 2, the first insulating film 35 and the second insulating film 36 are formed on its surface, and when, for example, the film thickness of the first insulating film 35 is selected as 10 nm and the film thickness of the second insulating film 36 is selected as 30 nm, it is possible to form $n^+$ source/drain regions 426, 427 by selecting the ion injection energy for forming source/drain regions of a high impurity concentration as 20 keV or more in case that the injected ion is, for example, phosphorus (P).

Figure 13:
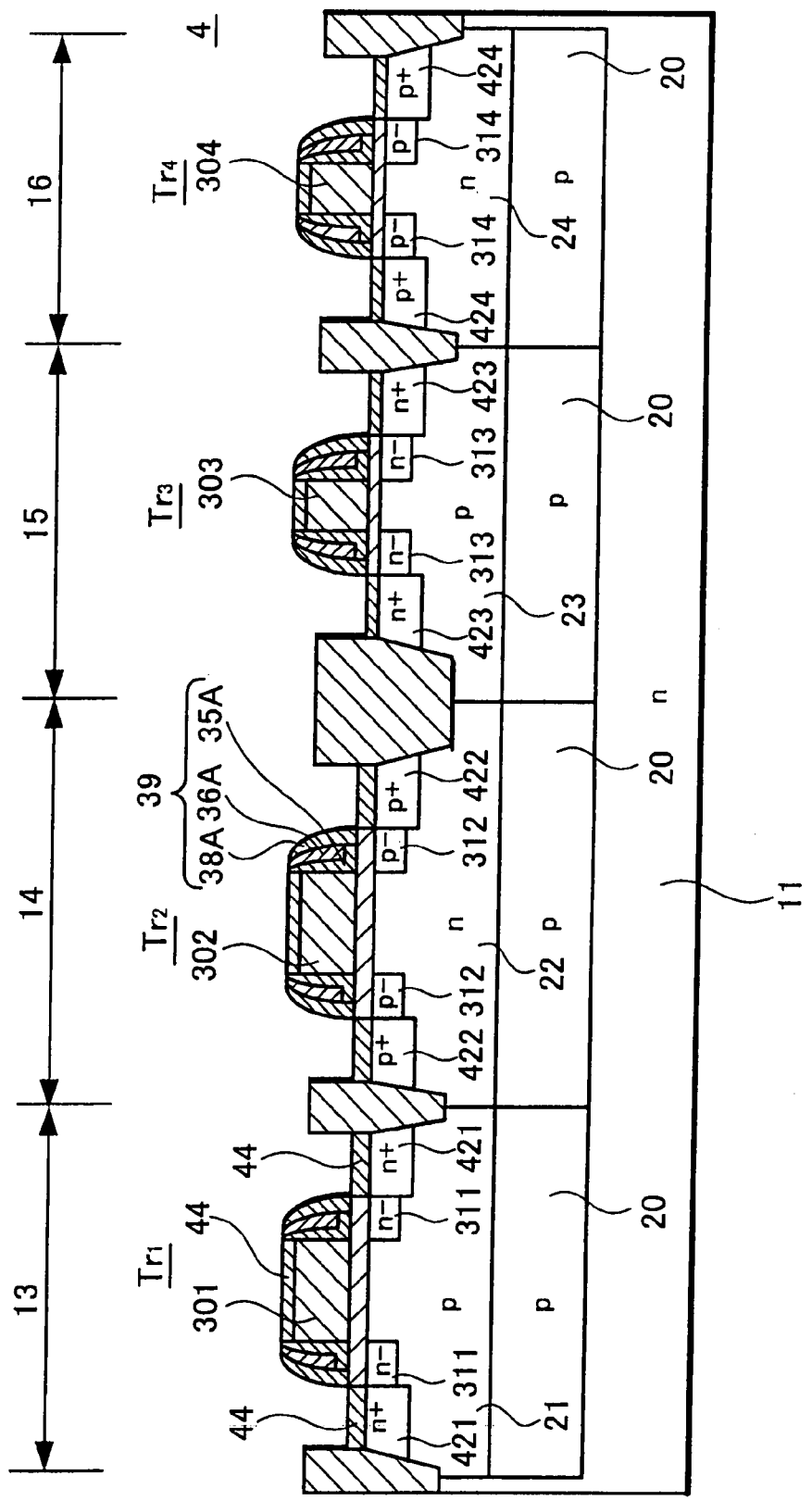
Figure 23:
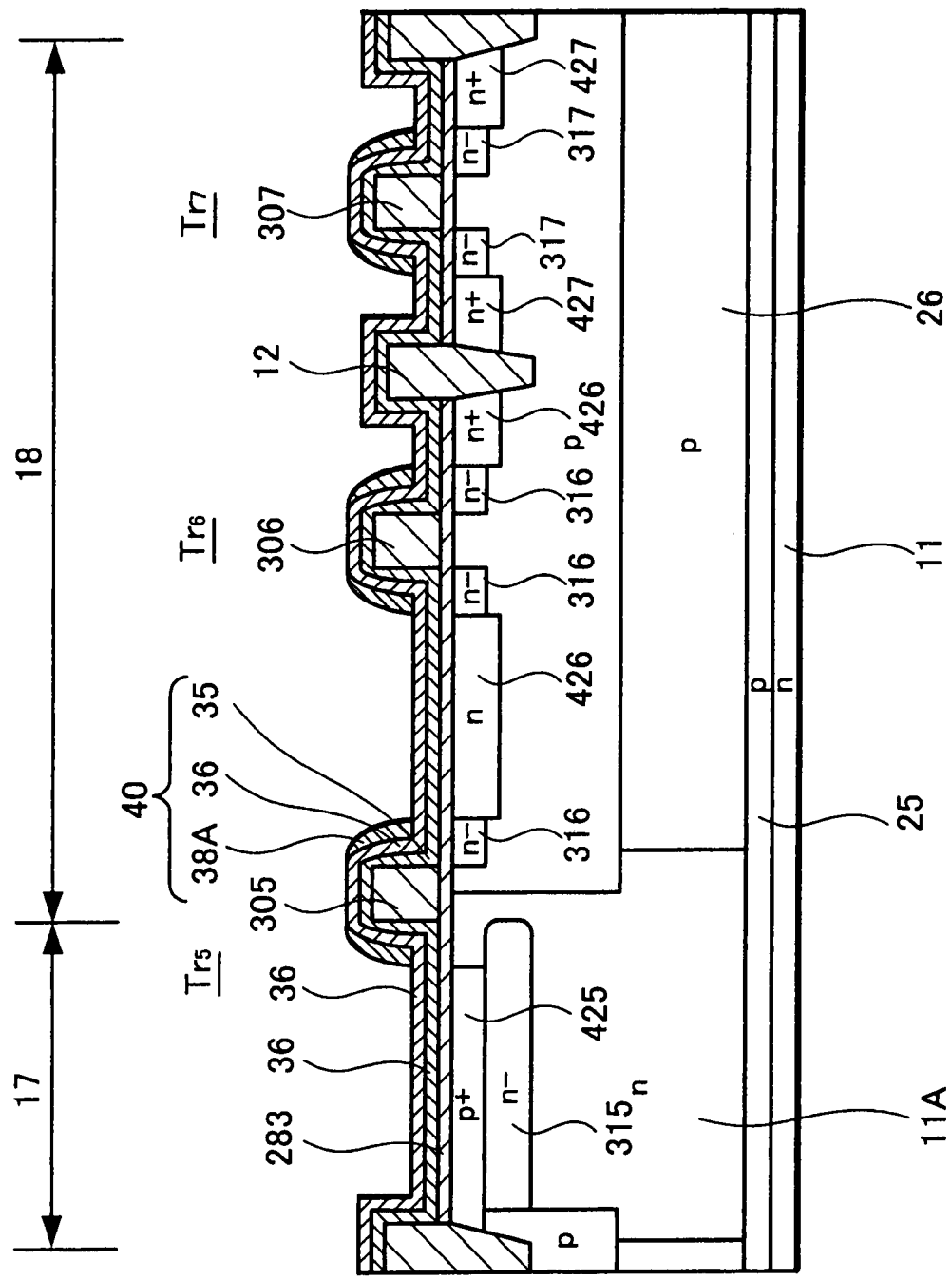

Next, as shown in FIG. 13 and FIG. 23, metal silicide layers 44 of a refractory metal are formed by a salicide method on the gate electrodes 301 to 304 composed of polycrystalline silicon and on the $p^+$ source/drain regions 421 to 424 on the side of the CMOS logic circuit portion 4. In other words, metal films of a refractory metal are coated and formed on the whole surfaces on the side of the at the CMOS logic circuit portion 4 and on the side of the picture elements 2. Subsequently, metal silicide layers 44 of a refractory metal are formed on the surfaces of the gate electrode 301 to 304 and on the surfaces of the source/drain regions 421 to 424 on the side of the CMOS logic circuit portion 4 by alloy processing and thereafter by removing non-reacted metals of a refractory metal. On the other hand, as the first and second insulating films 35 and 36 are formed on the side of the picture element 2, metal silicide layers 44 of a refractory metal will not be formed thereat. As to a metal of a refractory metal, for example, Co, Ti, Mo, Ni, W and the like can be used. In this example Co silicide layers are formed.

On the side of the CMOS logic circuit portion 4, a CMOS transistor structure is formed by an n-channel MOS transistor Tr1 formed in the first p-type semiconductor well region 21 and a p-channel MOS transistor Tr2 formed in the second n-type semiconductor well region 22, and a CMOS transistor structure is formed by an n-channel MOS transistor Tr3 formed in the third p-type semiconductor well region 23 and a p-channel MOS transistor Tr4 formed in the fourth n-type semiconductor well region 24. On the side of the picture element 2, a sensor portion 45 is formed. In this example, the sensor portion 45 is constituted as an HAD sensor by the $p^+$ semiconductor region 425 and the n-type semiconductor region 315 and by the n-type semiconductor well region 11A and the p-type semiconductor well region 5.

Thereafter, a wiring process, an on-chip lens forming process and a color filter forming process are performed according to a conventional technique relating to a CMOS type solid-state imaging device. According to the above mentioned processes, an aimed CMOS type solid-state imaging device 1 can be obtained where CMOS transistors having metal silicide layers 44 of a refractory metal are formed only on the side of the CMOS logic circuit portion 4 while metal silicide layers 44 of a refractory metal are not formed on the side of the picture element 2.

In the above example, an n-type semiconductor substrate is used as the common semiconductor substrate 11, but it should be noted that a p-type common semiconductor substrate 11 can be used in case of other semiconductor devices. Further, it is possible to form the semiconductor regions opposite to those of the above example respectively.

Further, in the above example, the source/drain region is made as an LDD structure for the p-channel MOS transistor Tr2 on the side of the CMOS logic circuit portion 4, but it is also possible to form it other than making the source/drain region as an LDD structure, that is, taking a form of eliminating a $p^-$ region 312.

According to the exemplified embodiment, the gate electrodes 305 to 307 and the source/drain regions 426, 427 of a high impurity concentration are formed without forming metal silicide layers of a refractory metal in the picture elements 2 and at the same time, on the side of the CMOS logic circuit portion 4, metal silicide layers 44 of a refractory metal can be formed at the gate electrode 301 to 304 and in the source/drain regions 421 to 424 of a high impurity concentration.

On the side of the CMOS logic circuit portion 4 where metal silicide layers 44 of a refractory metal are formed at the gate electrodes 301 to 304 and in the regions 421 to 424 of a high concentration of source/drain regions, an LDD structure is made by forming sidewalls 39 composed of insulating films 35, 36 and 38 of a 3-layer structure and at the same time, it is possible to form CMOS transistors Tr1 to Tr4 having metal silicide source layers 44 of a refractory metal. On the side of the picture elements 2 where metal silicide layers of a refractory metal are not formed at the gate electrodes 305 to 307 and in the regions 426, 427 of a high concentration of source/drain regions, it is possible to form MOS transistors Tr5 to Tr7 where the first and the second insulating films 35, 36 remain on the sensor portion 45 and on the source/drain regions 316, 317, 426, 427 without being removed even when etchingback and sidewalls 40 are formed by etchingback only the third insulating films 38 such that metal silicide layers of a refractory metal are not formed even for the LDD structure thereof.

When etchingback the third. insulating films 38, the second insulating films 36 operate as etching stoppers such that the second and first insulating films 36 and 35 are avoided from removed by etching, so that the first and the second insulating films 35 and 36 come to remain as they are. As the metal silicide layer 44 of a refractory metal is formed by a silicide method, metal silicide layers of a refractory metal are not formed in the sensor portion 45 where the first insulating film 35 and the second insulating film 36 remain and further at the gate electrodes 305 to 307 and in the regions 426, 427 of a high impurity concentration on the side of the picture element 2, and metal silicide layers 44 of a refractory metal can be formed at the first insulating film 35, at the gate electrodes 301 to 304 where the second insulating films 36 are removed and in the regions 421 to 424 of a high impurity concentration of the source/drain regions on the side of the CMOS logic circuit portions 4, 5.

On the side of the picture element 2, when the ion is injected for forming the regions 426, 427 of a high impurity concentration in the source/drain regions, the regions 426, 427 of a high impurity concentration in the source/drain regions can be formed even if without removing the first and second insulating films 35 and 36 by selecting the total thickness t4+t5 of the first and second insulating films 35 and 36 such a thickness that the ion can enough pass through. Additionally, the thickness of the sidewall 40 which is used as a mask for injecting impurities to the regions 426, 427 in the source/drain regions can be optimized by controlling the film thickness of the third insulating film 38, so that a sidewall structure and a source/drain region structure having similar effects as a conventional sidewall method can be obtained.

Figure 24:
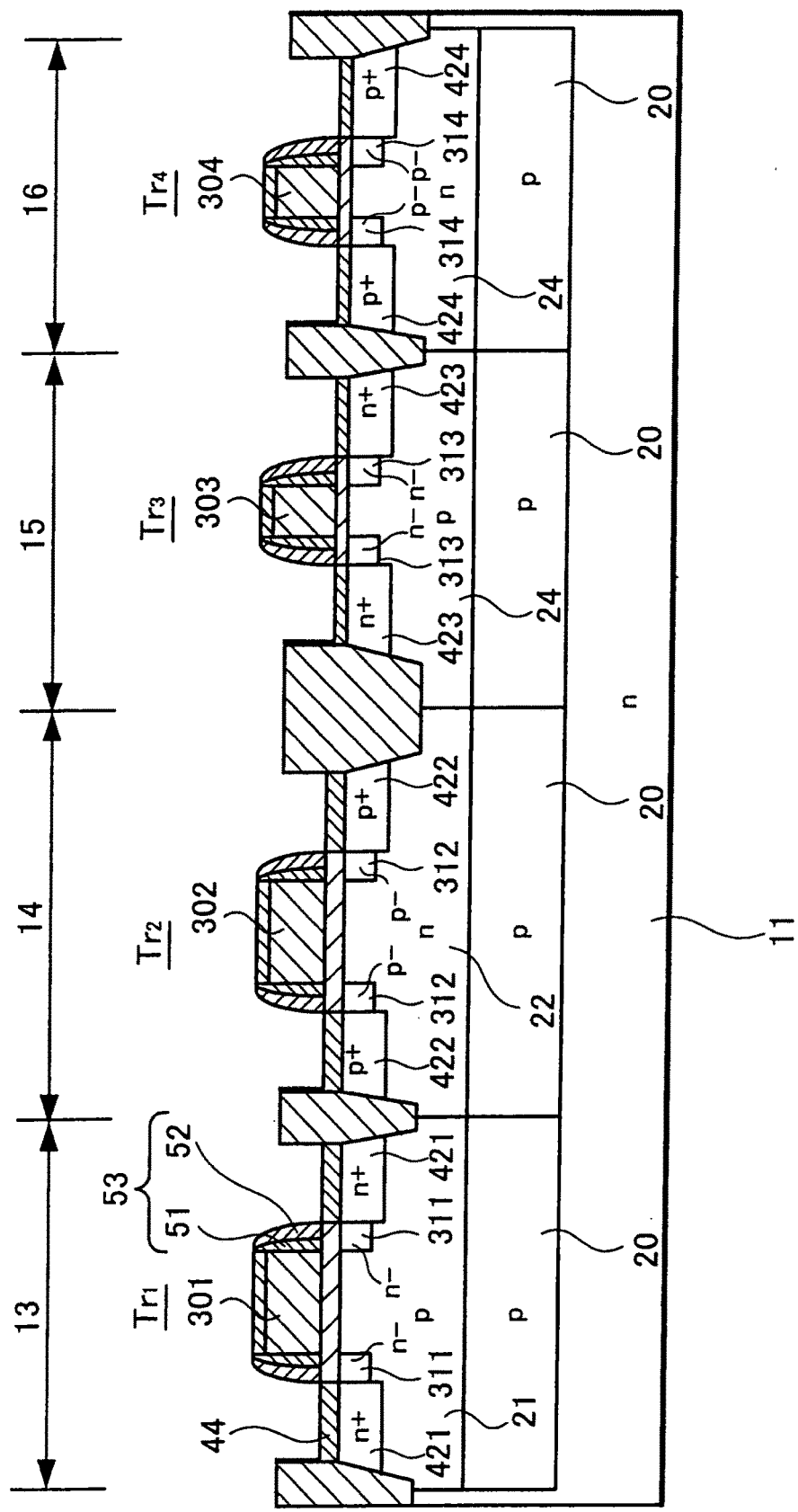
FIG. 24 is a cross-sectional view of a CMOS logic circuit portion showing another exemplified embodiment of a semiconductor device according to the present invention, which is applied to a CMOS type solid-state imaging device.
Figure 25:
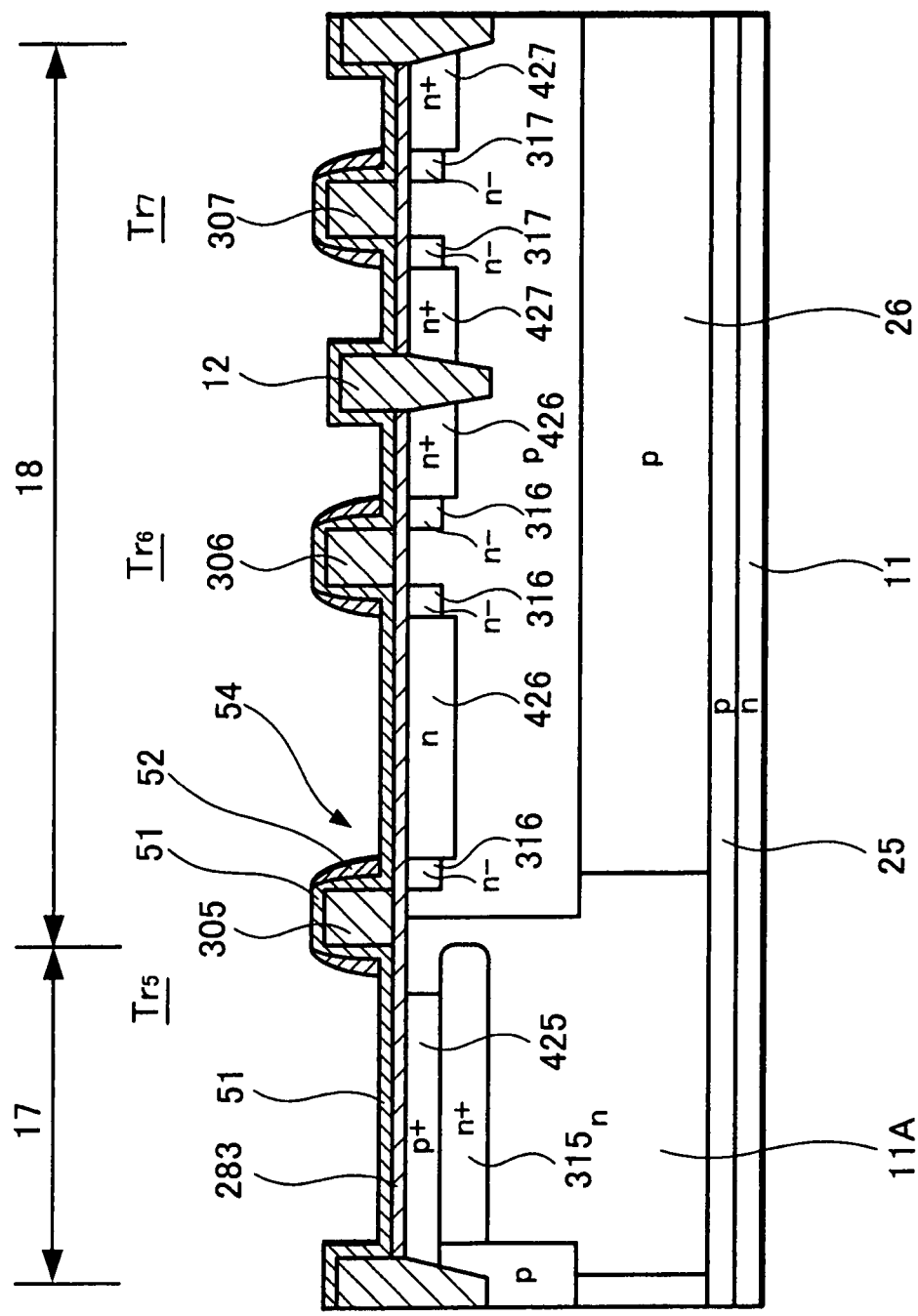
FIG. 25 is a cross-sectional view of a picture element portion showing another exemplified embodiment of a semiconductor device according to the present invention, which is applied to a CMOS type solid-state imaging device.

Consequently, a CMOS logic circuit portion 4 where the parasitic capacitance is reduced with a high speed operation and with low power consumption can be attained. At the same time, it becomes possible to make the picture elements 2 of a low junction leak current, that is, an imager portion of a high picture quality reduced with a noise level into a same semiconductor chip with the logic circuit portion of a high speed and low power consumption. Further, it can be avoided from exposing the surface of the sensor portion forming region 17 of the picture element 2 to the plasma atmosphere in case of the etchback when the sidewalls 39, 40 are formed, so that it can also suppress defect making in the sensor portion caused by plasma damage, contamination and the like In the above mentioned exemplified embodiment, the sidewall structure was employed as a 3-layer structure of the first insulating film 35, the second insulating film 36 and the third insulating film 38, but a 2-layer structure can be employed. FIG. 24 and FIG. 25 show another exemplified embodiment of a solid-state imaging device 1 according to the present invention where the sidewall structure is made as a 2-layer structure. In this exemplified embodiment of the solid-state imaging device 1 according to the present invention, on the side of the CMOS logic circuit portion 4, sidewalls 53 of a 2-layer structure composed of first insulating films 51 and second insulating films 52 both of which are etchedback on the side wall of each of the gate electrodes 301 to 304 constituting MOS transistors Tr1 to Tr4 are formed. Additionally, on the side of the picture element 2, the first insulating film 51 is made remained on the whole surface on the side of the picture elements 2 without etchingback the first insulating film 51 such that the sidewall 54 composed of the second insulating film 52 is formed on the side wall of each of the gate electrodes 305 to 307 of the MOS transistors Tr5 to Tr7 by etchingback only the second insulating film 52. Films which have different etching rates each other are used for the first insulating film 51 and the second insulating film 52. For example, it is possible to use a silicon nitride film for the first insulating film 51 and a silicon oxide film for the second insulating film 52. It is possible to select the film thickness of the silicon nitride film which is the first insulating film 51 as 30 nm or less and to select the film thickness of the silicon oxide film which is the second insulating film 52 as 100 nm or less. It is also possible to use a silicon oxide film as the first insulating film 51 and to use a silicon nitride film as the second insulating film 52. However, with respect to the etchback it is similar to the other constitutions of silicon oxide films of the aforementioned FIG. 13 and FIG. 23, so that repetitive explanations will be omitted. Alternately, with respect to the manufacturing process the first and second insulating films 35 and 36 will be replaced by the first insulating film 51 and the third insulating film 38 will be replaced by the second insulating film 52. Others are similar to the processes shown in FIG. 4 to FIG. 23.

In the exemplified embodiment of FIG. 24 and FIG. 25, if there is a problem of an increase of the interfacial level when a silicon nitride film is used for the first insulating film 51 and it is directly piled on the semiconductor substrate, the first insulating film 51 is changed to be a silicon oxide film or preferably to be a 3-layer structure of the first, second and third insulating films 35, 36 and 38 as shown in FIG. 11 and FIG. 21 mentioned above.

Further, as a silicon oxide film has a lower dielectric constant than that of a silicon nitride film, it is better to select an insulating film composed of a silicon oxide film as the first layer of the 3-layer structure for a device where a parasitic capacitance composed of a fringe capacitance on the side wall of the gate electrode, that is, a parasitic capacitance formed between an edge portion on the side of the gate insulating film of the gate electrode and the source/drain region becomes a problem.

In the exemplified embodiment of FIG. 13 and FIG. 23, the film thickness t5 of the first insulating film 35 is selected to be approximately 10 nm, the film thickness t6 of the second insulating film 36 to be approximately 30 nm and the film thickness t7 of the third insulating film 38 to be approximately 100 nm, but with respect to respective film thicknesses of the insulating films 35, 36, 38 it is considered effective to select, for example, the film thickness t5 of the first insulating film 35 as 20 nm or less, the film thickness t6 of the second insulating film 36 as 30 nm or less and the film thickness t7 of the third insulating film 38 as 100 nm or less.

Figure 26:
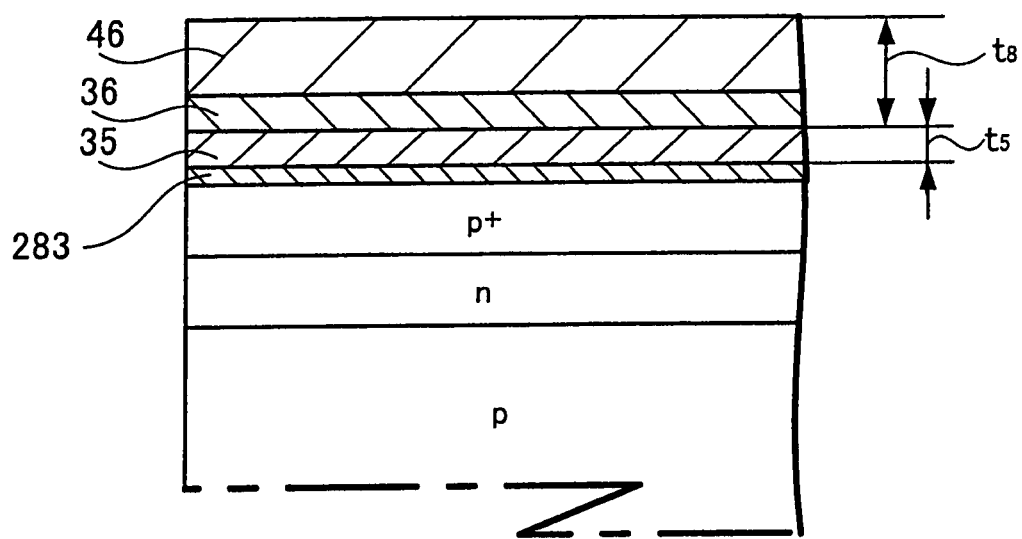
FIG. 26 is a cross-sectional view of a sensor portion of a CMOS type solid-state imaging device according to the present invention showing another exemplified embodiment.

Especially, for the sensor portion 45 of the picture elements 2, it is desired to obtain the incident light as much as possible without reflecting. As shown in FIG. 26, a silicon oxide film 35 as a first insulating film and a silicon nitride film (LPCVD-SiN film) 36 by means of a reduced pressure CVD as a second insulating film are formed on the sensor portion 45 through the insulating film 283 and further, a silicon nitride film (plasma CVD-SiN film) 46 by means of plasma CVD is additionally formed thereon. In this case, the film thickness t4 of the silicon oxide film 35 which is the first insulating film is selected as 20 nm or less (the thinner is the better and including 0 nm) and the total film thickness t8 of the silicon nitride film 36 which is the second insulating film and the silicon nitride film 46 thereon is selected as 150 nm to 20 nm, preferably as 100 nm to 20 nm and as approximately 60 nm for an optimum value. By selecting the film thickness of each insulating film as such a value, the stacked films of the silicon oxide film 35, silicon nitride films 36 and 46 operate as reflection prohibiting films such that the efficiency of the incident light to the sensor portion 45 can be improved.

The film structure which has such a reflection prohibiting function can be applied to a 2-layer film structure composed of insulating films 51, 52 shown in FIG. 24 and FIG. 25.

In the above mentioned exemplified embodiment, sidewalls by insulating films of a 3-layer structure or a 2-layer structure which includes a silicon nitride film are constituted. It is desirable to eliminate silicon nitride films when the characteristic of the MOS transistor is required so much that the influence of the above mentioned silicon nitride film can not be neglected. For example, when a CMOS transistor structure is made, usually boron (B) is introduced as a p-type impurity to the gate electrode of polycrystalline silicon for the p-channel MOS transistor by an ion injection. After the ion is injected, an annealing process of a high temperature is conducted for its activation, but there might be a phenomenon that the boron (B) in the gate electrode of the polycrystalline silicon diffuses and enters the silicon substrate if the gate insulating film is thin at that time. It is observed that this boron (B) is easily diffused such that it is recognized that the boron diffuses with an increased speedy diffusion when the silicon nitride film (SiN film) exists on the sidewall. Its mechanism is not completely known, but one of the reasons is that the film material of the silicon nitride film includes a lot of hydrogen and it is assumed that the diffusion speed of the boron is made to be more rapid when the hydrogen diffuses in the gate electrode. The second reason is assumed that the silicon nitride film has a large stress such that the diffusion speed of the hydrogen is made to be more rapid owing to that film stress. At least it was experimentally recognized that the diffusion of the boron becomes more when the silicon nitride film is used.

Next, another exemplified embodiment of a semiconductor device and a manufacturing method thereof according to the present invention where silicon nitride films are not used as insulating films of the sidewalls will be described. The semiconductor device of the exemplified embodiment, similarly as mentioned above, is a semiconductor device having a common semiconductor substrate provided with a semiconductor region having a MOS transistor where a metal silicate layer of a refractory metal is formed and a semiconductor region having a MOS transistor where a metal silicate layer of a refractory metal is not formed.

Figure 27:
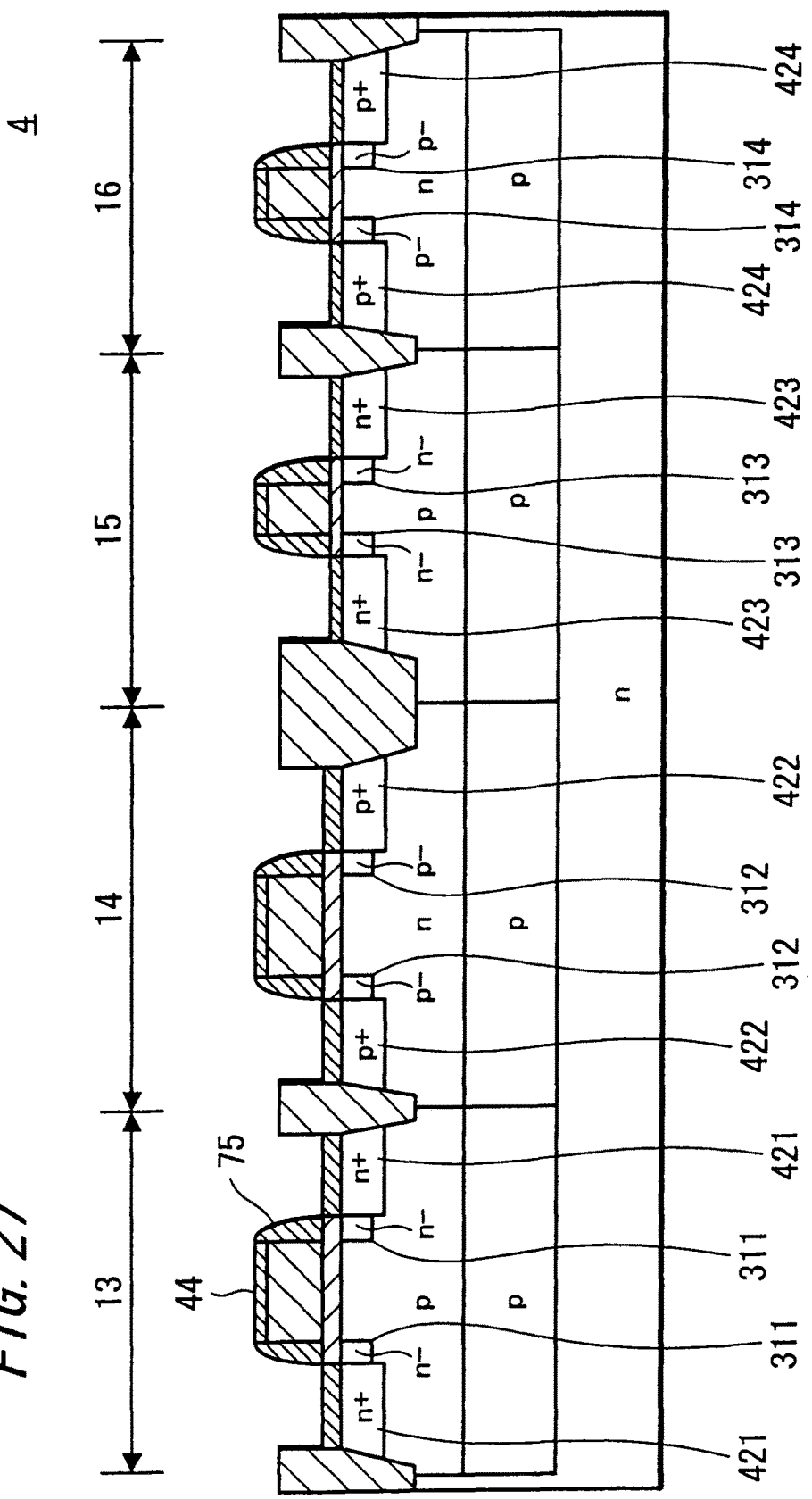
FIG. 27 is a cross-sectional view of a CMOS logic circuit portion showing another exemplified embodiment of a semiconductor device according to the present invention, which is applied to a CMOS type solid-state imaging device.
Figure 28:
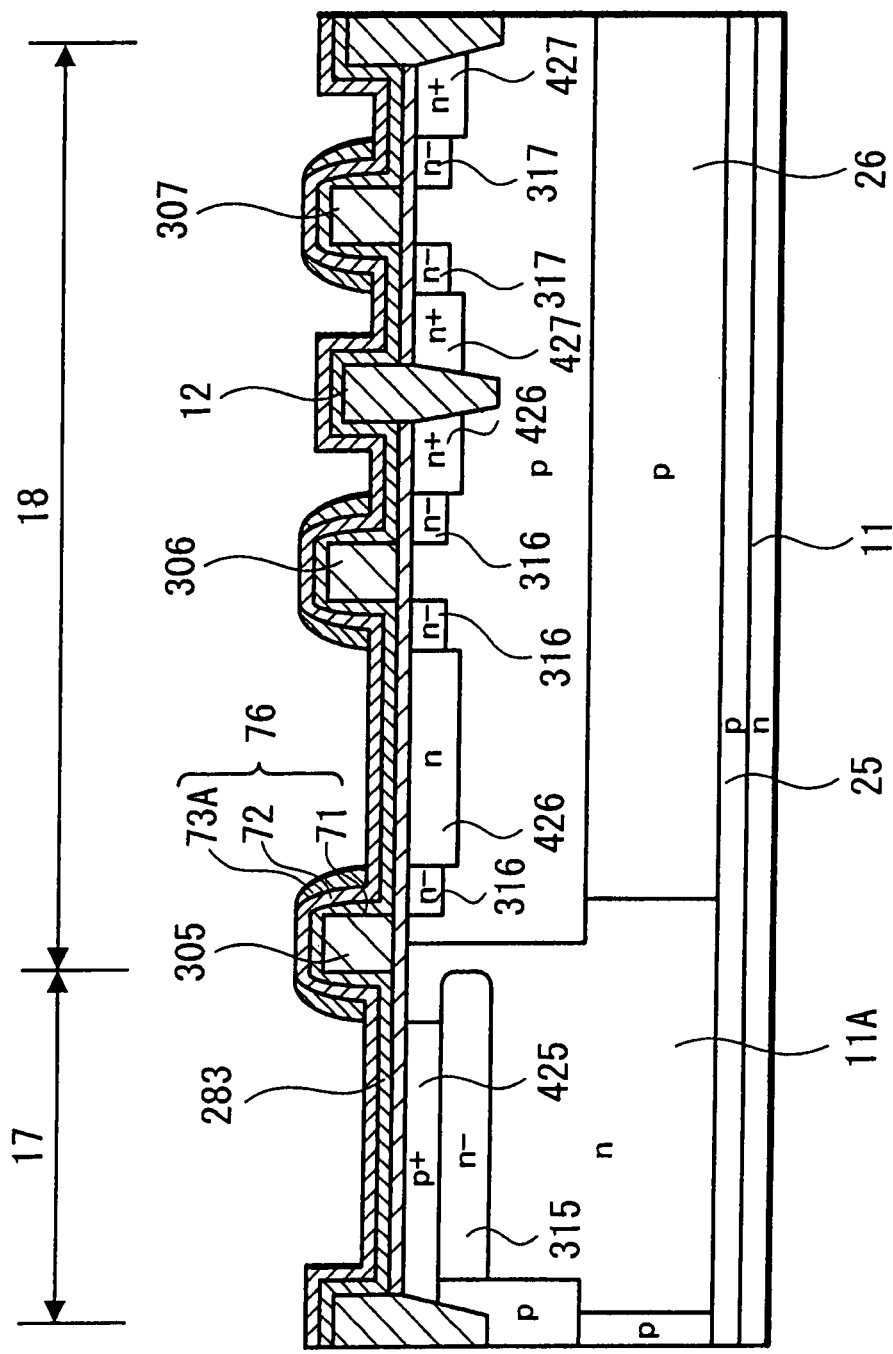
FIG. 28 is a cross-sectional view of a picture element portion showing another exemplified embodiment of a semiconductor device according to the present invention, which is applied to a CMOS type solid-state imaging device.

FIG. 27 to FIG. 28 show another exemplified embodiment where a semiconductor device according to the present invention is applied to the CMOS type solid-state imaging device of FIG. 1. FIG. 27 and FIG. 28 show cross-sectional views corresponding to the CMOS logic circuit portion 4 and one picture elements 2 imager area 3 at the A-A line of FIG. 1. FIG. 27 shows the CMOS logic circuit portion 4 and FIG. 28 shows a main portion of the one picture elements 2.

According to the exemplified embodiment of a CMOS type solid-state imaging device, as shown in FIG. 27 and FIG. 28, element separating regions 12 are formed in the common semiconductor substrate 11 of a first conductivity type, that is, of an n-type in this example, picture elements 2 constituting an imager area 3 are formed in a desirable region of the semiconductor substrate 11 and a CMOS logic circuit portion 4 is formed in another desirable region of the semiconductor substrate 11. It is constituted such that metal silicide layers of a refractory metal are not formed on the side of the picture elements 2 and metal silicide layers of a refractory metal are formed at CMOS transistors on the side of the CMOS logic circuit portion 4.

In the CMOS logic circuit portion 4, as shown in FIG. 27, a second conductivity type of, that is, p-type of semiconductor well regions 20 are formed at a deep position of the n-type semiconductor substrate 11 extending from a first to a fourth MOS transistor forming regions 13 to 16 such that p-type of semiconductor well regions 20 introduced with the second conductivity type of, that is, p-type of impurity are formed. Additionally, in the first and the third MOS transistor forming regions 13 and 15, p-type semiconductor well regions 21 and 23 which extend from the surface of the substrate to the p-type semiconductor well regions 20 are formed. Further, in the second and the fourth MOS transistor forming regions n-type semiconductor well regions 22 and 24 which extend from the surface of the substrate to the p-type semiconductor well regions 20 are formed. On the p-type semiconductor well region 21 and the n-type semiconductor well region 22, gate electrodes 301 and 302 which are made of such as polycrystalline silicon films are formed respectively through gate insulating films 281. In the p-type semiconductor well region 21, a source/drain region of an LDD structure consisting of an n region 311 and an $n^+$ region 421 at the both sides of the gate electrode 301 is formed and an n-channel MOS transistor Tr1 is formed. In the n-type semiconductor well region 22, a source/drain region of an LDD structure consisting of an $p^-$ region 312 and an $n^+$ region 422 at the both sides of the gate electrode 302 is formed and a p-channel MOS transistor Tr2 is formed. The n-channel MOS transistor Tr1 and the p-channel MOS transistor Tr2 constitute a CMOS transistor structure. Gate electrodes 303 and 304 made of, for example, polycrystalline silicon films are formed on the p-type semiconductor well region 23 and the n-type semiconductor well region 24 through gate insulating films 282. In the p-type semiconductor well region 23, a source/drain region of an LDD structure consisting of an $n^-$ region 313 and an $n^+$ region 423 at the both sides of the gate electrode 303 is formed and an n-channel MOS transistor Tr3 is formed. In the n-type semiconductor well region 24, a source/drain region of an LDD structure consisting of an $p^-$ region 314 and an $p^+$ region 424 at the both sides of the gate electrode 304 are formed and a p-channel MOS transistor Tr4 is formed. The n-channel MOS transistor Tr3 and the p-channel MOS transistor Tr4 constitute a CMOS transistor structure.

Additionally, according to the exemplified embodiment a sidewall 75 of a single layer composed of an insulating film 73 (corresponding to a third insulating film mentioned later) without using a silicon nitride film is especially formed at each of the gate electrodes 301 to 304 of the MOS transistors Tr1 to Tr4. The insulating film 73 can be formed, for example, by silicon oxide film ($SiO_2$ film). According to the sidewall 75 of a single layer structure composed of a silicon oxide film, the boron (B) which is an impurity in the gate electrodes 302, 304 of p-channel MOS transistor Tr2, Tr4 described later is avoided from diffusing and from being injected into silicon substrate when an activating annealing of the introduced impurity which is ion injected, for example, to a source/drain region is processed. The $n^-$ regions 311, 313 and $p^-$ regions 312, 314 constituting the source/drain regions are formed with self-aligning by using the gate electrodes 301 to 304 as masks. The $n^-$ regions 421, 423 and $p^-$ regions 422, 424 are formed with self-aligning by using the sidewalls 75 made of the insulating films 73 of a single layer structure and the gate electrodes 301 to 304 as masks. Then, metal silicide layers 44 of a refractory metal are formed respectively on the surfaces of the gate electrodes 301 to 304 of the MOS transistors Tr1 to Tr4 and on the surfaces of $n^+$ regions 421, 423 and $p^+$ regions 422, 424 of the source/drain regions. It should be noted that it is similarly constituted on the side of the CMOS logic circuit portion 5. In this case 2 channels of power supplies are connected in the example of the CMOS logic circuit portions 4, 5.

For example, the power supply voltage for the CMOS transistor structure consisting of the n-channel MOS transistor Tr1 and the p-channel MOS transistor Tr2 is made different from those for the MOS transistor Tr3 and the p-channel MOS transistor Tr4.

With respect to the picture element 28, as shown in FIG. 28, a p-type semiconductor well region 25 introduced with a p-type impurity extending through a sensor portion forming region 17 and a MOS transistor forming region 18 is formed at a deep portion of the n-type semiconductor substrate 11. Further, in the MOS transistor forming region 18, double stacked p-type semiconductor well regions 26 and 27 are formed from the surface side extending to the p-type semiconductor well region 25. In the sensor portion forming region 17 surrounded by the p-type semiconductor well regions 25, 26, 27, an n-type semiconductor region 315 having a higher impurity concentration than that of the region 11A is formed at the surface side of the n-type semiconductor region 11A. The n-type semiconductor region 11A is a part of the semiconductor substrate 11 separated by the p-type semiconductor region 25 which is formed by an ion injection at a deep position of the semiconductor substrate 11. At the surface of the substrate, a $p^+$ semiconductor region 425 having a high impurity concentration is formed such that it contacts with the n-type semiconductor region 11A for the purpose of reducing the junction leak current. A sensor portion of photodiodes (so called a HAD sensor portion) 45 is formed by means of the p-type semiconductor well region 25, the n-type semiconductor regions 11A, 315 and the $p^+$ semiconductor region 425. On the other hand, in the MOS transistor forming region 18, for example, gate electrodes 305, 306, 307 made of polycrystalline silicon films are formed through gate insulating films 19; source/drain regions of an LDD structure composed of $n^-$ region 315, $n^+$ region 425 and source/drain regions of an LDD structure composed of $n^-$ region 316 and $n^+$ region 426 and $n^+$ region 426 and source/drain regions of an LDD structure composed of n region 317 and $n^+$ region 427 are formed at both sides of the gate electrodes respectively; and a plurality of n-channel MOS transistors, for example, a MOS transistor Tr5 for reading out and MOS transistors Tr6, Tr7 for signal outputs of outputting a signal, for example, from the sensor portion 45 are formed. Additionally, in the regions of picture elements 2, first insulating films 71 and second insulating films 72 are piled for covering the upper sides of the sensor portions 45, the gate electrodes 305 to 307 of the MOS transistors Tr5, Tr6, Tr7 and the source/drain regions, so that sidewall portions 73A composed of third insulating films 73 are formed on the side walls of the gate electrodes 305 to 307 respectively. The first film 71 can be formed, for example, by a silicon oxide film ($SiO_2$ film) and the second insulating film 72 can be formed, for example, by a silicon nitride film (SiN film). The third film 73 can be formed, for example, by a silicon oxide film ($SiO_2$ film) as mentioned above. The $n^-$ regions 316, 317 constituting the source/drain regions are formed with self-aligning by using the gate electrodes 305 to 307 as masks. The $n^+$ regions 426, 427 are formed with self-aligning by using sidewalls 76 of a 3-layer structure of insulating films 71, 72, 73A and the gate electrodes 305 to 307 as masks. At this time, first and second insulating films 71, 72 are formed on the $n^+$ regions 426, 427 of the source/drain regions, but it is possible to form $n^+$ regions 426, 427 also under the insulating films 71, 72 by making the film thicknesses of the insulating films 71, 72 and the acceleration energy (injection energy) when injecting an impurity optimized. Further, sidewalls 76 of a 3-layer structure are formed on the side walls of the gate electrodes 305 to 307, so that source/drain regions of an LDD structure similar to those of the MOS transistors Tr1 to Tr4 of the CMOS logic circuit portion 4 shown in FIG. 27 can be formed. For the MOS transistors Tr5 to Tr7, metal silicide layers of a refractory metal are not formed on gate electrodes 305 to 307 and $n^+$ regions 426, 427.

According to the CMOS type solid-state imaging device of the present exemplified embodiment, an insulating films, for example, silicon oxide films of a single layer structure without using silicon nitride films are formed as sidewalls which are formed on the side walls of the gate electrodes 301 to 304 on the side of the CMOS logic circuit portions 4, 5, so that when an activating annealing process is performed after ion-injecting impurities to the high impurity concentration regions ($n^+$ region, $p^+$ region) 421, 424, 422, 423 of the source/drain regions, the boron (B) which is an impurity in the gate electrodes 302, 304 of p-channel MOS transistor Tr2, Tr4 is suppressed from diffusing such that the characteristic deterioration is avoided. Consequently, it becomes possible to constitute a CMOS transistor structure where a severe characteristic of a transistor is demanded.

Furthermore, it has similar effects as those of aforementioned exemplified embodiments. In more detail, by using the sidewall 75 of a single layer structure composed of the third insulating film 73, metal silicide layers 44 of a refractory metal can be formed at the gate electrodes 301 to 304 of the CMOS transistors Tr1 to Tr4 and on the surfaces of the high impurity concentration regions 421 to 424 in the source/drain regions of an LDD structure on the side of the CMOS logic circuit portion 4. At the same time it becomes possible to avoid forming metal silicide layers of a refractory metal for the MOS transistors Tr5 to Tr7 on the side of the picture elements 2. Further, MOS transistors of an LDD structure can be constituted for the MOS transistor Tr5 to Tr7 on the side of picture elements 2.

In the CMOS logic circuit portions 4, 5, metal silicide layers of a refractory metal 44 are formed, so that the device can be designed with a fine structure and with a reduced parasitic resistance such that it becomes possible to realize a high speed operation and a reduction in power consumption. On the other hand, in the picture elements 2, metal silicide layers of a refractory metal are not formed, so that a junction leak current caused by the metal of a refractory metal in the MOS transistor is suppressed. Additionally, as the surfaces of the sensor portions are protected by the first and the second insulating films 71, 72, a defect such as plasma damage and a contamination is suppressed from being produced.

Consequently, both can be MOS transistors having source/drain regions of an LDD structure where one region is a CMOS logic circuit region having a CMOS transistor formed with a metal silicide layer of a refractory metal and the other region is an imager area having a MOS transistor formed without a metal silicide layer of a refractory metal being formed can be made into a same semiconductor chip. At the same time, the diffusion of the boron (B) which is an impurity in the gate electrode of the p-channel MOS transistor is avoided such that a p-channel MOS transistor where a severe characteristic of a transistor is established is obtained.

Next, a manufacturing method of a solid-state imaging device according to the exemplified embodiment will be described. FIG. 29 to FIG. 41 show manufacturing processes of a CMOS logic circuit 4 side where a metal silicide layer of a refractory metal is formed and FIG. 42 to FIG. 53 show manufacturing processes of one picture element 2 side where a metal silicide layer of a refractory metal is not formed. The processes of FIG. 29 to FIG. 41 correspond to the processes of FIG. 42 to FIG. 53 each other with respect to the processes.

Figure 29:
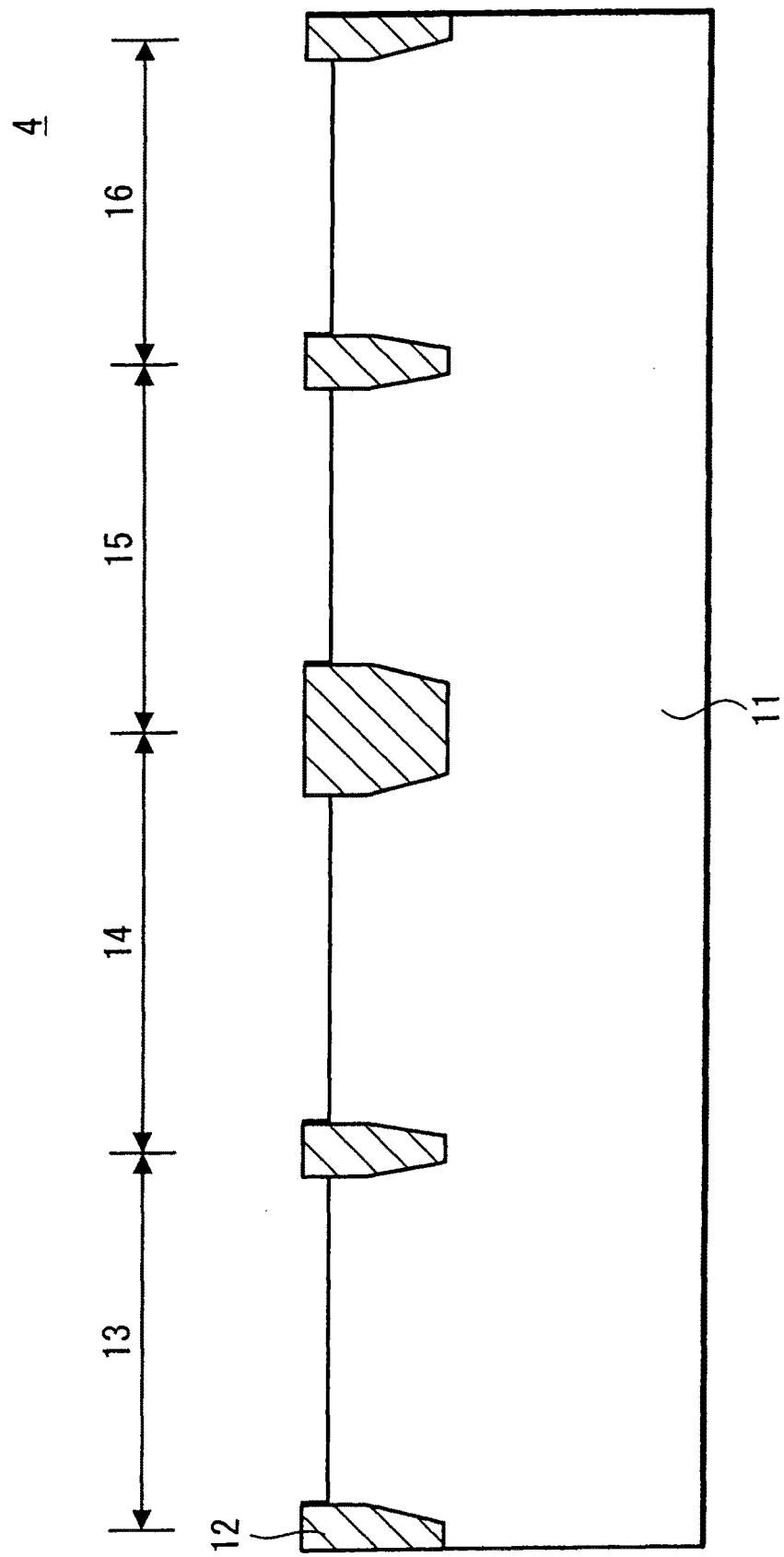
FIG. 29 to FIG. 41 are manufacturing process diagrams of a CMOS logic circuit portion corresponding to FIG. 27 showing another exemplified embodiment of a manufacturing method of a CMOS type solid-state imaging device.
Figure 42:
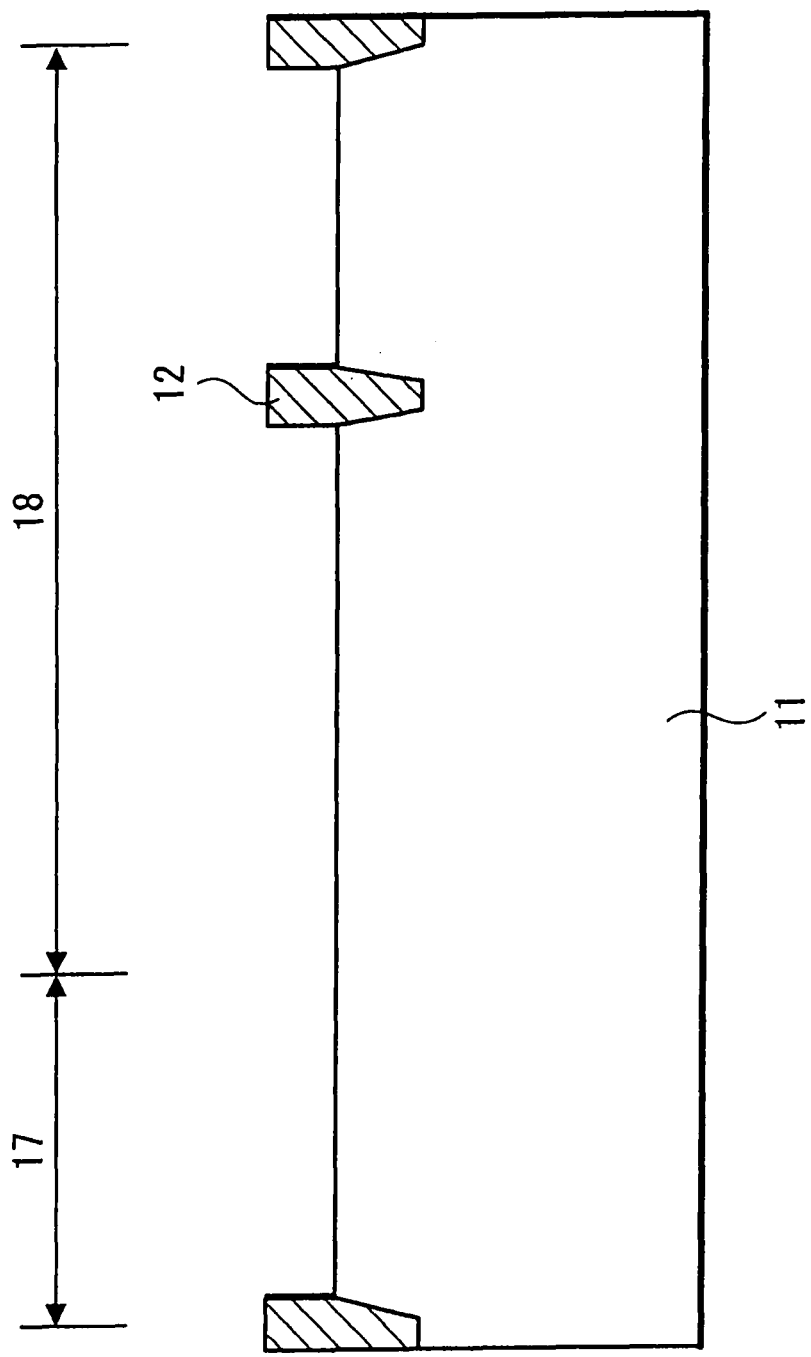
FIG. 42 to FIG. 54 are manufacturing process diagrams of a picture element portion corresponding to FIG. 28 showing another exemplified embodiment of a manufacturing method of a CMOS type solid-state imaging device.

First, as shown in FIG. 29 and FIG. 42, a common silicon semiconductor substrate 11 of a first conductivity type, that is, an n-type in this example of is provided and element separating regions 12 are formed in the semiconductor substrate 11. The element separating regions 12 are formed similarly as the aforementioned exemplified embodiment by forming grooves at the portions corresponding to the element separating regions through a mask made of, for example, a silicon nitride film (SiN film) formed on the surface of the semiconductor substrate 11, by coating a heat oxide films at the inner walls of the grooves, thereafter by burying the groves with silicon oxide films (e.g. CVD-SiO$_2$ films) and thereafter by removing the silicon nitride films. In the CMOS logic circuit portion 4, the element separating regions 12 are formed so as to form a first MOS transistor forming region 13, a second MOS transistor forming region 14, a third MOS transistor region 15 and a fourth MOS transistor region 16. (see FIG. 29) In the picture element 2, the element separating regions 12 are formed so as to form a sensor portion (photodiode) forming region 17 and a MOS transistor forming region 18. (see FIG. 42)

Figure 30:
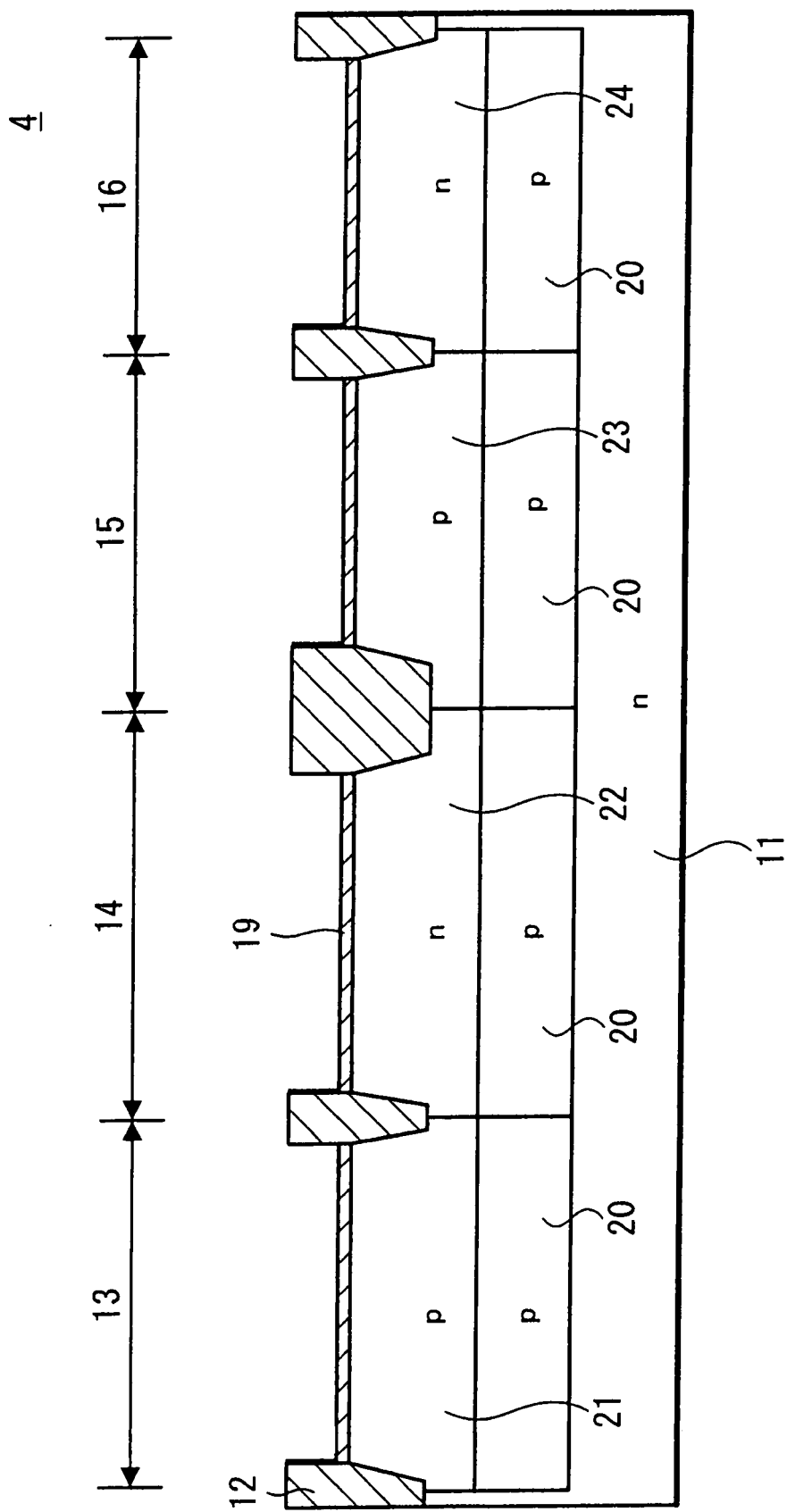
Figure 43:
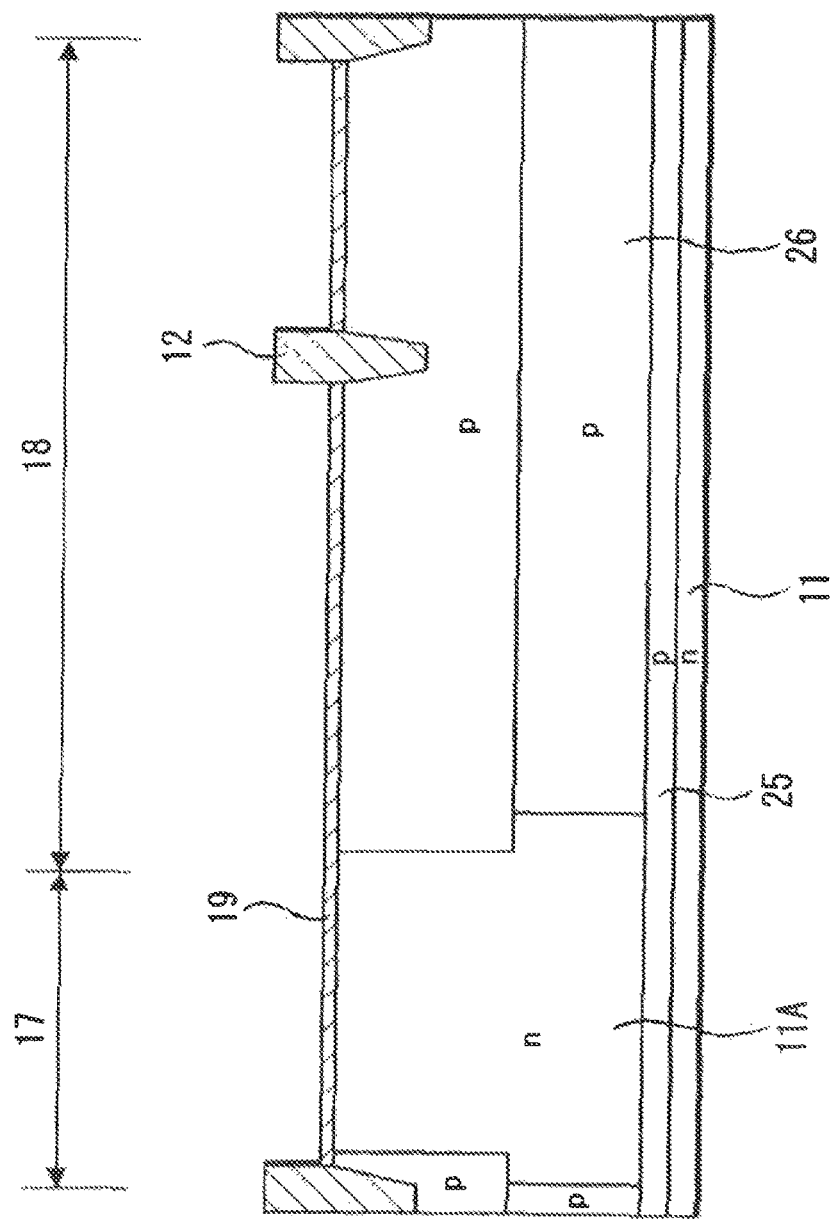

Next, as shown in FIG. 30 and FIG. 43, an insulating film for an ion injection, for example, a screen oxide film (SiO$_2$ film) 19 is formed on the semiconductor substrate 11 a semiconductor well region of a desirable conductive type by introducing a desirable impurity using an ion injection method. The semiconductor well regions can be formed by injecting to each of regions 13 to 18 with selected impurities to be injected and with selected injection conditions (injection energy, impurity concentration and the like) using a photo-resist method. On the side of the CMOS logic circuit portion 4, a second conductivity type, that is, p-type of and the same impurity concentration of semiconductor well regions 20 are formed, for example, at a deep position of each of the MOS transistor forming regions 13 to 16. Additionally, in the first and the third MOS transistor forming regions 13 and 15, p-type semiconductor well regions 21 and 23 which extend from the surface of the substrate to the p-type semiconductor well regions 20 are formed, and in the second and the fourth MOS transistor forming regions, n-type semiconductor well regions 22 and 24 are formed. In this case, it is allowed to form the p-type semiconductor well regions 20 by a single ion injection process at the same time with respect to the first to the fourth MOS transistor regions 13 to 16 or to form them individually with respect to each of p-type and n-type semiconductor well regions 21, 22, 23, 24. In the latter case, the masks for the ion injection of the semiconductor well region 21, 22, 23, 24 are commonly used such that it can save one mask for the ion injection. (see FIG. 30) On the side of the picture elements 2, the second conductivity type, that is, p-type of and the same impurity concentration of p-type semiconductor well regions 25 are formed at a deep position of the sensor portion forming region 17 and the MOS transistor forming region 18. Further, p-type semiconductor well regions 26, 27 are formed to a depth direction at a portion which separates the side of the MOS transistor forming region 18 and the sensor portion forming region 17. In the sensor portion forming region 17, an n-type semiconductor well regions 11A which is surrounded by the p-type well regions 25, 26 and 27 is formed by means of the n-type semiconductor substrate 11. (see FIG. 43)

Figure 31:
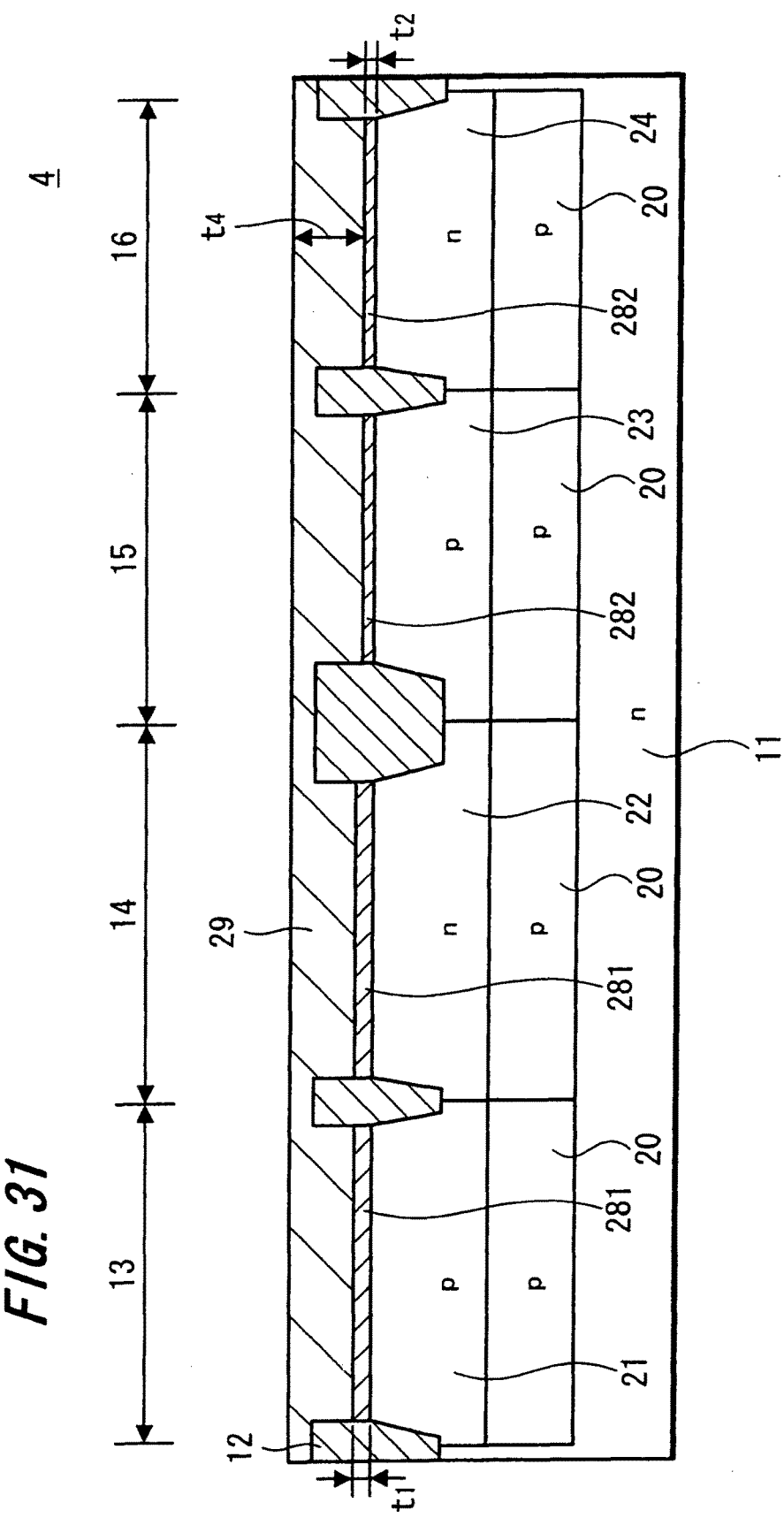
Figure 44:
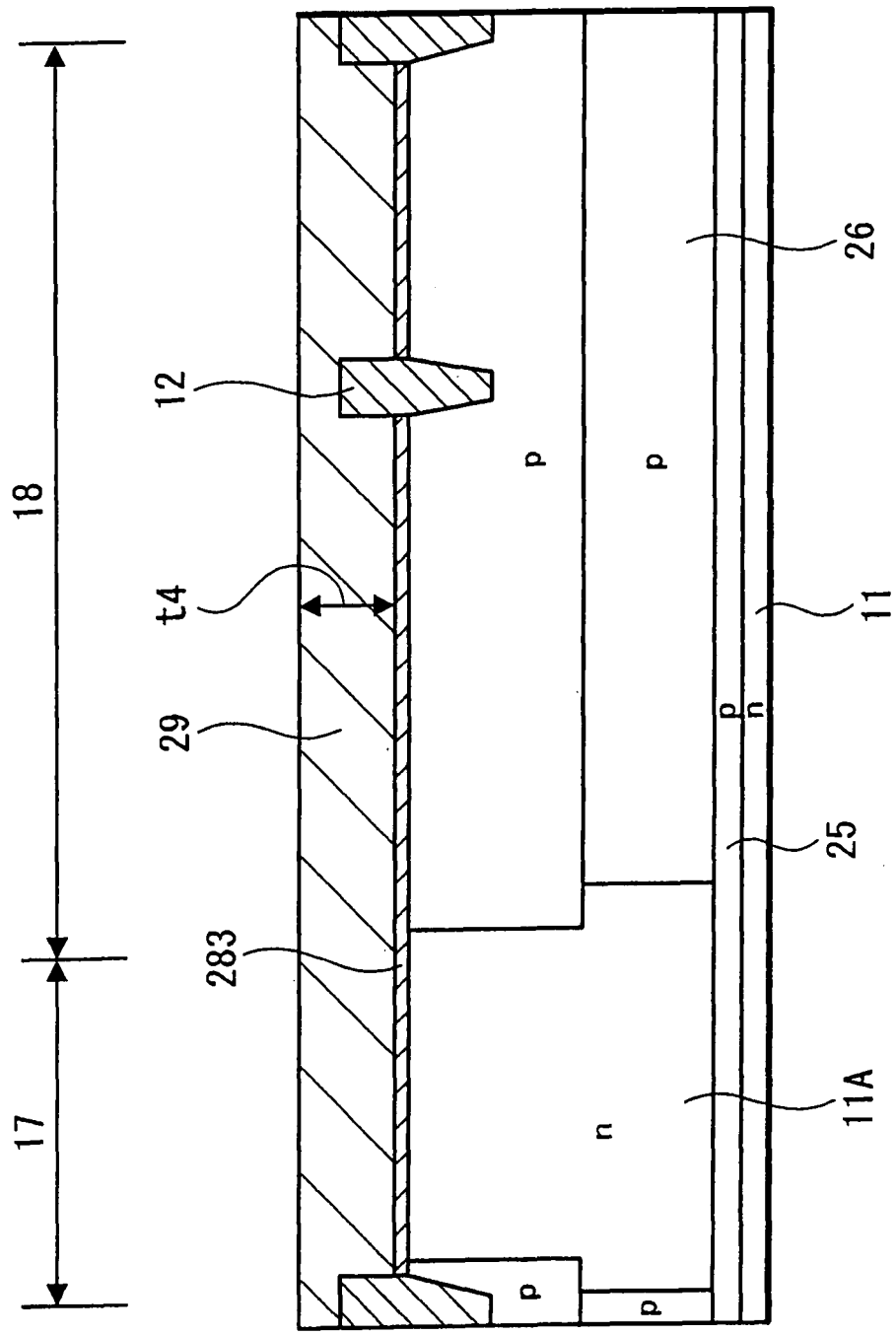

Next, as shown in FIG. 31 and FIG. 44, insulating films of desirable film thicknesses 28 [281, 282, 283] are formed on the regions 13 to 18 of the CMOS logic circuit portion 4 and the picture element 2 respectively and gate electrode material films 29 are formed on the gate insulating films 28. As the gate insulating films 28, for example, silicon oxide films (SiO$_2$ films) are used. As the gate electrode material films 29, for example, polycrystalline silicon films are used. On the side of the CMOS logic circuit portion 4, gate insulating films 281 of the same desirable film thickness t1, for example, of 5 nm thickness are formed on the first and the second MOS transistor forming regions 13 and 14; and gate insulating films 282 of the same desirable film thickness t2, for example, of 3 nm thickness are formed on the third and the fourth MOS transistor forming regions 15 and 16. (see FIG. 31) On the side of the picture elements 2, gate insulating films 283 of the same desirable film thickness t3, for example, of 3 nm thickness are formed on the sensor portion forming region 17 and the MOS transistor forming region 18. (see FIG. 44) The film thickness t4 of the gate electrode material films 29 can be selected as, for example, 200 nm.

Figure 32:
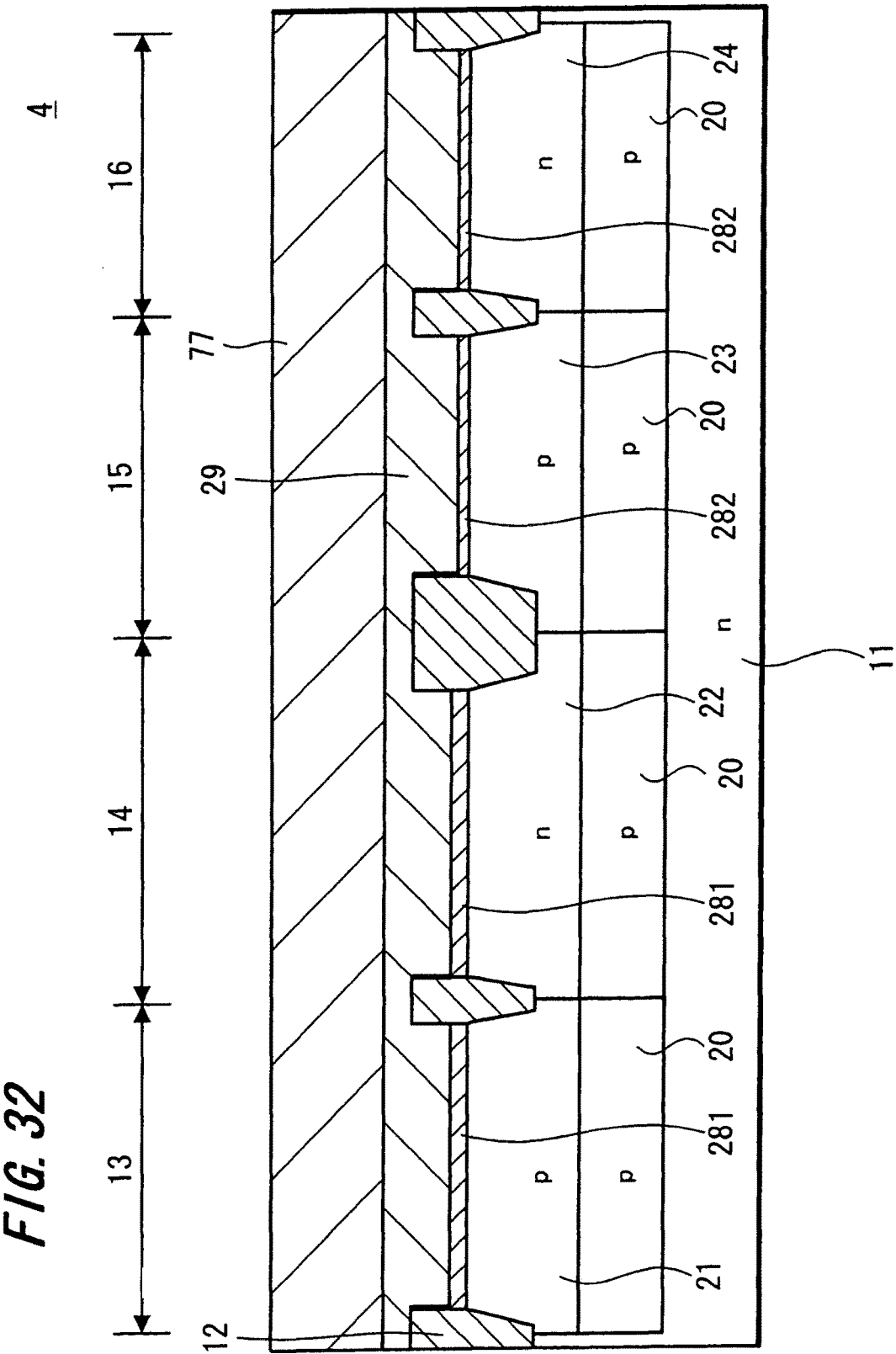
Figure 45:
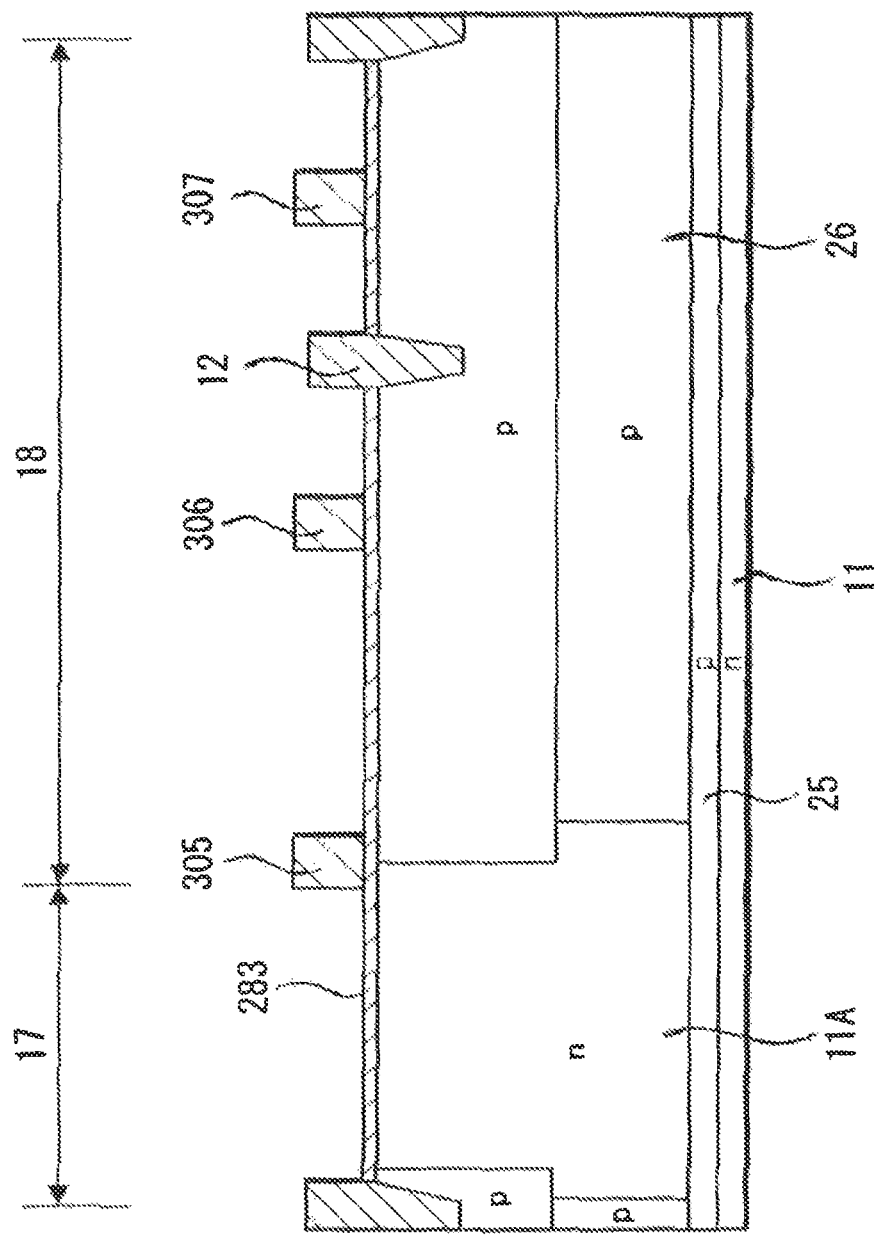

Next, as shown in FIG. 32 and FIG. 45, the gate electrode material films 29 are patterning processed by using, for example, a photo-resist method and an etching method, for example, a dry etching method and gate electrodes 30 [305, 306, 307] of MOS transistors to be formed on the side of the picture elements 2 are selectively formed. On the side of the picture elements 2, gate electrodes 305, 306 and 307 are formed at positions corresponding to the MOS transistor forming regions 18. (see FIG. 45) On the side of the CMOS logic circuit portion 4, the photo-resist mask 77 remains on the gate electrode material film 29, so that the gate electrode material film 29 is not etched. (see FIG. 32)

Figure 33:
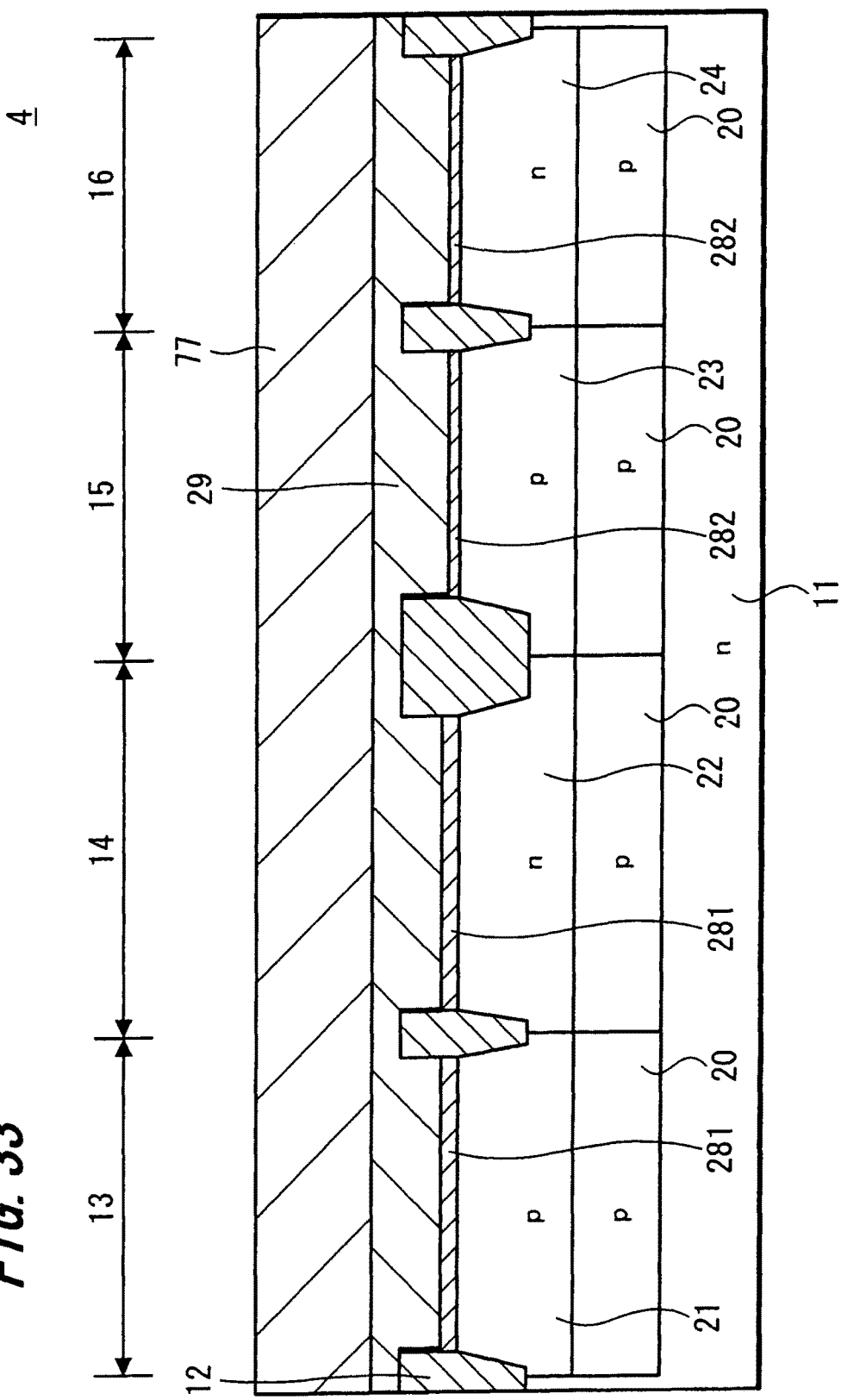
Figure 46:
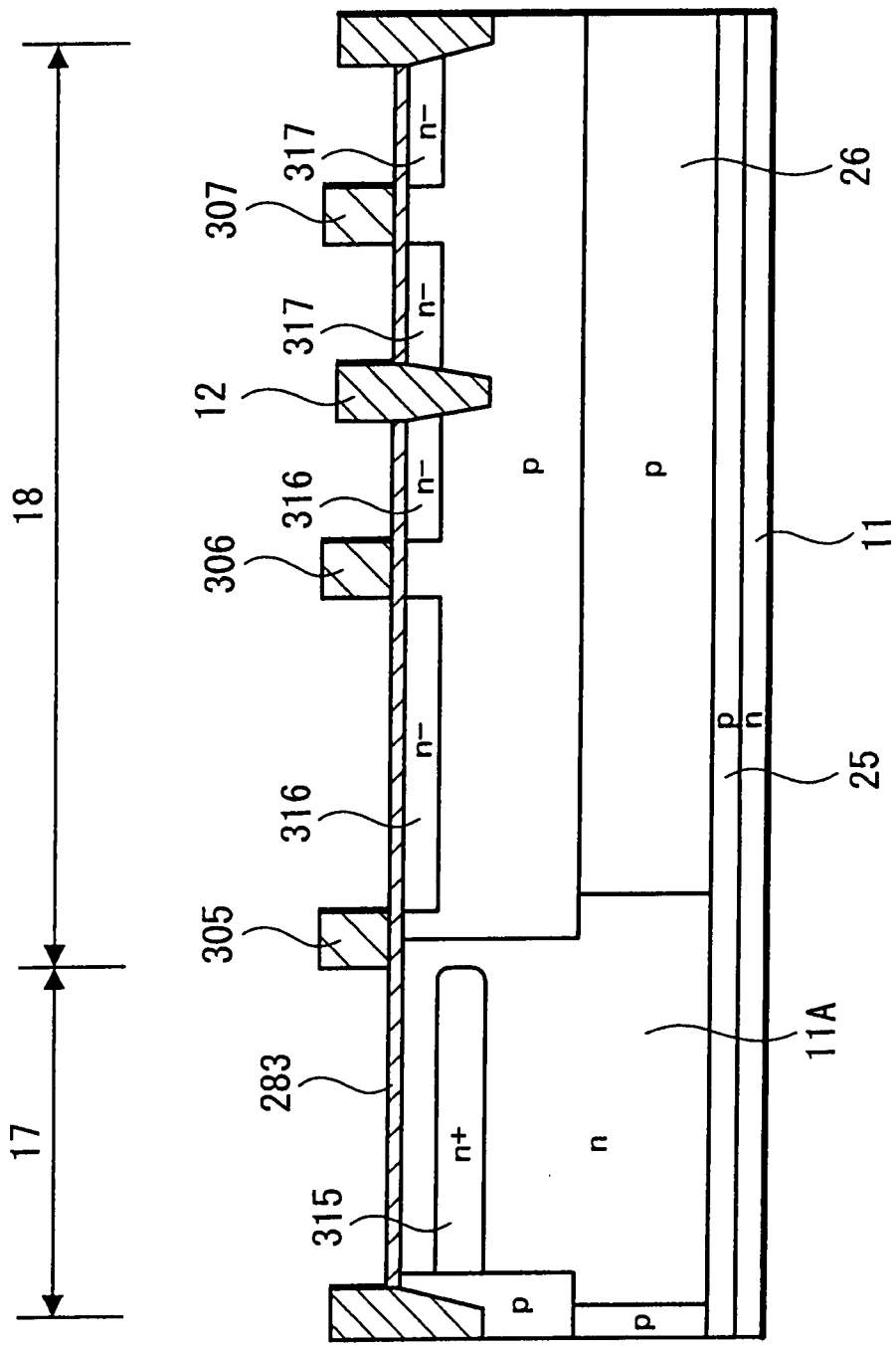

Next, as shown in FIG. 33 and FIG. 46, desirable impurities are introduced by an ion injection method to the regions on the side of the picture elements 2 using the element separating region 12 and the gate electrodes 30 [305 to 307] as masks respectively and impurity introducing regions 31 [315, 316, 317] of desirable conductive types are formed. On the side of the picture element 2, an impurity introducing region, that is, an n-type semiconductor region 315 constituting a photodiode is formed in the n-region (corresponding to the n-type semiconductor substrate) 11A of the sensor portion forming region 17. Additionally, impurity introduced regions, that is, n⁻ regions 316, 317 of a low impurity concentration which constitute an LDD structure are formed in the p-type semiconductor well region 27. (see FIG. 46) On the side of the CMOS logic circuit portion 4, the photo-resist mask 77 is coated and formed, so that the impurity is not introduced. (see FIG. 33)

Figure 34:
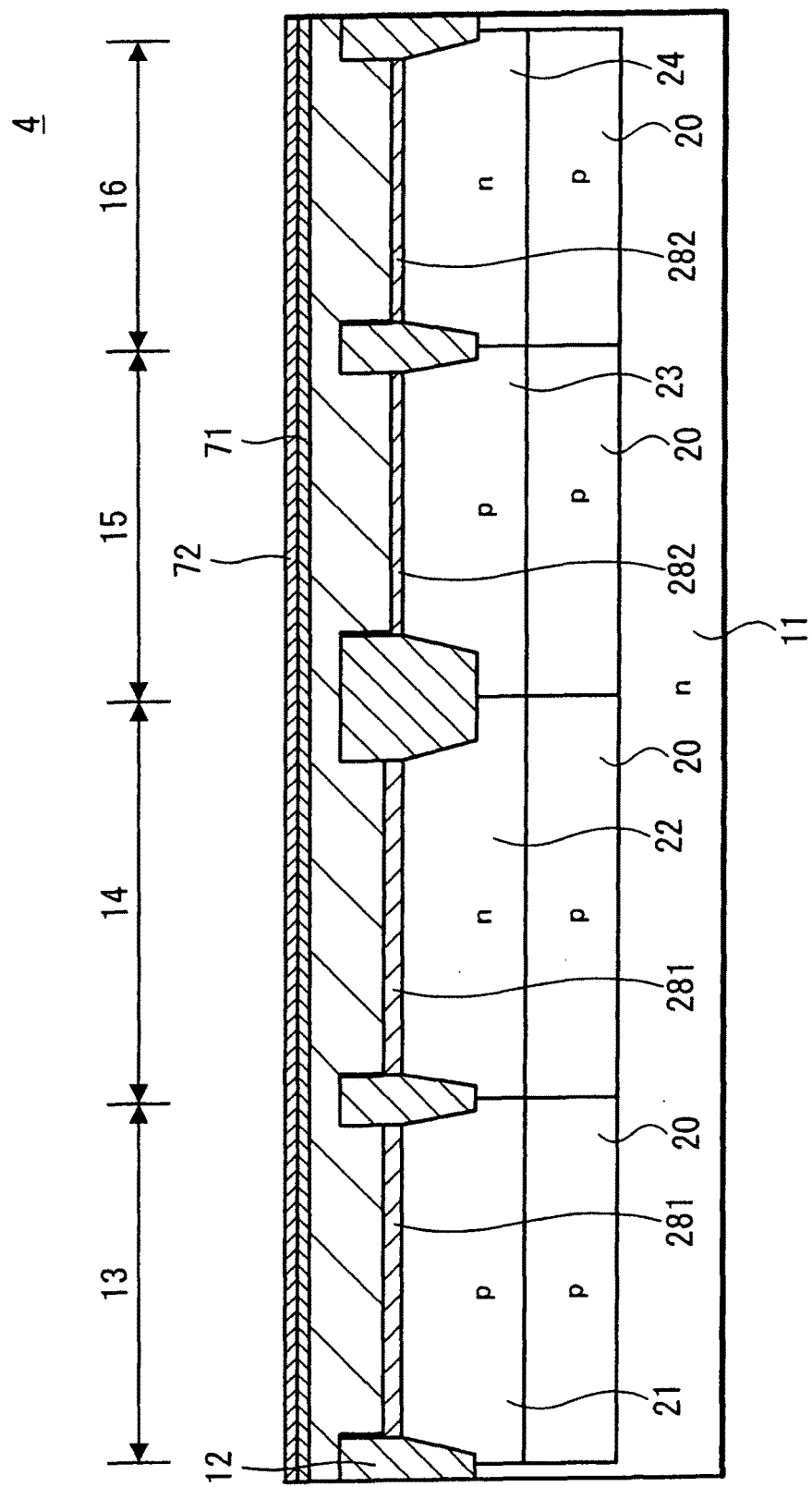
Figure 47:
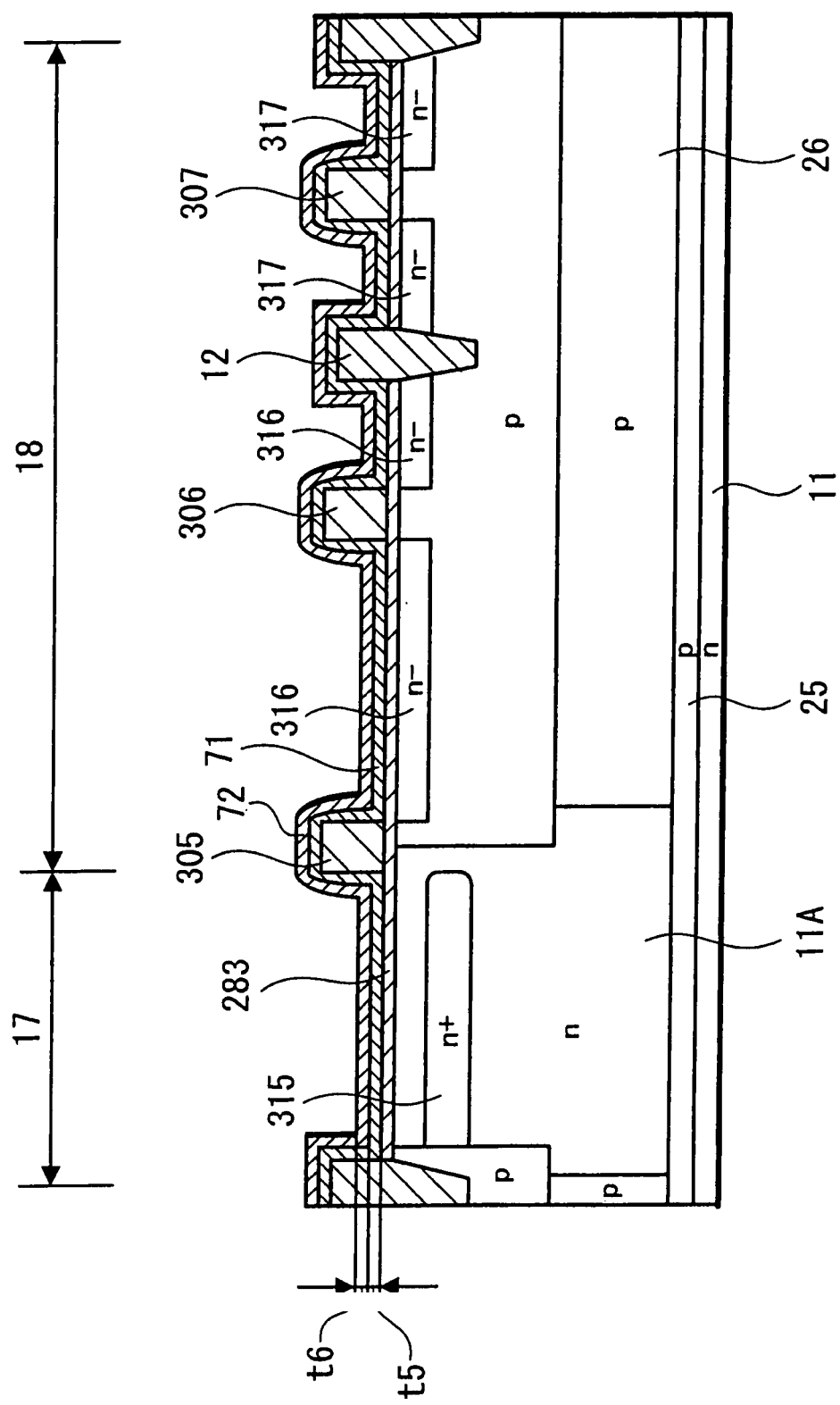

Next, as shown in FIG. 34 and FIG. 47, first insulating films 71 and second insulating films 72 of film thicknesses t5, t6 respectively are formed successively on the upper surfaces of the gate electrode material films 29 on the side of the CMOS logic circuit portion 4 and on the whole surface of the semiconductor substrate 11 including the gate electrodes 30 [305 to 307] on the side of the picture elements 2. It is possible to use, for example, silicon oxide films (SiO$_2$ films) as the first insulating films 71. It is possible to use, for example, silicon nitride films which have a different etching rate from that of the silicon oxide films as the second insulating films 72. It is possible to select the film thickness t5 of the first insulating film 71 as, for example, approximately 10 nm and the film thickness t6 of the second insulating film 72 as, for example, approximately 30 nm.

Figure 35:
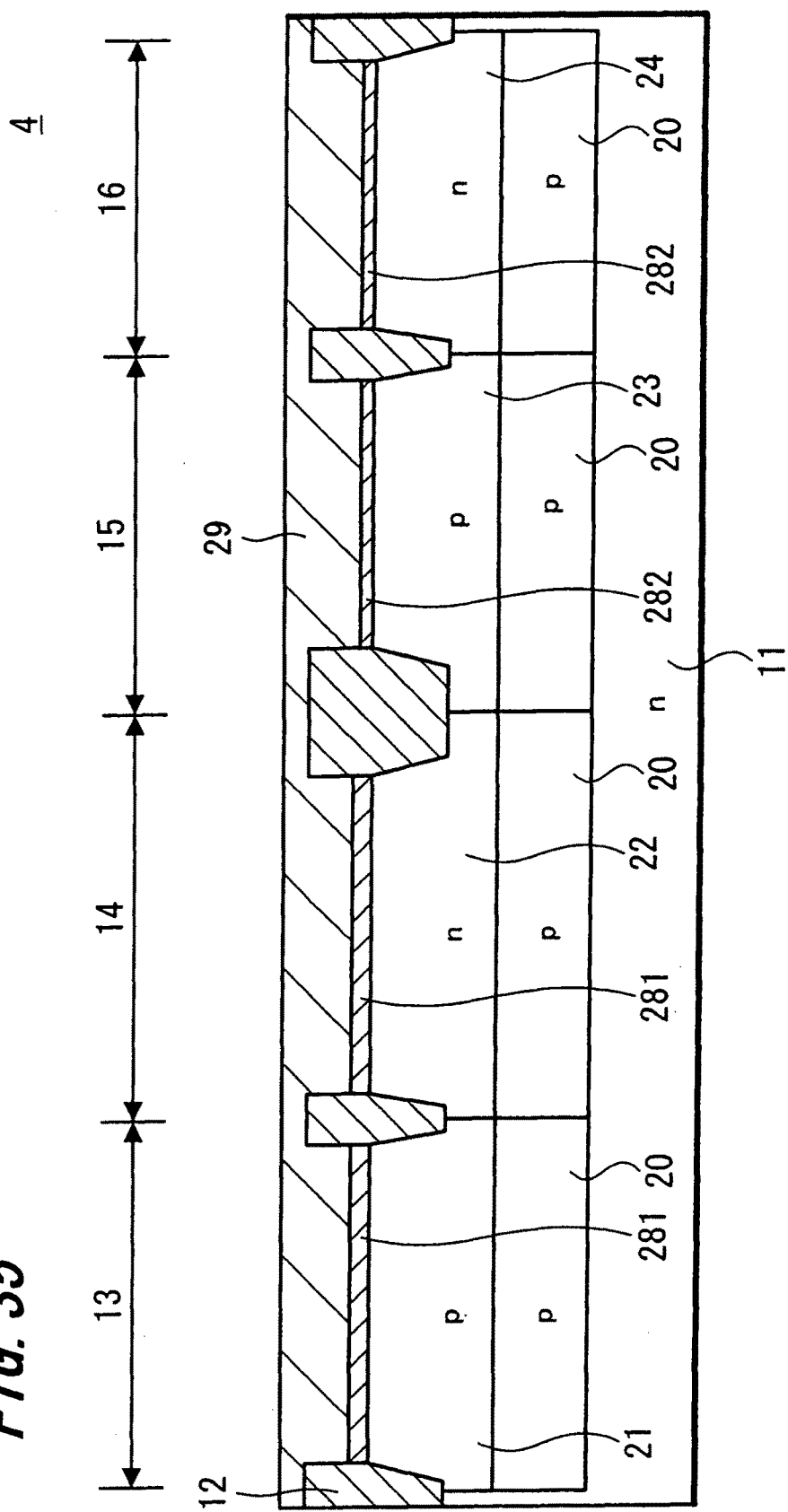
Figure 48:
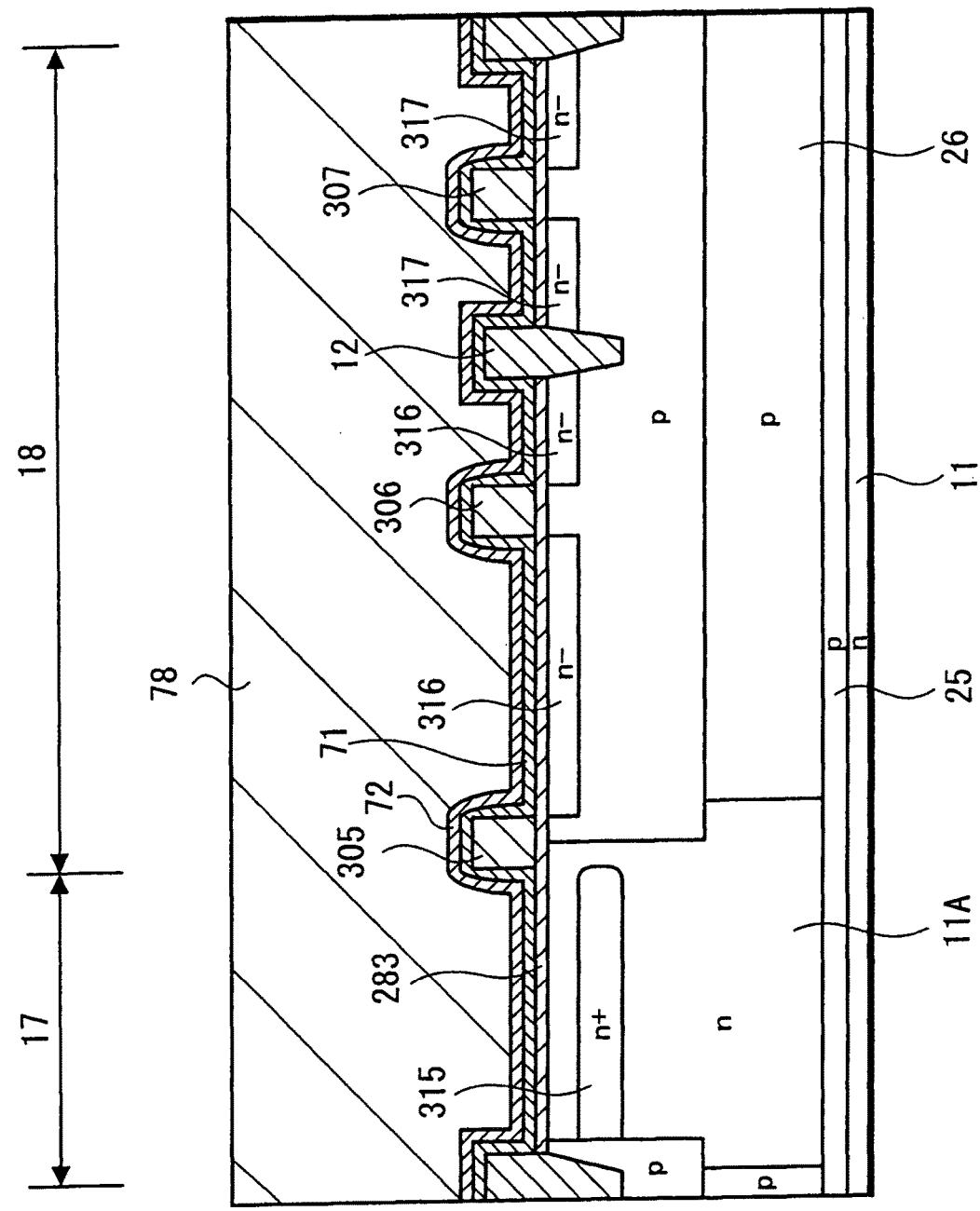

Next, as shown in FIG. 35 and FIG. 48, photo-resist masks 78 are formed selectively on the second insulating films 72 on the side of the picture elements 2 and in this condition the first and second insulating films 71 and 72 on the side of the CMOS logic circuit portion 4 are etching processed using an etchback method such that the gate electrode material films 29 are exposed. (see FIG. 35) In the region on the side of the picture elements 2, the first and second insulating films 71 and 72 are protected by the photo-resist mask 78 and remain without being removed by etching. (see FIG. 48)

Figure 36:
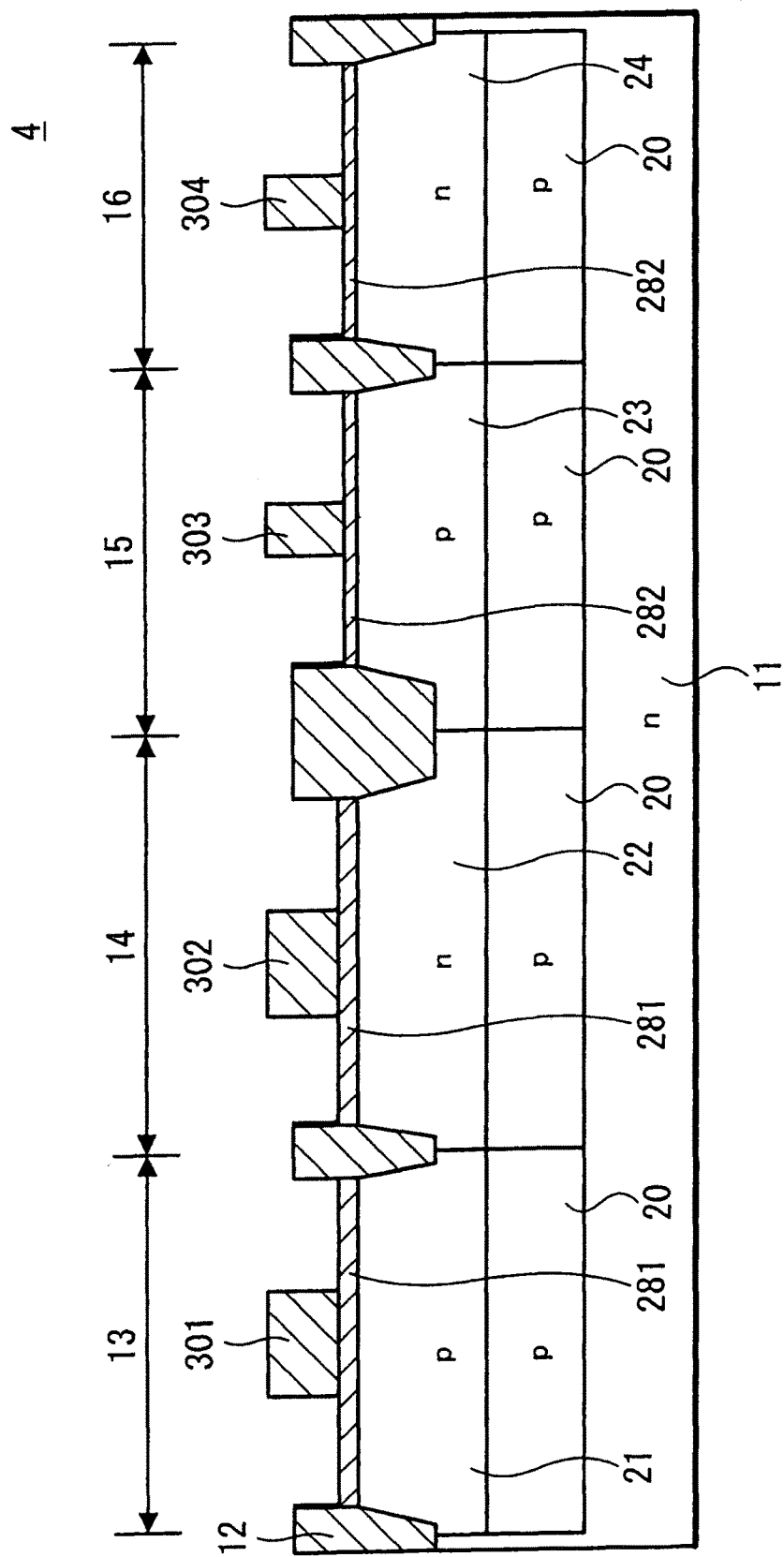
Figure 49:
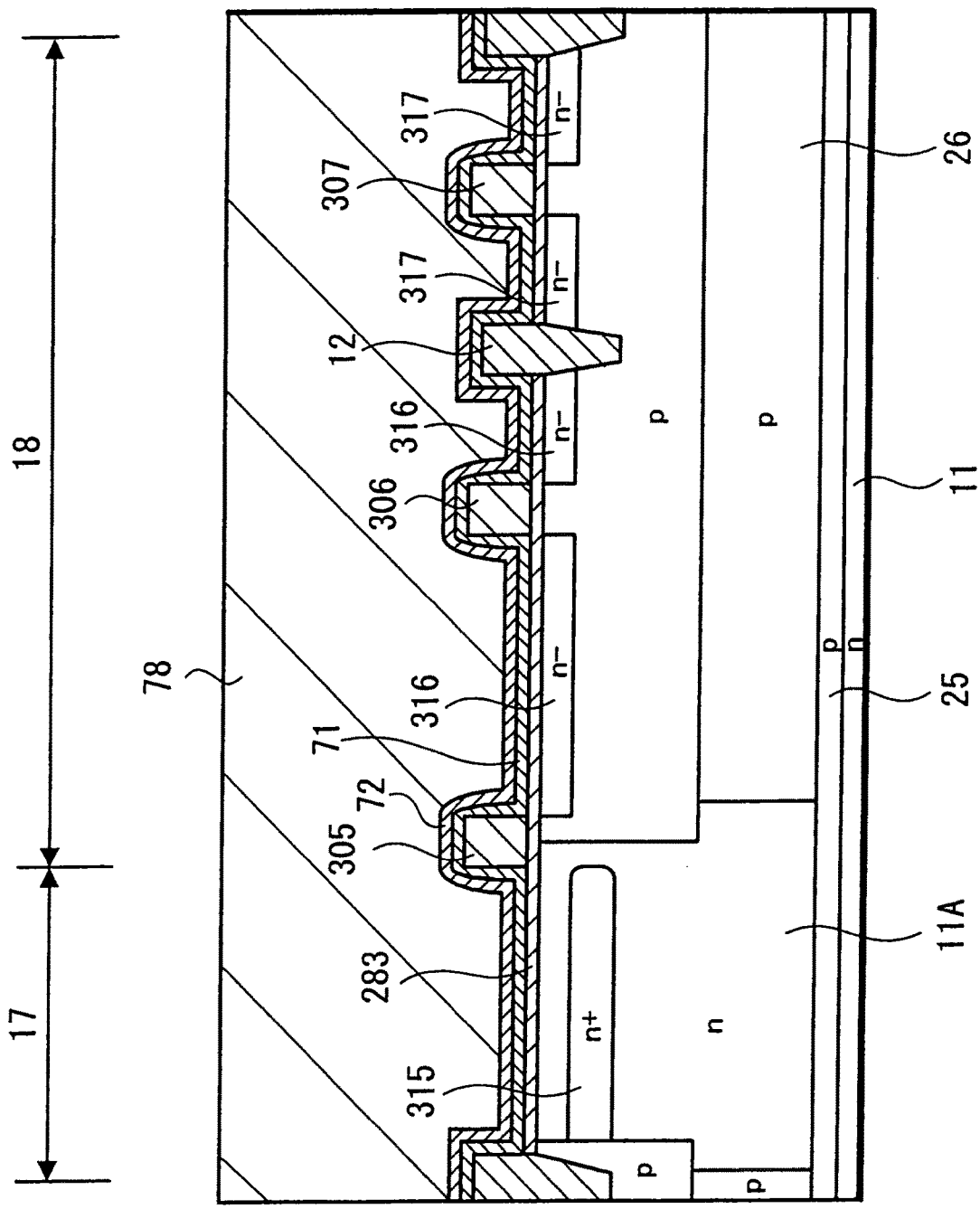

Next, as shown in FIG. 36 and FIG. 49, the gate electrode material films 29 on the side of the CMOS logic circuit portion 4 are patterning processed by using, for example, a photo-resist method and an etching method, for example, a dry etching method and gate electrodes 30 [301 to 304] are formed. On the side of the CMOS logic circuit portion 4, there are formed a gate electrode 301 at a position corresponding to the first MOS transistor forming region 13, a gate electrode 302 at a position corresponding to the second MOS transistor forming region 14, a gate electrode 303 at a position corresponding to the third MOS transistor forming region 15 and a gate electrode 304 at a position corresponding to the fourth MOS transistor forming region 16 respectively. In this example similarly as the aforementioned exemplified embodiment, for taking a characteristic designing into a consideration, the gate length of the gate electrode 301 and 302 in the first and second MOS transistor forming regions 13 and 14 are selected larger than the gate length of the gate electrode 303 and 304 in the third and fourth MOS transistor forming regions. (see FIG. 36)

Figure 37:
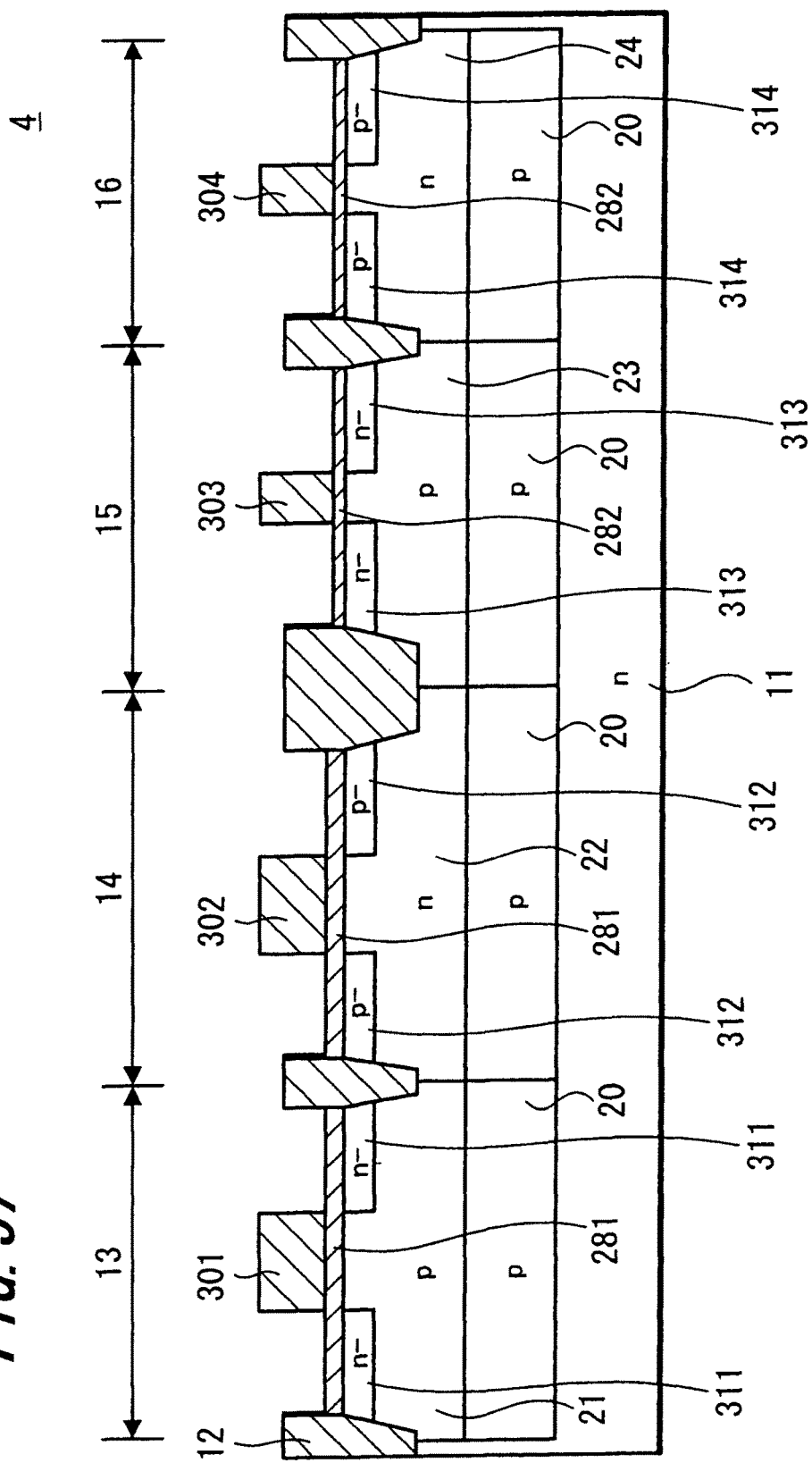
Figure 50:
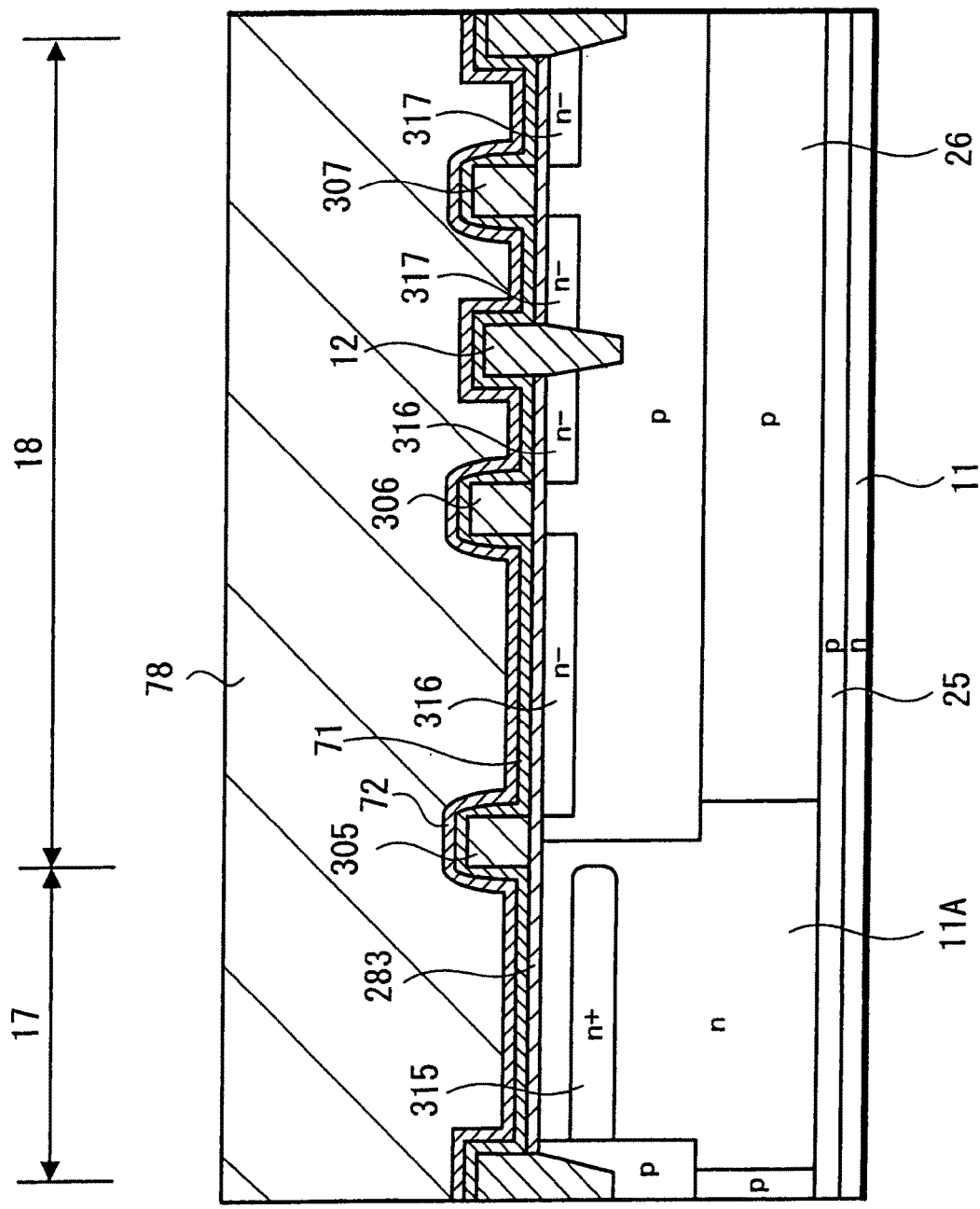

Next, as shown in FIG. 37 and FIG. 50, desirable impurities are introduced by an ion injection method with respect to the side of the CMOS logic circuit portion 4 using the element separating regions 12 and the gate electrodes 30 [301 to 304] as masks respectively and impurity introducing regions 311, 312, 313, 314 of desirable conductive types are formed. The impurity introducing regions 311 to 314 can be formed by injecting to each of regions with selected impurities to be injected and with selected injection conditions (injection energy, impurity concentration and the like) using a photo-resist method. On the side of the CMOS logic circuit portion 4, there are formed impurity introducing regions, that is, $n^-$ regions 311, 313 of low impurity concentration constituting LDD structures in the first and third p-type semiconductor well regions 21 and 23 and impurity introducing regions, that is, $p^-$ regions 312, 314 of low impurity concentration constituting LDD structures in the second and fourth n-type semiconductor well regions 22 and 24. (see FIG. 37) On the side of the picture elements 2, etching is not conducted, because it is protected by the photo-resist mask 79. (see FIG. 50)

Figure 38:
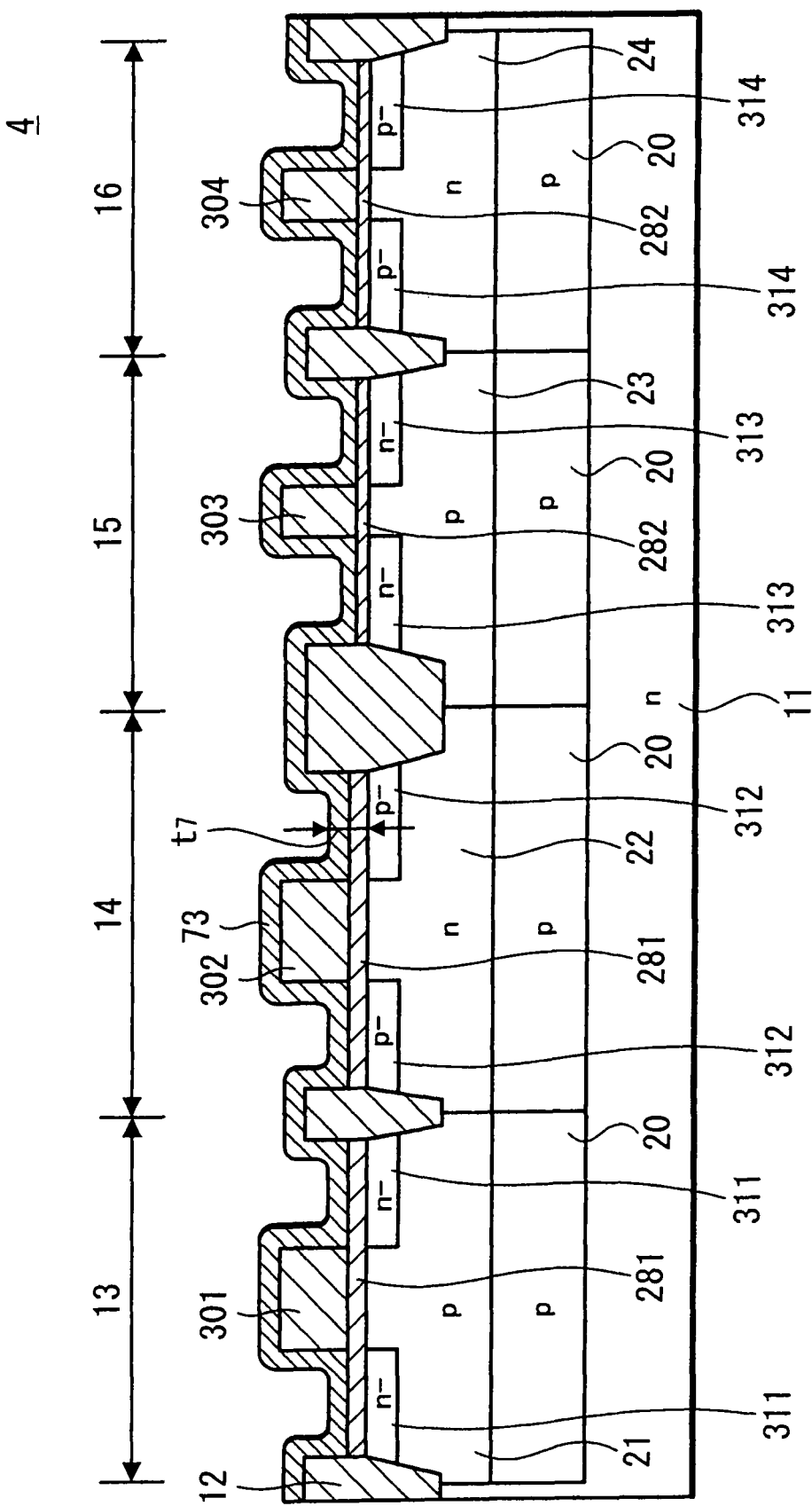
Figure 51:
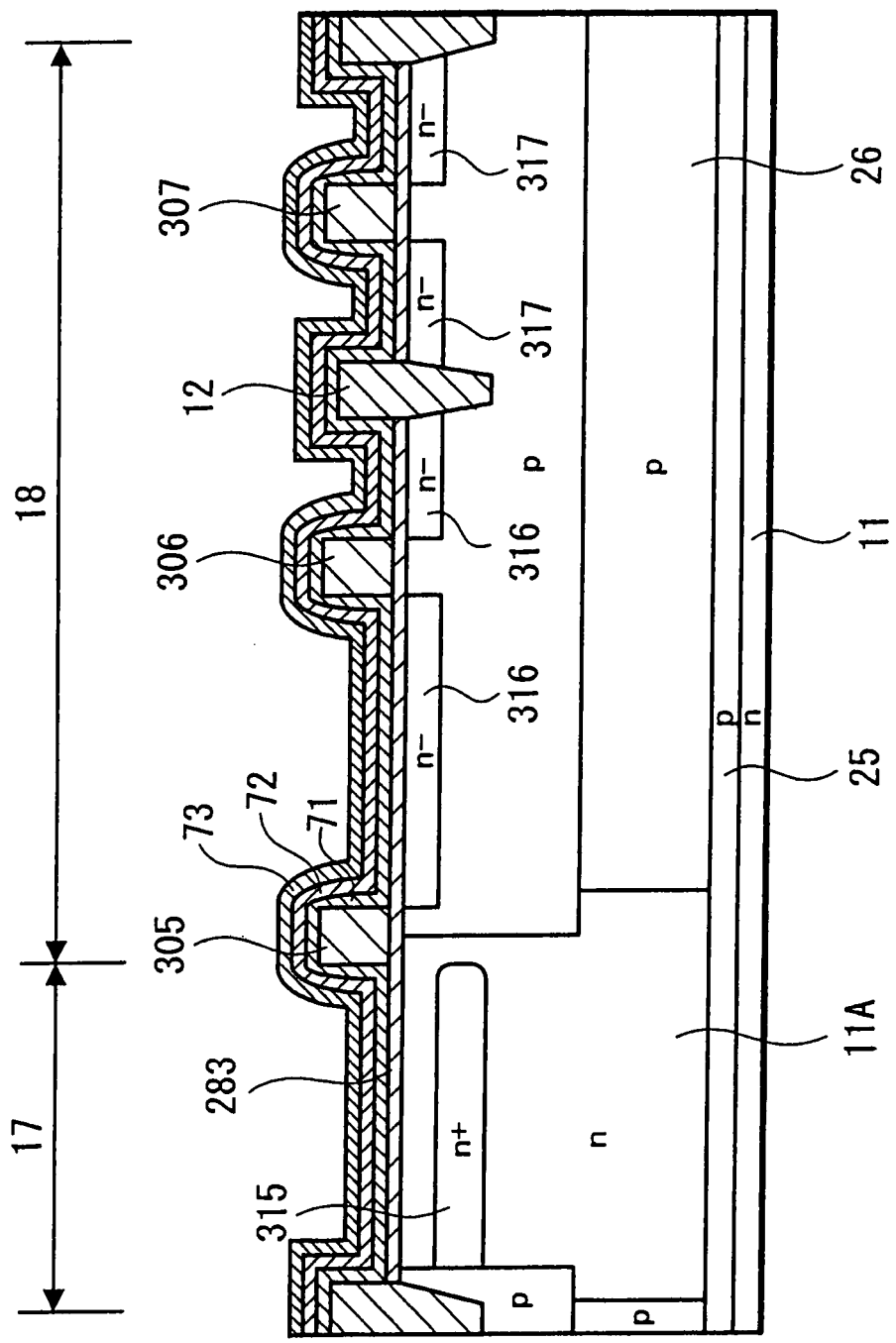

Next, as shown in FIG. 38 and FIG. 51, the third insulating films 73 are formed on the whole surfaces of the substrates on the side of the CMOS logic circuit portion 4 and on the side of the picture elements 2. It is possible to use, for example, silicon oxide films ($SiO_2$ film) which have a different etching rate from that of the second insulating films 72 as the third insulating films 73. It is possible to select the film thickness t7 of the third insulating film 73 as, for example, approximately 100 nm.

Figure 39:
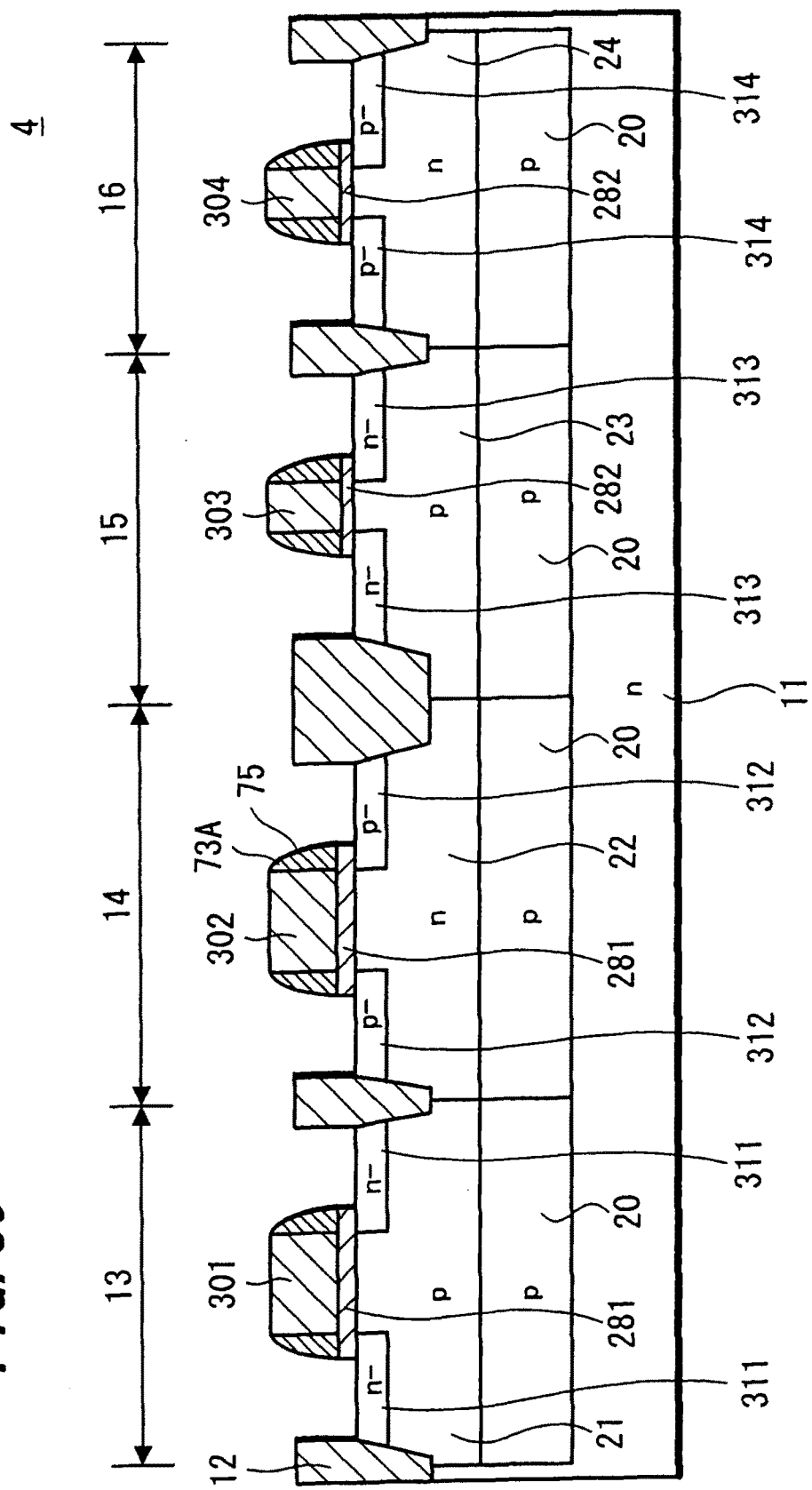
Figure 52:
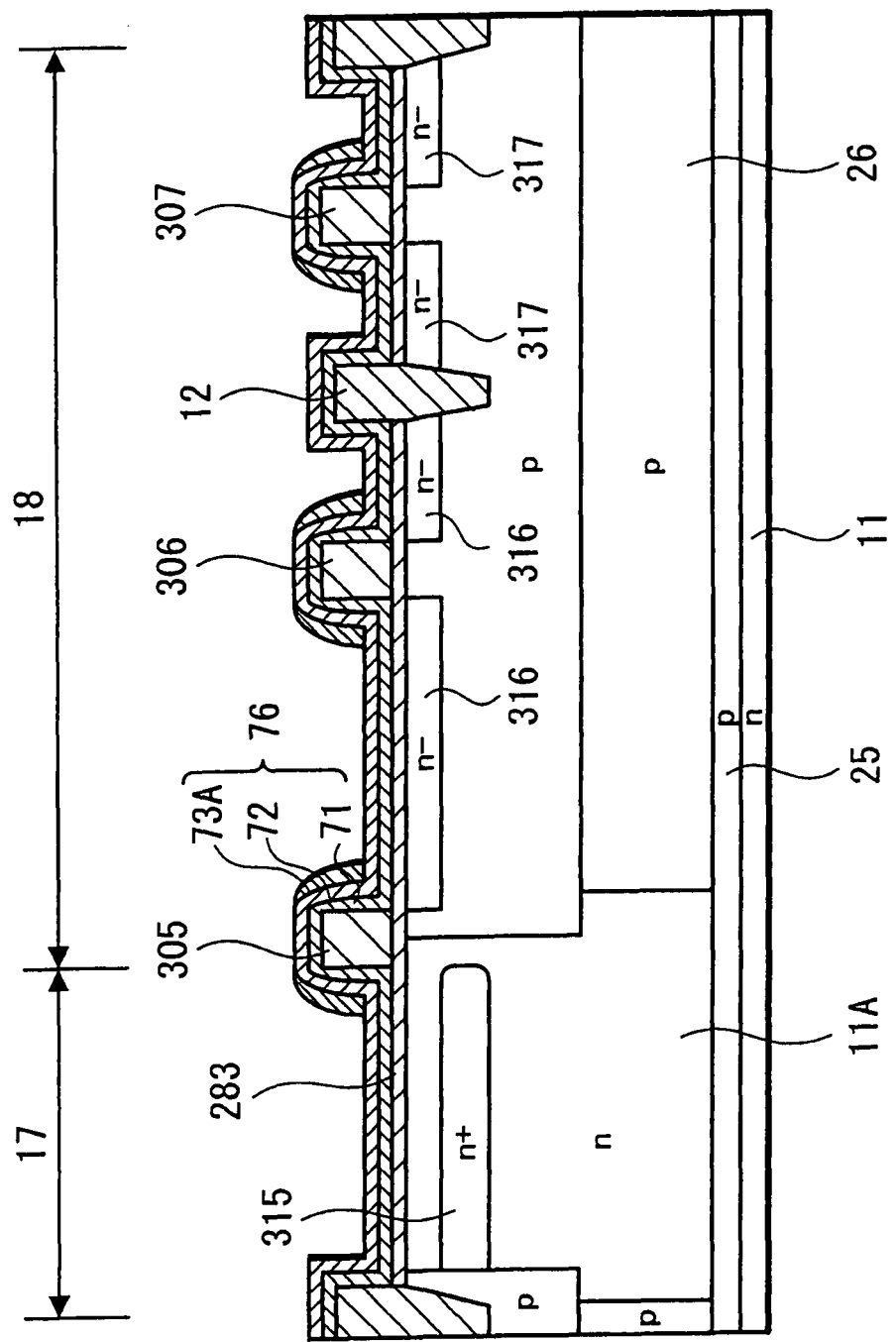

Next, as shown in FIG. 39 and FIG. 52, the third insulating films 73 are etching processed using an etchback method such that sidewall portions 73A are formed on the side walls of the gate electrodes 301 to 307 respectively on the side of the at the CMOS logic circuit portion 4 and on the side of the picture elements 2. In this way, sidewalls 75 of a single layer structure composed of the third insulating films 73A are formed on the gate electrodes 301 to 304 respectively on the side of the CMOS logic circuit portion 4. (see FIG. 39) Additionally, on the side of the picture elements 2, only the third insulating films 73 are etchback, because the second insulating films 72 become etching stoppers such that the first and second insulating films 71 and 72 will not be removed. Consequently, sidewalls 76 of a 3-layer structure composed of the first, second and third insulating films 71, 72 and 73A are formed on the side walls of the gate electrodes 305 to 307 respectively. (see FIG. 52)

Figure 40:
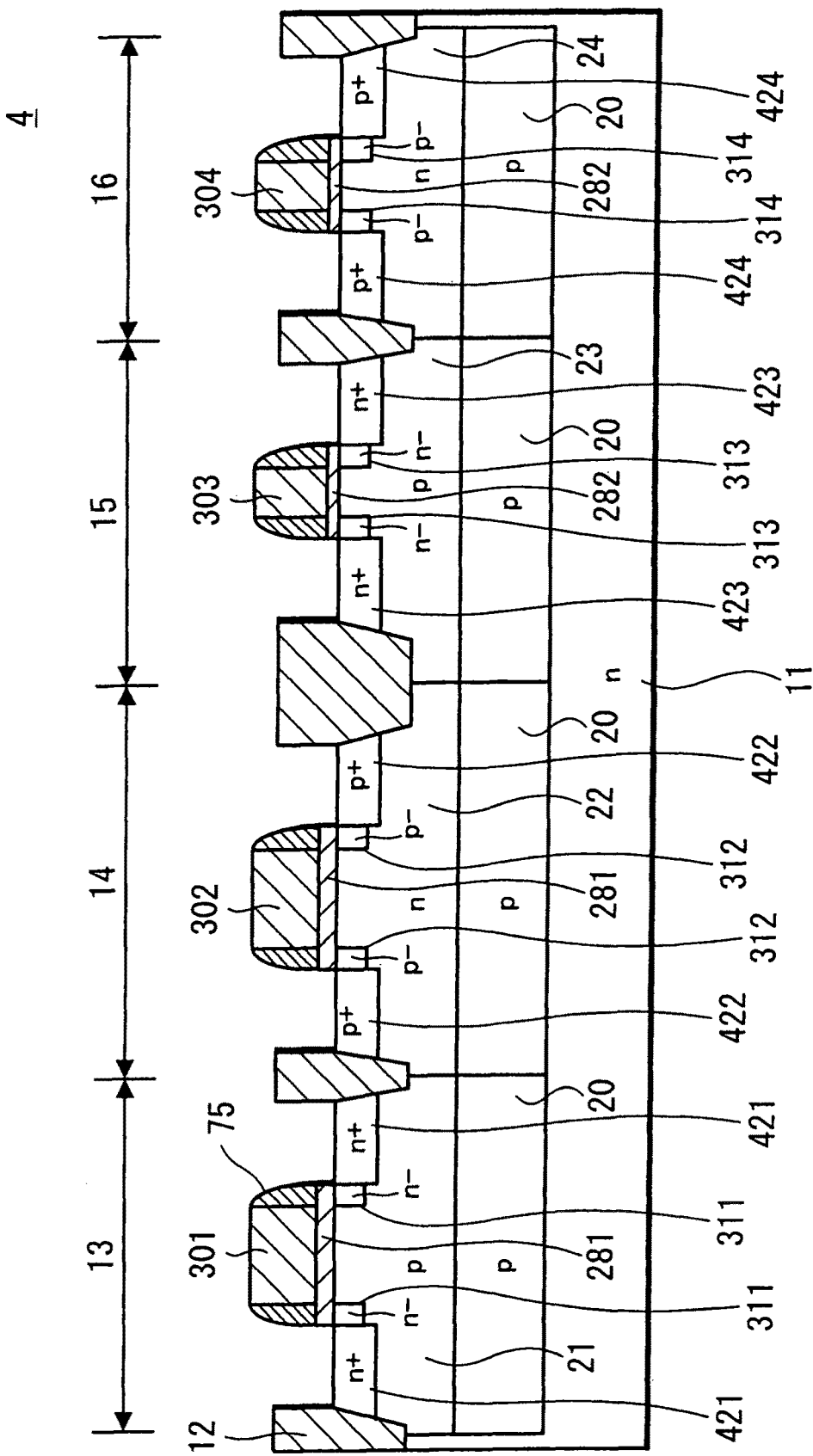
Figure 53:
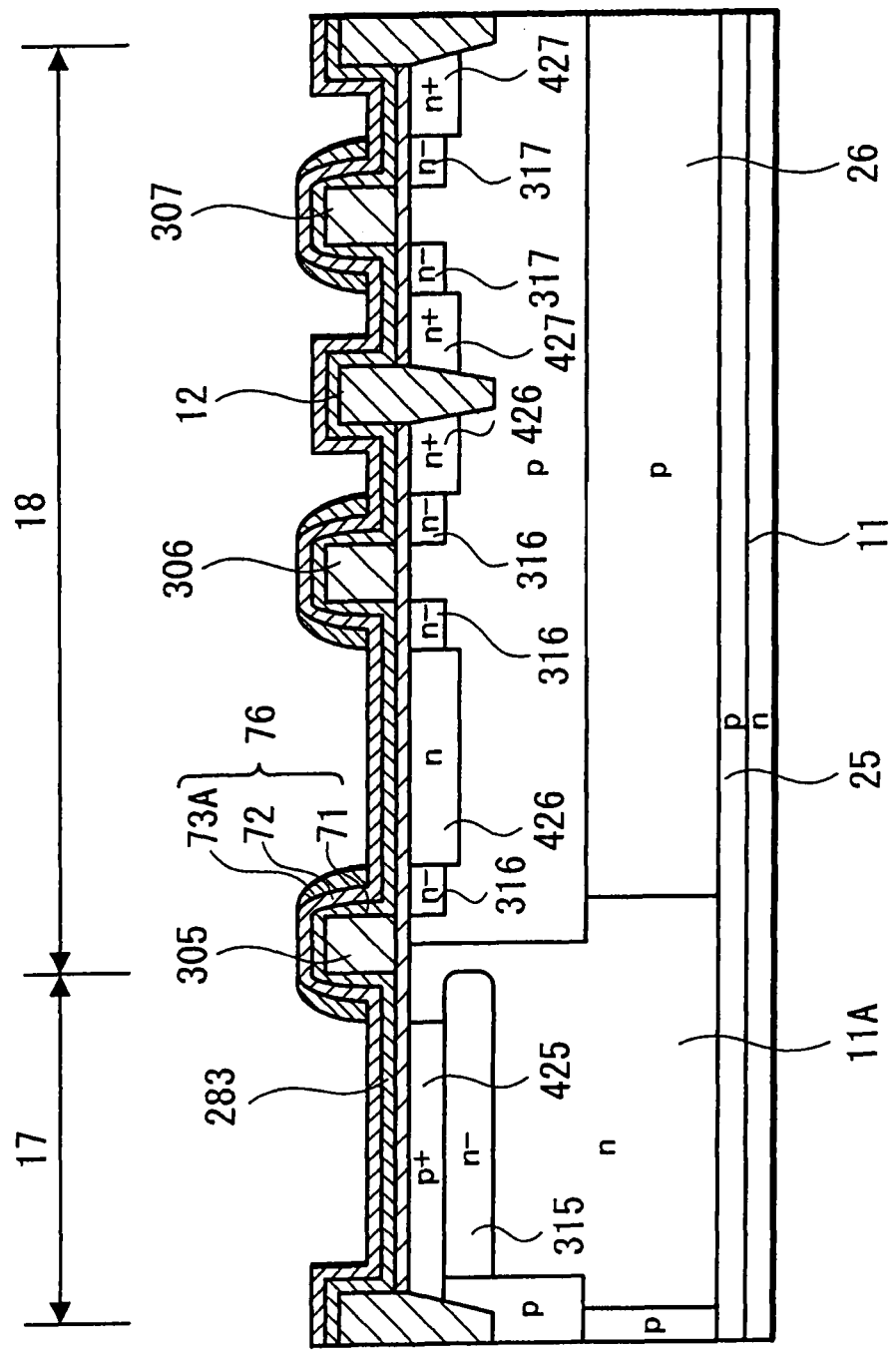

Next, as shown in FIG. 40 and FIG. 53, in the regions on the side of the CMOS logic circuit portion 4 and on the side of the picture elements 2, desirable impurities are introduced by an ion injection method using the gate electrodes 301 to 307 and sidewalls 75, 76 as masks and impurity introduced regions 42 [421, 422, 423, 424, 425, 426, 427] of desirable conductive types which will become source/drain regions and HADs (Hole Accumulation Diodes) are formed. The impurity introducing regions 42 can be formed by injecting to each of the regions with selected impurities to be injected and with selected injection conditions (injection energy, impurity concentration and the like) using a photo-resist method. On side of the CMOS logic circuit portion 4, $p^+$ source/drain regions 421 and 423 of a high impurity concentration are formed in the p-type semiconductor well regions 21 and 23, and $n^+$ source/drain regions 422 and 424 of a high impurity concentration are formed in the n-type semiconductor well region 22 and 24. P-type source/drain regions of an LDD structure are formed by a $p^+$ region 311 and a $p^+$ region 421 and by a $p^-$ region 313 and a $p^+$ region 423 respectively. N-type source/drain regions of an LDD structure are formed by an $n^-$ region 312 and an $n^+$ region 422 and by an n region 314 and an $n^+$ region 424 respectively. (see FIG. 40) When the impurity is introduced, the impurity is also introduced in the gate electrodes 301 to 304 of the polycrystalline silicon such that conductivity is given. For example, boron (B) is introduced to the gate electrodes 302, 304 on the side of the p-channel MOS transistor and phosphorus (P) is introduced to the gate electrodes 301, 303 on the side of the n-channel MOS transistor. On the side of the picture elements 2, a $p^+$ semiconductor region (hole storage region) 425 which is an impurity introducing region of a high concentration for forming a buried photodiode, that is, a so called a HAD (Hole Accumulation Diode) is formed on the surface of the sensor portion forming region 17 for the purpose of more reducing a junction leak current. Additionally, $n^+$ source/drain regions 426, 427 of a high impurity concentration are formed in the MOS transistor forming region. 18. N-type source/drain regions of an LDD structure are formed by an $n^-$ region 316 and an $n^+$ region 426 and by an $n^-$ region 317 and an $n^+$ region 427 respectively. (see FIG. 53)

In the MOS transistor forming region 18 on the side of the picture elements 2, the first insulating film 71 and the second insulating film 72 are formed on its surface, and when, for example, the film thickness of the first insulating film 71 is selected as 10 nm and the film thickness of the second insulating film 72 is selected as 30 nm, it is possible to form $n^+$ source/drain regions 426, 427 by selecting the ion injection energy for forming source/drain regions of a high impurity concentration as 20 keV or more in case that the injected ion is, for example, phosphorus (P).

Figure 41:
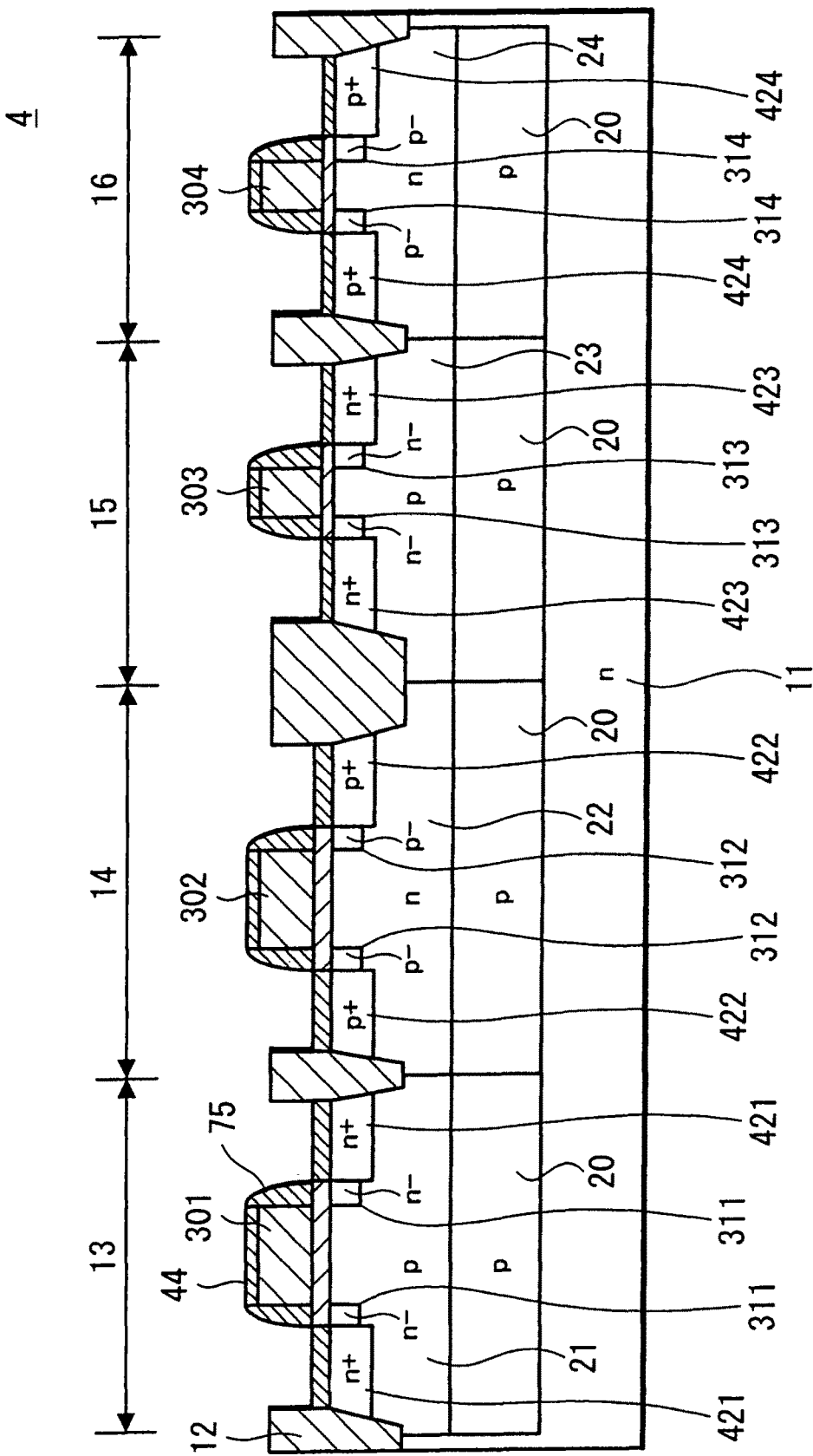
Figure 54:
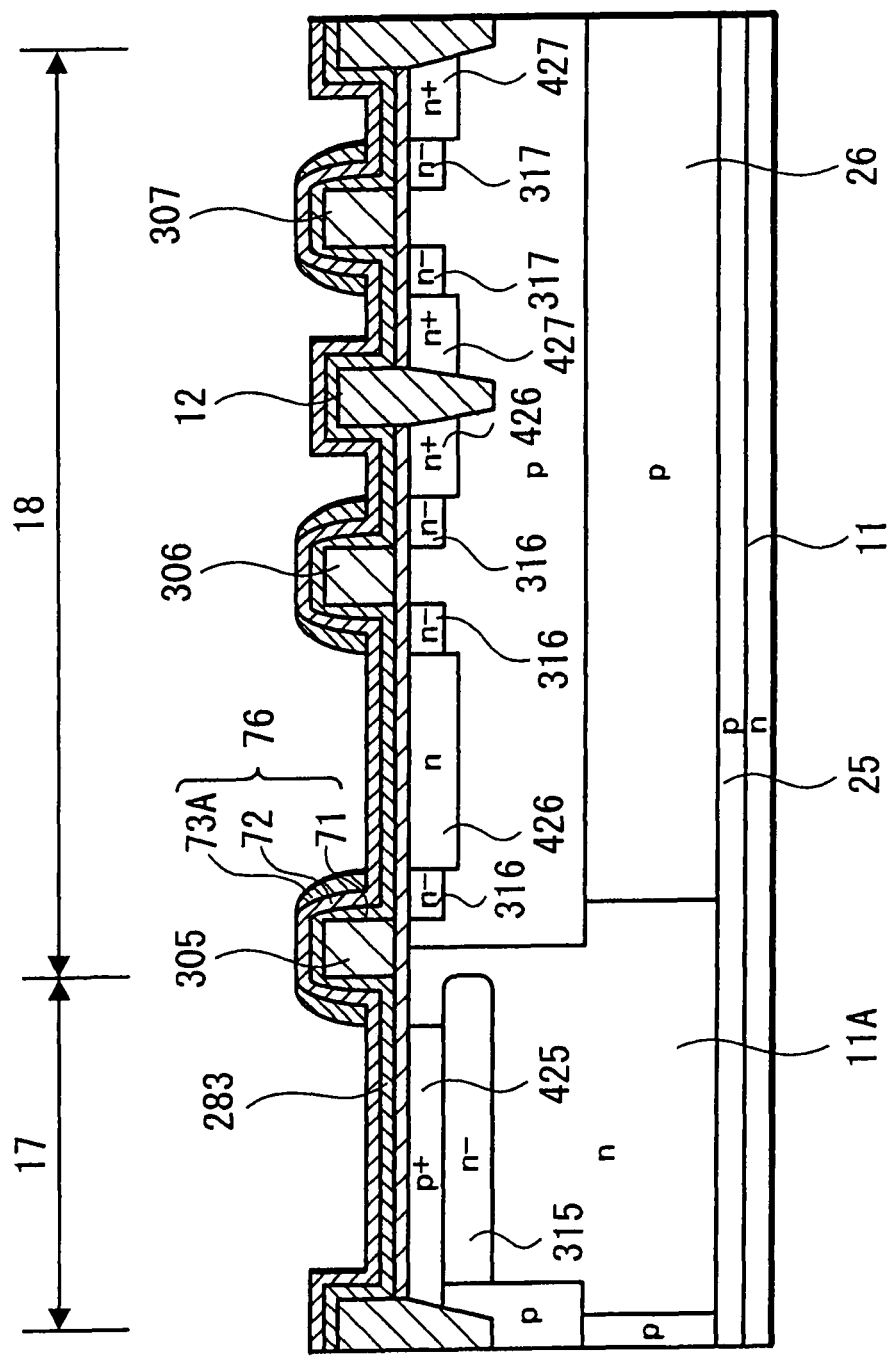

Next, as shown in FIG. 41 and FIG. 54, metal silicide layers 44 of a refractory metal are formed by a salicide method on the gate electrodes 301 to 304 composed of polycrystalline silicon and on the $p^+$ source/drain regions 421 to 424 on the side of the CMOS logic circuit portion 4. (see FIG. 41) On the other hand, as the first and second insulating films 71 and 72 are formed on the side of the picture element 2, metal silicide layers 44 of a refractory metal will not be formed thereat. As to a metal of a refractory metal, for example, Co, Ti, Mo, Ni, W and the like can be used. In this example Co silicide layers are formed.

On the side of the CMOS logic circuit portion 4, a CMOS transistor structure is formed by an n-channel MOS transistor Tr1 formed in the first p-type semiconductor well region 21 and a p-channel MOS transistor Tr2 formed in the second n-type semiconductor well region 22, and a CMOS transistor structure is formed by an n-channel MOS transistor Tr3 formed in the third p-type semiconductor well region 23 and a p-channel MOS transistor Tr4 formed in the fourth n-type semiconductor well region 24. On the side of the picture element 2, a sensor portion 45 is formed. In this example, the sensor portion 45 is constituted as an HAD sensor by the p$^+$ semiconductor region 425 and the n-type semiconductor region 315 and by the n-type semiconductor well region 11A and the p-type semiconductor well region 425.

Thereafter, a wiring process, an on-chip lens forming process and a color filter forming process are performed according to a conventional technique relating to a CMOS type solid-state imaging device. According to the above mentioned processes, an aimed CMOS type solid-state imaging device can be obtained where CMOS transistors having metal silicide layers 44 of a refractory metal are formed only on the side of the CMOS logic circuit portion 4 while metal silicide layers 44 of a refractory metal are not formed on the side of the picture element 2.

In the above example, an n-type semiconductor substrate is used as the common semiconductor substrate 11, but it should be noted that a p-type common semiconductor substrate 11 can be used in case of other semiconductor devices. Further, it is possible to form the semiconductor regions opposite to those of the above example respectively.

Further, in the above example, the source/drain region is made as an LDD structure for the p-channel MOS transistor Tr2 on the side of the CMOS logic circuit portion 4, but it is also possible to form it other than making the source/drain region as an LDD structure, that is, taking a form of eliminating a p$^-$ region 312.

According to the exemplified embodiment, at the respective MOS transistors of an LDD structure on the side of the CMOS logic circuit portion 4, sidewalls 75 of a single layer structure made of insulating films other than silicon nitride films, which are silicon oxide films 73 (third insulating films) in this example, are formed. Additionally, an impurity of a high concentration is ion injected to the gate electrode of the polycrystalline silicon. For example, boron (B) impurity is ion injected on the side of the p-channel MOS transistor and phosphorus (P) impurity is ion injected on the side of the n-channel MOS transistor. In this way, sidewalls 75 of silicon oxide films other than silicon nitride films are formed, so that when an activating annealing process is performed after introducing an impurity, diffusion of boron (B) in the substrate is suppressed with respect to the gate electrodes where especially boron (B) is introduced. Consequently, a p-channel MOS transistor of an excellent transistor characteristic can be formed. With respect to the gate electrode to which phosphorus (P) is introduced, it is difficult for the phosphorus (P) to diffuse in the substrate.

Further, this exemplified embodiment also has similar effects as those mentioned above. In more detail, it is possible to manufacture a CMOS type solid-state imaging device where metal silicide layers 44 of a refractory metal are not formed on the side of the picture elements 2 and metal silicide layers of a refractory metal are formed only on the side of the CMOS logic circuit portions 4, 5. Furthermore, both MOS transistors on the side of the CMOS logic circuit portions 4, 5 and MOS transistors on the side of the picture elements 2 can be formed in the source/drain regions of an LDD structure. On the side of the picture elements 2, the surfaces of the first and the second insulating films 71, 72 are protected when the metal silicide layer 44 of a refractory metal is formed, so that it becomes possible to avoid forming metal silicide layers of a refractory metal on the side of the picture elements 2. When etchingback the third insulating film 73 on the side of the picture elements 2, it is possible to make the second insulating film 72 operate as an etching stopper, so that the surface of the silicon substrate of the sensor portion will not be exposed to the plasma such that the silicon substrate is avoided from the damage and a defect such as a plasma damage and a contamination is suppressed from being produced. Further, as similar as explained in connection with aforementioned FIG. 26, an effect of reflection prohibition can be obtained by selecting the condition such as film thicknesses of the film structures having interlayer insulating films (silicon nitride films) of the first insulating film 71, second insulating film 72, wirings thereon and the like. Consequently, a CMOS logic circuit portion 4 where the parasitic capacitance is reduced with a high speed operation and with low power consumption can be attained. At the same time, it becomes possible to make the picture elements 2 of a low junction leak current, that is, an imager portion of a high picture quality reduced with a noise level into a same semiconductor chip with the logic circuit portion of a high speed and low power consumption.

Figure 55:
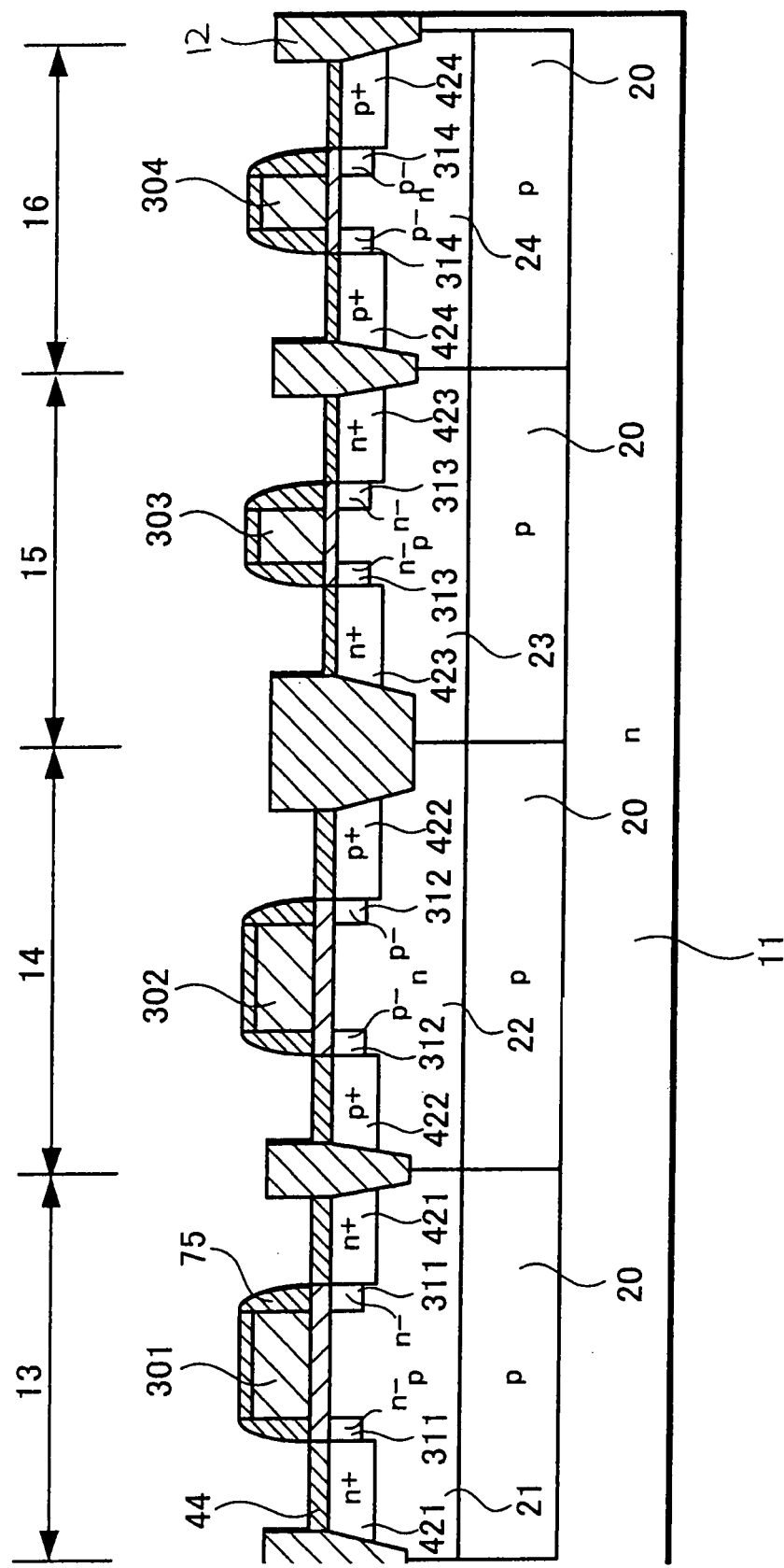
FIG. 55 is a cross-sectional view of a picture element portion showing another exemplified embodiment of a semiconductor device according to the present invention, which is applied to a CMOS type solid-state imaging device.
Figure 56:
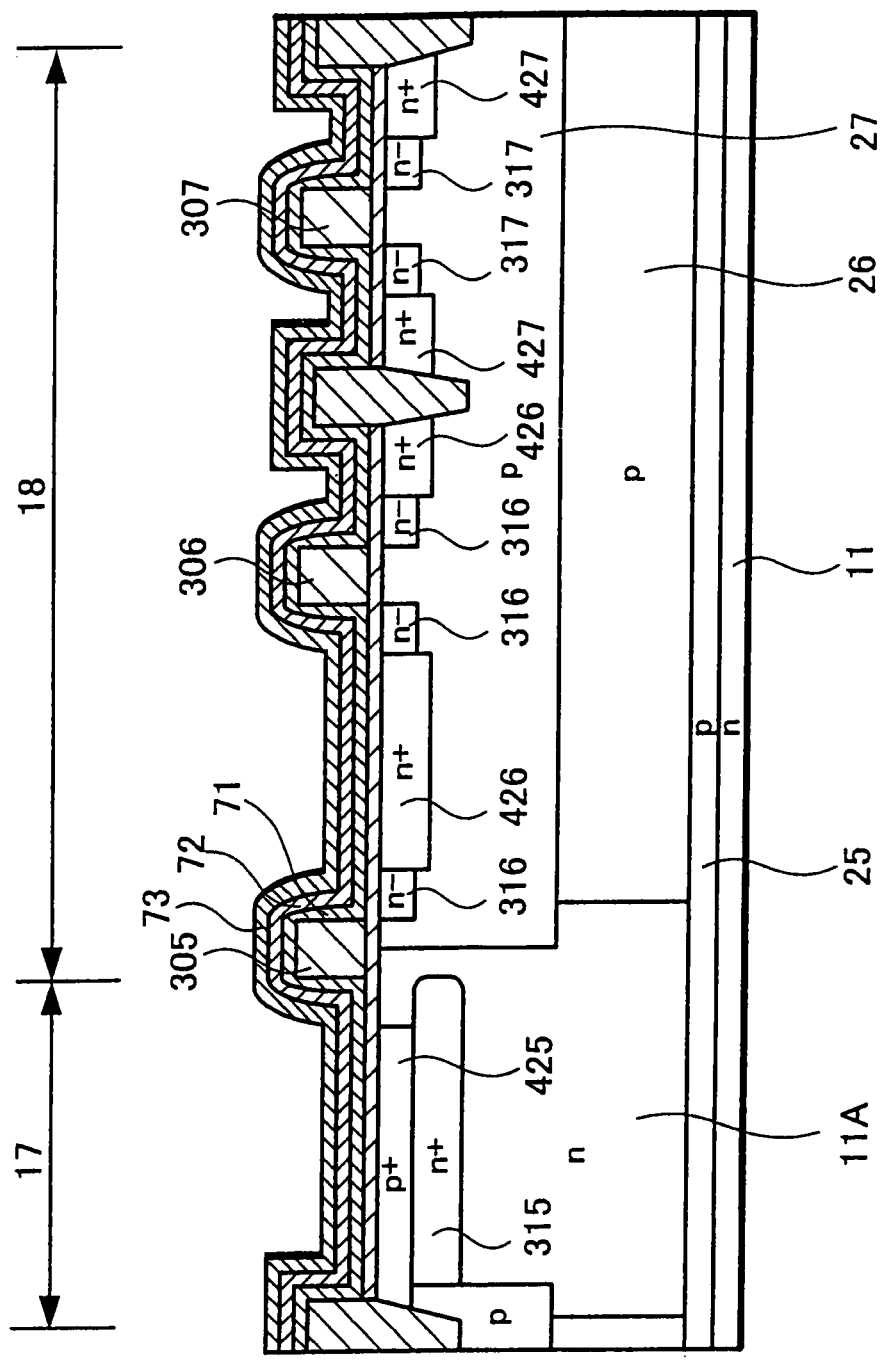
FIG. 56 is a cross-sectional view of a picture element portion showing another exemplified embodiment of a semiconductor device according to the present invention, which is applied to a CMOS type solid-state imaging device.
Figure 57:
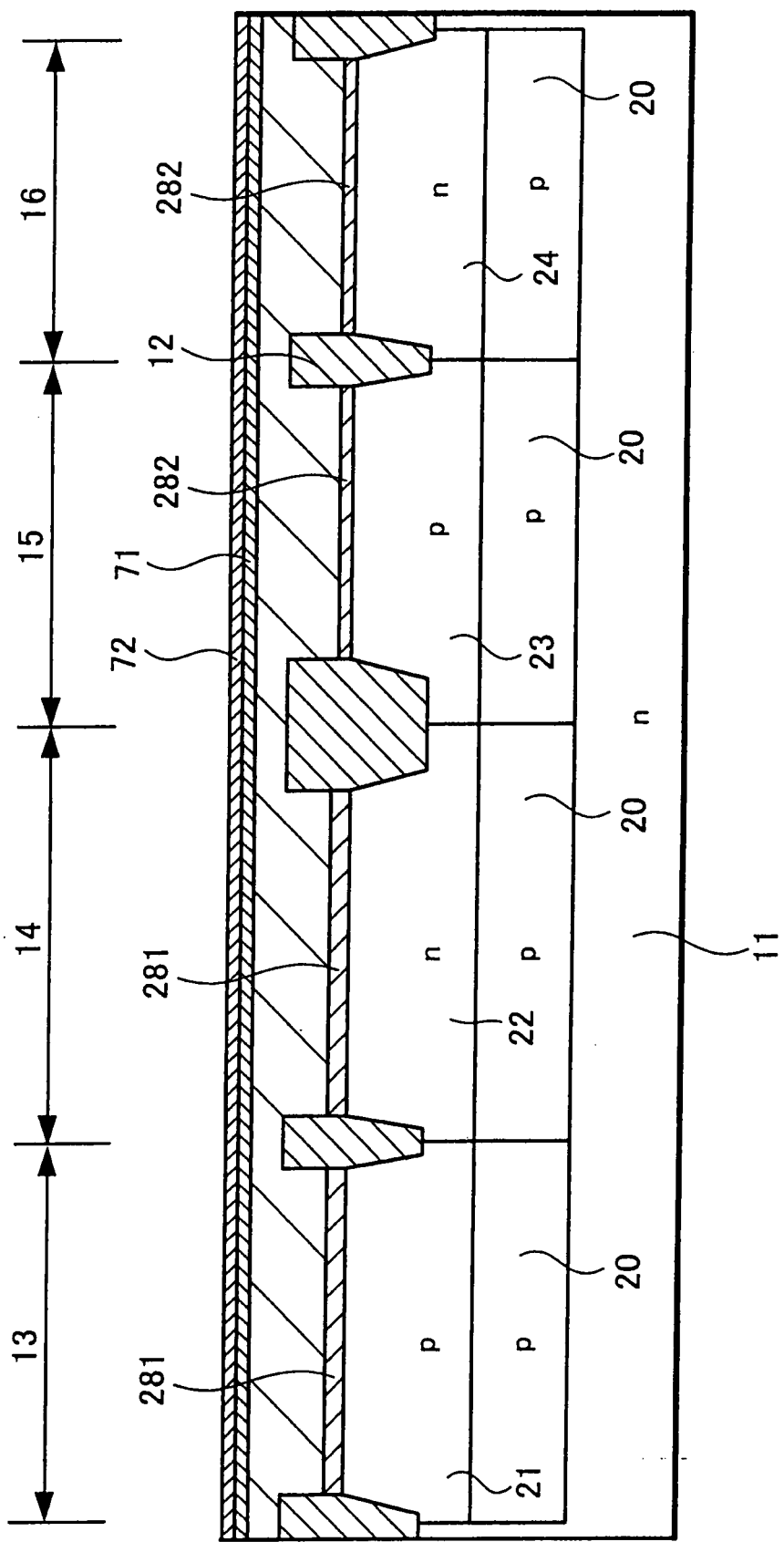
FIG. 57 to FIG. 60 are manufacturing process diagrams of a CMOS logic circuit portion corresponding to FIG. 55 showing another exemplified embodiment of a manufacturing method of a CMOS type solid-state imaging device.

FIG. 55 and FIG. 56 show another exemplified embodiment where a semiconductor device according to the present invention is applied to the CMOS type solid-state imaging device of FIG. 1. This example is a modified example of the CMOS type solid-state imaging device shown in FIG. 27 and FIG. 28.

According to the solid-state imaging device of the exemplified embodiment, the side of the CMOS logic circuit portion 4 is constituted similarly as the aforementioned FIG. 27 where the sidewall 75 at each of the gate electrodes 301 to 304 of the MOS transistors Tr1 to Tr4 is formed by a single layer structure composed of the third insulating film such as a silicon oxide film (SiO$_2$ film) 73. (see FIG. 55) On the other hand, the side of picture elements 2 is constituted such that the first, second and third insulating films such as the silicon oxide film (SiO$_2$ film) 71, the silicon nitride film (SiN film) 72 and the silicon oxide film (SiO$_2$ film) 73 remain without being etchedback on the whole surface including the surfaces of the sensor portion 45, the gate electrode 304 to 307 and the regions of the source/drain regions. (see FIG. 56) However, other constitutions are similar to those of FIG. 27 and FIG. 28, so that the same reference numerals are put on the portions corresponding to FIG. 27 and FIG. 28 and repetitive explanations will be omitted.

Next, a manufacturing method of such a CMOS type solid-state imaging device will be described using FIG. 57 to FIG. 64. FIG. 57 to FIG. 60 show manufacturing processes on the side of the CMOS logic circuit portion 4, and FIG. 61 to FIG. 64 show manufacturing processes on the side of picture elements where metal silicide layers of a refractory metal are not formed. The processes of FIG. 57 to FIG. 60 correspond to the processes of FIG. 61 to FIG. 64 respectively.

In this exemplified embodiment, first similar processes as the aforementioned processes of FIG. 29 to FIG. 34 and processes of FIG. 42 to FIG. 47 are performed. Processes of FIG. 57 correspond to those of FIG. 34 and processes of FIG. 61 correspond to those of FIG. 42.

Figure 58:
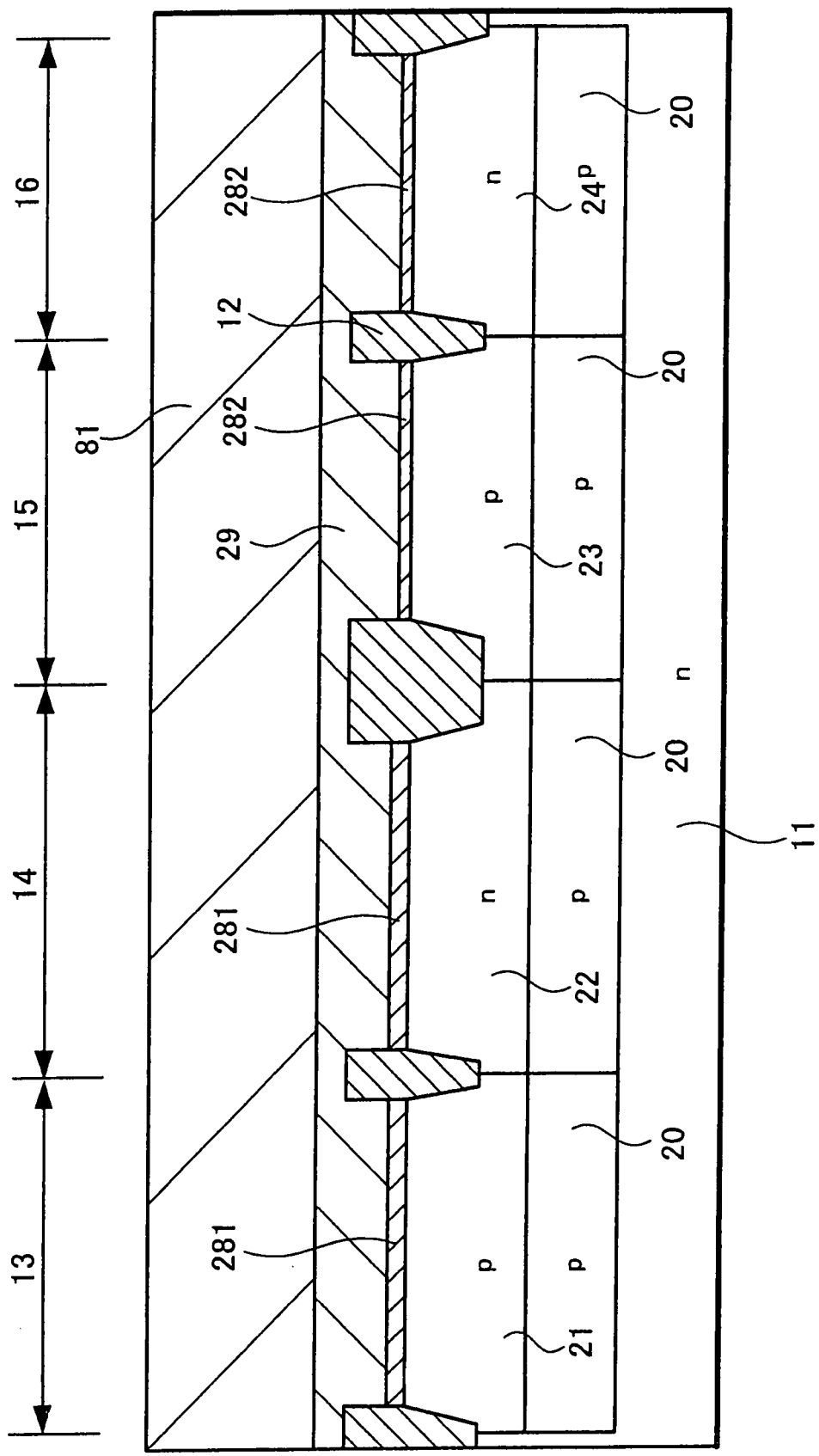
Figure 62:
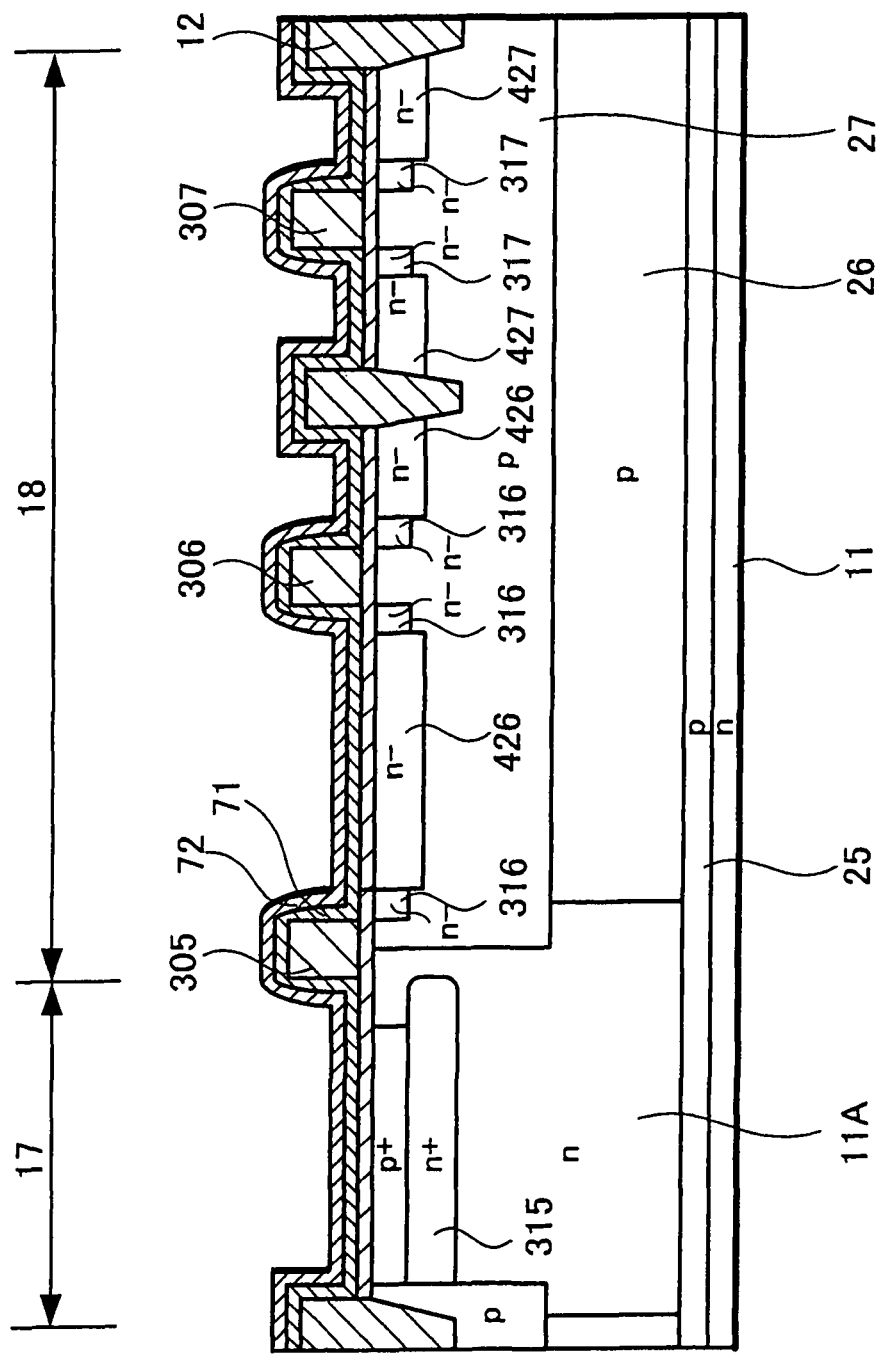

Next, as shown in FIG. 58 and FIG. 62, n$^+$ source/drain regions 426, 427 of the MOS transistors are formed by a photo-resist method and an ion injection method on the side of the picture elements 2 using the gate electrodes 304 to 307 and the sidewall composed of the first insulating film 71 and the second insulating film 72 which are not etchedback as masks. Further, a p+ semiconductor region 425 is formed on the surface of an n-type semiconductor region 11A of the sensor portion for the purpose of more reducing a junction leak current. (see FIG. 62) Impurities are not introduced by means of a photo-resist mask 81 on the side of CMOS logic circuit portion 4. (see FIG. 58)

Next, each of the gate electrodes 301 to 304 is formed after performing similar processes as the processes of FIG. 35 to FIG. 37 on the side of the CMOS logic circuit portion 4 and additionally, n− and p− regions 311 to 314 of the source/drain regions are formed. The photo-resist mask 78 is removed after performing similar processes as the processes of FIG. 48 to FIG. 50 on the side of the picture elements 2.

Figure 59:
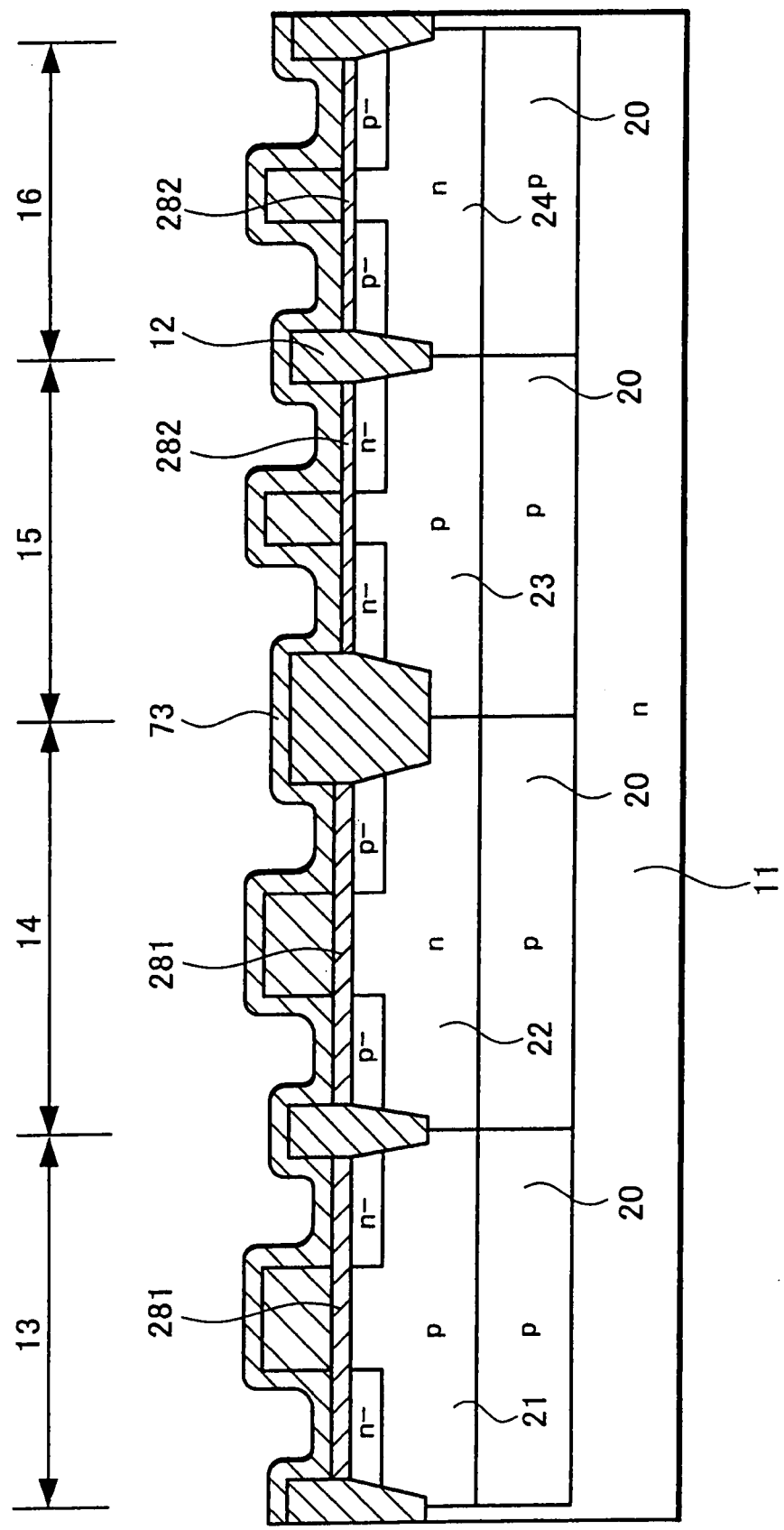
Figure 63:
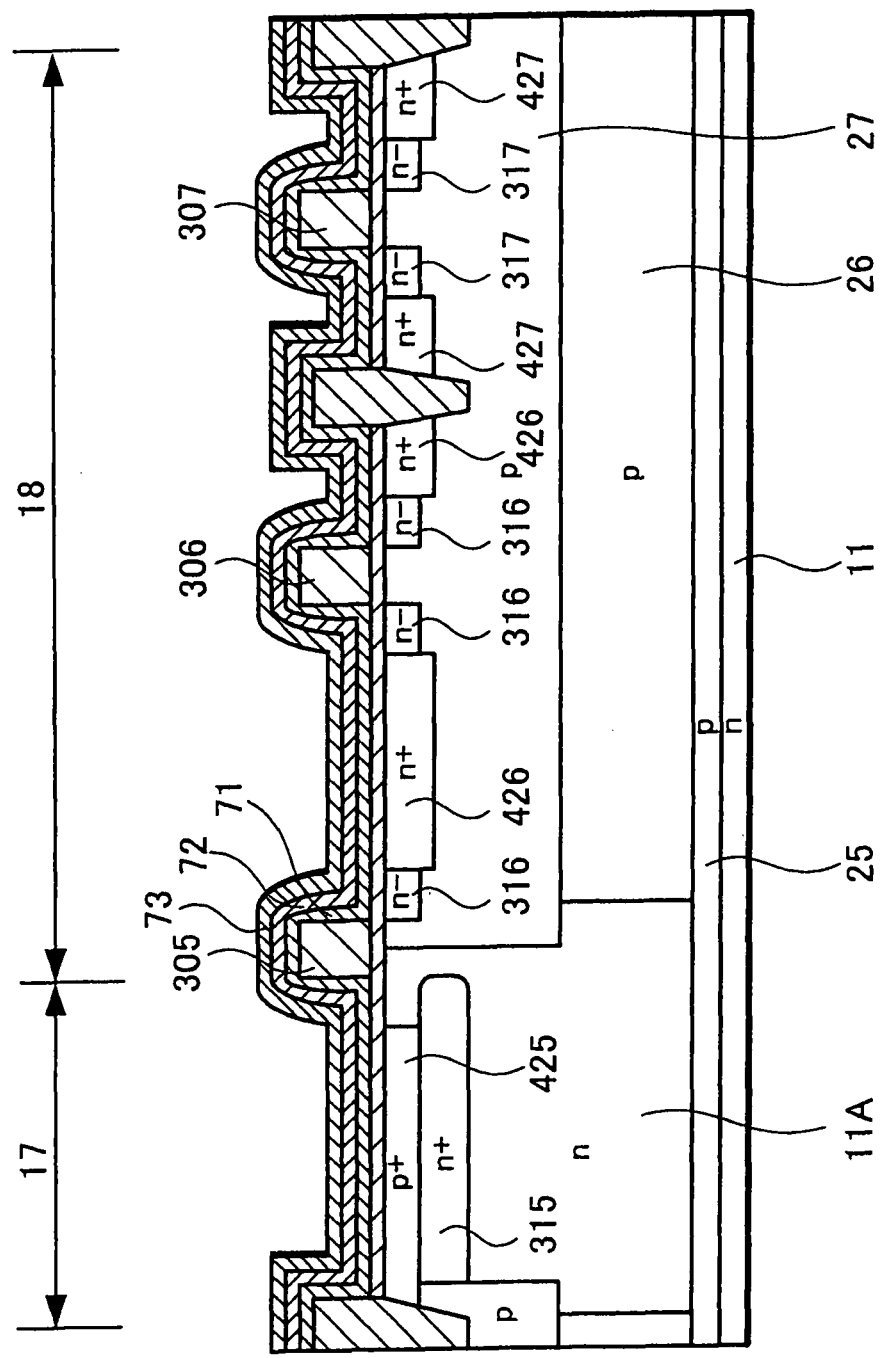

Next, as shown in FIG. 59 and FIG. 63, third insulating films 73 (similar silicon oxide films as mentioned above) are formed on the whole surface of the CMOS logic circuit portion 4 and the picture elements 2.

Figure 60:
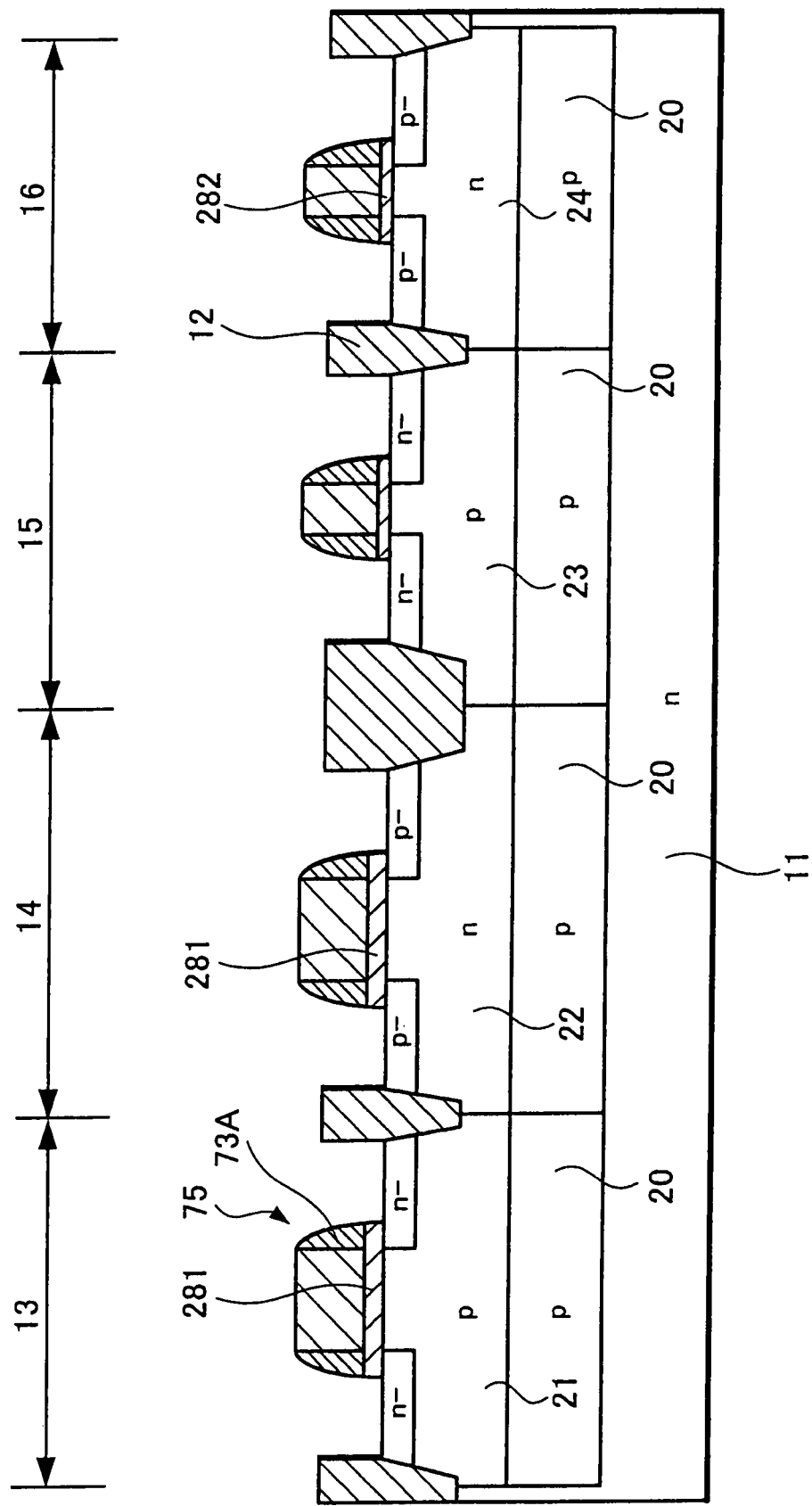
Figure 61:
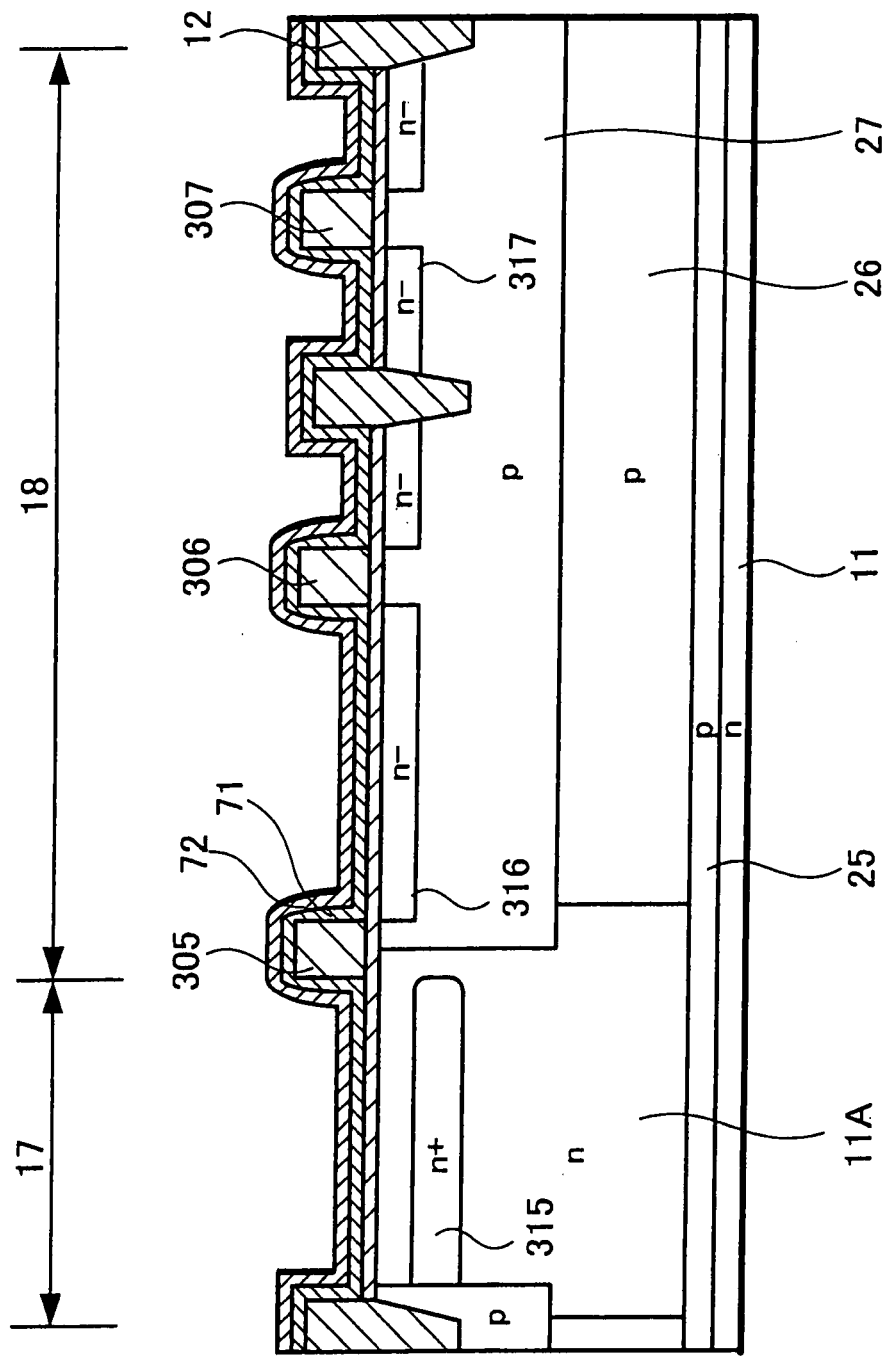
FIG. 61 to FIG. 64 are manufacturing process diagrams of a picture element portion corresponding to FIG. 56 showing another exemplified embodiment of a manufacturing method of a CMOS type solid-state imaging device.
Figure 64:
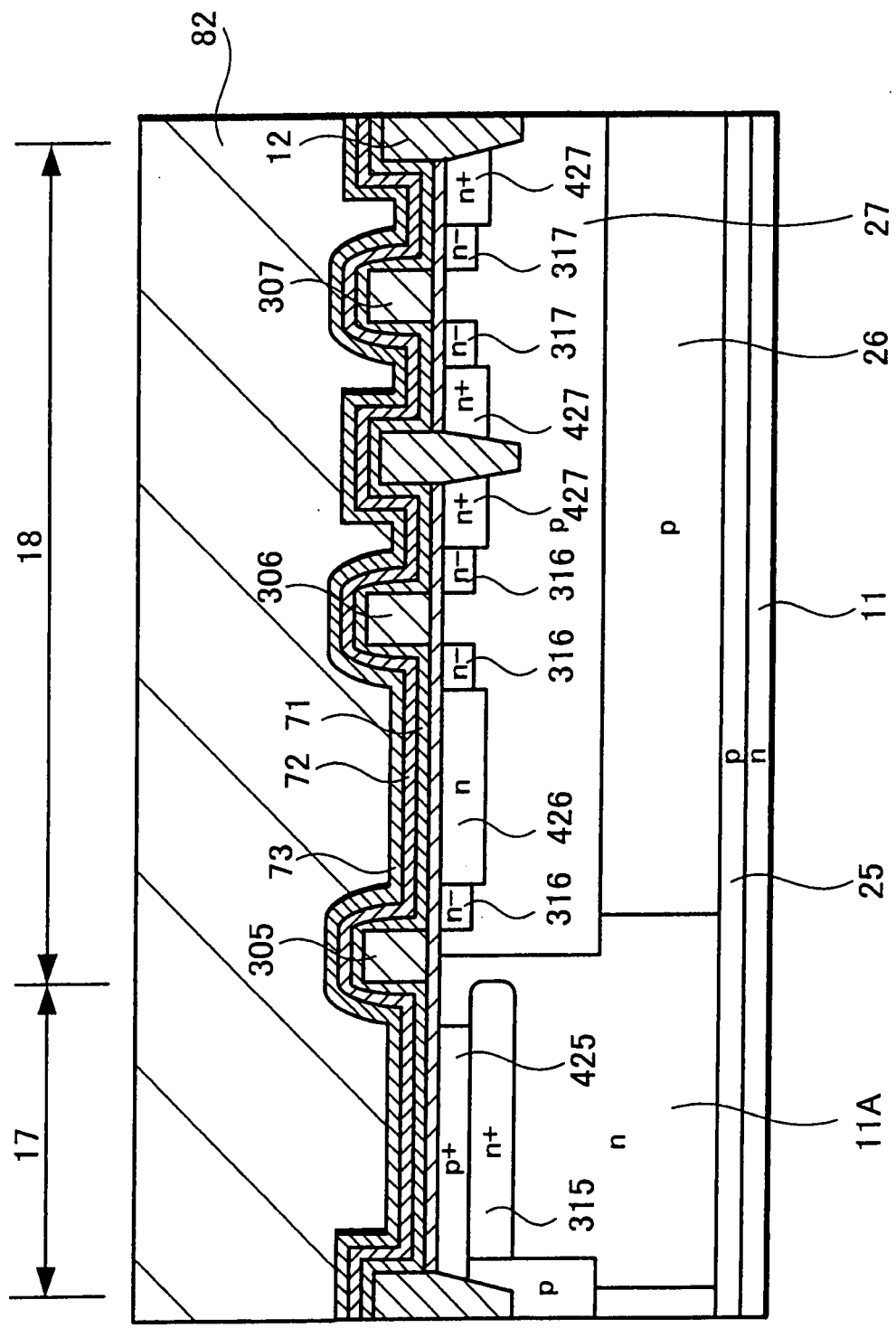

Next, as shown in FIG. 60 and FIG. 64, the side of the picture elements is coated with a photo-resist mask 82, the third insulating film 73 only on the side of the CMOS logic circuit portion 4 is etchedback and sidewalls 75 of a single layer structure composed of the silicon oxide film 73 which is the third insulating film.

Thereafter, by performing the same processes as the processes of FIG. 40 to FIG. 41, CMOS transistors having metal silicide layers 44 of a refractory metal are formed on the side of the CMOS logic circuit portion 4 such that the CMOS logic circuit portion 4 is formed. On the other hand, the photo-resist mask on the side of the picture elements 2 is removed so as to perform the formation of the picture elements. (see FIG. 55 and FIG. 56)

This exemplified embodiment also has similar operational effects as those of the CMOS type solid-state imaging device and the manufacturing method thereof mentioned above in connection with FIG. 27 and FIG. 28. Further, the structure is such a structure where the film thickness of the second insulating film 72 can be freely selected, so that the intensity of the reflected light with respect to the incident light to the sensor portion 45, which is decided based on the structure of the first, second and third insulating films 71, 72 and 73, can be minimized.

Figure 65:
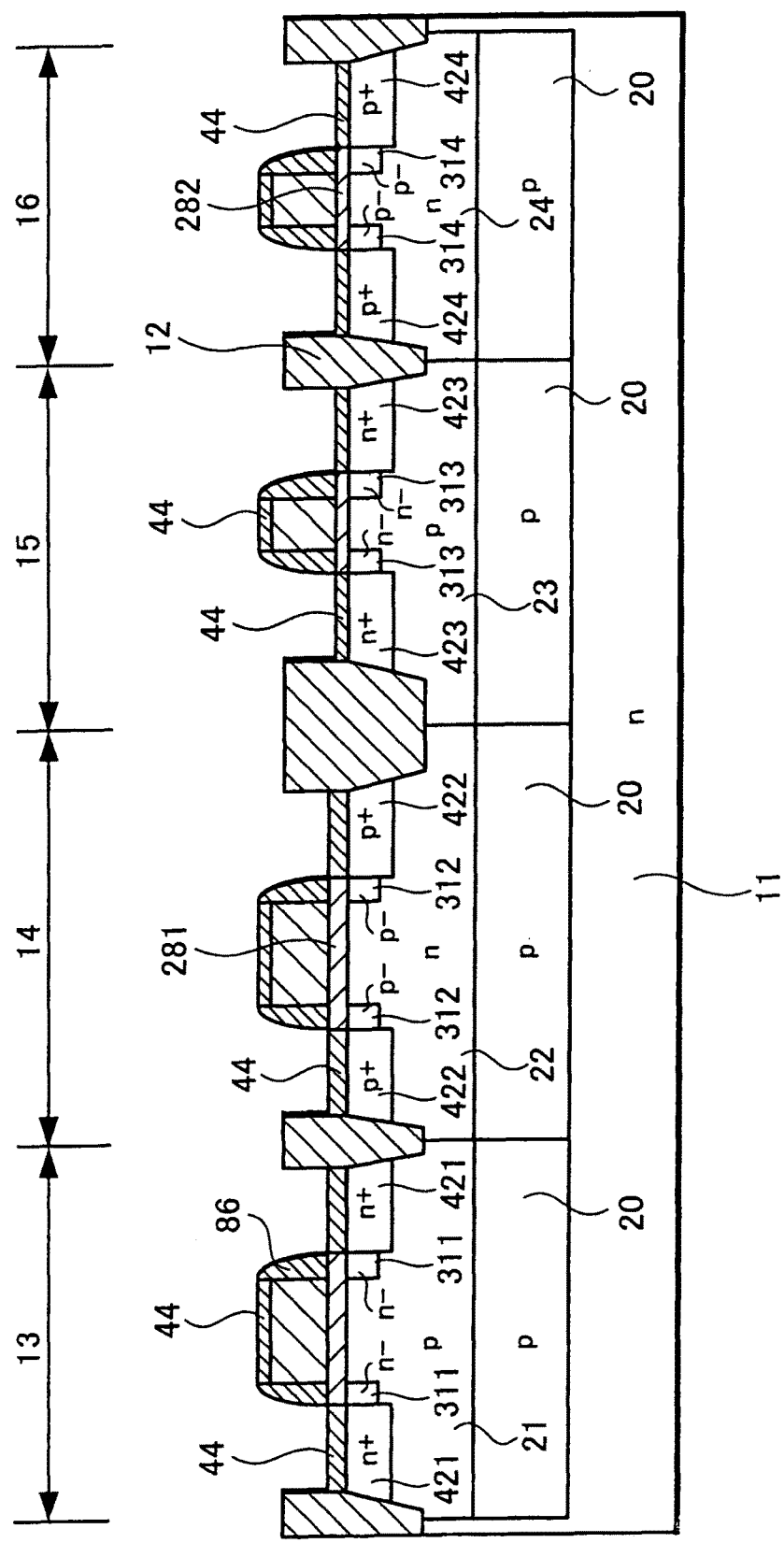
FIG. 65 is a cross-sectional view of a picture element portion showing another exemplified embodiment of a semiconductor device according to the present invention, which is applied to a CMOS type solid-state imaging device.
Figure 66:
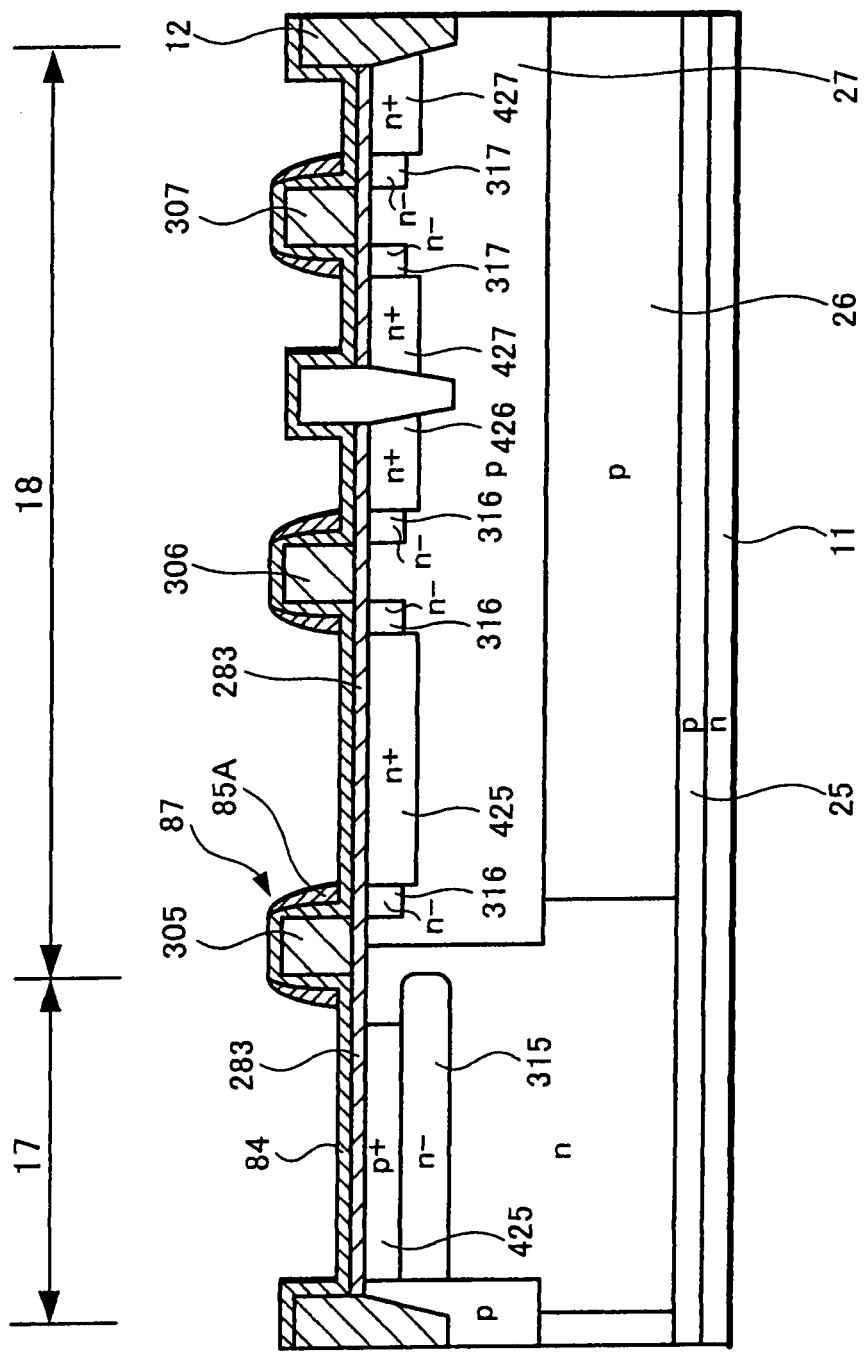
FIG. 66 is a cross-sectional view of a picture element portion showing another exemplified embodiment of a semiconductor device according to the present invention, which is applied to a CMOS type solid-state imaging device.

FIG. 65 and FIG. 66 show another exemplified embodiment where a semiconductor device according to the present invention is applied to the CMOS type solid-state imaging device of FIG. 1. This example is a modified example of the CMOS type solid-state imaging device shown in FIG. 27 and FIG. 28.

According to the solid-state imaging device of the exemplified embodiment, the side of the CMOS logic circuit portion 4 is constituted similarly as the aforementioned FIG. 27 where the sidewall 86 at each of the gate electrodes 301 to 304 of the MOS transistors Tr1 to Tr4 is formed by a single layer structure composed of a newly formed second insulating film 75 (such as a silicon oxide film: corresponding to the third insulating film 73). (see FIG. 55) On the other hand, the side of picture elements 2 is constituted such that the first insulating film 71 (e.g. a silicon oxide film) is eliminated, a first insulating film 84 (a silicon nitride film: corresponding to the second insulating film 72 mentioned above) is newly coated on the whole surface and at the same time a sidewall 87 composed of a second insulating film 85 (a silicon oxide film: corresponding to the third insulating film 73) is formed. (see FIG. 66) However, other constitutions are similar to those of FIG. 27 and FIG. 28, so that the same reference numerals are put on the portions corresponding to FIG. 27 and FIG. 28 and repetitive explanations will be omitted.

Figure 67:
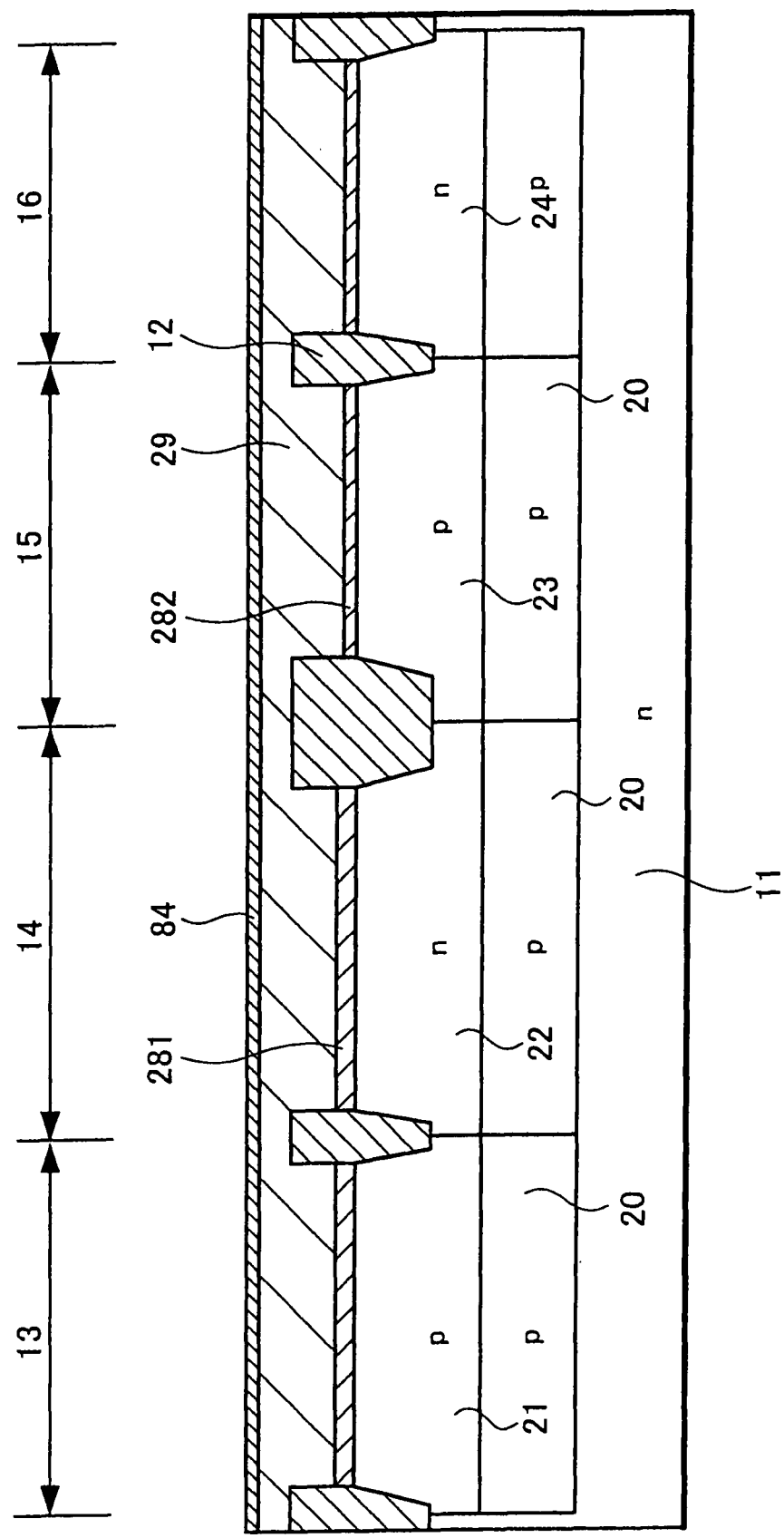
FIG. 67 to FIG. 69 are manufacturing process diagrams of a CMOS logic circuit portion corresponding to FIG. 65 showing another exemplified embodiment of a manufacturing method of a CMOS type solid-state imaging device.
Figure 68:
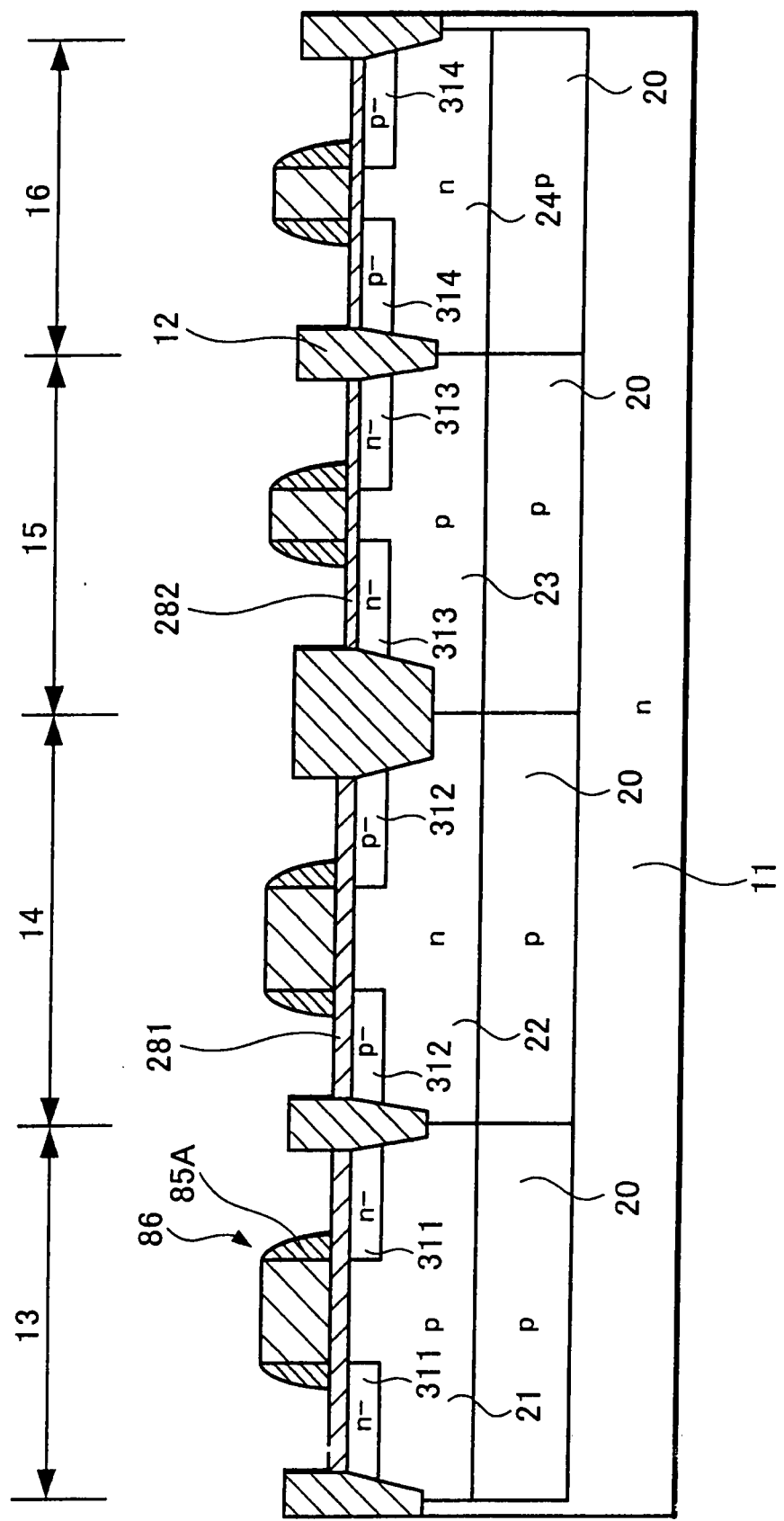
Figure 69:
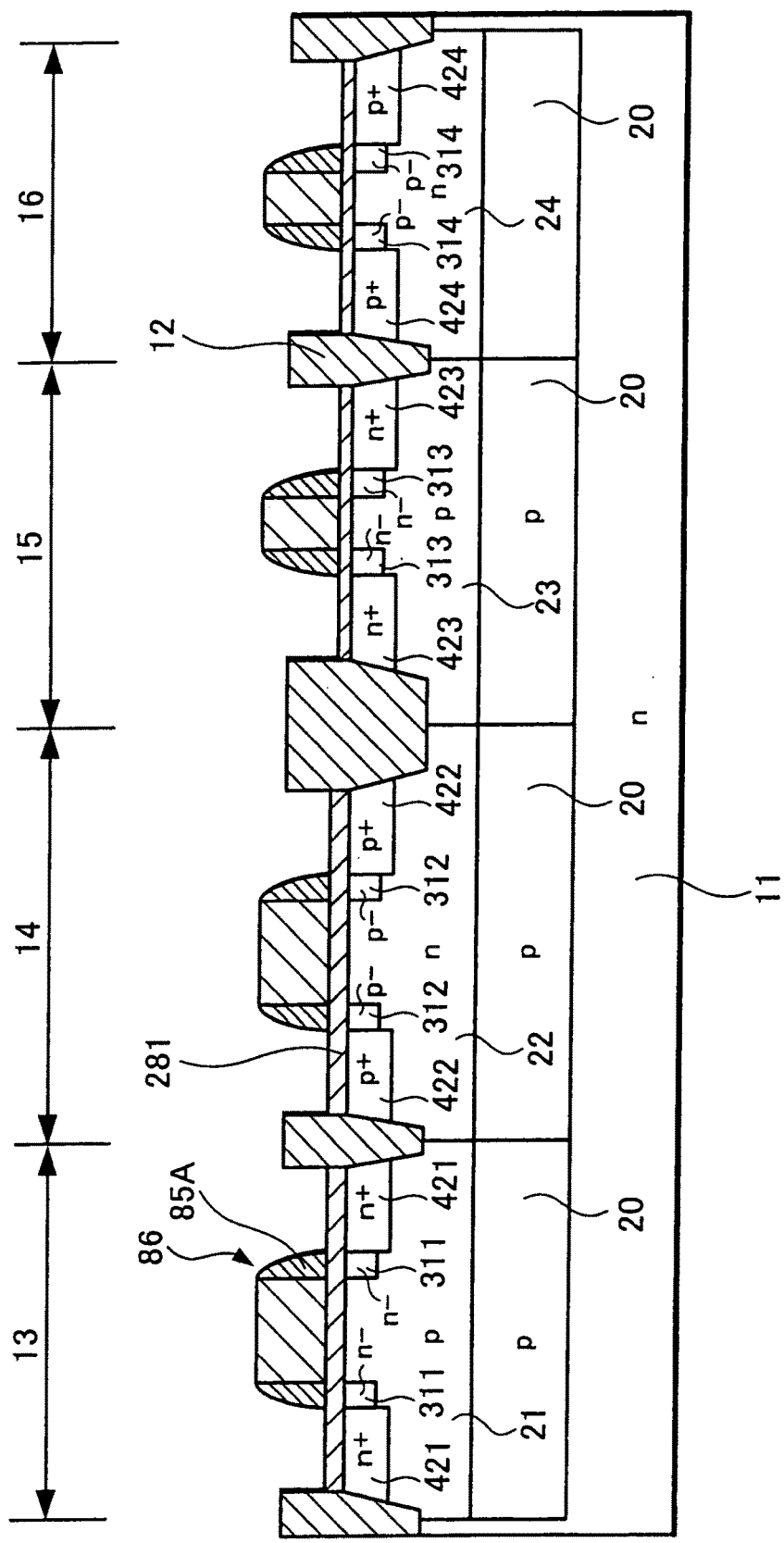
Figure 70:
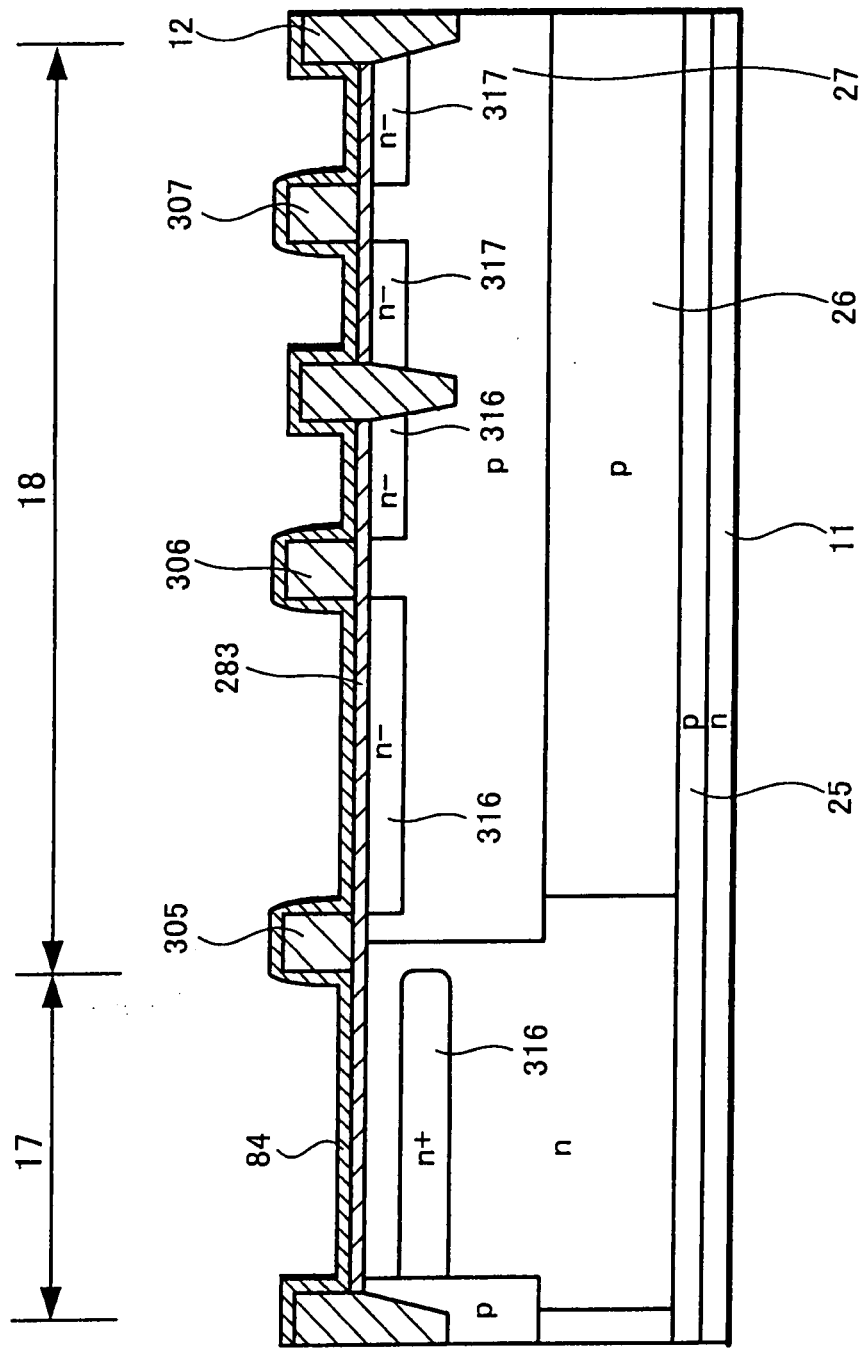
FIG. 70 to FIG. 72 are manufacturing process diagrams of a picture element portion corresponding to FIG. 66 showing another exemplified embodiment of a manufacturing method of a CMOS type solid-state imaging device.
Figure 71:
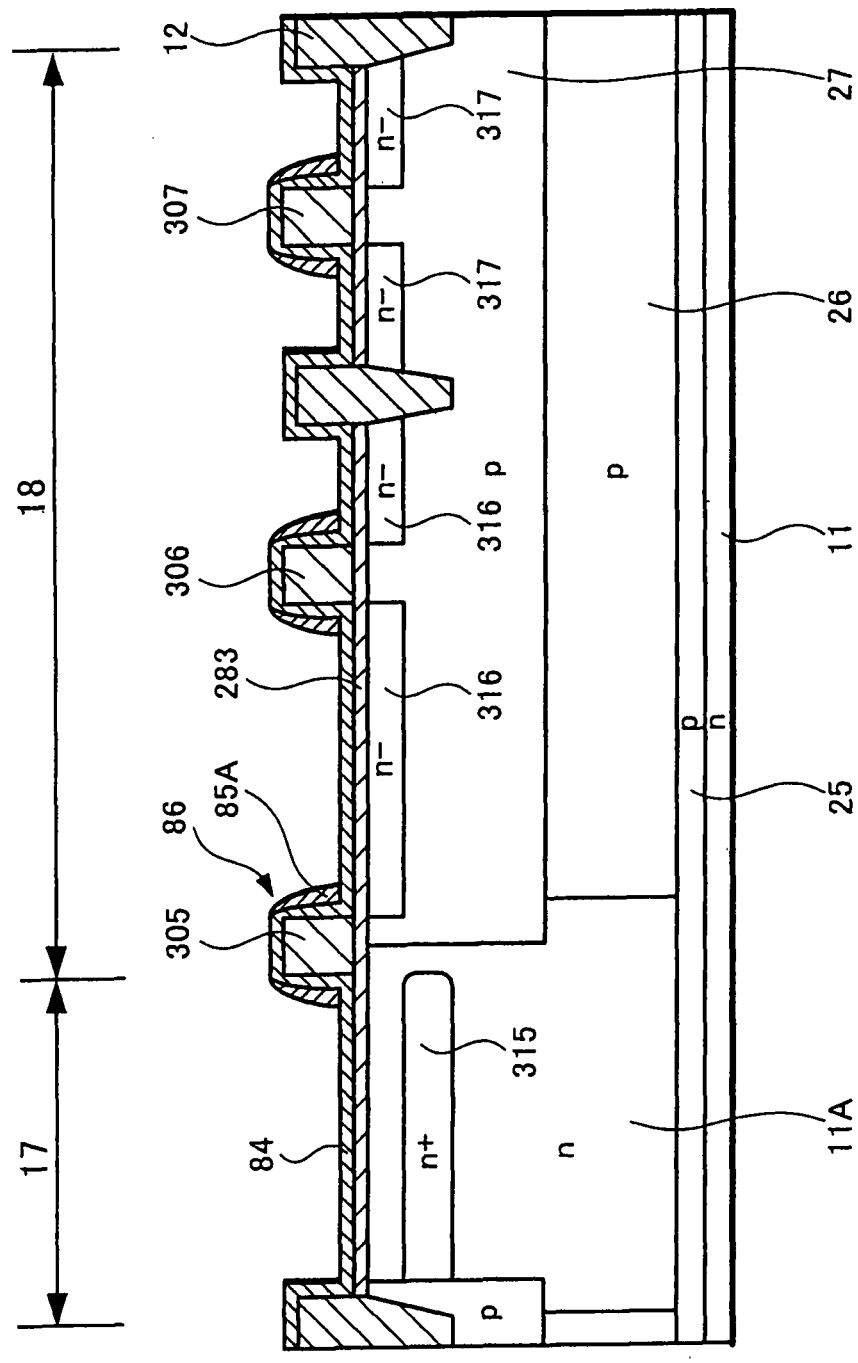
Figure 72:
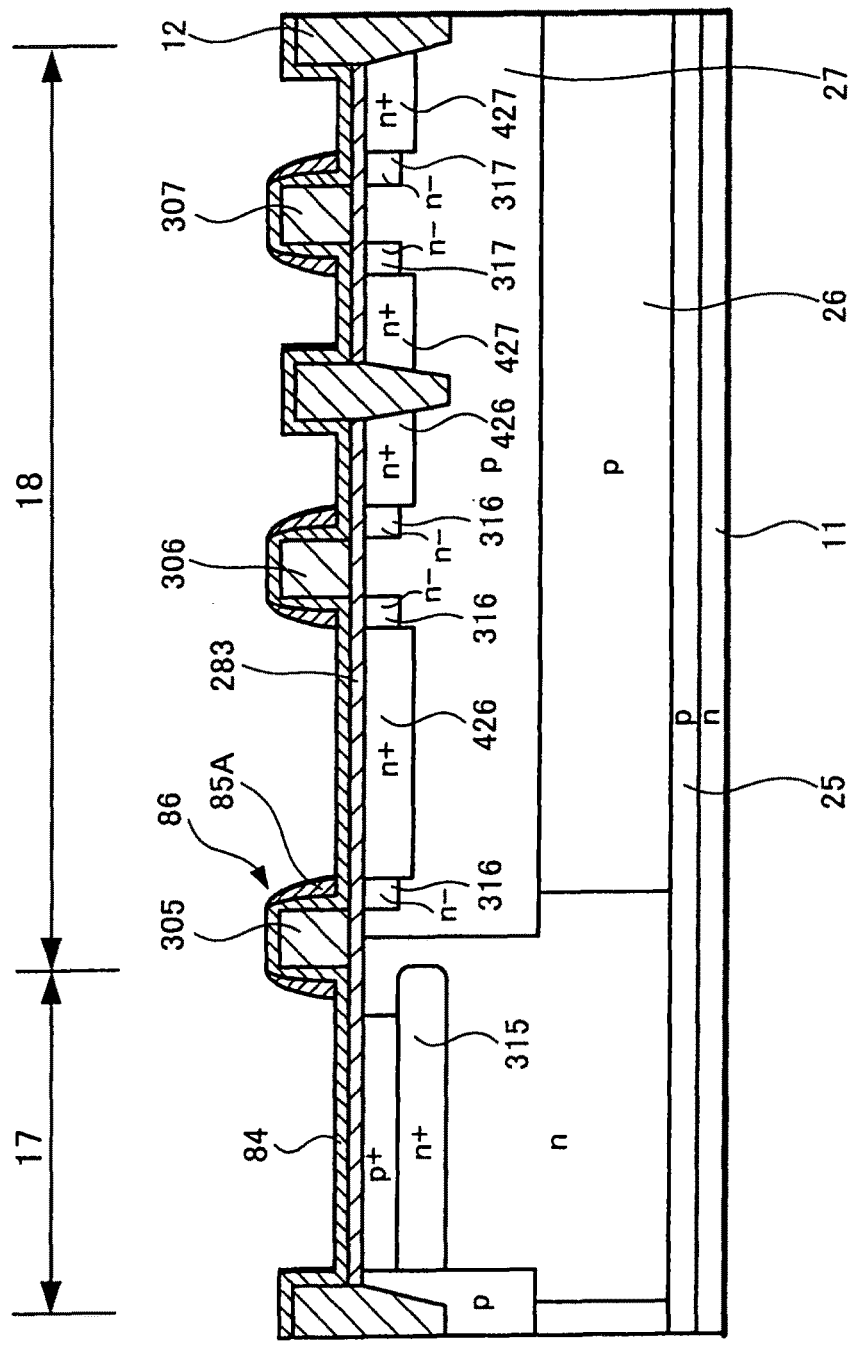

Next, a manufacturing method of such a CMOS type solid-state imaging device will be described using FIG. 67 to FIG. 72. FIG. 67 to FIG. 69 show manufacturing processes on the side of the CMOS logic circuit portion 4, and FIG. 70 to FIG. 72 show manufacturing processes on the side of picture elements 2 where metal silicide layers of a refractory metal are not formed. The processes of FIG. 67 to FIG. 69 correspond to the processes of FIG. 70 to FIG. 72 respectively.

In this exemplified embodiment, first similar processes as the aforementioned processes of FIG. 29 to FIG. 34 and processes of FIG. 42 to FIG. 47 are performed in a condition that the first insulating film 71 (e.g. SiO$_2$ film) is eliminated. Processes of FIG. 67 correspond to those of FIG. 34. Processes of FIG. 70 correspond to those of FIG. 47, but a first insulating film 84 (e.g. silicon nitride film) is newly piled on the gate insulating film 283 and gates 305 to 307. The film thickness of the first insulating film 84 such as silicon nitride film is selected to be approximately 40 nm.

Next, similar processes as the processes of FIG. 35 to FIG. 38 are performed, that is, the gate electrodes 301 to 304 are formed on the side of the CMOS logic circuit portion 4, additionally n− and p− regions 311 to 314 of the source/drain regions are formed and a second insulating film 85 (e.g. silicon oxide film) is piled on the whole surface. The film thickness of the second insulating film 85 such as silicon oxide film can be selected as approximately 100 nm. Similar processes as those of FIG. 49 to FIG. 51 are performed on the side of the picture elements 2.

Next, as shown in FIG. 68 and FIG. 71, sidewalls 86 composed of the second insulating films 85 are formed on the side walls of the gate electrode 301 to 307 respectively by etchingback the second insulating films 85 on the side of the CMOS logic circuit portion 4 and on the side of the picture elements 2.

Next, as shown in FIG. 69 and FIG. 72 (corresponding to aforementioned FIG. 40 and FIG. 53), n+ and p+ source/drain regions 421 to 424, p+ semiconductor region 425 and n+ source/drain regions 426, 427 are formed by ion-injecting impurities of a high concentration of desirable conductive types on the side of CMOS logic circuit portion 4 and on the side of the picture elements 2. With respect to ion injection on the picture element 2, the injection is conducted with energy such as 20 keV or more in a case that the ion injected is phosphorus (P). Thereafter, by performing the same processes as the processes of FIG. 41 and FIG. 54, metal silicide layers 44 of a refractory metal are formed so as to perform the formation of the CMOS logic circuit portion 4. On the other hand, the formation of the picture elements 2 where metal silicide layers of a refractory metal are not formed is performed.

This exemplified embodiment also has similar operational effects as those of the CMOS type solid-state imaging device and the manufacturing method thereof mentioned above in connection with FIG. 27 and FIG. 28. The structure of this exemplified embodiment can be adapted when the intensity of the reflected light relative to the incident light onto the light receiving sensor portion 45 can be more reduced with respect to the 2-layer structure of the silicon oxide film and the silicon nitride film.

Figure 73:
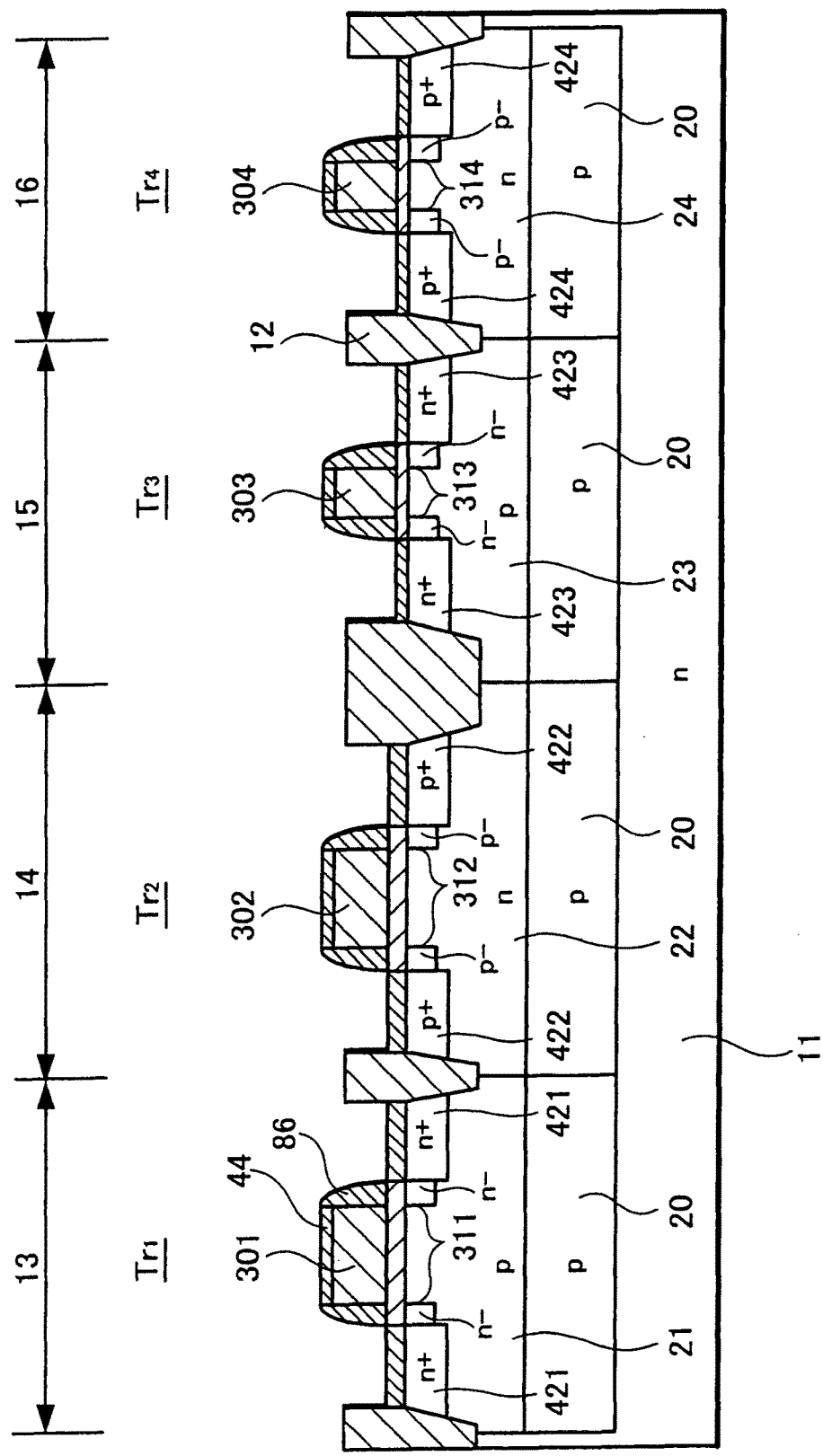
FIG. 73 is a cross-sectional view of a picture element portion showing another exemplified embodiment of a semiconductor device according to the present invention, which is applied to a CMOS type solid-state imaging device.
Figure 74:
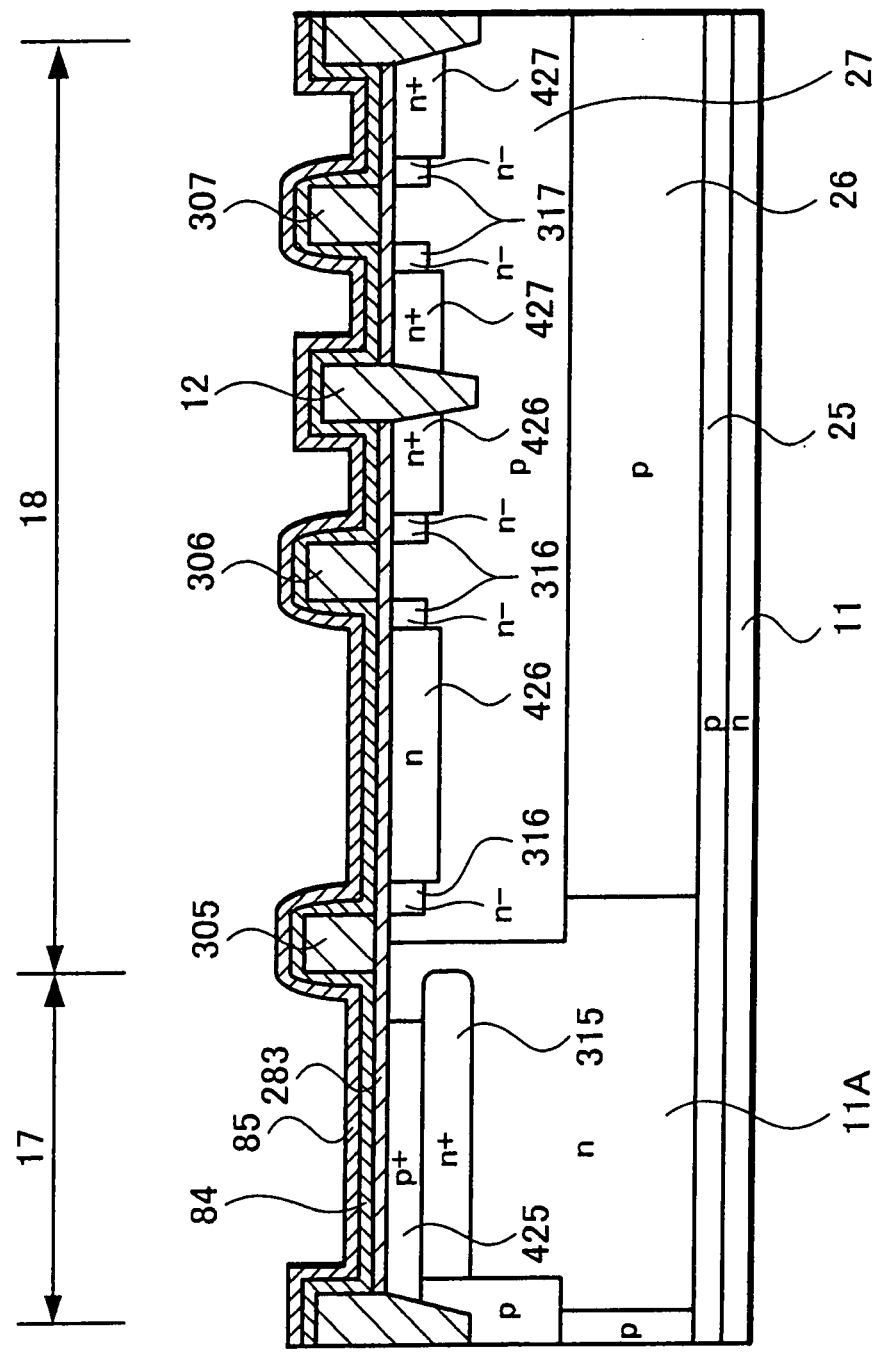
FIG. 74 is a cross-sectional view of a picture element portion showing another exemplified embodiment of a semiconductor device according to the present invention, which is applied to a CMOS type solid-state imaging device.
Figure 75:
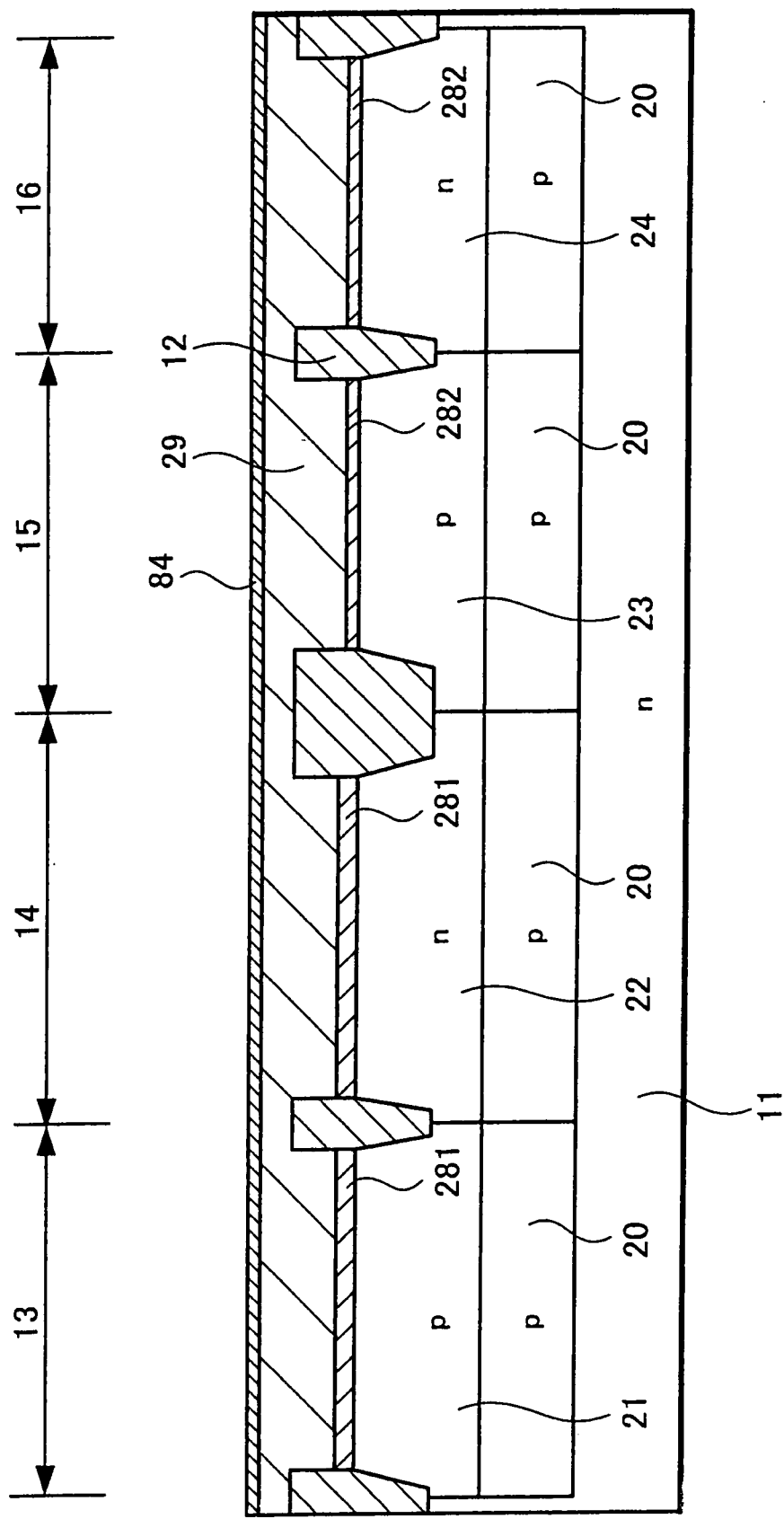
FIG. 75 to FIG. 78 are manufacturing process diagrams of a CMOS logic circuit portion corresponding to FIG. 73 showing another exemplified embodiment of a manufacturing method of a CMOS type solid-state imaging device.

FIG. 73 and FIG. 74 show another exemplified embodiment where a semiconductor device according to the present invention is applied to the CMOS type solid-state imaging device of FIG. 1. This example is a modified example of the CMOS type solid-state imaging device shown in FIG. 27 and FIG. 28.

According to the solid-state imaging device of the exemplified embodiment, the side of the CMOS logic circuit portion 4 is constituted similarly as the aforementioned FIG. 27 where the sidewall 75 at each of the gate electrodes 301 to 304 of the MOS transistors Tr1 to Tr4 is formed by a single layer structure composed of the third insulating film such as a silicon oxide film ($SiO_2$ film) 73. (see FIG. 73) On the other hand, the side of picture elements 2 is constituted such that a first insulating film 84 (a silicon nitride film: corresponding to the second insulating film 72 mentioned above) and a second insulating film 85 (a silicon oxide film: corresponding to the third insulating film 73) are piled so as to cover the whole surface including the surfaces of gate insulating film 283 and the gate electrode 305 to 307. (see FIG. 66) However, other constitutions are similar to those of FIG. 27 and FIG. 28, so that the same reference numerals are put on the portions corresponding to FIG. 27 and FIG. 28 and repetitive explanations will be omitted.

Next, a manufacturing method of such a CMOS type solid-state imaging device will be described using FIG. 75 to FIG. 82. FIG. 75 to FIG. 78 show manufacturing processes on the side of the CMOS logic circuit portion 4, and FIG. 79 to FIG. 82 show manufacturing processes on the side of picture elements where metal silicide layers of a refractory metal are not formed. The processes of FIG. 75 to FIG. 78 correspond to the processes of FIG. 79 to FIG. 82 respectively.

In this exemplified embodiment, first similar processes as the aforementioned processes of FIG. 29 to FIG. 34 and processes of FIG. 42 to FIG. 47 are performed in a condition that the first insulating film 71 (e.g. $SiO_2$ film) is eliminated. Processes of FIG. 75 correspond to those of FIG. 34. Processes of FIG. 79 correspond to those of FIG. 47, but a first insulating film 84 (e.g. silicon nitride film) is newly piled on the gate insulating film 283 and gates 305 to 307. The film thickness of the first insulating film 84 such as silicon nitride film is selected to be approximately 40 nm.

Figure 76:
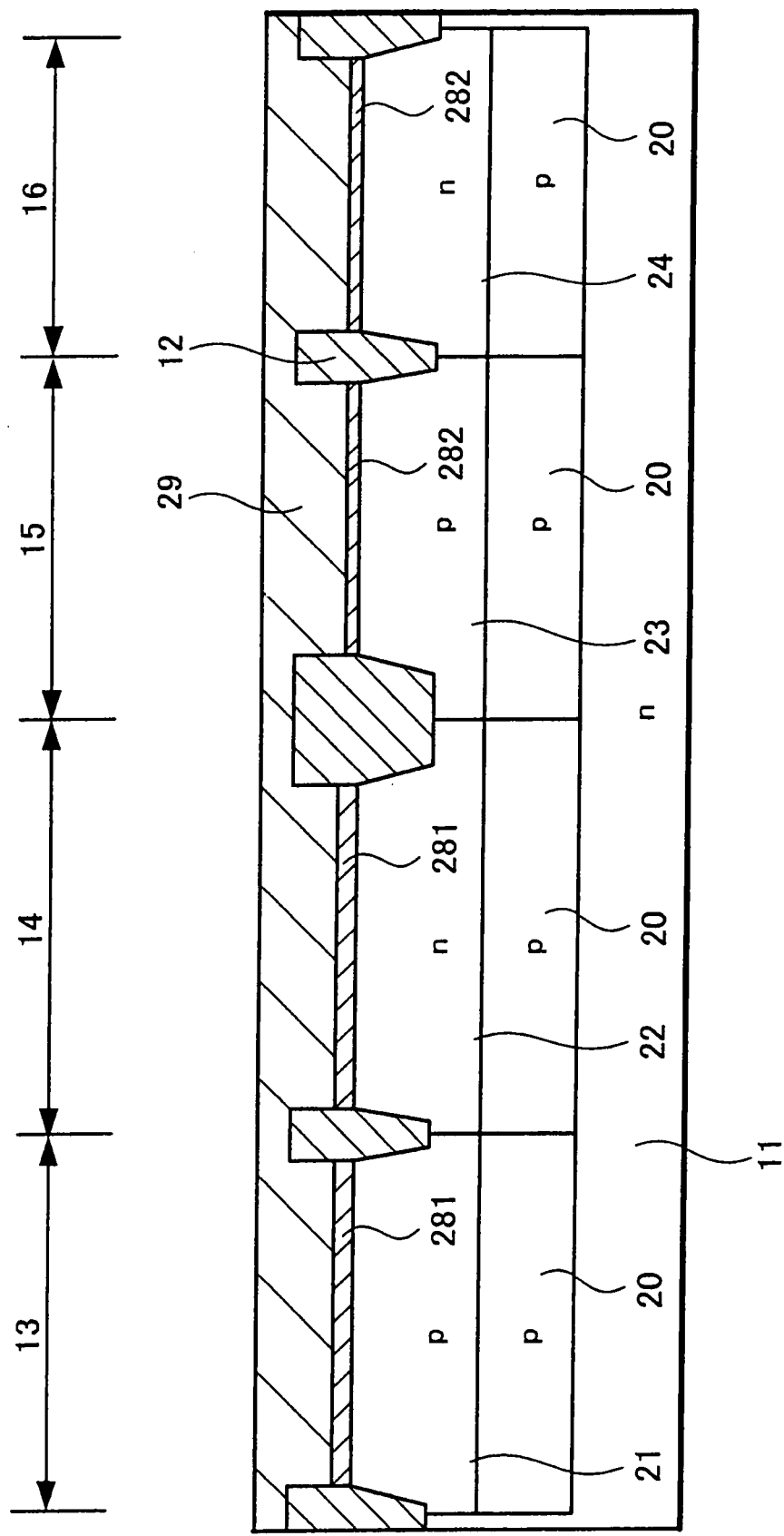
Figure 80:
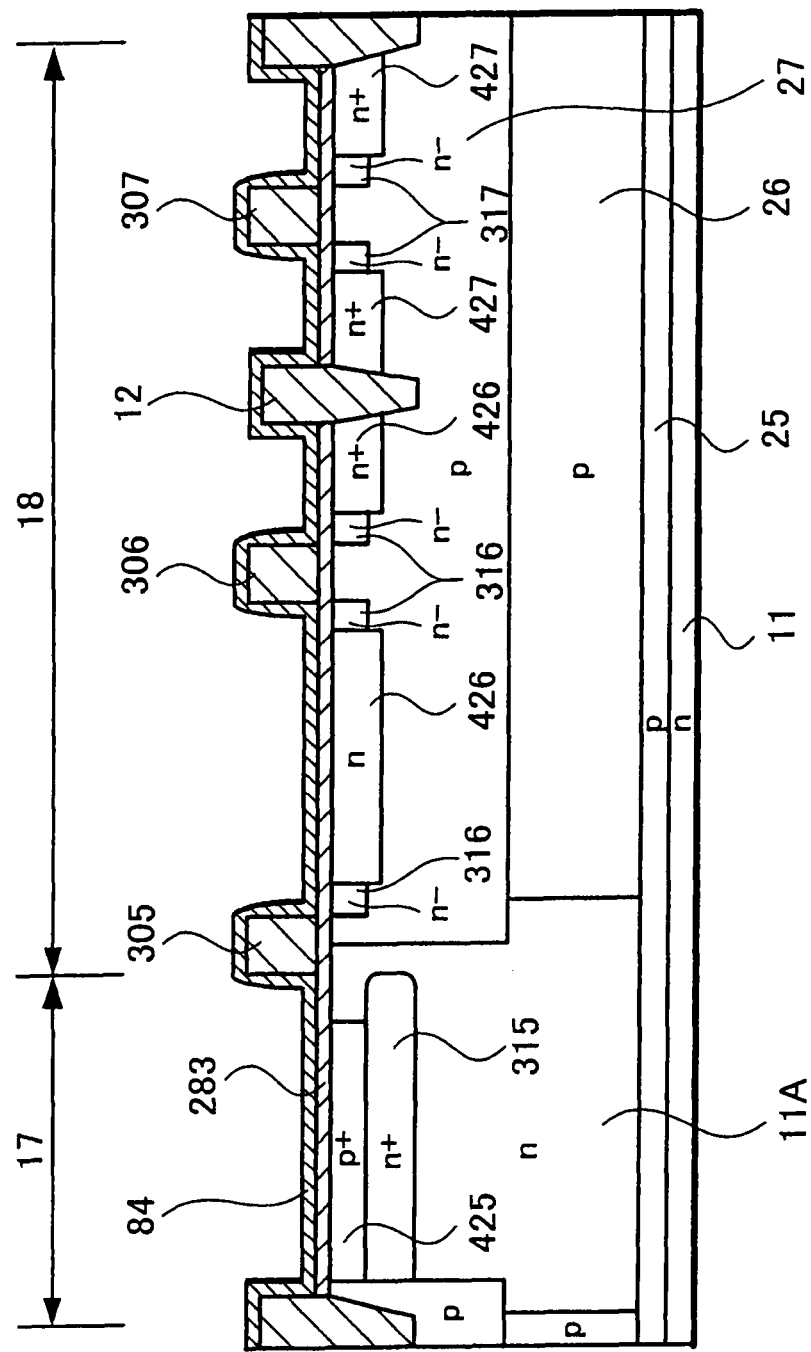

Next, as shown in FIG. 76 and FIG. 80, $n^+$ source/drain regions 426, 427 of the MOS transistors are formed by a photo-resist method and an ion injection method on the side of the picture elements 2 using the gate electrodes 304 to 307 and the sidewall composed of the first insulating film 84 which is not etchedback as masks. Further, a p+ semiconductor region 425 is formed on the surface of an n-type semiconductor region 11A of the sensor portion for the purpose of more reducing a junction leak current. (see FIG. 80) Impurities are not introduced by means of a photo-resist mask 88 on the side of CMOS logic circuit portion 4. (see FIG. 76)

Next, each of the gate electrodes 301 to 304 is formed after performing similar processes as the processes of FIG. 35 to FIG. 37 on the side of the CMOS logic circuit portion 4 and additionally, $n^-$ and $p^-$ regions 311 to 314 of the source/drain regions are formed. The photo-resist mask 78 is removed after performing similar processes as the processes of FIG. 48 to FIG. 50 on the side of the picture elements 2.

Figure 77:
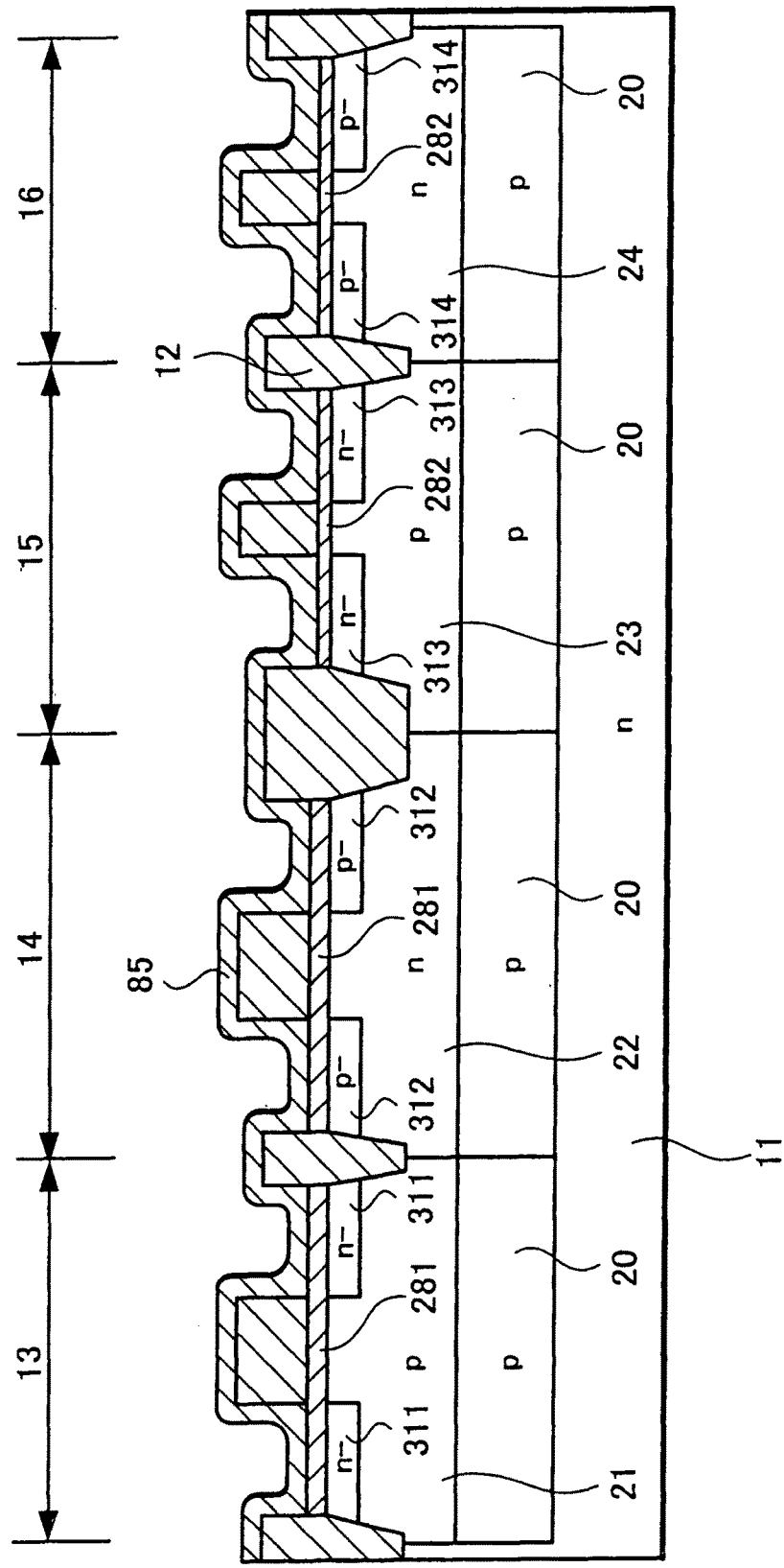
Figure 81:
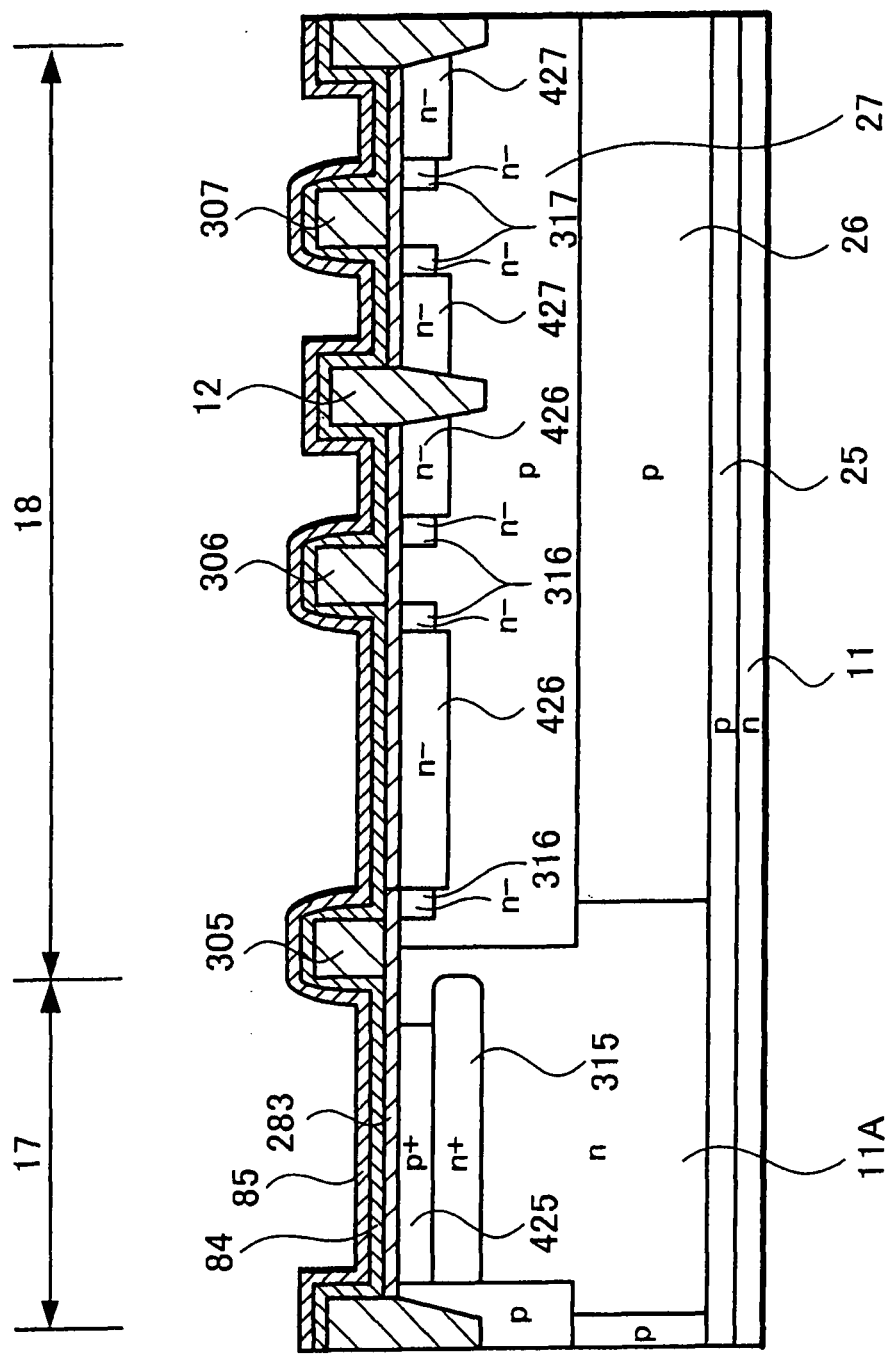

Next, as shown in FIG. 77 and FIG. 81, second insulating films 85 (e.g. silicon oxide films) are formed on the whole surface of the CMOS logic circuit portion 4 and the picture elements 2.

Figure 78:
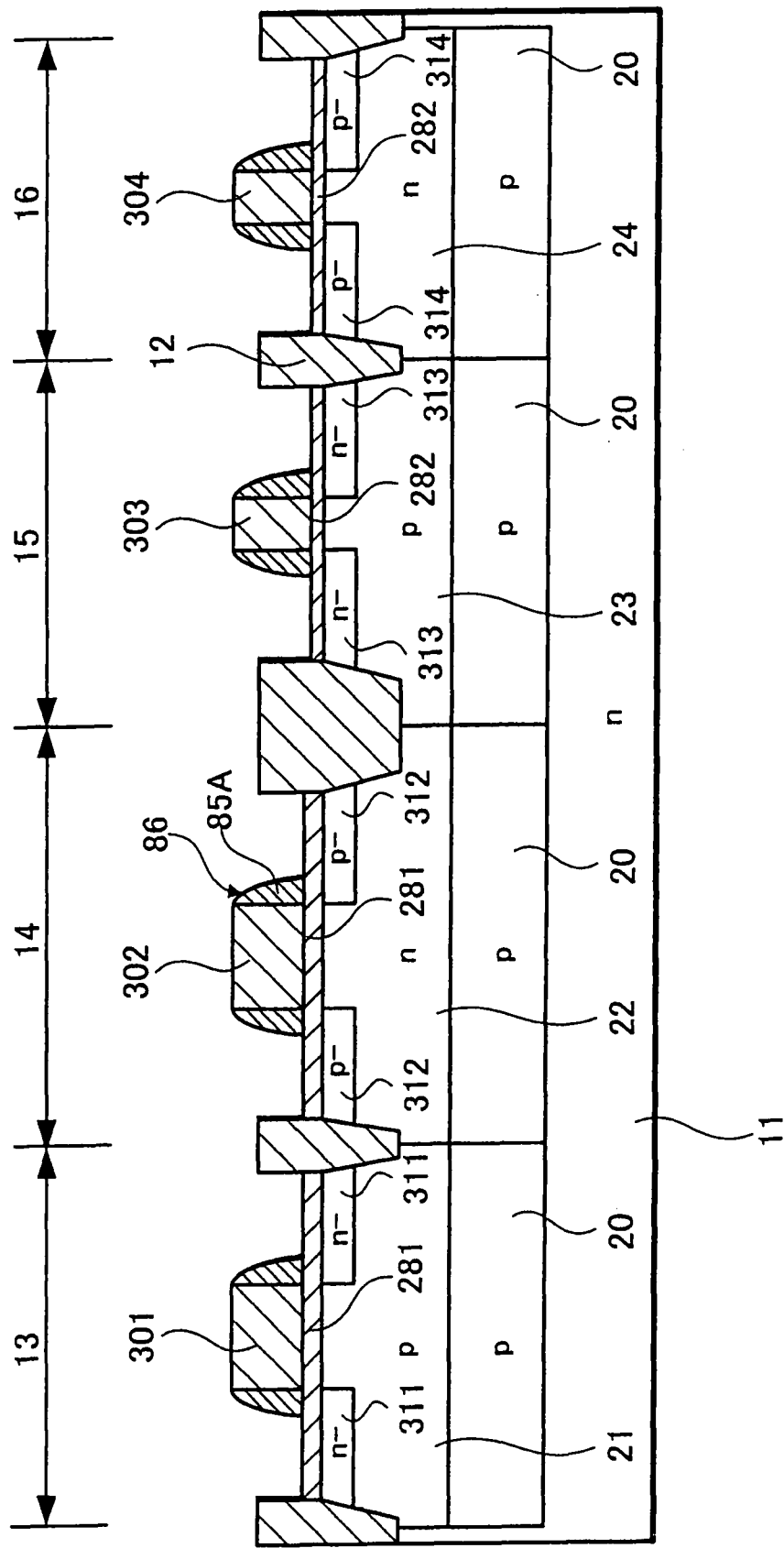
Figure 79:
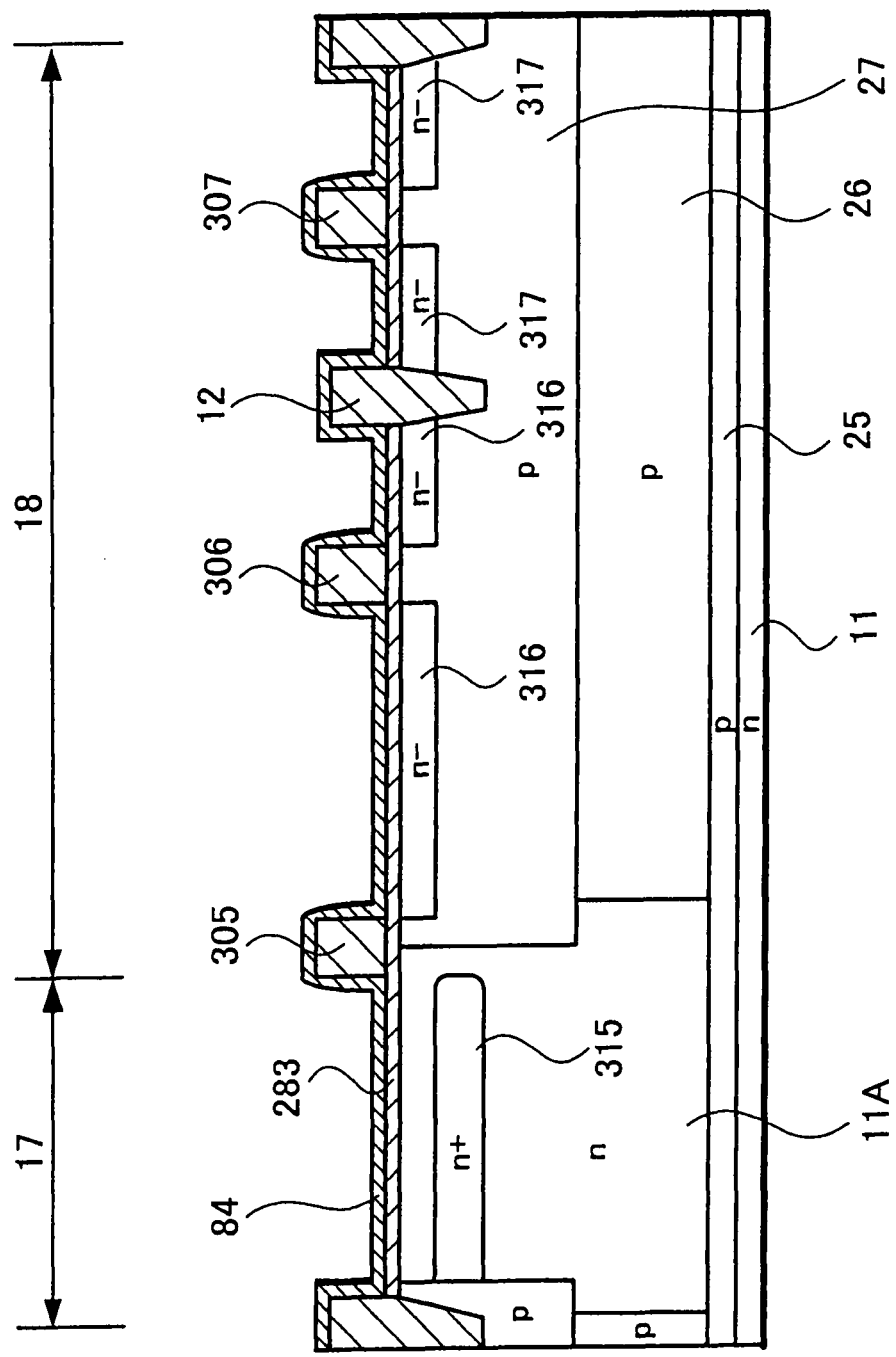
FIG. 79 to FIG. 82 are manufacturing process diagrams of a picture element portion corresponding to FIG. 74 showing another exemplified embodiment of a manufacturing method of a CMOS type solid-state imaging device.
Figure 82:
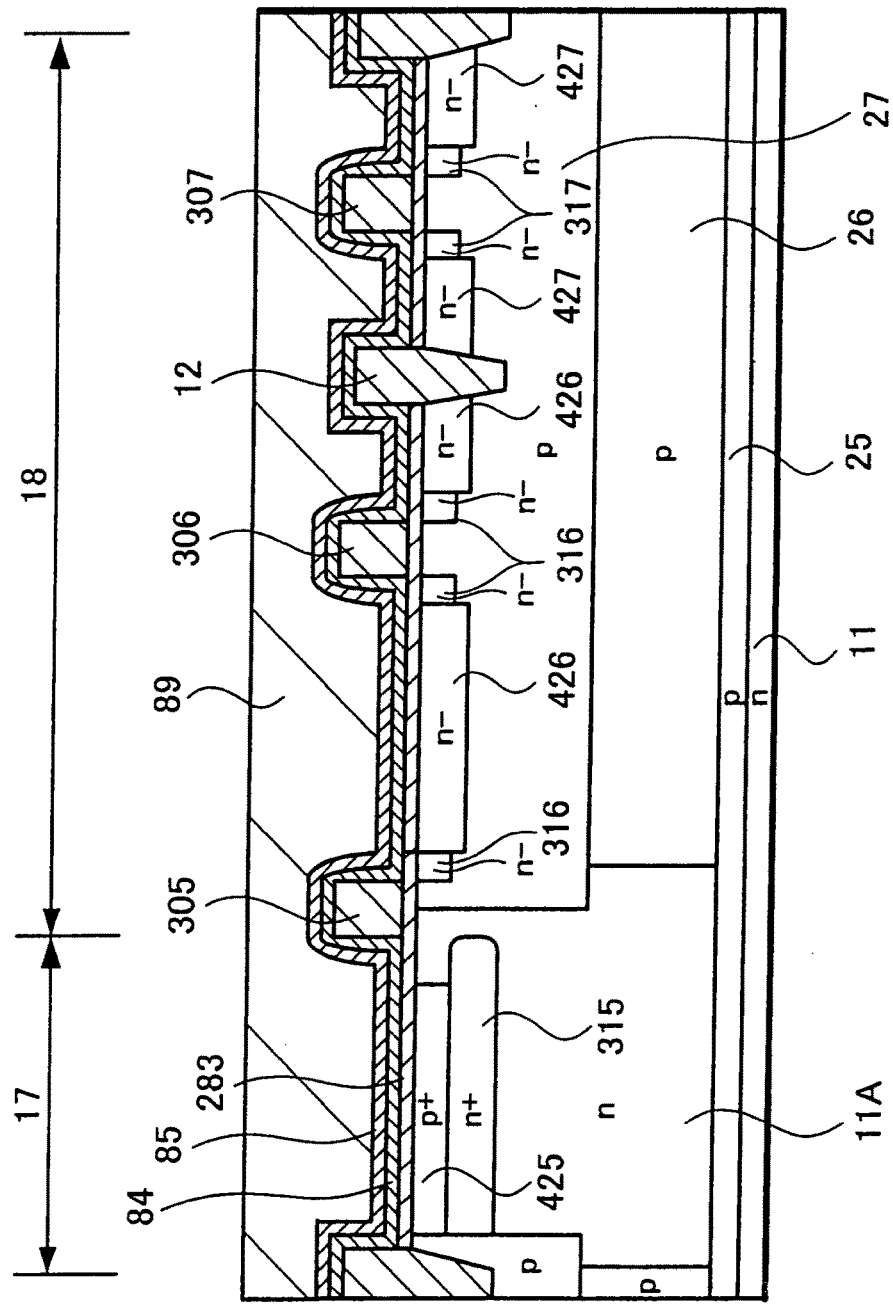

Next, as shown in FIG. 78 and FIG. 82, the side of the picture elements 2 is coated with a photo-resist mask 89, the second insulating film 85 only on the side of the CMOS logic circuit portion 4 is etchedback and sidewalls 86 of a single layer structure composed of the silicon oxide film 85 which is the second insulating film.

Thereafter, by performing the same processes as the processes of FIG. 40 to FIG. 41, CMOS transistors having metal silicide layers 44 of a refractory metal are formed on the side of the CMOS logic circuit portion 4 such that the CMOS logic circuit portion 4 is formed. On the other hand, the photo-resist mask 82 on the side of the picture elements is removed so as to perform the formation of the picture elements 2. (see FIG. 73 and FIG. 74)

This exemplified embodiment also has similar operational effects as those of the CMOS type solid-state imaging device and the manufacturing method thereof mentioned above in connection with FIG. 27 and FIG. 28. Further, the structure is such a structure where the film thickness of the first insulating film 84 can be freely selected, so that the intensity of the reflected light with respect to the incident light to the sensor portion 45, which is decided based on the structure of the first insulating film 84, can be minimized.

Figure 83:
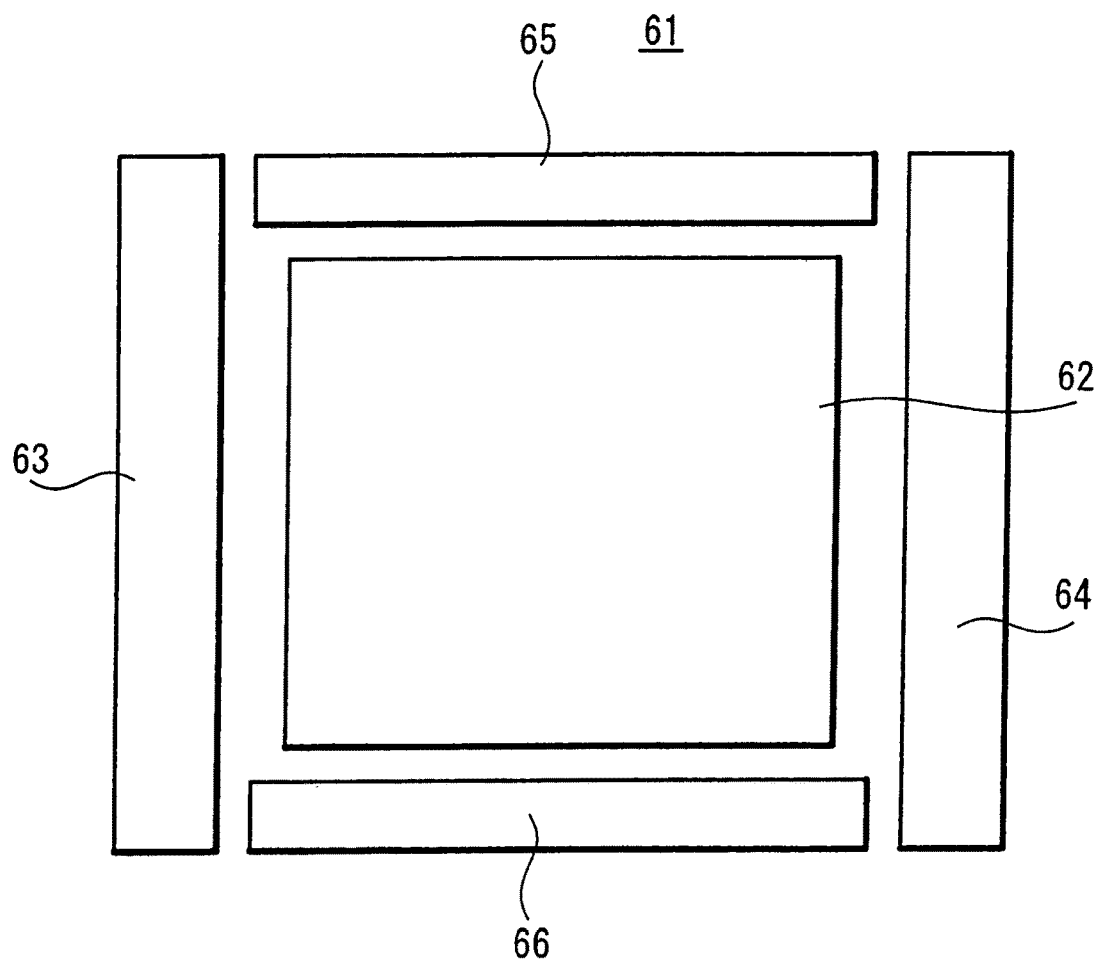
FIG. 83 is a conceptional constitutional diagram showing one exemplified embodiment of a semiconductor device according to the present invention which is applied to a logic LSI with embedded DRAM.

The above mentioned exemplified embodiments relate to cases which are applied to a CMOS type solid-state imaging device, but the present invention is not limited to such a CMOS type solid-state imaging device. For example, as shown in FIG. 83, the present invention is also applicable to a semiconductor device 61, that is, a so-called logic with embedded DRAM semiconductor integrating circuit (LSI) which is composed of a DRAM cell 62 where one memory cell is composed of a MOS transistor and a capacitor and CMOS logic circuit portions 63, 64 and analog circuit portions 65, 66 which are provided at the peripheral of the DRAM cell 62. In this case, metal silicide layers of a refractory metal are not formed at the MOS transistors on the side of the DRAM cell 62 and metal silicide layers of a refractory metal are formed at the CMOS transistors on the side of the CMOS logic circuit portions 63, 64. This logic LSI with embedded DRAM 61 is also designed with a high quality characteristic.

Furthermore, regions for being selectively formed the metal silicide layers of a refractory metal are not limited by the above examples. For example, it is not necessary to form metal silicide layers of a refractory metal in a region where a protective transistor or a protective diode is formed in consideration of an electrostatic breakdown for such an I/O cell inside of the logic circuit portion. In other word, the logic circuit in this case falls into the scope of a region where metal silicide layers of a refractory metal are not formed according to the present invention.

Further, the present invention is widely applicable to various devices where metal silicide layers of a refractory metal are selectively formed in the regions within a semiconductor chip.

Consequently, the present invention is applicable to various electronic apparatuses equipped with such various devices. According to the present invention, it can be accelerated to make various electronic apparatuses with a small size and with a high function by adopting the semiconductor devices where a small size and a high quality are accomplished. Especially, a tremendously big effect can be obtained by applying it to mobile communication terminals such as potable telephone. Such an electronic apparatus is included within the scope of the present invention.

Further, materials of the above mentioned insulating films 35, 36, 38 or insulating films 51, 52 are not limited to the above mentioned combinations and can be changed at any time according to demands.

DESCRIPTION OF REFERENCE NUMERALS

1 .. CMOS TYPE SOLID-STATE IMAGING DEVICE
2 .. PICTURE ELEMENTS

3 .. IMAGING REGION
4, 5 .. CMOS LOGIC CIRCUIT PORTION
6, 7 .. ANALOG CIRCUIT PORTION
11 .. SEMICONDUCTOR SUBSTRATE
12 .. ELEMENT SEPARATING REGION
13 to 16 .. MOS TRANSISTOR FORMING REGION
17 .. SENSOR PORTION FORMING REGION
18 .. MOS TRANSISTOR FORMING REGION
19 .. INSULATING FILM
20, 21 to 24 .. SEMICONDUCTOR WELL REGION
25 to 27 .. SEMICONDUCTOR WELL REGION
28 [281 to 283] .. GATE INSULATING FILM
29 .. GATE ELECTRODE MATERIAL FILM
30 [301 to 307] .. GATE ELECTRODE
31 [311 to 317] .. IMPURITY INTRODUCING REGION
35 .. FIRST INSULATING FILM
35A .. SIDEWALL PORTION
36 .. SECOND INSULATING FILM
36A .. SIDEWALL PORTION
37 .. PHOTO-RESIST MASK
38 .. SECOND INSULATING FILM
39, 40 .. SIDEWALL
42 [421 to 427] .. IMPURITY INTRODUCING REGION
44 .. METAL SILICIDE LAYER OF A REFRACTORY METAL
45 .. SENSOR PORTION
46 .. INSULATING FILM
TR1 to TR7 .. MOS TRANSISTOR
Ti to T7 .. FILM THICKNESS
51 .. FIRST INSULATING FILM
52 .. SECOND INSULATING FILM
53, 54 .. SIDEWALL
71 .. FIRST INSULATING FILM
72 .. SECOND INSULATING FILM
73 .. THIRD INSULATING FILM
73A .. SIDEWALL PORTION
75, 76 .. SIDEWALL
77, 78, 79, 81, 88, 89 .. PHOTO-RESIST MASK
84 .. FIRST INSULATING FILM
85 .. SECOND INSULATING FILM
86, 87 .. SIDEWALL
61 .. LOGIC LSI WITH EMBEDDED DRAM
62 .. DRAM CELL
63, 64 .. CMOS LOGIC CIRCUIT PORTION
65, 66 .. ANALOG CIRCUIT PORTION

The invention claimed is:

1. A manufacturing method for a semiconductor device comprising:
forming gate electrodes over corresponding gate insulation film portions on a first and second regions on a substrate and the second region having a cell and at least one transistor;
forming a first impurity introducing region by introducing an impurity to the first and second regions using said gate electrodes as a mask;
forming a first conductivity type region in the second region;
stacking a first insulating film and a second insulating film on the whole surface of said first region and said second region;
forming a mask on the second region;
forming a sidewall comprised of the first and second insulating films;
forming a second impurity introducing region by introducing an impurity using the sidewall and the gate electrode as a mask;
forming a sidewall of a single layer film made of a third insulating film on the side wall of the gate electrodes in said first region and forming a sidewall by said third insulating film through said first and second insulating films on the side wall of said gate electrodes in said second region by forming a third insulating film on the whole surfaces of said first region and said second region and there after etching back said third insulating film; forming a third impurity introducing region by introducing an impurity in said first region and said second region using said gate electrodes and said sidewall as a mask; and
forming a silicide layer at the third impurity introducing region of said first region or at said third impurity introducing region and the gate electrodes and wherein the second region with an image sensor is substantially entirely free of any silicide material throughout the entire image sensor region and wherein the silicide layer is formed by forming a metal film and selectively removing non-reacted portions to form the silicide layer by a salicide method; and further wherein the second region includes locations of protective circuit elements.

2. A manufacturing method of a semiconductor device according to claim 1, wherein said second insulating film is formed by an insulating film having a different etching characteristic from that of said third insulating film.

3. A manufacturing method of a semiconductor device according to claim 2, wherein said first insulating film is formed by a silicon oxide film; said second insulating film is formed by a silicon nitride film and said third insulating film is formed by a silicon oxide film.

4. A manufacturing method of a semiconductor device according to claim 1, wherein a field effect transistor composed of said gate electrode and said first and second impurity introducing region and constituting a logic circuit is formed in said first region; and a field effect transistor composed of said gate electrode and said first and second impurity introducing region and an imager area composed of a sensor portion are formed in said second region such that a CMOS type solid-state imaging device is manufactured.

5. A manufacturing method of a semiconductor device according to claim 1, wherein a field effect transistor composed of said gate electrode and said first and second impurity introducing region and constituting a logic circuit is formed in said first region; and a memory device composed of a field effect transistor composed of said gate electrode and said first and second impurity introducing region and a capacitance device is formed in said second region such that a semiconductor integrating circuit of a logic with embedded DRAM is manufactured.

6. A manufacturing method for a semiconductor device according to claim 1, wherein the selectively formed suicide layer is not formed on the second impurity introducing region of the second region.

7. A manufacturing method for a semiconductor device comprising:
forming gate electrodes over corresponding gate insulation film portions on first and second regions on a substrate and wherein the second region has a cell and at least one transistor;
forming a first impurity introducing region by introducing an impurity to said first and second regions using said gate electrodes as a mask;
forming a first conductivity type region in the second region;
forming a mask on the second region;

stacking a first insulting layer and a second insulating layer on the whole surface of said first region and said second region;

forming a second impurity introducing region by introducing an impurity to said second region using said first and second insulating films of said gate electrodes and the side wall of said gate electrode as a mask;

forming a third impurity introducing region by masking the upper face of said second region, and introducing an impurity to said first region using said gate electrodes as a mask; and forming a fourth impurity introducing region by forming a third insulating film on the whole surfaces of said first region and said second region and thereafter masking said second region and etching back said third insulating film, by forming a sidewall of a single layer film made of a third insulating film on the side wall of said gate electrodes in said first region and by introducing an impurity to said first region using said gate electrodes and said sidewall as a mask; and forming a silicide layer at said fourth impurity introducing region of said first region or at said fourth impurity introducing region and said gate electrodes and wherein the second region with an image sensor is substantially entirely free of any silicide material throughout the entire image sensor region, wherein the silicide layer is formed only at the second impurity introducing region by etching back the first insulating film and wherein the silicide layer is formed by forming a metal film and selectively removing non-reacted portions to form the silicide layer by a salicide method; and further wherein the second region includes locations of protective circuit elements.

8. A manufacturing method of a semiconductor device according to claim 7, wherein said second insulating film is formed by an insulating film having a different etching characteristic from that of said third insulating film.

9. A manufacturing method of a semiconductor device according to claim 8, wherein said first insulating film is formed by a silicon oxide film; said second insulating film is formed by a silicon nitride film and said third insulating film is formed by a silicon oxide film.

10. A manufacturing method of a semiconductor device according to claim 7, wherein a field effect transistor composed of said gate electrode and said first and second impurity introducing region and constituting a logic circuit is formed in said first region; and a field effect transistor composed of said gate electrode and said first and second impurity introducing region and an imager area composed of a sensor portion are formed in said second region such that a CMOS type solid-state imaging device is manufactured.

11. A manufacturing method of a semiconductor device according to claim 7, wherein a field effect transistor composed of said gate electrode and said first and second impurity introducing region and constituting a logic circuit is formed in said first region; and a memory device composed of a field effect transistor composed of said gate electrode and said first and second impurity introducing region and a capacitance device is formed in said second region such that a semiconductor integrating circuit of a logic with embedded DRAM is manufactured.

12. A manufacturing method for a semiconductor device comprising:

forming gate electrodes over corresponding gate insulation film portions on a first and second regions on a substrate and the second region has a cell and at least one transistor;

forming a first impurity introducing region by introducing an impurity to said first and second regions using said gate electrodes as a mask;

forming a first conductivity type region in the second region;

forming a first insulating film on the whole surface of said first region and said second region;

forming a mask on the second region;

forming a second impurity introducing region, and by introducing an impurity to said first region using said gate electrodes as a mask;

forming a sidewall of a single layer film made of a second insulating film on the side wall of the gate electrodes in said first region and for forming a sidewall by said second insulating film through said first insulating film on the side wall of said gate electrodes in said second region by forming a second insulating film on the whole surfaces of said first region and said second region and there after etching back said second insulating film;

forming a third impurity introducing region by introducing an impurity in said first region and said second region using said gate electrodes and said sidewall as a mask; and forming a silicide layer at the third impurity introducing region of said first region or at said third impurity introducing region and the gate electrodes and wherein the second region with an image sensor is substantially entirely free of any silicide material throughout the entire image sensor region, wherein the silicide layer is formed by etching back the first insulating film and wherein the silicide layer is formed by forming a metal film and selectively removing non-reacted portions to form the suicide layer by a salicide method; and further wherein the second region includes locations of protective circuit elements.

13. A manufacturing method of a semiconductor device according to claim 12, wherein said first insulating film is formed by an insulating film having a different etching characteristic from that of said second insulating film.

14. A manufacturing method of a semiconductor device according to claim 13, wherein said first insulating film is formed by a silicon nitride film and said second insulating film is formed by a silicon oxide film.

15. A manufacturing method of a semiconductor device according to claim 12, wherein a field effect transistor composed of said gate electrode and said first and second impurity introducing region and constituting a logic circuit is formed in said first region; and a field effect transistor composed of said gate electrode and said first and second impurity introducing region and an imager area composed of a sensor portion are formed in said second region such that a CMOS type solid-state imaging device is manufactured.

16. A manufacturing method of a semiconductor device according to claim 12, wherein a field effect transistor composed of said gate electrode and said first and second impurity introducing region and constituting a logic circuit is formed in said first region; and a memory device composed of a field effect transistor composed of said gate electrode and said first and second impurity introducing region and a capacitance device is formed in said second region such that a semiconductor integrating circuit of a logic with embedded DRAM is manufactured.

17. A manufacturing method for a semiconductor device comprising:

forming gate electrodes over corresponding gate insulation film portions on a first and second regions on a substrate and wherein the second region has a cell and at least one transistor;
forming a first impurity introducing region by introducing an impurity to said first and second regions using said gate electrodes as a mask;
forming a first conductivity type region in the second region;
forming a first insulating layer on the whole surface of said first region and said second region;
forming a mask on the second region;
forming a second impurity introducing region by introducing an impurity to said second region using said first insulating film of said gate electrodes and the side wall of said gate electrodes as a mask;
forming a third impurity introducing region by masking said second region and by introducing an impurity to said first region using said gate electrodes as a mask;
forming a fourth impurity introducing region by forming a second insulating film on the whole surfaces of said first region and said second region and thereafter masking said second region and etching back said second insulating film and forming a silicide layer at said fourth impurity introducing region of said first region or at said fourth impurity introducing region and the gate electrodes and wherein the second region with an image sensor is substantially entirely free of any silicide material throughout the entire image sensor region, wherein the silicide layer is formed by etching back the first insulating film and wherein the silicide layer is formed by forming a metal film and selectively removing non-reacted portions to form the silicide layer by a salicide method; and further wherein the second region includes locations of protective circuit elements.

18. A manufacturing method of a semiconductor device according to claim 17, wherein said first insulating film is formed by an insulating film having a different etching characteristic from that of said second insulating film.

19. A manufacturing method of a semiconductor device according to claim 18, wherein said first insulating film is formed by a silicon nitride film and said second insulating film is formed by a silicon oxide film.

20. A manufacturing method of a semiconductor device according to claim 17, wherein a field effect transistor composed of said gate electrode and said first and second impurity introducing region and constituting a logic circuit is formed in said first region; and a field effect transistor composed of said gate electrode and said first and second impurity introducing region and an imager area composed of a sensor portion are formed in said second region such that a CMOS type solid-state imaging device is manufactured.

21. A manufacturing method of a semiconductor device according to claim 17, wherein a field effect transistor composed of said gate electrode and said first and second impurity introducing region and constituting a logic circuit is formed in said first region; and a memory device composed of a field effect transistor composed of said gate electrode and said first and second impurity introducing region and a capacitance device is formed in said second region such that a semiconductor integrating circuit of a logic with embedded DRAM is manufactured.

\* \* \* \* \*